United States Patent [19]
Hyatt

[11] Patent Number: 5,432,526
[45] Date of Patent: Jul. 11, 1995

[54] LIQUID CRYSTAL DISPLAY HAVING CONDUCTIVE COOLING

[76] Inventor: Gilbert P. Hyatt, 7841 Jennifer Cir., La Palma, Calif. 90623

[21] Appl. No.: 515,881

[22] Filed: Apr. 27, 1990

Related U.S. Application Data

[60] Division of Ser. No. 59,286, Jun. 8, 1987, which is a continuation of Ser. No. 860,277, Dec. 13, 1977, which is a continuation-in-part of Ser. No. 101,881, Dec. 28, 1970, abandoned, Ser. No. 134,958, Apr. 19, 1971, Ser. No. 135,040, Apr. 19, 1971, Ser. No. 229,213, Apr. 13, 1972, Pat. No. 3,820,894, Ser. No. 230,872, Mar. 1, 1972, Pat. No. 4,531,182, Ser. No. 232,459, Mar. 7, 1972, Pat. No. 4,370,720, Ser. No. 246,867, Apr. 24, 1972, Pat. No. 4,310,878, Ser. No. 288,247, Sep. 11, 1972, Pat. No. 4,121,284, Ser. No. 291,394, Sep. 22, 1972, Pat. No. 4,396,976, Ser. No. 302,771, Nov. 1, 1972, Ser. No. 325,941, Jan. 22, 1973, Pat. No. 4,060,848, Ser. No. 366,714, Jun. 4, 1973, Pat. No. 3,986,022, Ser. No. 339,817, Mar. 9, 1973, Pat. No. 4,034,276, Ser. No. 490,816, Jul. 22, 1974, Pat. No. 4,029,853, Ser. No. 476,743, Jun. 5, 1974, Pat. No. 4,364,110, Ser. No. 522,559, Nov. 11, 1974, Pat. No. 4,209,852, Ser. No. 550,231, Feb. 14, 1975, Pat. No. 4,209,843, Ser. No. 727,330, Sep. 27, 1976, abandoned, Ser. No. 730,756, Oct. 7, 1976, abandoned, Ser. No. 754,660, Dec. 27, 1976, Pat. No. 4,486,850, Ser. No. 812,285, Jul. 1, 1977, Pat. No. 4,371,953, Ser. No. 844,765, Oct. 25, 1977, Pat. No. 4,523,290, Ser. No. 849,812, Nov. 9, 1977, and Ser. No. 849,733, Nov. 9, 1977, abandoned.

[51] Int. Cl.⁶ ............................................. G09G 3/36
[52] U.S. Cl. .................................... 345/87; 359/48
[58] Field of Search ............... 340/702, 784, 705, 794, 340/795; 350/351, 331 R, 331 T; 362/294, 373; 361/380, 389; 357/81, 82; 353/54, 55, 57, 58, 60, 61; 352/202; 358/60, 61; 345/87, 88; 359/48, 49, 70, 80

[56] References Cited

U.S. PATENT DOCUMENTS

| | | |
|---|---|---|
| 2,169,838 | 8/1939 | Herbst . |
| 2,314,920 | 3/1943 | Bumstead . |
| 2,342,778 | 2/1944 | Wolff . |
| 2,605,335 | 7/1952 | Greenwood . |
| 2,792,447 | 5/1957 | Kazan . |
| 2,897,487 | 7/1959 | Owen . |
| 3,001,185 | 9/1961 | Cleek . |
| 3,007,388 | 11/1961 | Ogata et al. . |
| 3,008,002 | 11/1961 | Kingsbury . |
| 3,037,072 | 5/1962 | Mendoza et al. . |
| 3,138,715 | 6/1964 | Walter . |
| 3,141,987 | 7/1964 | Altman . |
| 3,152,509 | 10/1964 | Zilimer . |
| 3,186,115 | 6/1965 | Todt et al. . |
| 3,207,905 | 9/1965 | Bray . |
| 3,231,746 | 1/1966 | Goodrich . |
| 3,253,139 | 5/1966 | Anderson . |

(List continued on next page.)

FOREIGN PATENT DOCUMENTS

| | | |
|---|---|---|
| 48-79596 | 10/1973 | Japan . |
| 52-77699 | 6/1977 | Japan . |

OTHER PUBLICATIONS

Electronic Design 19; Sep. 13, 1970; Material with a Hot Future, Liquid Crystals, pp. 77–81.

Lechner et al.; Liquid Crystal Matrix Displays; Proceedings of the IEEE, Nov. 1971, pp. 1566–1579.

(List continued on next page.)

*Primary Examiner*—Jeffery Brier

[57] ABSTRACT

Illumination control systems implemented with illumination amplifiers, such as liquid crystal devices, are provided. Heat transfer devices remove heat, such as heat caused by the high intensity illumination, from the illumination amplifier. The illumination amplifiers can be implemented in either transmissive or reflective modes. In a reflective mode, illumination can be reflected from a front side and heat can be removed from a back side of the illumination amplifier. Color is provided, such as generating multiple channels of different color images and projecting the different color images to generate a multicolored image.

72 Claims, 14 Drawing Sheets

U.S. PATENT DOCUMENTS

| | | | |
|---|---|---|---|
| 3,323,414 | 6/1967 | Ritchie . | |
| 3,330,182 | 7/1967 | Gerber . | |
| 3,380,028 | 4/1968 | Gustafson et al. . | |
| 3,401,262 | 9/1968 | Fergason et al. | 350/351 |
| 3,410,999 | 11/1968 | Fergason et al. | 350/351 |
| 3,427,458 | 2/1969 | Darformak et al. . | |
| 3,435,228 | 3/1969 | Gordon . | |
| 3,444,316 | 5/1969 | Gerritsen . | |
| 3,450,192 | 6/1969 | Hay . | |
| 3,473,084 | 10/1969 | Dodge . | |
| 3,476,029 | 11/1969 | Schreckendgust . | |
| 3,500,456 | 3/1970 | Ross . | |
| 3,501,966 | 3/1970 | Shapiro et al. . | |
| 3,516,729 | 6/1970 | Adler . | |
| 3,526,711 | 9/1970 | DeBoer . | |
| 3,527,879 | 9/1970 | Pritchard . | |
| 3,541,254 | 11/1970 | Orthuber . | |
| 3,544,711 | 12/1970 | DeBitetto . | |
| 3,558,892 | 1/1971 | Seeley . | |
| 3,566,021 | 2/1971 | Jakes, Jr. . | |
| 3,571,493 | 3/1971 | Baker et al. . | |
| 3,576,364 | 4/1971 | Zanoni . | |
| 3,576,394 | 4/1971 | Lee . | |
| 3,578,912 | 5/1971 | Beavers . | |
| 3,588,324 | 6/1971 | Marie . | |
| 3,605,594 | 9/1971 | Gerritsen . | |
| 3,621,133 | 11/1971 | Baker et al. . | |
| 3,627,408 | 12/1971 | Fergason . | |
| 3,641,264 | 2/1972 | Macovski . | |
| 3,643,568 | 2/1972 | Guillet et al. . | |
| 3,647,959 | 3/1972 | Schlesinger et al. . | |
| 3,654,606 | 4/1972 | Marlowe et al. . | |
| 3,655,269 | 4/1972 | Heilmeier . | |
| 3,666,881 | 5/1972 | Stein . | |
| 3,670,202 | 6/1972 | Paine et al. . | |
| 3,675,023 | 7/1974 | Kunke et al. . | |
| 3,675,023 | 7/1972 | Kunke et al. . | |
| 3,696,344 | 10/1972 | Feinleib et al. . | |
| 3,700,802 | 10/1972 | Markin et al. . | |
| 3,700,805 | 10/1972 | Hanlon . | |
| 3,702,723 | 11/1972 | Borden, Jr. . | |
| 3,705,758 | 12/1972 | Haskal . | |
| 3,707,323 | 12/1972 | Kessler et al. . | |
| 3,708,219 | 1/1973 | Forlini et al. . | |
| 3,713,042 | 1/1973 | Kinsel . | |
| 3,716,658 | 2/1973 | Rackman . | |
| 3,720,923 | 3/1973 | Chen et al. . | |
| 3,723,651 | 3/1973 | Gorog . | |
| 3,723,739 | 3/1973 | Horton . | |
| 3,727,527 | 4/1973 | Borkowski et al. . | |
| 3,730,607 | 5/1973 | Grabmaier et al. . | |
| 3,738,242 | 6/1973 | Lee et al. . | |
| 3,743,382 | 7/1973 | Rosenberg . | |
| 3,744,906 | 7/1973 | Sato et al. . | |
| 3,748,753 | 7/1973 | Whitcomb et al. . | |
| 3,758,195 | 9/1973 | Hedman, Jr. et al. . | |
| 3,761,617 | 9/1973 | Tsuchiya et al. . | |
| 3,764,213 | 10/1973 | O'Meara . | |
| 3,765,011 | 10/1973 | Sawyer et al. . | |
| 3,770,961 | 11/1973 | Westell . | |
| 3,772,685 | 11/1973 | Masi . | |
| 3,776,615 | 12/1973 | Tsukamoto et al. . | |
| 3,778,791 | 12/1973 | Lewicki et al. . | |
| 3,786,486 | 1/1974 | Torresi . | |
| 3,788,729 | 1/1974 | Lowell et al. . | |
| 3,790,901 | 2/1974 | White et al. . | |
| 3,798,452 | 3/1974 | Spitz et al. . | |
| 3,813,145 | 5/1974 | Hedman, Jr. et al. . | |
| 3,815,982 | 6/1974 | Wagensonner . | |
| 3,818,129 | 6/1974 | Yamamoto . | |
| 3,818,496 | 6/1974 | Lee et al. . | |
| 3,820,875 | 6/1974 | Bohmer . | |
| 3,824,003 | 7/1974 | Koda et al. . | |
| 3,824,604 | 7/1974 | Stein . | |
| 3,833,297 | 9/1974 | Swartz . | |
| 3,840,695 | 10/1974 | Fischer . | |
| 3,844,650 | 10/1974 | Nicholson et al. . | |

(List continued on next page)

OTHER PUBLICATION

Hudspeth; What's New in Cool(ing)?; Electro–Optical Systems Design; May 1977.

Cunningham; Integrated Optics: 1973–1975; Electro–Optical Systems Design; Jun. 1975.

Davis; Computer Design; Mar. 1972.

Liquid Crystals: a big case for displays; Part I; Fergason; Optical Spectra; Jun. 1978.

Liquid Crystals: a big case for displays; Part II; Fergason; Optical Spectra; Sep. 1978, pp. 42 and 46.

Heilmeier; Liquid Crystal Display Devices; Scientific American; Apr. 1970, pp. 100 to 106.

Hendrickson et al.; Television Projectors; Society of Photo–Optical Instrumentation Engineers; Mar. 17, 18, 1975.

Lebedev et al.; Liquid Crystals in Optics; Soviet Journal of Optical Technology; Jul. 1975, pp. 403 to 412.

(List continued on next page.)

U.S. PATENT DOCUMENTS

| | | |
|---|---|---|
| 3,862,360 | 1/1975 | Dill et al. . |
| 3,864,730 | 2/1975 | Roth . |
| 3,879,723 | 4/1975 | Hornung . |
| 3,883,778 | 5/1975 | Kaji et al. . |
| 3,896,338 | 7/1975 | Nathanson et al. . |
| 3,898,007 | 8/1975 | Wiklund . |
| 3,899,786 | 8/1975 | Gruebel et al. . |
| 3,907,405 | 9/1975 | Fukai et al. . |
| 3,927,411 | 12/1975 | Lee et al. . |
| 3,943,279 | 3/1976 | Austefjord . |
| 3,956,745 | 5/1976 | Ellis . |
| 3,981,002 | 9/1976 | Gardner . |
| 3,985,866 | 10/1976 | de Quervain et al. . |
| 3,986,022 | 10/1976 | Hyatt . |
| 3,989,356 | 11/1976 | Altman . |
| 4,006,968 | 2/1977 | Ernstoff et al. . |
| 4,087,687 | 5/1978 | Bean . |
| 4,090,219 | 5/1978 | Ernstoff et al. . |
| 4,100,579 | 7/1978 | Ernstoff .................... 340/793 |
| 4,127,322 | 11/1978 | Jacobson et al. . |
| 4,151,554 | 4/1979 | Tucker . |
| 4,236,223 | 11/1980 | Stanly et al. . |
| 4,239,349 | 12/1980 | Scheffer . |
| 4,342,906 | 8/1982 | Hyatt . |
| 4,368,963 | 1/1983 | Stolov .................... 350/331 T |
| 4,435,732 | 3/1984 | Hyatt . |
| 4,471,385 | 9/1984 | Hyatt . |
| 4,611,245 | 9/1986 | Trias . |
| 4,614,415 | 9/1986 | Hyatt . |
| 4,672,457 | 6/1987 | Hyatt . |
| 4,692,208 | 9/1987 | Chisum . |
| 4,739,396 | 4/1988 | Hyatt . |

OTHER PUBLICATIONS

Lechner et al.; Liquid Crystal Matrix Displays; Proceedings of the IEEE; Nov. 1971.

Robertson; Projection Television; Wireless World; Sep. 1976.

Sobel; Summary: New Techniques in Video Displays; IEEE Transactions on Consumer Electronics; Aug. 1975.

Tults; Facsimile Printer Utilizing Liquid Crystal Cells; Society For Information Display; May 1970.

White et al.; Liquid Crystal Light Valves; Electronics Letters; Dec. 1970.

Morozumi et al.; 4.25–in. and 1.51–in. B/W and Full-Color LC Video Displays Addressed by Poly–Si TFTs; SID Digest; 1984, pp. 316–318.

Anderson; Projecting Images With Liquid Crystals; Bell Laboratories Record; 1974, pp. 223–229.

Assouline; Liquid Crystal and Photoconductor Image Converter; Proceedings of the IEEE; Nov. 1971.

Bauchsbaum's Complete Handbook Of Practical Electronic Reference Data; Bauchsbaum; Prentice–Hall, Inc.; 1973; pp. 431 to 433.

Radiotron Designer's Handbook; Radio Corporation of America; 1953; pp. 6 to 9.

Warner et al.: Integrated Circuits; McGraw–Hill (1965); pp. 129, 137, 167, 246 to 255, 269, 312 to 314, 323, 324, 330.

Obert; Thermodynamics; McGraw–Hill; 1948; pp. 31 and 32.

"Light Valve is Bright Spot for Liquid Crystals", *Electronics*, Nov. 9, 1990, p. 33.

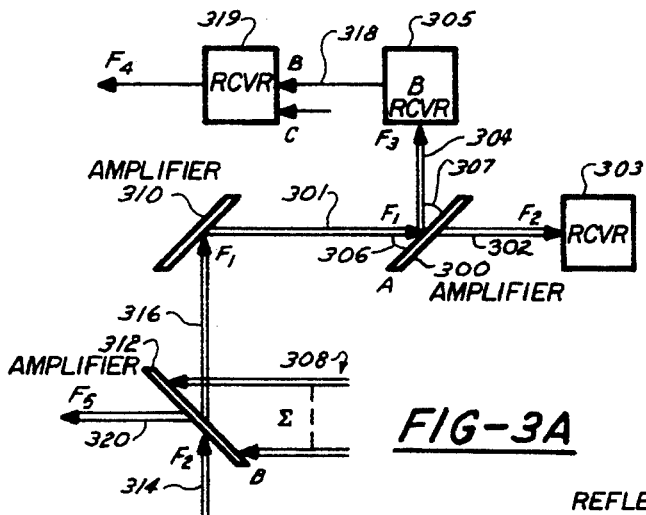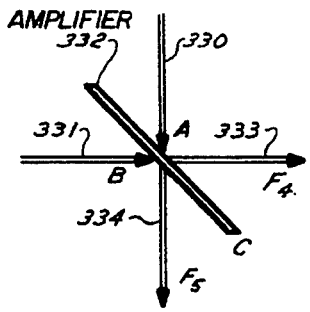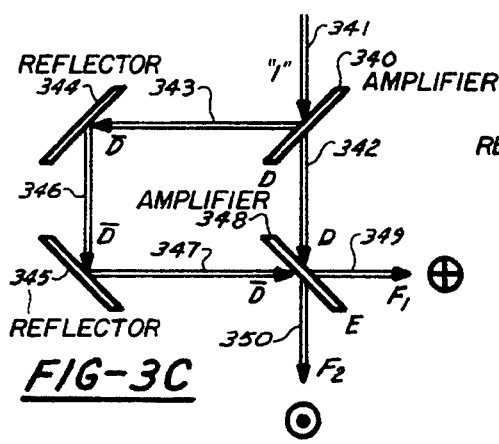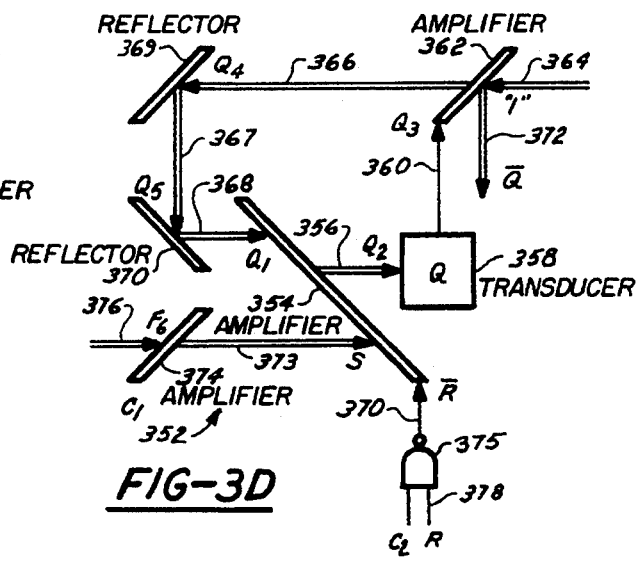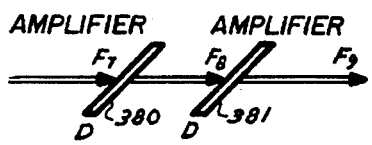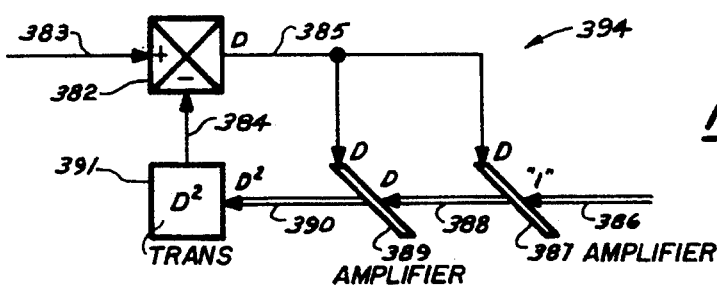

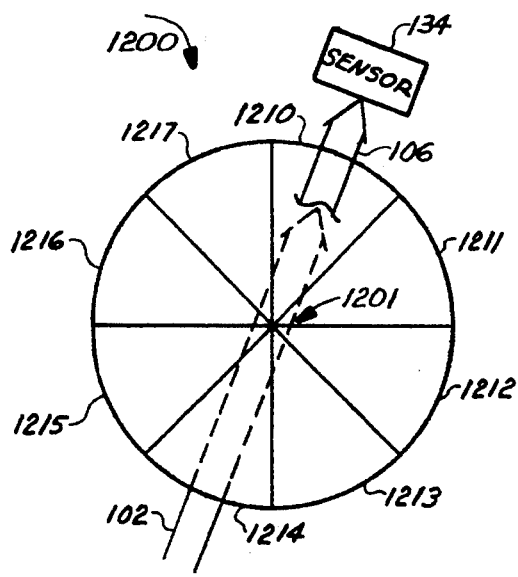
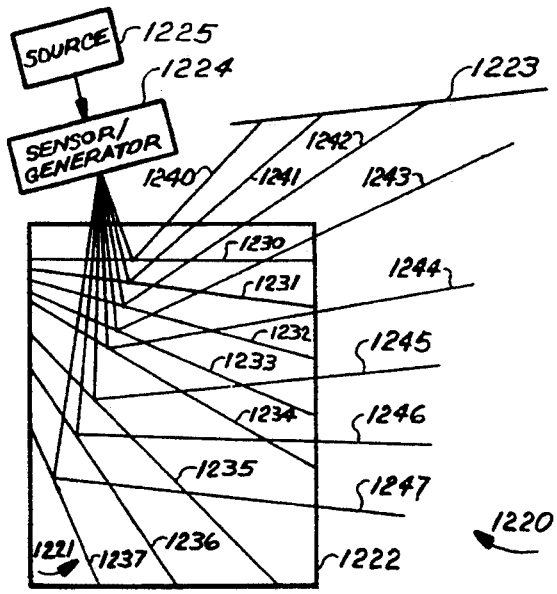
FIG 12A
FIG 12B
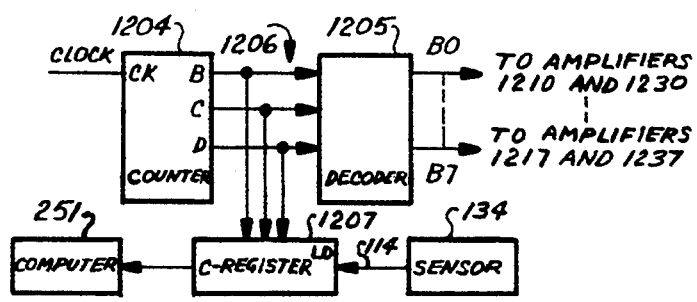
FIG 12C
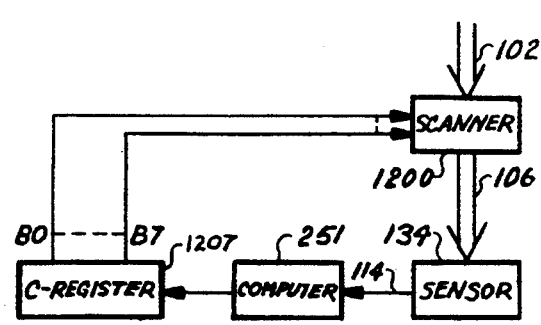
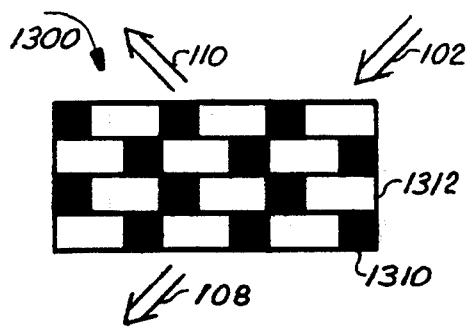
FIG 12D
FIG 13

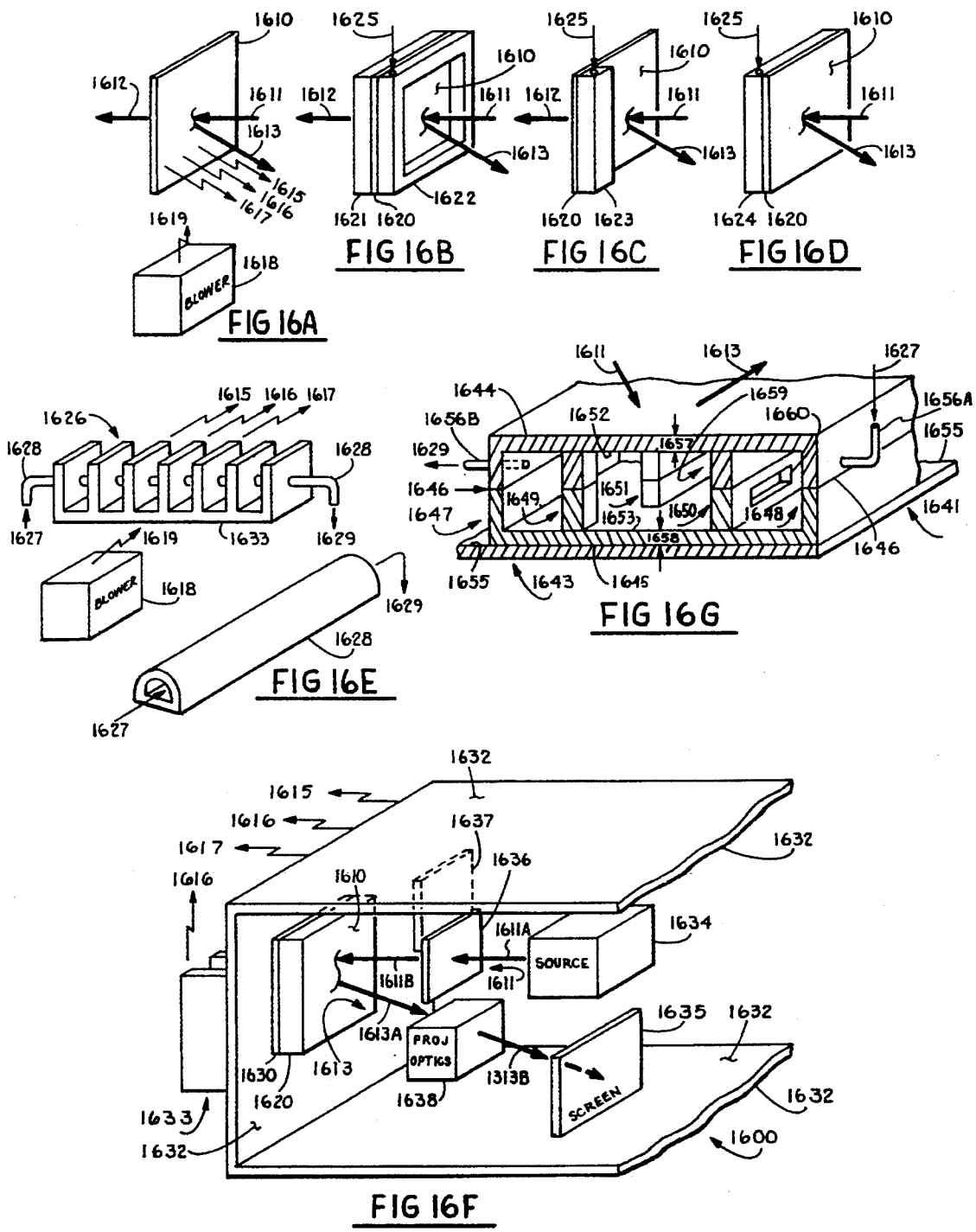

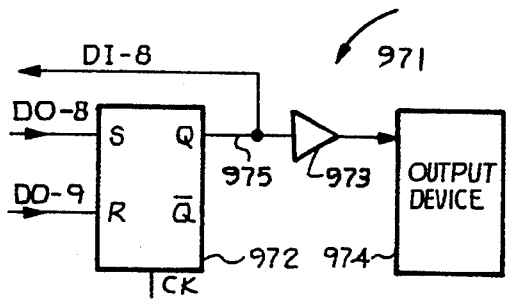
FIG. 17A
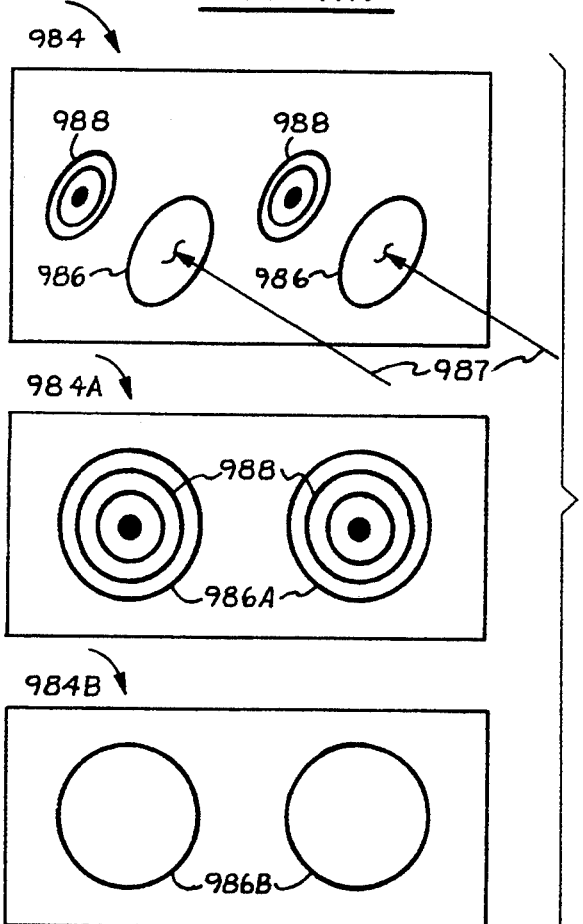
FIG. 17C
FIG. 17B
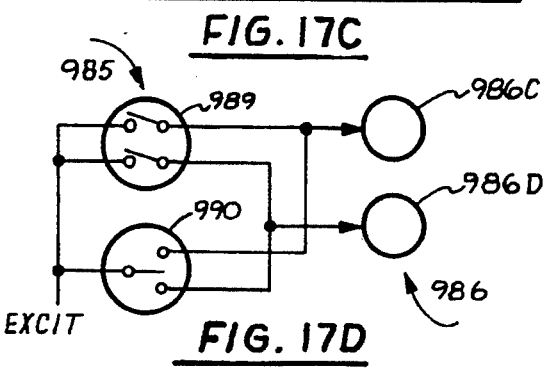
FIG. 17D
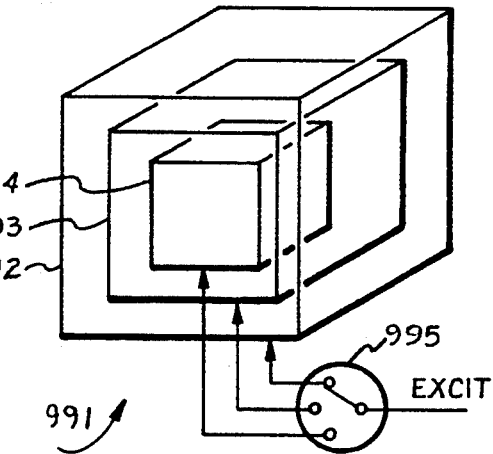
FIG. 17E

LIQUID CRYSTAL DISPLAY HAVING CONDUCTIVE COOLING

CROSS REFERENCE TO RELATED APPLICATIONS

The present application is a divisional of parent application LIQUID CRYSTAL DISPLAY SYSTEM HAVING COOLING Ser. No. 07/059,286 filed on Jun. 8, 1987 by Gilbert P. Hyatt and copending herewith;

wherein parent application Ser. No. 07/059,286 is a continuation of copending grandparent application HIGH INTENSITY ILLUMINATION CONTROL SYSTEM Ser. No. 05/860,277 filed on Dec. 13, 1977 by Gilbert P. Hyatt and copending herewith;

wherein grandparent application Ser. No. 05/860,277 is a continuation in part of each application in the following chain of patent applications, all by Gilbert P. Hyatt:

(1) FACTORED DATA PROCESSING SYSTEM FOR DEDICATED APPLICATIONS Ser. No. 101,881 filed on Dec. 28, 1970; proceedings therein having been terminated;

(2) CONTROL SYSTEM AND METHOD Ser. No. 134,958 filed on Apr. 19, 1971; still pending in the PTO;

(3) CONTROL APPARATUS Ser. No. 135,040 filed on Apr. 19, 1971; still pending in the PTO;

(4) APPARATUS AND METHOD FOR PRODUCING HIGH REGISTRATION PHOTOMASKS Ser. No. 229,213 filed on Apr. 13, 1972 and now U.S. Pat. No. 3,820,8943 issued on Jun. 28, 1974;

(5) MACHINE CONTROL SYSTEM OPERATING FROM REMOTE COMMANDS Ser. No. 230,872 filed on Mar. 1, 1972; now U.S. Pat. No. 4,531,182 issued on Jul. 23, 1985;

(6) COORDINATE ROTATION FOR MACHINE CONTROL SYSTEM Ser. No. 232,459 filed on Mar. 7, 1972 and now U.S. Pat. No. 4,370,720 issued on Jan. 25, 1983;

(7) DIGITAL FEEDBACK CONTROL SYSTEM Ser. No. 246,867 filed on Apr. 24, 1972 and now U.S. Pat. No. 4,310,878 issued on Jan. 12, 1982;

(8) COMPUTERIZED SYSTEM FOR OPERATOR INTERACTION Ser. No. 288,247 filed on Sep. 11, 1972 and now U.S. Pat. No. 4,121,284 issued on Oct. 17, 1978;

(9) A SYSTEM FOR INTERFACING A COMPUTER TO A MACHINE Ser. No. 291,394 filed on Sep. 22, 1972 and now U.S. Pat. No. 4,396,976 issued on Aug. 2, 1983;

(10) DIGITAL ARRANGEMENT FOR PROCESSING SQUAREWAVE SIGNALS Ser. No. 302,771 filed on Nov. 1, 1972; still pending in the PTO;

(11) ELECTRONIC CALCULATOR SYSTEM HAVING AUDIO MESSAGES FOR OPERATOR INTERACTION Ser. No. 325,941 filed on Jan. 22, 1973 and now U.S. Pat. No. 4,060,848 issued on Nov. 29, 1977;

(12) ILLUMINATION CONTROL SYSTEM Ser. No. 366,714 filed on Jun. 4, 1973 and now U.S. Pat. No. 3,986,022 issued on Oct. 12, 1976;

(13) DIGITAL SIGNAL PROCESSOR FOR SERVO VELOCITY CONTROL Ser. No. 339,817 filed on Mar. 9, 1973 and now U.S. Pat. No. 4,034,276 issued on Jul. 5, 1977;

(14) HOLOGRAPHIC SYSTEM FOR OBJECT LOCATION AND IDENTIFICATION Ser. No. 490,816 filed on Jul. 22, 1974 and now U.S. Pat. No. 4,029,853 issued on Jun. 24, 1980;

(15) COMPUTERIZED MACHINE CONTROL SYSTEM Ser. No. 476,743 filed on Jun. 5, 1974 and now U.S. Pat. No. 4,364,110 issued on Dec. 14, 1982;

(16) SIGNAL PROCESSING AND MEMORY ARRANGEMENT Ser. No. 522,559 filed on Nov. 11, 1974 and now U.S. Pat. No. 4,209,852 issued on Jun. 24, 1980;

(17) METHOD AND APPARATUS FOR SIGNAL ENHANCEMENT WITH IMPROVED DIGITAL FILTERING Ser. No. 550,231 filed on Feb. 14, 1975 and now U.S. Pat. No. 4,209,843 issued on Jun. 24, 1980;

(18) ILLUMINATION SIGNAL PROCESSING SYSTEM Ser. No. 727,330 filed on Sep. 27, 1976; now abandoned;

(19) PROJECTION TELEVISION SYSTEM USING LIQUID CRYSTAL DEVICES Ser. No. 730,756 filed on Oct. 7, 1976; now abandoned;

(20) INCREMENTAL DIGITAL FILTER Ser. No. 754,660 filed on Dec. 27, 1976 and now U.S. Pat. No. 4,486,850 issued on Dec. 4, 1984;

(21) ANALOG READ ONLY MEMORY Ser. No. 812,285 filed on Jul. 1, 1977 and now U.S. Pat. No. 4,371,953 issued on Feb. 1, 1983;

(22) DATA PROCESSOR ARCHITECTURE Ser. No. 844,765 filed on Oct. 25, 1977; now U.S. Pat. No. 4,523,290 issued on Jun. 11, 1985;

(23) DIGITAL SOUND SYSTEM FOR CONSUMER PRODUCTS Ser. No. 849,812 filed on Nov. 9, 1977; now pending in the PTO; and

(24) INTELLIGENT DISPLAY SYSTEM Ser. No. 849,733 filed on Nov. 9, 1977 and now abandoned;

where the benefit of the filing dates of all of the above-listed applications are herein claimed in accordance with the United States Code such as with 35 USC 120 and 35 USC 121 and other authorities provided therefor;

where all of the above listed patents and patent applications are incorporated herein by reference as if fully set forth at length herein; and where one skilled in the art will be able to combine the disclosures in said applications and patents that are incorporated by reference with the disclosure in the instant application from the disclosures therein and the disclosures herein.

The present application is further related to the following patent applications:

(25) ADAPTIVE ILLUMINATION SOURCE INTENSITY CONTROL DEVICE Ser. No. 152,105 filed on Jun. 11, 1971 by Lee, Wimmer, and Hyatt now U.S. Pat. No. 3,738,242 issued on Jun. 12, 1973;

(26) ADAPTIVE ILLUMINATION CONTROL DEVICE Ser. No. 325,792 filed on Jan. 22, 1973 by Lee, Wimmer, and Hyatt now U.S. Pat. No. 3,927,411 issued on Dec. 16, 1975;

(27) ILLUMINATION CONTROL SYSTEM Ser. No. 327,918 filed on Jan. 30, 1973 by Lee, Wimmer, and Hyatt now U.S. Pat. No. 3,818,496 issued on Jun. 18, 1974; and

(28) ELECTRO-OPTICAL PRINTER Ser. No. 754,647 filed on Dec. 27, 1976 by Stanly and Hyatt now U.S. Pat. No. 4,236,223 issued on Nov. 25, 1976;

wherein all of the above-referenced applications are herein incorporated by reference as if fully set forth at length herein and where one skilled in the art will be able to combine the disclosures in said applications and patents that are incorporated by reference with the disclosure in the instant application from the disclosures therein and the disclosures herein. TABLE OF CONTENTS

SECTION

Cross Reference to Related Applications
Background of the Invention
    Field of the Invention
    Description of the Prior Art
Summary of the Invention
Brief Descriptions of the Drawings
Detailed Description of the Invention
    Illumination Amplifier Devices
    Digital Excitation
    Analog Excitation
    Schematic Notation
    Illumination Computer
    Digital Control Arrangements
    Analog Control Arrangements
    Batch Fabricated Arrangement
    Closed Loop Control
    Flat Plane Configuration
    Discrete Illumination Device
    Light Pen Arrangement
    Illuminated Switches
    Color Control
    Control of Natural Illumination
    Illumination Control for Buildings
    Illumination Control for Vehicles
    Illumination Shade
    Temperature Control
    Control of Artificial Illumination
    Lamp Control
    Dimmer Control
    Flasher Control
    Camera Systems
    Image Rotation Control
    Aperture Control
    Shutter Control
    Photographic Camera System
    Source Illumination Control
    Audience Display System
    Illumination Chopper, Scanner, And Modulator
    Illumination Modulators
    Camera System Improvements
    Movie Camera System
    Computer Control Arrangement
    Traffic Light Control
    Operator Panel
    Improved Slide Projector
    Segment Arrays
    Multiple Electrode Logic
    Fringe Control
    Integrated Electro-Optic Devices
    Improved Fiber Optic Arrangement
    Additional Considerations
    Pertinence Of Material Incorporated-By-Reference
    Projection Display Arrangement
    Alternate Scanner Embodiment
    Spacial Control of Illumination
    Audience Display System, Additional Features
    Further Considerations
    Electro-Optical Thermal Design
    Large Panel Construction
    Antecedent Basis For Projection Disclosure
    Pulse Modulated Control
    Time-Domain Pulse Modulation
    Optical Effects
    Light Organ
    Further Spacial Control Features
SCOPE AND LIMITATIONS
IN THE CLAIMS

BACKGROUND OF THE INVENTION

1. Field of the Invention

The field of the invention is illumination control systems and, in particular, liquid crystal illumination control systems.

2. Prior Art

The prior art in illumination control systems includes liquid crystal devices. The prior art in illumination control devices and particularly in liquid crystal devices is established by the art cited herein.

SUMMARY OF THE INVENTION

The present invention is directed to illumination control systems and in particular illumination control devices controlling high intensity illumination and having cooling.

In a first embodiment; a liquid crystal illumination control system comprises an illumination source generating source illumination; an electrical controller generating electrical control signals; a liquid crystal illumination controller coupled to the illumination source and to the electrical controller and generating reflected illumination in response to the source illumination and in response to the electrical control signals, wherein the source illumination generates heat in the liquid crystal illumination controller, and wherein the liquid crystal illumination controller includes a deposited heat conductive electrode conducting heat generated by the source illumination; and a heat transfer device coupled to the liquid crystal illumination controller and removing heat conducted by the heat conductive electrode.

In a second embodiment; a liquid crystal illumination control system comprises an illumination source generating source illumination; an electrical controller generating electrical control signals; a reflective liquid crystal illumination controller coupled to the illumination source and to the electrical controller and controlling reflection of the source illumination to generate reflected illumination in response to the electrical control signals, wherein the source illumination generates heat in the reflective liquid crystal illumination controller; and a metallic electrode deposited on the reflective liquid crystal illumination controller and removing heat generated in the reflective liquid crystal illumination controller by the source illumination.

In a third embodiment; a liquid crystal illumination control system comprises an illumination source generating source illumination; an electrical signal controller generating electrical control signals; a first liquid crystal illumination controller coupled to the illumination source and to the electrical signal controller and generating first controlled illumination having a first color in response to the source illumination and in response to the electrical control signals; a second liquid crystal illumination controller coupled to the illumination source and to the electrical signal controller and generating second controlled illumination having a second color that is different from the first color in response to the source illumination and in response to the electrical control signals; a screen coupled to the first liquid crystal illumination controller and to the second liquid crystal illumination controller and generating a colored display image in response to the first controlled illumination and the second controlled illumination; a first metallic thermal conductor deposited on the first liquid crystal illumination controller and removing heat from the first liquid crystal illumination controller; and a second metallic thermal conductor deposited on the second liquid crystal illumination controller and removing heat from the second liquid crystal illumination controller.

An object of this invention is to provide an improved illumination control system.

A further object of this invention is to provide an improved illumination amplifier control system.

A further object of this invention is to provide an improved illumination amplifier having heat removal for cooling.

A further object of this invention is to provide an improved illumination control system having conductive cooling.

A further object of this invention is to provide an improved illumination amplifier display system.

A further object of this invention is to provide an improved color illumination amplifier control system.

A further object of this invention is to provide an improved high intensity illumination control system.

A further object of this invention is to provide an improved illumination amplifier intensity control system.

A further object of this invention is to provide an improved illumination duty cycle control system.

The foregoing and other objects, features, and advantages of this invention will become apparent from the following detailed description of preferred embodiments of this invention, as illustrated in the accompanying drawings.

BRIEF DESCRIPTION OF THE DRAWINGS

A better understanding of the invention may be had from a consideration of the following detailed description taken in conjunction with the following drawings, in which.

FIG. 3 illustrates illumination arrangements in schematic and block diagram form comprising FIG. 3A showing a generalized control network, FIG. 3B showing operation of a single illumination amplifier, FIG. 3C showing an exclusive-OR and coincidence logical arrangement, FIG. 3D showing a flip-flop logical arrangement, FIG. 3E showing an analog exponential arrangement, and FIG. 3F showing an analog implicite servo arrangement.

FIG. 13 is a schematic and block diagram illustrating an interspersed array of electro-optical elements for illumination control.

FIG. 16 is a structural arrangement illustrating alternate embodiments of a projection illumination amplifier arrangement, heat transfer arrangement, and large panel arrangement comprising FIG. 16A showing a general heat transfer arrangement, FIG. 16B showing a picture frame heat transfer arrangement, FIG. 16C showing an edge heat transfer arrangement, FIG. 16D showing a reflective mode back-mounted heat transfer arrangement, FIG. 16E showing heat transfer devices, FIG. 16F showing a projection display system employing various heat transfer arrangements, and FIG. 16G showing various heat transfer and large panel construction features in accordance with the present invention.

FIG. 17 is a block and schematic diagram arrangement showing pulse modulated and display arrangements comprising FIG. 17A showing a pulse modulation circuit, FIG. 17B showing a pulse modulation program flow diagram, FIGS. 17C and 17D showing a liquid crystal display arrangement, and FIG. 17E showing a liquid crystal toy.

Figure 1:
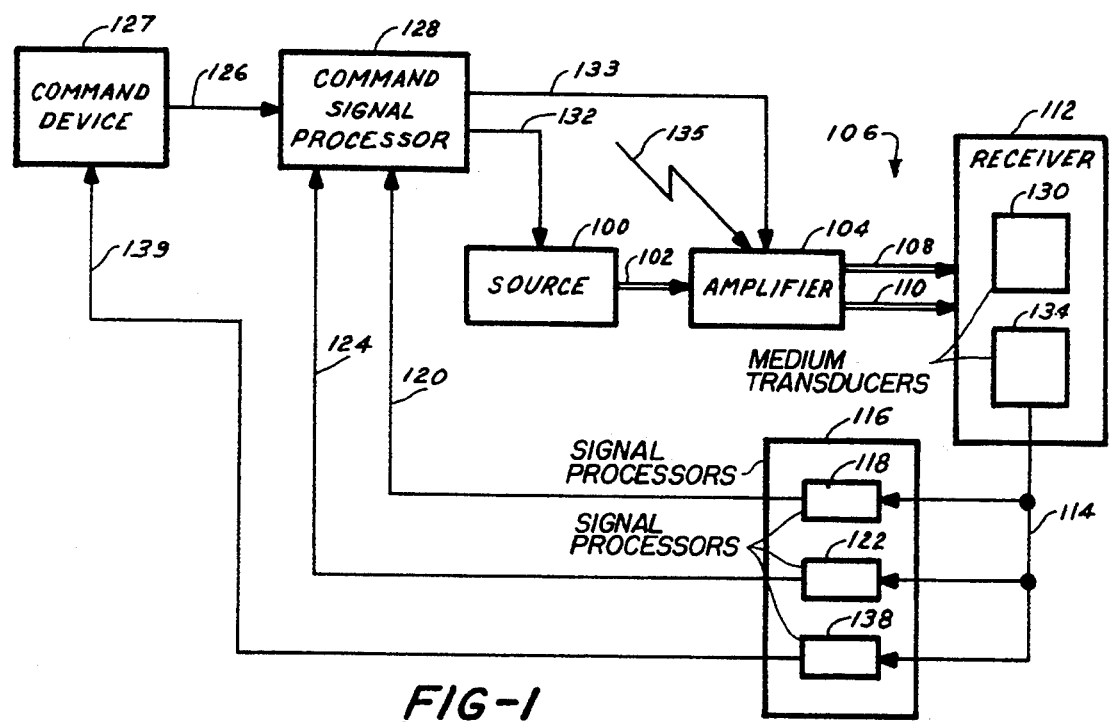
FIG. 1 is a block diagram of an illumination control arrangement in accordance with the present invention.

By way of introduction of the illustrated embodiment, the components shown in FIGS. 1 through 17 of the drawings have been assigned general reference numerals and a brief description of such components is given in the following description. The components in FIGS. 1-16 have in general been assigned three or four digit reference numerals wherein the hundreds digit of the reference numerals corresponds to the figure number. For example, the components in FIG. 1 have reference numerals between 100 and 199 and the components in FIG. 2 have reference numerals between 200 and 299 except that the same component appearing in successive drawing figures has maintained the first reference numeral. The components in FIG. 17 has not been numbered as discussed above, but has been assigned 900 series reference numerals to be consistent with the corresponding figure in the referenced copending applications.

DETAILED DESCRIPTION OF THE INVENTION

The illumination control system of this invention can take any of a number of possible forms. Preferred embodiments of several features of the present invention are shown in the accompanying figures and will be described in detail hereafter.

The system of this invention is exemplified by the simplified block diagram shown in FIG. 1. An illumination source 100 generates illumination 102 which is directed to an illumination amplifier 104. The illumination 102 from the source 100 may be defined as source illumination. Source illumination 102 may be raw illumination or may be controlled by source illumination control devices such as will be described hereafter. Illumination amplifier 104 may be a variable illumination transmissivity device such as a well known liquid crystal device. Controlled illumination 106 from illumination amplifier 104 is directed to illumination receiver 112. This controlled illumination 106 may be controlled by reflection, transmission, or by other characteristics of illumination amplifier 104. Also, controlled illumination 106 may comprise a plurality of illumination signals such as one or more reflected components and one or more transmitted components, where one of these illumination components 108 may perform a first illumination task such as exposing an illumination sensitive medium which may be receiver 130 and another of these illumination components 110 may perform a second illumination task such as illuminating an illumination sensitive feedback transducer which may be receiver 134. The illumination sensitive medium provides an illumination reaction in response to the illumination such as a chemical reaction in a photographic film medium or a thermal reaction in an illumination absorbing medium, wherein exposure of such mediums are discussed in detail hereinafter. One arrangement comprising control of a plurality of illumination signals will be discussed hereafter with reference to FIGS. 3, 4, and 5.

Illumination receiver 112 may include an arrangement for illuminating an illumination sensitive medium 130 such as a film and may include a feedback transducer 134 for providing feedback signal 114 for control of illumination.

Illumination feedback signals 114 may be used to control illumination amplifiers 104, may be used to control illumination sources 100 and may be used as feedback to command devices 127. Feedback signal processor 116 provides signal processing for feedback signals 114 and may include illumination amplifier feedback signal processor 118 for generating an illumination amplifier feedback signal 120 for control of illumination 106 by amplifiers 104 with processed command signals 133: may further include illumination source feedback signal processor 122 for generating illumination source feedback signals 124 for control of illumination 102 by source 100 with processed command signals 132; and may still further include illumination command device feedback signal processor 138 for generating illumination command device feedback signals 139 for control of command signals 126 by command devices 127.

Illumination command signal 126 may be open loop or closed loop input commands from command devices 127. Such a command device may be a manual device for operator control such as a switch arrangement or may be an automatic device such as a digital computer, an analog computer, or other such well known command arrangements. Command signal processor 128 may generate illumination source command signals 132 to command source 100 to generate source illumination 102; or may generate illumination amplifier command signals 133 to command amplifier 104 to control illumination 106; or both.

Illumination Amplifier Devices

An amplifier may be described as a device that permits a relatively large amount of energy to be controlled with a relatively small amount of control energy. An illumination amplifier is herein intended to mean, a device that controls illumination with a control signal which may be a low energy electrical control signal in a preferred embodiment. Prior art illumination controls require high energy control signals to excite illumination sources such as incandescent lamps or to drive mechanical devices such as shutters. In a preferred embodiment, the system of this invention requires a low level electrical signal to excite an illumination amplifier such as a liquid crystal device for control of illumination.

Illumination amplifier arrangements are herein discussed relative to electrical excitation signals controlling the reflectivity-transmissivity characteristics of illumination amplifiers for control of illumination signals. Illumination amplifiers may also be controlled with other signals 135 such as temperature conditions for controlling the reflectivity-transmissivity characteristic of a temperature sensitive cholesteric liquid crystal device. Similarly, various control signals such as electrical and temperature signals 133 and 135 may be used to control other parameters of illumination such as combinations of reflectivity, transmissivity, absorption, refraction, and filtering of illumination.

It should be understood that an actual illumination device such as an illumination amplifier may not be a perfect reflector or transmitter of illumination and may absorb, transmit, and reflect a certain amount of illumination even when controlled to be fully transmissive or fully reflective. For simplicity in describing this invention, a perfect illumination amplifier will be assumed without absorbtion and with the ability to completely control reflectivity and transmissivity.

For simplicity of presentation, illumination amplifiers may be shown without electrodes, excitation and control arrangements. The electrical excitation can be provided with well known arrangements and may not be discussed in detail herein. Illumination amplifiers discussed and illustrated herein are intended to include suitable electrode and excitation arrangements even though these electrode and excitation arrangements may not be specifically illustrated.

This invention relates to illumination amplifiers which may include electro-optical and electro-chemical devices exemplified with liquid crystal devices for controlling illumination with electrical signals. In order to exemplify the teachings of this invention, arrangements may be described using illumination amplifiers such as the well known liquid crystal panels.

Liquid crystal devices may be used to exemplify features of this invention. Liquid crystal devices are well known in the art and are in use for numeric display devices. Typical devices are sold by Industrial Electronic Engineers, Inc. of Van Nuys, Calif. such as series 1500-01; by American Micro-Systems, Inc. of Santa Clara, Calif. such as model no. 21450; by RCA of Somerville, N.J. and by other well known sources. Such liquid crystal devices are typically composed of only microns thick liquid crystal material contained between glass substrates or plates with transparent electrodes etched on a glass substrate. When the electrodes are excited, the liquid crystal material changes the transmissivity and reflectivity characteristics. Liquid crystal material may be of the nematic, smectic, cholesteric, and other well known types. Excitation is typically alternating current of 60 Hz frequency, 20 volts and with only micro-amperes of current. Liquid crystal displays are further discussed in the March 1972 issue of Computer Design Magazine on pages 77 and 78 entitled A Comparison and Review of Digital Readouts by Sidney Davis and in the November 1971 issue of the Proceedings of the IEEE entitled Liquid Crystal Matrix Displays by Lehner et al wherein these articles are incorporated herein by reference. Because liquid crystals and the associated arrangements such as alternating current excitation devices are well known in the display technology, a liquid crystal display device and the associated excitation may be shown in block diagram or schematic form without specifically showing these well known excitation arrangements. Similarly, because the selective control of areas of liquid crystal devices such as the control of display segments by etched electrodes are well known in the art, controlled areas of variable transmissivity and reflectivity characteristics need be shown only in the form and shape of the desired controlled area without showing the construction, selective etching, and excitation which are well known in the art.

Figure 7A:
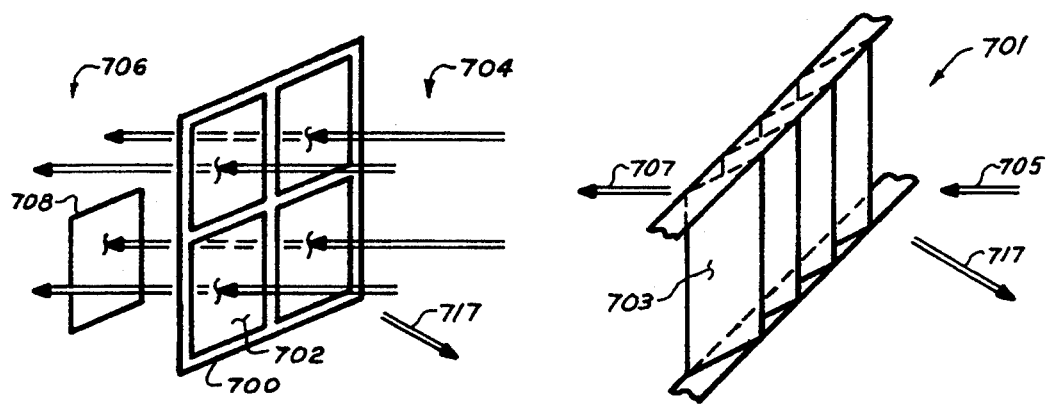
FIG. 7 is a schematic and block diagram illustrating illumination control arrangements for buildings and for vehicles comprising FIG. 7A showing a first window and a louver illumination control arrangement, FIG. 7B showing a second window illumination control arrangement, FIG. 7C showing an artificial illumination control arrangement, and FIG. 7D showing a temperature control arrangement.

For simplicity of discussion, illumination amplifier arrangements may be discussed with respect to simple area control of illumination. Several embodiments are presented herein using amplifier segments such as concentric rings (FIG. 8C) bands or stripes (FIGS. 7B and 8B) and patterns (FIG. 7C and 8A). It will become obvious that more complex arrangements may be provided such as intricate patterns of controllable amplifiers. Such a pattern may be a dot pattern similar to the well known half tone dot patterns widely used in the printing art. Other patterns will become obvious to those skilled in the art.

Digital Excitation

Digital control of an illumination amplifier is relatively simple when compared to analog control, where a digital control signal may be either on for exciting an illumination amplifier or off for non-exciting an illumination amplifier. An alternating current excitation may be used with a liquid crystal type of illumination amplifier. In such an arrangement, an electronic switch may be used to provide controlled excitation for the amplifier by selectively switching a sinusoidal excitation signal.

Figure 2A:
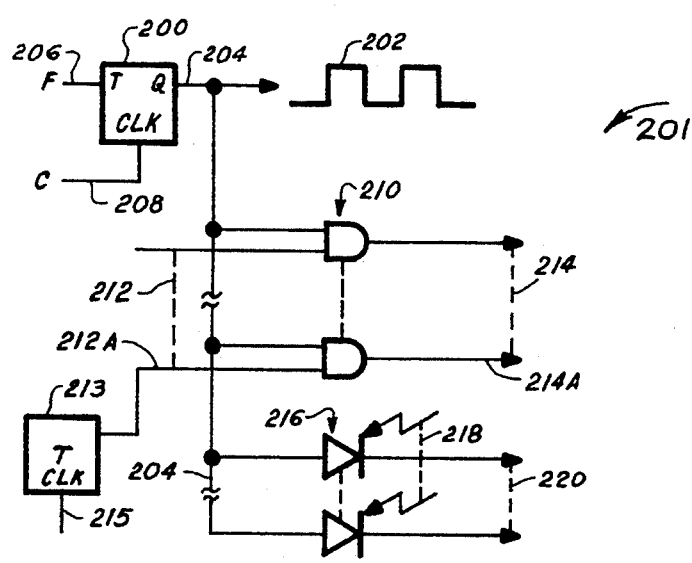
FIG. 2 illustrates various excitation arrangements for illumination amplifiers in schematic and waveform diagrams comprising FIG. 2A showing a digital excitation arrangement, FIG. 2B showing pulse modulation waveforms, FIG. 2C showing an analog excitation arrangement, and FIG. 2D showing pulse width modulation waveforms.

A digital excitation arrangement 201 is shown in FIG. 2A, where a well known flip-flop 200 is arranged to selectively generate a square wave 202 as output signal Q on line 204. When the F input 206 is true, the flip-flop 200 will change state for each clock pulse 208, thereby generating an output signal 204 at a frequency that is half of the frequency of clock signal 208. When the F input 206 is false, flip-flop 200 will maintain its output state and will not be responsive to the clock signal. Therefore, flip-flop 200 will digitally generate an alternating excitation signal 202 at half the frequency of clock signal 208 as controlled by logic signal 206. The digital clock signal C 208 may be the output of count down logic to provide a clock pulse at the desired frequency.

For one digital excitation embodiment, a continuous squarewave 202 is generated to provide an alternating excitation signal such as with input signal 206 to flip-flop 200 maintained true for a continuous squarewave 202 as output signal 204. Output signal 204 may be selectively gated with AND gates 210 controlled with select signals 212 to selectively generate amplifier excitation which may be square wave excitation signals 214 for a plurality of illumination amplifier devices.

It has been found that digital excitation has particular advantages because of (1) the well known low power characteristic of switching devices as compared to linear amplifying devices and (2) the convenience of generating squarewave signals with digital circuits such as flip-flop 200. Also, the low power requirements of many illumination amplifier devices may permit direct excitation with logic signals 204 and 214.

As described herein, illumination sensitive transducers may be used to convert an illumination signal into an electrical signal for control of an illumination amplifier. In such an arrangement, the transducer may be a photosensitive switch such as the well known family of gated rectifiers such as silicon controlled rectifier (SCR) type devices. These gated rectifier devices may be arranged for gating with an illumination signal to generate alternating excitation directly from an illumination signal. Transducers 216 may be such illumination sensitive gated rectifier devices. Devices 216 may be arranged to be responsive to illumination signals 218 to switch an excitation signal such as square wave 204 to output lines 220 to excite various illumination amplifiers. The square wave nature of the excitation signal 204 provides for automatically extinguishing of transducers 216 when illumination gate signal 218 is removed, thereby removing squarewave excitation from amplifier control lines 220. The well known gated rectifier technology will permit other excitation arrangements such as SCR control of sinusoidal signals. Gated rectifier devices are herein intended to include the well known group of gated switches characterized by SCR devices and including triacs and other SCR type devices. Typical devices are the General Electric photo SCR type H10C1, the General Electric photo switch type L1V, and other photo sensitive devices.

Excitation arrangement 201 provides a detailed illustration of a command arrangement that may be part of the illumination control system illustrated in FIG. 1 where excitation arrangement 201 may be included in command signal processor 128; where command signals 126 from command device 127 may include command signal F 206 to flip-flop 200, command signals 212 to gates 210 and command signal 215 to flip-flop 213; and where processed command signals 132 and 133 may include processed command signals 204, 214, and 220. In another embodiment, illumination signals 106 may include illumination signals 218, transducers 134 may include gated rectifiers 216, and transducer signals 114 may include transducer signals 220.

Analog Excitation

Analog control of an illumination amplifier is relatively more complex than the digital control discussed above, where the analog control signal may take any one of a range of values and may be continuously adjustable over that range. Such an analog control arrangement may have particular advantages when compared to a digital control arrangement such as continually variable transmissivity-reflectivity characteristics for analog operations including closed loop illumination servo arrangements.

Analog excitation devices may be implemented as pulse modulated devices or as amplitude devices. Illumination amplifiers may be able to operate on analog amplitude signals permitting a relatively simple excitation arrangement, but many types of illumination amplifiers such as certain liquid crystal devices cannot directly utilize analog amplitude signals and, therefore, must be excited with pulse modulated signals. A pulse modulated signal operates on the principal of constant amplitude and variable duty cycle, including pulse width modulated and pulse rate modulated analog signals.

An arrangement using analog amplitude excitation depands on the ability of an illumination amplifier to control an amplifier characteristic such as the transmissivity-reflectivity characteristic discussed herein as a function of or proportional to the analog amplitude of the excitation signal. Analog amplitude signals are relatively simple to obtain because many devices such as illumination transducers provide output electrical signals proportional to the input illumination signals. Analog command devices that provide analog amplitude outputs such as digital-to-analog converters and potentiometers are well known in the art and will be discussed hereafter in relation to FIGS. 2C and 9B.

An arrangement using pulse modulated analog excitation is more generally applicable than an analog amplitude arrangement because certain types of illumination amplifiers may not be controllable with analog amplitude signals. Also, certain types of illumination amplifiers may be more precise when controlled with pulse modulated (on-off) signals. Pulse modulated signals will now be described with reference to FIG. 2B.

Pulse width modulation control is illustrated with signals 222 and 223! where signal 222 has a low duty cycle with a narrow pulse 226 and signal 223 has a higher duty cycle with a wider pulse 227. As the analog parameter varies from zero to maximum, the pulse width varies from virtually no pulse through a range of widening pulses to the extreme of the signal being in the high state 226, 227 virtually continuously. Therefore the area under the pulses known in the art as the duty cycle varies proportionally with the analog parameter.

Pulse rate modulation control is illustrated with signals 224 and 225; where signal 224 has a low duty cycle with a low pulse rate or a wide spacing 228 between pulses 229 and 230 and where signal 225 has a high duty cycle with a high pulse rate or a narrow spacing 231 between pulses 232 and 221. As the analog parameter varies from zero to maximum, the pulse rate varies from virtually no pulses through a range of greater numbers of pulses over a given period to the extreme of the signal being in the high state virtually continuously. Therefore, the area inside the pulses or the duty cycle varies proportionally with the analog parameter. For pulse rate modulation, pulses 229, 230, 232, and 221 may have a constant pulse width as contrasted to pulse width modulation pulses described above.

For pulse modulation control, a pulse frequency or frequency range may be selected based upon the dynamic requirements of the application. For a visual application, a rate of 30 Hz or greater may be required because the human eye may detect flicker at lower frequencies. For various control applications, pulse rates may be permitted below the rate of a pulse every several seconds or pulse rates may be required exceeding thousands of pulses per second. A particular illumination amplifier may be selected for it's dynamic response characteristics to satisfy the dynamic requirements of the system.

An analog amplitude signal characteristic may be obtained from a pulse modulated signal by integrating pulse modulated signals. This integration may be inherent in the system such as with an illumination amplifier, a transducer, or the human eye. In certain systems it may be necessary to provide filtering or integration such as with reactive electronic components in electronic circuits or other well known electronic and illumination integrating devices.

Pulse modulation devices may be analog amplitude to pulse modulation converters which accept analog amplitude inputs and generate pulse modulated outputs. A preferred embodiment of an analog control may include a pulse width modulation device, although other pulse modulation devices may be used such as the well known reset integration pulse rate modulation device.

Figure 2C:
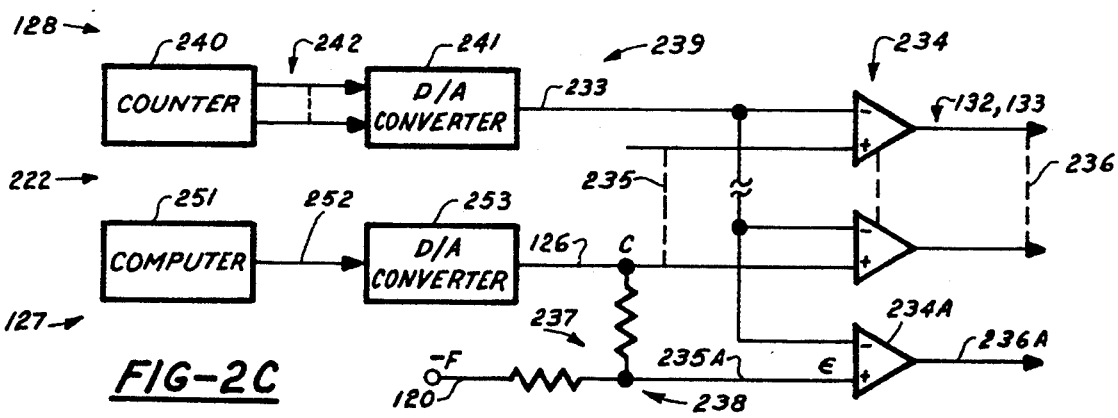
Figure 2B:
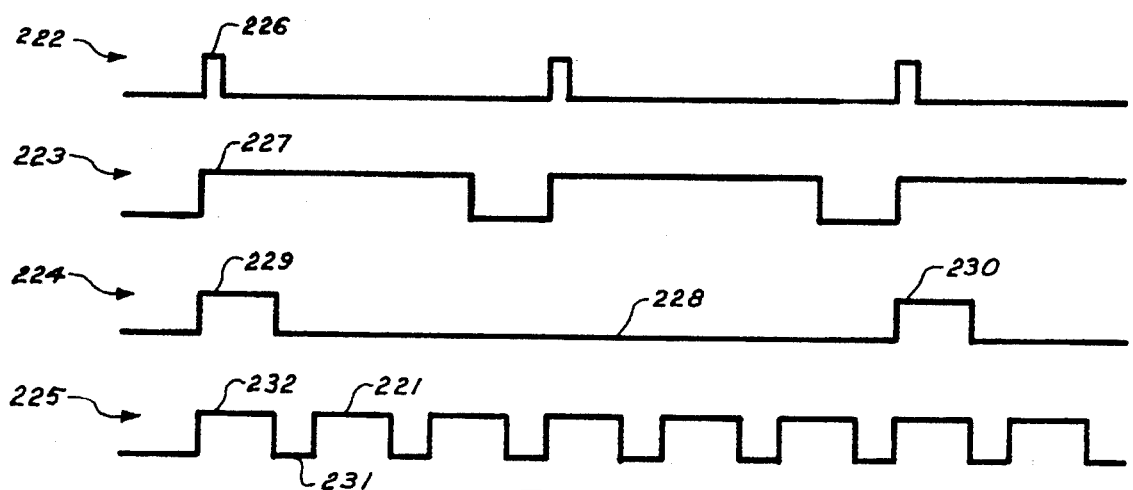
Figure 2D:
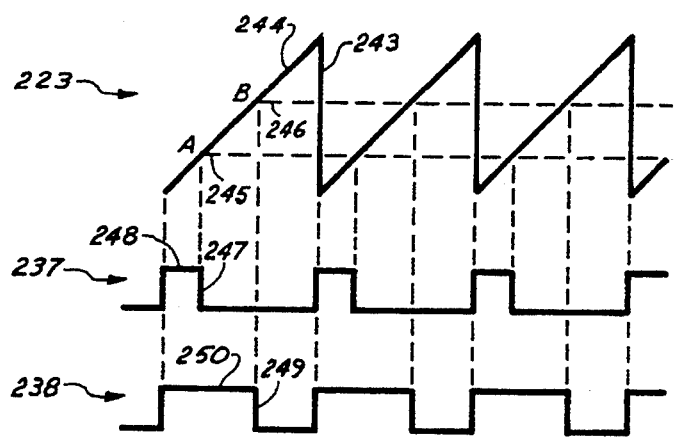

A preferred embodiment of a pulse width modulation arrangement is shown in FIG. 2O and will be described with respect to the waveforms shown in FIG. 2D. Modulator 222 generates a ramp waveform 223 on line 233 which provides a reference input to comparators 234. Each comparator 234 compares a ramp signal 233 with an input analog signal 235 to generate a pulse width modulated output signal 236. Output signals 236 are pulse width modulated signals similar to waveforms 237 and 238; where each output signal 236 such as waveforms 237 and 238 goes true at the start of ramp 223 and remains true as long as the ramp 223 has an amplitude that is less than an input signal 235. When ramp 233 makes a transition to being more positive than an input signal 235, a corresponding output signal 236 goes false providing a pulse that has a width proportional to the amplitude of the input analog signal.

Ramp generator 239 is composed of counter 240 and digital-to-analog converter 241. Counter 240 is a well known digital counter that counts to a maximum value, then overflows to a zero value, then counts back up to the maximum value. Digital output signals 242 of counter 240 excite a well known digital-to-analog (D/A) converter 241 that may include a weighted resistor ladder and analog switches, but may be other well known D/A converter arrangements. Converter 241 provides an analog output 233 proportional to the input count parameter 242. Therefore, output signal 233 is a sawtooth waveform 223 that is reset 243 when counter 240 overflows and that generates a ramp 244 as the count in counter 240 increases.

For illustrative purposes, analog voltage levels A 245 and B 246 are superimposed on ramp 244 of waveform 223. At the beginning of the ramp, the output signals 236 of two of the comparitors 234 are shown as waveforms 237 and 238 related to a pair of input signals 235 having amplitudes A 245 and B 246, respectively. As ramp 244 increases but remains below input signal thresholds 245 and 246, output signals 237 and 238 remain high. As ramp 244 makes a transition through amplitude A 245, the ramp amplitude 244 becomes greater than the input signal amplitude 245 and a comparitor 234 causes the output signal 237 to make a transition 247 to the low state. Therefore, pulse width 248 is proportional to amplitude A 245. Similarly, as the ramp amplitude 244 makes a transition through amplitude B 246, a comparitor 234 causes the output signal 238 to make a transition 249 to the low state. Therefore, pulse width 250 is proportional to amplitude B 246 which is proportionally greater than pulse width 248 by the same amount that amplitude B 246 is greater than amplitude A 245.

A computer or other digital command device can provide a command input to an illumination amplifier such as with amplifier excitation channels 236. In one embodiment, computer 251 generates output commands 252 to at least one D/A converter 253, which provides a command signal 235 to a comparitor 234 for generating a pulse width modulated signal 236 to control an illumination amplifier. Other digital command arrangements for controlling analog illumination devices will become obvious to those skilled in the art.

A servo summing junction may be incorporated into modulator 222 as summing junction 238 comprising well known arrangements such as summing resistors 237. An analog command signal such as command signal C 126 may be summed with a negated feedback signal such as feedback signal-F 120 to generate an error (difference) signal ε 235A as an analog command signal. Pulse width modulator 222 will then generate a pulse width modulated excitation signal 236A with comparitor 234A for controlling an illumination servo amplifier. Summing junction 238 and modulator 222 will be further discussed hereafter in relation to a servo system illustrated in FIG. 5.

Comparitors 234 are well known in the art and may be Fairchild integrated circuit comparitors serial no. 710.

Modulator 222 has been found to have particular advantage for a system requiring a plurality of independent pulse width signal conversions because much of the control devices are common to all conversion channels, such as counter 240 and converter 241 being common to all channels 236.

Excitation arrangement 222 provides a detailed illustration of a command arrangement that may be part of the illumination control system illustrated in FIG. 1 where command device 12,7 may include computer 251 and D/A converter 253; where command signal 126 from command device 127 may include command signals 235; where command signal processor 128 may include counter 240, converter 241, and comparitors 234; and where processed command signals 132 and 133 may include processed command signals 236.

An alternate embodiment of a pulse modulated excitation arrangement is provided in the copending applications referenced above. This alternate embodiment provides pulse modulated waveforms directly as outputs from a digital computer. Other arrangements for generating pulse modulated waveforms will become obvious to those skilled in the art.

Schematic Notation

In order to discuss various inventive features in a simple form, it will be necessary to adapt an illumination schematic notation. Symbolic notations, designations, and signals may be defined in a form similar to that used for electronic schematics.

An illumination notation will now be defined with reference to FIG. 3A.

Electrical signals such as signal 318 are shown having a single line from source to destination and may or may not have an arrowhead at a receiving device such as device 319.

Illumination signals such as signals 301, 302, and 304 are shown having a double line from source to destination with an arrowhead at a receiving device. An illumination notation may be used herein showing an incident or input illumination signal for an illumination amplifier with an arrowhead at the amplifier such as shown for signals 301 and 316 incident on amplifiers 300 and 310 respectively. Other notations may show a transmitted signal with the arrowhead directed away from the amplifier from which it is transmitted colinear with an input signal such as transmitted signal 302 and may further show a reflected signal from an amplifier non-colinear with an input signal and with the arrowhead directed away from the amplifier from which it is reflected such as with reflected signal 304.

Illumination can be directed in the required direction with well known illumination processing devices such as mirrors and prisms. Therefore, illumination may be shown and described herein in schematic form without illustrating the routing devices for simplified discussion. For example, reflected and transmitted illumination signals 302 and 304 shown in FIG. 3 A are directed in approximately the proper directions such as with the angle of incidence 306 equal to the angle of reflection 307, but illumination signals 108 and 110 shown in FIG. 1, which may correspond to illumination signals 302 and 304 of FIG. 3, are not directionally oriented in their schematic form. It will be obvious to those skilled in the art from the schematic representations and descriptions as to the proper directions for illumination and the proper illumination processing arrangements to direct illumination in those directions.

A diagonal block will be used herein to define an illumination amplifier in schematic form such as diagonal lines 300, 310, and 312. A symbolic designation may be assigned to an illumination amplifier such as an A and a B for amplifiers 300 and 312 respectively. An amplifier symbol not only identifies the associated amplifier, but is also intended to define the associated excitation signal and, therefore, the operating condition of the amplifier.

A digital notation will now be defined with reference to amplifier 300 which has an associated logical symbol A. If A is true, then amplifier 300 is defined to be transmissive, with transmitted illumination 302 being maximized and reflected illumination 304 being minimized. Illumination 302 will be defined herein as a true condition associated with amplifier 300 and will be designated A. Similarly, if A is false ($\overline{A}$), then amplifier 300 is defined to be reflective; with reflected illumination 304 being maximized and transmitted illumination 302 being minimized. Therefore, illumination 304 will be defined herein as a false or complement condition associated with amplifier 300 and will be designated $\overline{A}$. If illumination 301 is a logical function defined as $F_1$, it will then be obvious that illumination 302 will be logical function $A \cdot F_1$ and that illumination 304 will be logical function $\overline{A} \cdot F_1$. The dot symbol is defined as a logical AND symbol as is well known in the digital computer art. If illumination 302 is designated $F_2$ and illumination 304 is designated $F_3$, then the logical equations can be described as:

$$F_2 = A \cdot F_1 \qquad \text{equation (1)}$$

$$F_3 = \overline{A} \cdot F_1 \qquad \text{equation (2)}$$

An analog notation will now be defined for amplifier 300. For proportional control of amplifier 300, illumination signals 302 and 304 can be controlled as a function of control signal A. Therefore, terms A, $F_1$, $F_2$, and $F_3$ can be used to designate analog or proportional signals. One important distinction of analog signals compared to digital signals is that analog signals may have continuous magnitudes which relate to mathematical operations. It is herein defined that, as excitation signal A increases in a positive direction, transmissivity increases and reflectivity decreases; thereby increasing transmitted signal $F_2$ 302 and decreasing reflected signal $F_3$ 304 proportionally. Similarly, as excitation signal A decreases in a negative direction, transmissivity decreases and reflectivity increases; thereby decreasing transmitted signal $F_2$ 302 and increasing reflected signal $F_3$ 304 proportionally. Therefore, transmitted signal $F_2$ 302 varies in a directly proportional manner with excitation signal A and reflected signal $F_3$ 304 varies in an inversely proportional manner with excitation signal A. This relationship satisfies the mathematical multiplication and division criterion. Therefore, illumination signal $F_2$ 302 may be the mathematical product of terms A and $F_1$, where $F_2 = A \cdot F_1$, and illumination signal $F_3$ 304 may be the mathematical quotient of terms A and $F_1$, where $F_3 = F_1/A$. Now, the mathematical equations may be described as $$F_2 = F_1 \cdot A \qquad \text{equation (3)}$$

$$F_3 = F_1/A \qquad \text{equation (4)}$$

Reflectors or prisms or both may be provided for changing the direction of an illumination signal such as with amplifier 310 operating in a reflective mode. Reflector 310 may be shown without a transmitted illumination signal to illustrate that it is merely a reflector. Also, if an amplifier is operating as a reflector, then it is not necessary to assign a designation.

Other illumination processing devices such as mirrors and prisms may also be used to change the direction of illumination signals.

An illumination receiver such as receivers 303 and 305 may be illumination sensitive devices including photoelectric transducers such as photocells, phototransistors, and photoresistors and including photosensitive media such as film, material to be eroded by an electron beam, or other such media.

An illumination signal such as $F_3$ 304 may be converted to electrical form with an illumination transducer. If receiver 305 were a transducer, it may be assigned either a logical or mathematical designation shown as B. Electrical signal B 318 may be used to perform well known electrical operations including electrical control of one or more illumination amplifiers. Electrical signal B is an electrical equivalent of illumination signal $F_3$ 305, where B and $F_3$ may each be used to define the same signal. Illumination amplifier 312 is shown with the notation B which is herein intended to mean that the excitation control signal B, which is generated by receiver 305, will control amplifier 312 as if illumination signal $F_3$ 304, which controls receiver 305, were controlling amplifier 312. Inverting and complementing of electrical signals is well known in the electronic art such as with inverting amplifiers and complementing logical gates. Therefore receiver 305 may provide a $-B$ inverted mathematical signal, or a $\overline{B}$ complemented logical signal in place of the B non-inverted, non-complemented signal.

A signal may be connected by notation rather than by signal lines. Amplifier 312 may be shown as controlled by electrical signal B from receiver 305 without showing the connection from receiver 305 to amplifier 312, but merely by using the same signal designation (B) for receiver output signal 318 and amplifier excitation signal. Similarly, amplifier 312 may be shown as controlling illumination signal $F_2$ 314 (where $F_2$ is the transmitted signal 302 from amplifier 300) without showing the connection from transmitted signal $F_2$ 302 to the input signal $F_2$ 314. It will be obvious to those skilled in the art that illumination signals can be routed in desired directions such as with reflectors typified by reflector 310 to satisfy this routing or connection by notation.

A receiver such as transducer receiver 305 is intended to include or to imply the signal processing devices required for providing the desired signal. These implied signal processing devices may take the form of devices 128, 116, 201, and 222 described previously with reference to FIGS. 1 and 2 herein. Lenses may be required for illumination signal processing and electronic amplifiers may be required for electrical signal processing. Such signal processing devices are well known in the art and may not be discussed herein. It is herein intended that the signal processing devices required to make an illumination signal such as signal 304 compatible with illumination receivers such as transducer 305 be implied by the receiver such as transducer 305 and it is further intended that signal processing devices required to make an electrical signal such as signal B 318 compatible with the controlled device such as amplifier 312 and gate 319 be implied by the receiver, gate, or other controlled device and may not be specifically described therewith. Therefore, signals will be assumed to be compatible for simplicity of description.

Illumination Computer

An illumination computer arrangement has been found to be feasible and to have particular advantages when compared to well known electronic computers. An illumination computer may have a very low power requirement, particularly where there is an available source of raw illumination. For example, a space vehicle may take particular advantage of the low power characteristic. In addition, a space vehicle may have an ample supply of raw illumination such as with sunlight or moonlight. In other embodiments, logical or mathematical functions may have significant advantages when implementable using illumination computational devices for systems that already provide illumination signals-such as with sun and star trackers, automotive headlight dimmers, copy machines such as the well known Zerox copy machines, and other illumination control systems.

Yet another advantage of an illumination computer is the low power consumption, where certain illumination amplifiers such as liquid crystal devices may consume less than a microwatt per computational element.

Illumination amplifier 300 provides a basic illumination control device for processing illumination signals. Illumination processing arrangements will now be briefly described with reference to FIG. 3A to exemplify basic illumination computer operations. Illumination amplifiers may be used for purposes such as for exposure and for feedback operations, where controlled illumination signal 302 may be used to expose an illumination sensitive medium in receiver 303 and controlled illumination signal 304 may be used to illuminate an illumination sensitive transducer such as a photocell for generating signal 318.

In one embodiment, the transmissivity-reflectivity characteristic of amplifier 300 is maintained constant, thereby causing both illumination signals 302 and 304 to vary proportionally with input illumination 302. Therefore, reflected illumination signal 304 will be proportional to input illumination signal 302 and may be used for direct feedback control as described hereafter.

In another embodiment, illumination 301 is maintained constant and the transmissivity-reflectivity characteristic of amplifier panel 300 varied, thereby causing the transmitted illumination signal 302 to vary directly with transmissivity and inversely with reflectivity and causing the reflected illumination signal 304 to vary inversely with transmissivity and directly with reflectivity. Therefore, illumination signal 302 will vary inversely with illumination 304, providing complement or inverse operations.

In still another embodiment, both the transmissivity-reflectivity characteristic of amplifier 300 and the input illumination signal 301 are varied, thereby causing both output illumination signals 302 and 304 to vary proportionally with input illumination signal 301 and causing one output illumination signal to vary directly with amplifier 300 excitation and the other output illumination signal to vary inversely with amplifier 300 excitation. As previously discussed, this arrangement may provide illumination multiplier operations and illumination divider operations. Therefore, control of transmissivity in an analog (proportional) manner will provide mathematical operations and control of transmissivity in a digital (on or off) manner will provide logical operations. Other logical and mathematical operations using illumination amplifier devices will be described hereafter.

The combination of analog illumination computational devices and illumination servo arrangements permit implicit computational serves to be implemented, where an implicit servo incorporates a computational operation in a feedback loop for generating an inverse computational operation as will be discussed hereafter.

The combination of digital illumination logical devices and illumination servo arrangements permit latching operations to be implemented such as with flip-flop devices and other digital memory devices as will be described in detail hereafter.

The preceeding discussion develops the arrangements necessary for mathematical and logical operations, which can be combined to provide digital illumination computer and analog illumination computer computational elements. From these elements, those skilled in the electronic computer art will be able to configure digital and analog illumination computer systems using computer design techniques well known in the electronic computer art.

As will be discussed relative to FIG. 5 hereafter, a single illumination amplifier 512 can be used to control a plurality of illumination signals 520 and 522 as a function of a common signal C. Many forms of illumination such as light are highly directional, where small areas of an illumination amplifier may be committed to individual illumination signals which are to be controlled as a function of the state of the particular illumination amplifier.

Digital Control Arrangements

A digital embodiment of an illumination computer will now be described in detail.

Digital logical elements are well known in the art and are described in the references listed hereafter. Availability of only one or two basic logical elements permits all logical operations to be performed such as described in the reference, Digital Computer Design Fundamentals by Chu in Section 3.9 on pages 112–115 and particularly in Table 3-14. Digital logical operations will now be discussed with reference to FIG. 3.

A logical AND operation can be performed with amplifier 300 as previously described, where illumination input $F_1$ 301 is ANDed with electronic input signal A to form illumination output $F_2 = A \cdot F_1$ 302 and where illumination input $F_1$ 301 is ANDed with electronic complement input signal $\overline{A}$ to form illumination output $F_3 = \overline{A} \cdot F_1$ 304.

A logical OR operation can be performed on a plurality of illumination signals such as signals 308 when the signals to be ORed together are incident on an illumination amplifier such as amplifier 312, where any one of incident signals 308 may provide sufficient illumination energy to define a logical level illumination signal. Signals 308 can be logical signals generated with various logical arrangements and provided properly incident to amplifier 312 with illumination processing devices such as reflectors, prisms, and lenses.

A logical NOT operation can be performed on an electronic signal A with amplifier 300, where signal 302 is equal to A and signal 304 is equal to $\overline{A}$ as previously discussed. This can be shown by setting signal 301 equal to a logical "one" and substituting into equations (1) and (2) where:

$$F_2 = A \cdot F_1 = A \cdot 1 = A$$

$$F_3 = \overline{A \cdot F_1} = \overline{A \cdot 1} = \overline{A}$$

A logical NOT operation can be performed on an illumination signal by converting the illumination signal to an electrical signal such as with transducer 305 converting illumination signal 304 to electronic signal B 318, then performing the logical NOT operation on the electrical signal as described previously for a logical NOT operation performed on a digital electrical signal with a well known logical inverter gate.

A logical switch or multiplexor operation can be performed as shown in FIG. 3B by having a logical signal A 330 and a logical signal B 331 incident on different planes of amplifier 332. When excitation signal C is true, signal B 331 will be transmitted as signal 333, thereby forming the term B·C for signal $F_4$ 333 and signal A 330 will be transmitted as signal $F_5$ 334, thereby forming the term A·C for signal $F_5$ 334. When excitation signal C is false, signal A 330 will be reflected as signal $F_4$ 333, thereby forming the term A·$\overline{C}$ for term $F_4$ 333, and signal B 331 will be reflected as signal $F_5$ 334, thereby forming the term B·$\overline{C}$ for signal $F_5$ 334. Logical equations can be derived by grouping the abovementioned terms as follows:

$$F_4 = B \cdot C + A \cdot \overline{C} \qquad \text{equation (5)}$$

$$F_5 = A \cdot C + B \cdot \overline{C} \qquad \text{equation (6)}$$

A logical exclusive-OR operation and a logical coincidence operation may be performed as shown in FIG. 3C; where excitation signal D to D amplifier 340 is used to form the logical complement signals of D (D and $\overline{D}$) in illumination signal form 342 and 347 and where excitation signal E to E amplifier 348 is used to form the logical exclusive OR and coincidence signals of D and E 349 and 350 respectively in illumination signal form. To form the complement terms of D, a logical "one" or constant illumination 341 is incident on complementing D amplifier 340. If logical term D is true, illumination 341 will be transmitted by D amplifier 340 to E amplifier 348 as signal D 342. If logical term D is false, illumination signal 341 will be reflected by D amplifier 340 to E amplifier 348 as signal $\overline{D}$ 347; where reflectors 344 and 345 process the 5 illumination signals 343 and 346 respectively; providing the $\overline{D}$ signal 347 incident on E amplifier 348 in the proper direction. E amplifier 348 is arranged for operation as previously described for the logical arrangement shown in FIG. 3B, where equations (5) and (6) may now be used to define the logical operations performed by the arrangement shown in FIG. 3C by substituting corresponding terms; D for A, $\overline{D}$ for B and E for C as follows:

$$F_1 = B \cdot C + A \cdot \overline{C} = \overline{D} \cdot E + D \cdot \overline{E} = D \oplus E \qquad \text{equation (7)}$$

$$F_2 = A \cdot C + B \cdot \overline{C} = D \cdot E + \overline{D} \cdot \overline{E} = D \odot E \qquad \text{equation (8)}$$

The form of equation (7) and equation (8) are well known as a logical exclusive −OR operation ⊕ and a logical coincidence operation ⊙.

Logical flip-flop operations can be performed, as illustrated hereafter by operation of an RS flip-flop 352 which will now be described with reference to FIG. 3D. Illumination amplifier 354 is controlled by the $\overline{R}$ reset signal 370 for performing a logical OR operation on a set S signal 373 and on a feedback Q signal 368 as previously described for logical OR operations. For steady state flip-flop operation, a flip-flop may be in either the Q or the $\overline{Q}$ complement states with either the Q signal true and the $\overline{Q}$ signal false for the Q state or the Q signal false and the $\overline{Q}$ signal true for the $\overline{Q}$ state. A Q signal represents a latched set condition and a $\overline{Q}$ signal represents a latched reset condition.

In this flip-flop arrangement, $\overline{R}$ amplifier 354 is excited to be transmissive for all conditions except when reset signal R 378 is true commanding reset of flip-flop 352. It should be noted that the S set signal 373 and the R reset signal 378 are usually false except when the flip-flop 352 is to be set with S signal 373 or reset with R signal 378. In compliance with the notation previously discussed, amplifier 354 should be transmissive when reset signal R 378 is false, thereby requiring a logical inversion operation which is performed with NAND gate 375 to generate a reset signal $\overline{R}$ 370 that is normally true.

Assuming that the flip-flop 352 is initially in the set position, the Q illumination signal 368 is true and the $\overline{R}$ amplifier 354 is transmissive; therefore causing illumination 368 to illuminate transducer 358 to generate a true $Q_3$ output signal 360 for control of $Q_3$ amplifier 362 to be transmissive. Amplifier 362 receives constant input illumination 364, where constant illumination is herein defined as a logical 1 or true state signal. In the set state, $Q_3$ amplifier will be excited by $Q_3$ signal 360 to transmit signal 366, which is processed by reflectors 369–370 to reflect signal 366 as signals 367–368 respectively to $\overline{R}$ amplifier 354. Therefore, with Q signal 368 true and signal $\overline{R}$ 370 true, $\overline{R}$ amplifier 354 transmits $Q_1$ signal 368 as $Q_2$ signal 356 which maintains flip-flop 352 in a latched set condition. Flip-flop 352 will remain latched in this set or Q state until reset by reset signal $\overline{R}$ 370 as will be discussed hereafter.

Flip-flop 352 will be reset by the $\overline{R}$ reset signal 370 going false, generated by the R signal 378 going true, thereby making $\overline{R}$ amplifier 354 reflective. When amplifier 354 becomes reflective, the $Q_2$ signal 356 then becomes false because the $Q_2$ signal 356 is dependent on a transmissive $\overline{R}$ amplifier 354. A false $Q_2$ signal 356 causes transducer 358 to generate a false $Q_3$ signal 360, which causes $Q_3$ amplifier 362 to become reflective, which then causes the $\overline{Q}$ signal 372 to be true and the $Q_4$ feedback signal 366 to be false. As a result, the $Q_5$ and $Q_1$ feedback signals 367 and 368 will be false, thereby unlatching the Q feedback latching signal. Therefore, when the $\overline{R}$ amplifier 354 again becomes transmissive, flip-flop 352 will remain latched in the reset condition because the $Q_1$ feedback latching signal 368 is false caused by a reflective feedback $Q_3$ amplifier 362.

Flip-flop 352 may be set by the S set signal 373 going true when the $\overline{R}$ signal 370 is false, thereby making the $Q_2$ signal 356 true by transmitting the S signal 373 through the transmissive $\overline{R}$ amplifier 354. With the $Q_2$ signal 356 true, Q signals 360, 366, 367, and 368 become true as previously discussed, thereby latching flip-flop 352 in the set condition. The S signal 373 can then go false, but the flip-flop 352 will remain latched in the set state with all Q signals true until receipt of a reset $\overline{R}$ signal 370.

Flip-flop 352 has been described for operation as an asynchronous latch. Operation as a synchronous flip-flop can be provided with input set and reset signals $F_6$ 376 and R 378 respectively being clocked with signals $C_1$ and $C_2$ respectively to $C_1$ amplifier 374 and to NAND gate 375 respectively. As is well known in the logical design art, the $\overline{R}$ signal 370 can only go false for resetting flip-flop 352 when the R reset signal 378 and the $C_2$ clock signal become true at the same time as inputs to NAND gate 375. Therefore, flip-flop 352 can only be reset at a $C_2$ clock time. Similarly, the S set signal 373 can go true to set flip-flop 352 only when the $C_1$ amplifier 374 is transmissive for transmitting the $F_6$ signal 376 as the S signal 373, which occurs only when the $C_1$ clock signal is true.

Therefore, flip-flop 352 can operate as either an asynchronous latch or, with clock signals $C_1$ and $C_2$, can operate as a synchronous flip-flop.

Other logical operations may be implemented and other implementations of the above described logic operations may be provided using the above described features of the present invention.

Certain logical operations may be performed more conveniently than other logical operations. As is well known in the art, logical equations can be written in many forms and, therefore can be written in a form that optimizes an embodiment such as by reducing the number of less convenient logical operations. For example, it may be desired to minimize complement terms, which can be accomplished by manipulation of logical equations with well known techniques such as De Morgan's theorems.

The preceeding description has illustrated how logical operations may be implemented with illumination devises. Because of the analogy between illumination logic elements and electronic logic elements and because the illumination logic elements satisfy Boolian equations, Boolian arithmetic, and other such well known digital design techniques; now illumination logic elements of the present invention may be used to implement more complex computer arrangements such as those implementable with electronic devices and which are well known in the art.

Other digital logic devices and digital arrangements to form digital computers using illumination control devices will now become obvious to those skilled in the art from the teachings of this invention.

Analog Control Arrangements

An analog embodiment of an illumination computer has been briefly described previously and will now be described in detail. For analog operations, it will be assumed that illumination amplifiers are controlled to be variable transmitters or variable reflectors in contrast to the digital illumination amplifier arrangements. Analog control previously described herein may be achieved with analog amplitude excitation, pulse duty cycle excitation, or other analog forms of excitation. The pulse duty cycle arrangement provides a preferred embodiment for use with this analog computer arrangement.

Constants of proportionality defined as k parameters may be used herein to permit equations to be written in simple form without the need to define illumination and electrical units, scale factors, and transfer functions.

Electronic analog computational elements are well known in the computer art and are described in the references listed hereafter. Availability of a set of basic analog illumination computational elements permits more complex illumination computational elements to be built up. For example, multiplication elements may be used to form an exponential computational element and exponential elements in an implicit servo arrangement may be used to form a root computational element as will be discussed in detail hereafter.

Analog computational operations will now be described with reference to FIG. 3.

Analog multiplication operations may be performed with illumination amplifier 300 as discussed previously. For amplifier A 300, transmissivity may be directly proportional to the magnitude of electrical control signal A; where transmitted signal $F_2$ 302 will be directly proportional to the incident signal $F_1$ 301 and further directly proportional to the transmissivity which is directly proportional to control signal A. Therefore, the $F_2$ signal 302 is directly proportional to both $F_1$ and A signals and, in equation form, may be written as:

$$F_2 = k \cdot F_1 \cdot A \qquad \text{equation (9)}$$

This equation defines a mathematical multiplication operation.

Analog division operations may also be performed with illumination amplifier 300. For amplifier A 300, reflectivity is inversely proportional to the electrical control signal A and, therefore, the reflected signal $F_3$ 304 is directly proportional to the incident signal $F_1$ 301 and is inversely proportional to the reflectivity and, therefore, is inversely proportional to control signal A. Therefore, the $F_3$ signal 304 is directly proportional to the $F_1$ signal 301 and inversely proportional to excitation signal A and, in equation form, may be written as:

$$F_3 = \frac{k \cdot F_1}{A} \qquad \text{equation (10)}$$

This equation defines a mathematical division operation.

An analog addition operation may be performed on a plurality of illumination signals such as signals 308 when the signals 308 are incident on an illumination amplifier such as amplifier 312; thereby providing output illumination 316 and 320 proportional to the sum of the input illumination signals 308. The analog addition operation is similar to the logical OR operation discussed previously relative to the combination of a plurality of illumination signals.

Combined addition and multiplication or addition and division operations may be provided with the arrangement illustrated in FIG. 3A. As previously discussed, signals 308 are added with amplifier B 312 to provide a sum input signal $\Sigma$. As excitation signal B is varied, then the sum input signal $\Sigma$ is multiplied by excitation signal B to provide a product output signal $F_5$ 320, which may be defined in equation form as:

$$F_5 = k \cdot \Sigma \cdot B \qquad \text{equation (11)}$$

Also, as excitation signal B is varied, then the sum input signal $\Sigma$ is divided by excitation signal B to provide a quotient output signal $F_1$ 316, which may be defined in equation form as:

$$F_1 = \frac{k \cdot \Sigma}{B} \qquad \text{equation (12)}$$

Further considering input signal $F_2$ 314, as excitation signal B is varied the $F_2$ input signal 314 will be multiplied by the B term as a component of the $F_1$ term and will be divided by the B term as a component of the $F_5$ term. These additional component terms will cause equations (11) and (12) to be written as equations (13) and (14) respectively, as will be obvious from the preceeding discussion.

$$F_5 = k_1 \cdot \Sigma \cdot B + \frac{k_2 \cdot F_2}{B} \qquad \text{equation (13)}$$

$$F_1 = \frac{k_1 \cdot \Sigma}{B} + k_2 \cdot F_2 \cdot B \qquad \text{equation (14)}$$

Analog exponential operations may be illustrated with respect to FIG. 3E. Input illumination signal $F_7$ is incident on amplifier 380 and is multiplied by excitation signal D to form output signal $F_8$, where signal $F_8$ is equal to:

$$F_8 = F_7 \cdot D \qquad \text{equation (13)}$$

Signal $F_8$ is incident on amplifier 381 to be multiplied again by parameter D to form signal $F_9$, where signal $F_9$ is equal to:

$$F_9 = F_8 \cdot D = (F_7 \cdot D) \cdot D = F_7 \cdot D^2 \qquad \text{equation (14)}$$

Therefore signal $F_9$ is proportional to a second order term. It will now be obvious that higher order exponentials may also be formed by further cascading of product terms.

An analog square root operation may be implemented as an implicit servo as will now be discussed with reference to FIG. 3F. An implicit servo performs an analog operation (square for this example) in the feedback of an amplifier such as amplifier 382 to generate an inverse operation (square root for this example). Input signal 383 is provided to square root circuits 394 which are arranged to generate the square root of an input signal 383 Assuming that signal 383 is $D^2$, it is desired to find the value of D. Input signal 383 is compared with feedback signal 384 in an electronic analog subtractor 382 to provide difference signal D 385. Signal 385 is then squared with amplifiers 387 and 389 as previously discussed with reference to FIG. 3E. Electrical Signal D 385 is multiplied by a constant or unity illumination signal 386 with amplifier 387 to provide illumination signal D 388. Illumination signal D 388 is further multiplied by signal D 385 with amplifier 389 to provide signal $D^2$ 390 which illuminates transducer 391 to generate electrical feedback signal 384. Therefore, signal D 385 must be the square root of signal $D^2$ 384 because of squaring computation performed with amplifiers 387 and 389 and, when feedback signal 384 is servoed to be equal to input signal 383, signal D 385 must also be the square root of signal $D^2$ 383.

Square root device 394 is an implicit servo loop, with device 382 being a summing junction. Therefore, implicit servo 394 will adjust signal D 385 until signal $D^2$ 384 is equal to the input signal 383. Because signal 385 is the square root (D) of feedback signal $D^2$ 384 and because signals 383 and 384 are substantially equal because of closed loop servo operation, signal 385 is also the square root (D) of input signal 383. Square root computational solution is available as an electrical signal 385 and as an illumination signal 388. This square root arrangement is exemplary of an implicit servo, which may be used to perform other inverse operations by placing the other analog computational arrangements in the feedback path of the servo.

Other analog computational devices and arrangements to form analog computers will now become obvious to those skilled in the art from the teachings of this invention.

It will be obvious that the arrangements shown in FIG. 3 illustrate specific embodiments of the system illustrated in FIG. 1 where illumination amplifier devices 104 may include amplifiers 300, 312, 332 and 340; where transducer devices 134 may include transducers 305, 358, and 391; where controlled illumination signals 106 may include controlled illumination signals 302, 304, 333, 334, 356, and 390; where command signals 133 may include signals 378 and 383; and where other devices and signals of FIG. 1 may provide a generalized system incorporating the arrangements illustrated in FIG. 3.

Batch Fabricated Arrangement

In accordance with another feature of this invention, a batch fabricated illumination control device will be described for use as an illumination computer. It will become obvious to those skilled in the art that this batch fabricated computer device is merely exemplary of features of this invention which may be applied to general illumination system arrangements.

Batch fabricated electronic devices such as integrated circuits are well known in the art. It has been found that significant advantages can be provided with batch fabricated illumination processing devices such as illumination amplifiers, reflectors, and transducers; where these advantages may be similar to the well known advantages of batch fabricated electronic circuits. In a preferred embodiment, batch fabricated illumination processing devices may be used in conjunction with batch fabricated electronic devices to provide substantially a batch fabricated system. Batch fabrication is herein intended to mean an arrangement that is fabricated as a composite device and may include monolithic devices and devices where a plurality of individual operations are provided with devices that are fabricated together as an inseparable assembly.

Illumination control arrangements may be comprised of batch fabricated illumination amplifiers 402, 403, 434, 435 and batch fabricated transducers 404 as shown in batch fabricated arrangement 400, which will now be described with reference to FIG. 4.

Illumination processing devices 402, 403, 434, 435 are shown as a plurality of diagonal surfaces such as surfaces 431–433, 455–458, and 440 representing illumination amplifiers. Devices 402, 403, 434, 435 may be constructed of glass that is molded and ground and having liquid crystal material contained on control surfaces such as surfaces 431–433 and 455–458 with etched electrodes and conductors. Other materials and processes will become obvious to those skilled in the art.

Although devices 402, 403, 434, 435 are shown with corresponding surfaces aligned such as corresponding surfaces 431 and 432, different mixes of surfaces of various configurations, orientations, and arrangements may be provided as required for 5 the particular computational operations. Also surfaces may be lined up for corresponding devices to physically mate as shown with devices 402 and 434 at interface 436 or may be lined up in a manner that precludes physical mating as shown with devices 402 and 403.

In one embodiment, batch fabricated device 434 may be arranged to mate with batch fabricated device 402 at interface 436. In such an arrangement, illumination amplifier construction may be provided within interface 436 such as by filling interface voids with liquid crystal material and providing electrodes 15 and conductors on interface surfaces such as with well known etching and deposition or plating processes. Such a batch fabricated arrangement may be used to batch fabricate the camera system discussed with reference to FIGS. 8 and 9 hereinafter such as by filling the interface voids between lens elements with liquid crystal material, etc. as discussed above.

Batch fabricated transducer array 404 may be constructed with well-known processes and may be similar to monolithic arrays of photo-electric devices that are well known in the art such as used in the RL-512 array manufactured by Reticon Corporation in Mountain View, Calif. Individual transducers 426 may be used to control excitation for illumination amplifiers on devices 402 403, 434, 435 with excitation arrangements previously described. Illumination signals 422 are shown incident on individual transducers 426 of transducer array 404. Semiconductor devices nay be provided in a batch fabricated form such as with photo-lithographic processes using masking and deposition techniques that are well known in the art.

Figure 4:
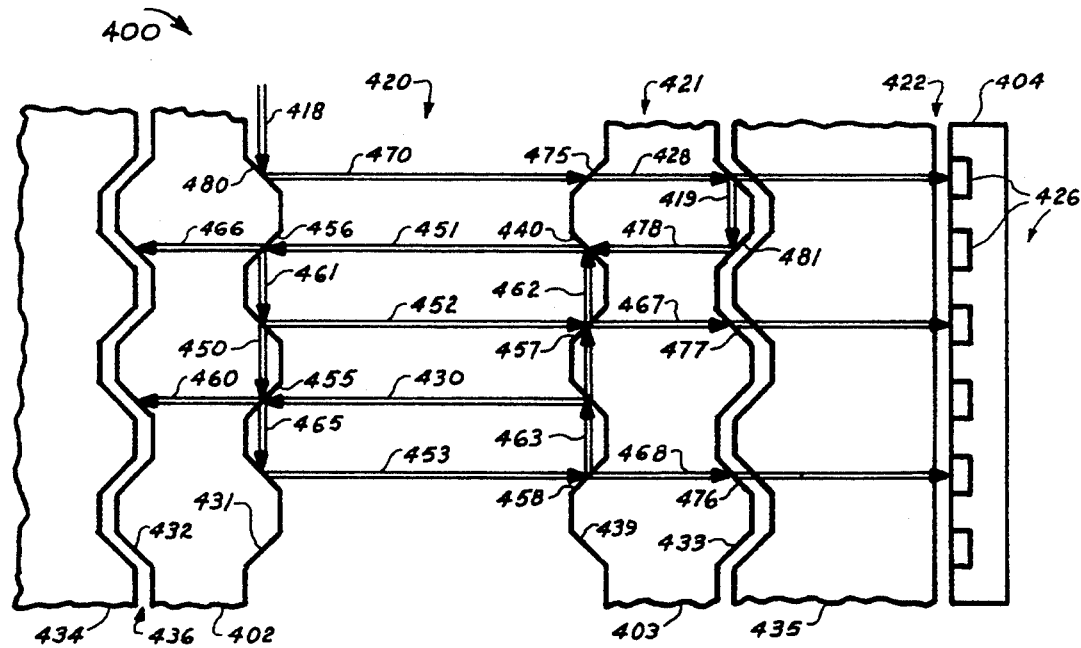
FIG. 4 is a schematic diagram of a batch fabricated illumination control arrangement.

One embodiment illustrated in FIG. 4 is shown as a small portion of a batch fabricated computer arrangement in two dimensional form for simplicity of discussion. It will become obvious to those skilled in the art that the illustrated embodiment is expandable in the illustrated two dimensions and that a third dimension may be included for a three dimension illumination computer arrangement.

Illumination signals 450–453 are incident on amplifiers 455–458 respectively which may have controlled transmissivity-reflectivity characteristics and may generate both reflected illumination 460–463 respectively and transmitted illumination 465–468 respectively under control of electrical excitation. Illumination signals 470, 468 are incident on amplifiers 475, 476 respectively which may be controlled to be only transmissive and illumination signals 418, 419 are incident on amplifiers 480, 481 respectively that may be controlled to be only reflective. Amplifiers controlled to be only transmissive and only reflective may be provided for directing illumination to the desired illumination processing devices and illumination receivers.

Illumination signals may be transmitted in batch fabricated devices 402, 403, 434, 435: which may be constructed of transmitting media such as glass or quartz: as signals 421 and may also be transmitted between batch fabricated devices 402, 403 as signals 420.

It will become obvious to those skilled in the art that digital logic and analog computational operations previously discussed can be performed with batch fabricated arrangements 400 as shown in FIG. 4.

A batch fabricated computer may be constructed in miniature form. The highly directly nature of many forms of illumination such as light and particularly monochromatic coherent light such as generated by a laser permits high intensity thin illumination beams to be processed. The high frequency nature of many forms of illumination such as light permits processing with small dimensional devices without concern with wave effects such as standing waves, gratings, fringe patterns, and other well known effects involving wavelength dimensioned signal processing devices with dimensions approaching the wavelength of the illumination.

The technology for molding, grinding, and other fabrication operations is advanced to the state where devices such as amplifiers 431–433 may have dimensions of small fractions of an inch which may be less than a tenth inch. The technology in transducer arrays such as constructed with monolithic processes permits transducer arrays 404 such as photo-electric transducer arrays to be provided with dimensions of small fractions of an inch which may be less than a tenth inch.

In consideration of the above size discussion, batch fabricated computer devices may be constructable with dimensions of less than a tenth inch on a side. Assuming a three dimensional arrangement having elements of a tenth inch dimensions, an element will occupy a thousandth of a cubic inch. This relates to a density of one thousand elements per cubic inch or more than a million elements per cubic foot.

Power consumption can be calculated based upon the assumption of 0.1 micro-ampere at 15 volts for each tenth inch square liquid crystal element, relating to 1.5 microwatts per liquid crystal element or 1.5 milliwatts per thousand elements in a cubic inch. A power density of 1.5 milliwatts per cubic inch is a very low power density for power dissipation compared to electronic computers. Power consumption of 1.5 microwatts per element is approximately one thousandth of the power consumption of well known electronic integrated circuit logic elements. Power consumption of excitation amplifiers for exciting illumination amplifiers may significantly exceed power consumption of the illumination amplifiers. Therefore, it should be noted that the above power consumption comparison will be slightly degraded for illumination amplifiers when excitation amplifier power consumption is considered.

It will be obvious that the arrangement shown in FIG. 4 illustrates a specific embodiment of the system illustrated in FIG. 1, where illumination amplifier devices 104 may include batch fabricated assemblies 402,403, 434, and 435, where transducer devices 134 may include batch fabricated transducer assembly 404; and where controlled illumination signals 106 may include controlled illumination signals 420–422.

Other batch fabricated arrangements will now become obvious to those skilled in the art from the teachings of this invention.

Closed Loop Control

In accordance with another feature of this invention, a closed loop illumination control system will be described for providing precise illumination control. Advantages of closed loop controls are well known in the art and include reduction of error mechanisms within the loop, compensation for control of dynamic response and other such advantages. Although many of the features of this invention may be described with open loop controls for simplicity herein, it is intended that this closed loop control arrangement be useable with each of those features in the various embodiments described herein.

Figure 5:
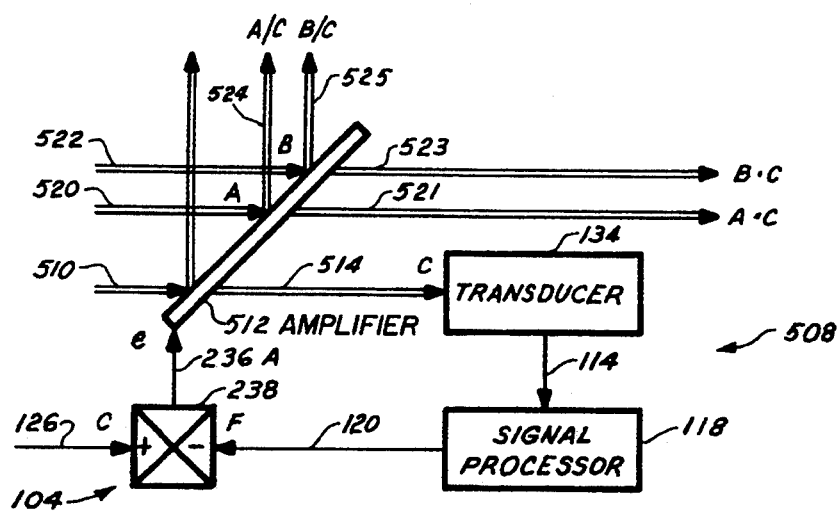
FIG. 5 is a schematic and block diagram illustrating a closed loop control for an illumination amplifier arrangement.

A closed loop illumination control arrangement 508 is illustrated in FIG. 5. Illumination 510 is controlled with amplifier 512 to generate controlled illumination 514, 521, and 523. Transducer 134 generates feedback signal 114 which is processed with signal processor 118 to generate processed feedback signal 120 for control of amplifier 512.

The servo control of FIG. 1 is shown in more detail in FIG. 5, where incident illumination 510 is controlled by amplifier 512 for providing controlled illumination 514 to transducer 134. Transducer 134 generates feedback signal 114 to feedback signal processor 118, which generates feedback control signal 120 to summing Junction 238. Summing junction 238 compares command signal 126 and feedback signal 120 to generate a servo control signal 236A for controlling amplifier 512. Control signal 236A may be related to the difference between the command signal 126 and the feedback signal 120 and, in a preferred embodiment, is a pulse modulated signal generated with an arrangement as previously described in relation to FIG. 2C.

Servo 508 will control illumination 514 to be approximately proportional to command signal 126 relatively independent of non-linearities in the servo components such as the response of amplifier 512, which may have a non-linear transmissivity with respect to excitation magnitude or other non-linear characteristics. Servo control of illumination permits precise illumination signals to be generated with low level electrical signals.

Illumination signals may be precisely directed to particular areas of an illumination amplifier, permitting an illumination amplifier to control a plurality of independent illumination signals such as amplifier 512 controlling signals 510, 520, and 522. An embodiment will be discussed hereafter where a servo control signal 236A may be used to control amplifier 512 for indirect control of other signals 520 and 522.

In one embodiment; if illumination 510 is maintained constant, the transmissivity characteristic of amplifier 512 will be controlled by servo 508 to be proportional to command signal 176, controlling illumination 514 proportional to signal 126. This capability can be utilized to precisely control amplifier transmissivity with a constant control illumination signal 510 for precisely controlling variable illumination signals 520 and 522. Assuming signal 510 is constant, assuming signal A 520 and signal B 522 are variables and assuming command signal 126 is a variable C; then the transmissivity of amplifier 512 will be controlled by servo loop 508 to be proportional to signal C as discussed previously. Also, as previously discussed, amplifier 512 will operate as a multiplier, where transmitted signals 521 and 523, corresponding to input signals A 520 and B 522 respectively, will be proportional to mathematical products A·C and B·C respectively. Also amplifier 512 will operate as a divider where reflected signals 524 and 525, corresponding to signals A 520 and B 522 respectively, will be proportional to the quotients A/C and B/C respectively. Therefore, it can be seen how a servo loop 508 can control an illumination amplifier 512 using an illumination control signal 510 to indirectly control variable illumination signals 520 and 522.

It will be obvious that the servo arrangement in FIG. 5 illustrates a specific embodiment of the system illustrated in FIG. 1 where illumination amplifier devices 104 may include illumination amplifier 512, and where command signal processor 128 may include summing junction 238, and where processed command signal 133 may include signal 236 A.

In one embodiment, summing junction 516 may include a pulse modulation arrangement such as pulse width modulator 222 to generate excitation signal ε 236A in pulse width form. One example of this arrangement is illustrated in simplified schematic form in FIG. 2C, where negated feedback signal-F 120 is summed with command signal C 126 using summing resistors 237 to form an analog amplitude signal 235A. Ramp signal 233 is compared with excitation signal 235A using comparitor 234A to form pulse width modulated excitation signal 236A for exciting illumination amplifier ε 512. Other embodiments will become obvious to those skilled in the art.

Although the servo arrangement shown in FIG. 5 has been discussed for control of illumination amplifier 512 in arrangement 104, it will be obvious to those skilled in the art that such a servo arrangement may be used to control an illumination source 100 with illumination amplifier feedback and command signals 120 and 133 respectively are replaced with illumination source feedback and command signals 124 and 132 respectively and where an electronic amplifier may be used to provide a higher power signal 236A for source excitation. Also, a pulse modulation arrangement such as pulse width modulator 222 may also be used with summing junction 238 for pulse modulation excitation of an illumination source.

Other closed loop excitation arrangements will be described hereafter to exemplify other forms of practicing this inventive feature relating to closed loop excitation arrangements.

A preferred embodiment of a serve control system is described in the copending patent applications referenced above.

In the prior art it is generally considered that liquid crystal devices are digital (on-off) devices and are not controllable in an analog (proportional) manner. This invention provides an arrangement using pulse modulated control signals for controlling digital (on-off) devices with duty cycle proportional control. Further, a servo arrangement is described for providing precise analog control of such liquid crystal devices. It will become obvious to those skilled in the art from the teachings of this invention that other devices may be controlled with pulse modulated signals or with servo arrangements and, in a preferred embodiment, with a combination of pulse modulation and servo arrangements as described in detail herein. This arrangement for controlling substantially uncontrollable devices such as digital devices in an analog manner has very broad applicability such as with control of digital devices, mechanical devices, and other devices that will now become obvious to those skilled in the art.

Flat Plane Configuration

In accordance with another feature of this invention, a flat plane integral arrangement is provided that may include an illumination source, an illumination amplifier, a display overlay for legends, and a switch panel. These devices may be used in various combinations for providing displays, illuminated switches and other such devices.

A flat plane configuration of illumination amplifiers such as the liquid crystal devices permit batch fabricated multi-function devices to be provided. These multi-function devices may take the form of batch fabricated, integrated, or composite devices including an integral illumination amplifier and an illumination source and may further include integral flat plane switches and other devices. It has been found that such a flat plane integral arrangement provides particular advantages such as low cost, high reliability, low volume, flexibility, and other advantages.

Figures 6A, 6B:
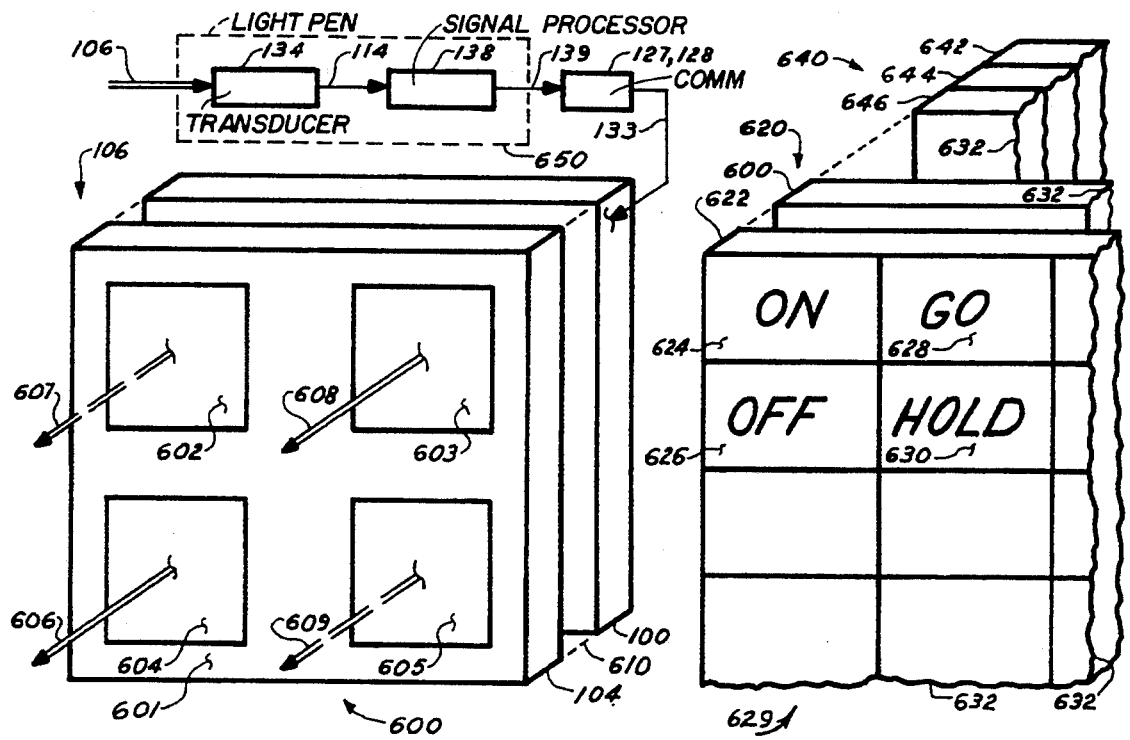
FIG. 6 illustrates display arrangements in schematic, waveform, and block diagram form comprising FIG. 6A showing a batch fabricated display arrangement, FIG. 6B showing a batch fabricated illuminated switch arrangement, FIG. 6C showing an illuminated switch schematic diagram, FIG. 6D showing a control arrangement for colored illumination, and FIG. 6E showing pulse modulation control waveforms.

A self illuminated flat plane device 600 for providing controlled illumination can be configured from a composite of an illumination amplifier 104 and illumination source 100 as shown in FIG. 6A. The illumination amplifier 104 may be a liquid crystal device. The illumination source 100 may be well known devices such as an electro-luminescent panel, an illuminated diffuser panel such as ground glass panels or lucite panels which may be edge lighted or back lighted, or other flat plane illumination sources. The construction and the excitation of such flat plane illumination sources are well known in the art and will not be discussed herein.

As shown in FIGS. 1 and 6, illumination 102 from the illumination source 100 is directed toward the illumination amplifier 104 which controls the source illumination 102 to provide the controlled illumination 106. A plurality of illumination apertures 602–605 are provided for selective control of a plurality of illuminated areas which may be independently illuminated with individual illumination amplifiers 104. An illumination mask 601 may be provided to selectively mask areas to reduce fringe illumination, to provide various aperture configurations, to isolate the areas of controlled illumination and for other such purposes. The mask 601 may be a coating such as provided with painting, printing, and silk screening processes; an overlay such as an opaque plastic device; or other well known illumination masking devices. The mask 601 may be arranged to reduce illumination outside of the areas of controlled illumination, but may not interfere with the areas of controlled illumination 602–605.

Each area 602–605 may be an independently controlled illumination amplifier for generating controlled illumination 606–609. Illumination signals 606 and 608 are shown with solid lines to illustrate high intensity illumination and illumination signals 607 and 609 are shown with broken lines to illustrate low intensity illumination.

Control and excitation devices that may be used with integral source-amplifier device 600 have been previously discussed in detail. Control arrangements may be open loop or closed loop, analog or digital, clack and white or colored, or other arrangements discussed herein.

Interface 610 between source 100 and amplifier 104 of integral device 600 may be a bonded interface such as with chemical, thermal, or other types of bonds. As an alternate, interface 610 may be a physical separation between source 100 and amplifier 104 such as an air gap, with source 100 and amplifier 104 spaced apart. An interface baffle such as the well known "egg-crate" or other illumination masking devices may be used to mask the source illumination 102 in the spaced apart interface 610. Also, brackets, standoffs, and other well known mounting fixtures may be used to mount spaced apart illumination devices 100 and 104.

Discrete Illumination Device

In accordance with still another feature of this invention, a discrete illumination device will now be described in a display configuration with reference to FIG. 6. In a preferred embodiment, discrete illumination device 629 provides an operator display for discrete conditions. It will be obvious to those skilled in the art that this display is merely exemplary of the features of this invention which may be applied to discrete illumination devices in general.

In a preferred embodiment, display 620 is a flat plane display and may be used with integral flat plane source-amplifier combination 600 for generating controlled illumination 106. Individually controlled apertures such as apertures 602–605 are arranged in the approximate configuration of an overlay or mask 622 comprising aperture masks 624–630. An aperture mask may be arranged for selective transmission of controlled illumination 106. Therefore, when an aperture is illuminated with controlled illumination 106, the related aperture mask is illuminated and the selective transmission characteristic of the particular aperture mask will cause the corresponding aperture mask symbol to be illuminated. In a display arrangement; a first aperture 624 may display the word ON, a second aperture 626 may display the word OFF, a third aperture 628 may display the word GO, and a fourth aperture 630 may display the word HOLD. An unlimited number of different types of display symbols may be provided including words, letters, and other symbols. Also, the displays masks 624–630 may be colored such as with transparent paint to provide colored displays.

Mask symbols 624–630 may be printed, painted, or silkscreened on a transparent mask substrate or directly on amplifier panel 600 as mask 601. Otherwise, mask 622 may be a film overlay or may be other well known mask arrangements.

A particular advantage of display 620 over prior art displays is the flexibility of generating new displays. In display 620, the integral source-amplifier device 600 merely generates controlled illumination 106 for aperture masks 624–630, where the particular aperture message is defined by the mask 622. A change in mask 622 will change the message, which may be a simple and inexpensive change.

Broken lines 632 are used to illustrate that display 620 may be expanded for larger display requirements.

A preferred embodiment of a discrete illumination device is arranged as an integral device and may provide an integral source-amplifier-mask combination.

Area illumination is herein defined as controlled illumination 606–609 providing substantially uniform illumination for an area such as apertures 624–630. Selective masking techniques described herein used in conjunction with controlled area illumination provides capabilities and advantages such as low cost, small size, and flexibility over prior art arrangements.

Area illumination from a source 100 may be made uniform with well known diffuser arrangements. In a preferred embodiment, a diffuser may be integrated with an illumination amplifier such as by etching or otherwise processing one of the surfaces of the glass substrates of a liquid crystal type illumination amplifier. A higher degree of integration may be obtained by providing an amplifier substrate as an illumination conductor such as an edge lighted device. In a preferred embodiment, an illumination conductor, diffuser, and substrate may all be provided as a single batch fabricated assembly.

Discrete displays using incandescent bulbs are discussed in the copending application Factored Data Processing System For Dedicated Applications referenced above as configured for a numerical control system. The flat plane display arrangement discussed herein is intended to be useable for such a discrete display application.

Light Pen Arrangement

In accordance with still another feature of this invention, an interactive control arrangement will be described providing interactive operator communication with illumination amplifier coding of illumination for a light pen. It will become obvious to those skilled in the art that this light pen arrangement is merely exemplary of more general features of this invention which may be applied to general illumination control arrangements.

A light pen is a well known input device for digital equipment and is widely used for inputting cathode ray tube (CRT) signals. A light pen consists of a transducer for detecting a coded illumination signal and further consists of signal processing electronics for providing a desired input signal related to the coded illumination signal. A light pen embodiment will now be discussed with reference to FIG. 6A. A plurality of illumination amplifiers 602-605 are provided that generate a code with controlled illumination. Light pen 650, comprising transducer 134 and signal processor 138, is responsive to illumination signals 606-609 for generating output signal 139 related to the illumination code from a selected illumination signal 106. Transducer 134 generates electrical feedback signal 114 in response to incident illumination and signal processor 138 generates electrical output signal 139 in response to input signal 114.

The light pen 650 is used by an operator who positions the light pen 650 for receiving selected illumination 606-609. Because each illumination signal has a unique code, as will be described hereafter output signal 139 provides a coded signal that uniquely defines the operator selected illumination.

Command device 127 and command signal processor 128 generate uniquely coded commands 133 to each illumination amplifiers 602-605; then command and processor devices 127, 128 receive a uniquely coded input signal 139 defining the particular illumination signal selected by an operator.

It has been found that variations in ambient illumination cause unnecessary design constraints for light pen 650 and electronics 127, 128. Ambient illumination may be affected by controlled illumination 106 comprising illumination signals 606-609. Therefore, an improved arrangement will now be discussed for generating light pen signals which will reduce variations in ambient illumination and will provide an improved illumination signal input for a light pen.

Figure 6C:
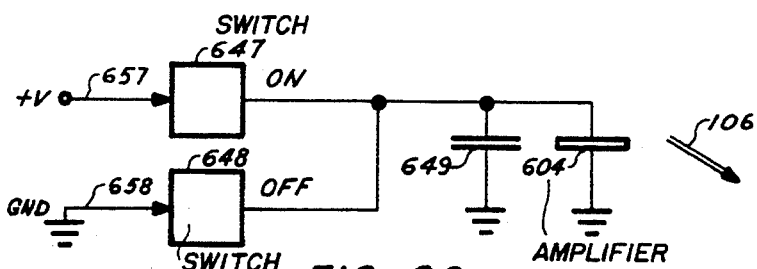
Figure 6D:
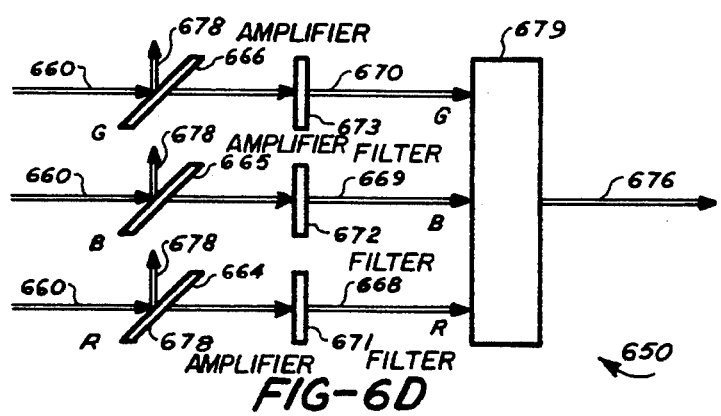
Figure 6E:
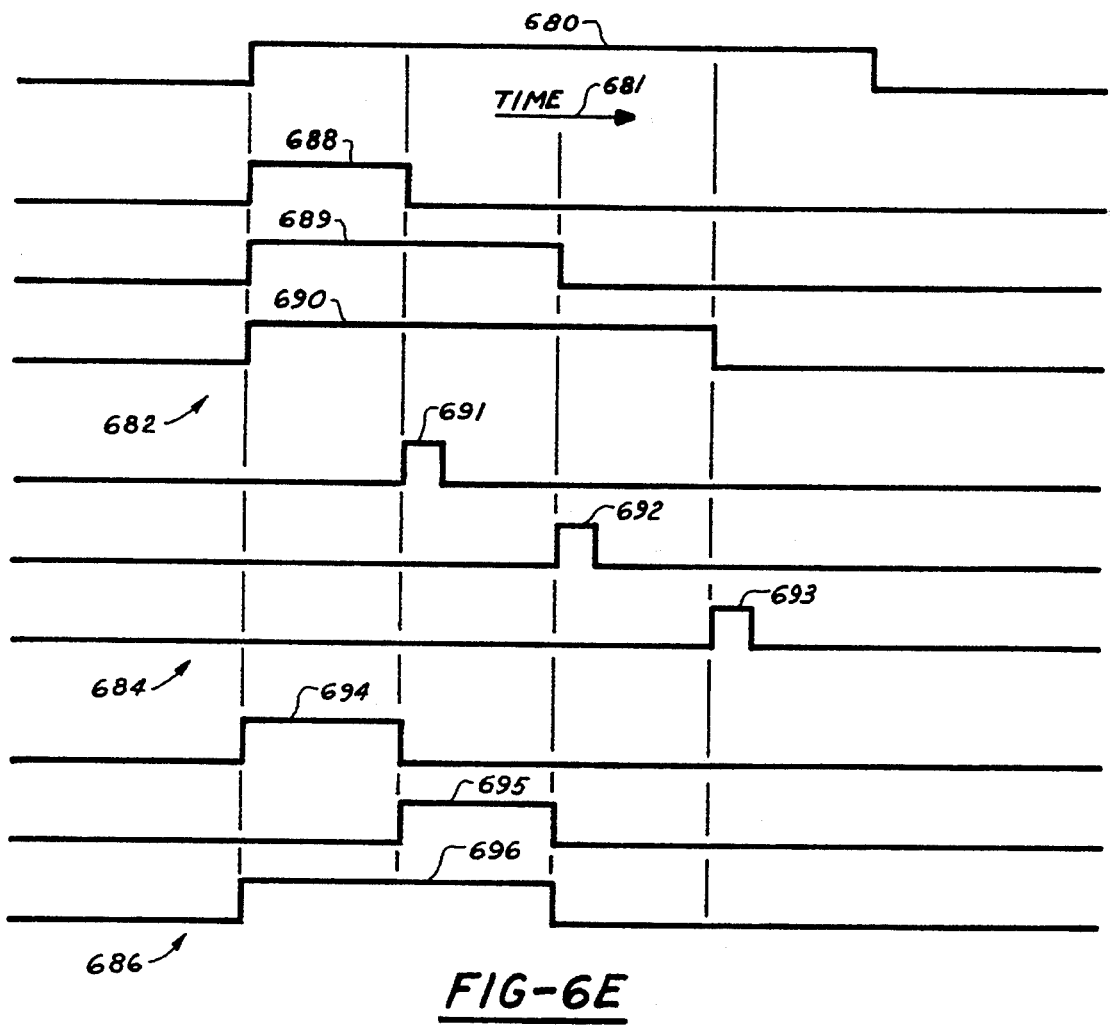

Waveforms shown in FIG. 6E will be used to illustrate light pen operation. Periodically, command electronics 127, 128 generates a blanking pulse 680 to turn off illumination signals 606-609. Superimposed on blanking pulse 680 are coded pulses fop each illumination signal 606-609 such as pulse duration coded signals 682, pulse position coded signals 684, and binary coded signals 686. Time is shown with arrow 681 as increasing to the right.

Pulse duration codes 082 provide code identification by the duration of the feedback signal 139. For example pulses 688-690 are impressed on illumination signals 606-608 respectively with amplifiers 604, 602, and 603 respectively. Sensing of one of the signal 688-690 therefore uniquely defines one of the illumination signals 606-608 respectively as selected by positioning of light pen 650 by an operator.

Pulse position codes 684 provide code identification by the time position of the feedback signal 139. For example, pulses 691-693 are impressed on illumination signals 606-608 respectively with amplifiers 604, 602, and 603 respectively. Sensing of one of the signal 691-693 therefore uniquely defines one,of the illumination signals 606-608 respectively as selected by positioning of light pen 650 by an operator.

Binary pulse codes 686 provide code identification by the binary code of the feedback signal 139. For example, pulses 694-696 are impressed on illumination signals 606-608 respectively with amplifiers 604, 602, and 603 respectively. Sensing of one of the signal 694-696 therefore uniquely defines one of the illumination signals 606-608 respectively as selected by positioning of light pen 650 by an operator. It can be assumed that pulse 694 represents a binary one, pulse 695 represents a binary two, and therefore pulse 696 represents a binary three by bracketing pulses 694 and 695.

Codes 682-686 can be expanded to cover a large number of codes for a large number of illumination signals, as required.

It will be obvious to those skilled in the art that blanking signal 680 controls illumination for improved light pen signal processing. Also, instead of blanking pulse 680 turning-off all illumination signals 606-609, blanking pulse 680 may turn-on all illumination signals, providing an alternate embodiment. This improved light pen arrangement can also be used for CRT displays and other well know display devices.

It will be obvious that the arrangement shown in FIG. 6 illustrates a specific embodiment of the system illustrated in FIG. 1 where illumination amplifier devices 104 may include amplifiers 602-605, and where controlled illumination 106 may include illumination signals 602-605.

Illuminated Switches

An illuminated switch arrangement will now be discussed using the illumination amplifier feature of this invention. In a preferred embodiment, an illuminated switch is provided in a flat plane, batch fabricated configuration, but other arrangements will become obvious to those skilled in the art from the teachings of this invention.

Prior art, illuminated switches use mechanical toggles or latching devices, switch contacts, and switch mounted lamp bulbs that are excited through switch contacts. The discrete devices such as mechanical latches and switches, and the individual lamps increase size, increase expense, and decrease reliability when compared to the batch fabricated illuminated switch arrangement of this invention.

It has been found that an illuminated switch arrangement of this invention provides particular advantages when used in conjunction with a batch fabricated switch arrangement such as the diaphram switch array Part. No. DC-404 built by Datanetics Corporation of Fountain Valley, Calif. or other well-known batch fabricated switch arrangements.

As shown in FIG. 6B, a batch fabricated switch array 640 is mounted in conjunction with integral illumination assembly 620. The switch array 640 may have a printed circuit board substrate 642, a spacer assembly 644 with holes to define switch locations, and a conducting diaphram 646. Other well known arrangements may also be used. When an operator applies pressure to diaphram 646 over a spacer hole location, the conductive diaphram 646 is depressed through the hole in the spacer 644 to make contact with conductors on the substrate 642 to provide a switch contact. With illumination panel 620 having apertures such as apertures 624-630 arranged in relation to switch locations, an operator can depress a region on mask 622 defined by mask symbols to actuate a corresponding switch. The symbols may be located directly over the switch locations or in close proximity with the switch locations. The distance required for the diaphram to move to contact the substrate may be small, possibly only several thousandths of an inch; where illumination panel 620 may have sufficient compliance or flexure to move the required distance. As an alternate, the illumination panel 620 may have cutouts or other special areas to permit switch depression motion.

In one embodiment, memory for a momentary switch such as a batch fabricated switch can be provided with a flip-flop as will now be discussed with reference to FIG. 2A. Flip-flop 213 may be a well known toggle flip-flop that is toggled when a switch is depressed with clock signal 215. Signal 215 may be processed with well known signal processor circuits such as for eliminating switch bounce effects. Flip-flop 213 provides a memory function, where it may be toggled to an alternate state for each switch depression, thereby providing an electronic toggle memory for momentary switch operation. Flip-flop 213 may control an illumination channel 214A with select signal 212A. Therefore, each time a corresponding switch is depressed, signal 215 clocks flip-flop 213 which changes state, thereby changing the state of an illumination amplifier controlled with signal 214A.

In another embodiment, memory for a momentary switch such as a batch fabricated switch can be provided with a DC electrical storage device such as a capacitor as will now be discussed with reference to FIG. 6C. Switches may be arranged as an ON switch 647 and an OFF switch 648. When depressed, ON switch 647 connects capacitor 649 to +V positive excitation 657 for charging capacitor 649 to a positive voltage. When depressed, OFF switch 648 connects capacitor 649 to ground GRN 658 or negative excitation for discharging capacitor 649 to a ground or negative voltage. Capacitor 649 provides excitation to illumination amplifier 604 for generation of illumination 106. In this embodiment, illumination amplifier 604 may be a DC excitable device that provides transmitted illumination 106 for +V excitation and reflects illumination for GRD excitation. Because of the low power drain associated with many types of illumination amplifiers such as for liquid crystal devices, capacitor 649 may be arranged to store enough energy to excite amplifier 604 for long periods of time.

In still another embodiment, the switch element may be a pressure sensitive integrated circuit element which is well known in the art for pressure control systems such as devices manufactured by National Semiconductor Corporation serial no. LX 1600A. This embodiment provides particular advantages where both, the switch element and the memory element, may be produced as a single monolithic device having common integrated circuit processes for manufacturing. Also, an integrated circuit light emitting diodes of well known configurations may also be produced as a part of the monolithic process and may be provided together with the batch fabricated switch and memory monolithic elements for a higher level of integration.

Other illuminated switch embodiments using illumination amplifiers, particularly batch fabricated arrangements, will now become obvious to those skilled in the art from the teachings of this invention.

Color Control

In accordance with another feature of this invention, an electronic control system for color display will be described for providing illumination of a selected color. It will become obvious to those skilled in the art that this color display system is merely exemplary of more general features of this invention which may be applied to general illumination system arrangements. For example, color may be considered to be only one of a plurality of spectral characteristics that may be controlled with this arrangement. Also, light may be considered to be only one of a plurality of illumination signals that may be controlled.

Colored light displays are in wide use such as with traffic lights, where prior art color controls are typically a plurality of illumination sources with colored filters provided either on a bulb or on a lens for generating the desired colors. Color selection is performed by exciting a bulb with a mechanical switch arrangement.

An electronic control for color 650 will now be described with reference to FIG. 6D to exemplify various arrangements for practicing this invention.

Unfiltered illumination 660 is incident on illumination amplifiers 664-666 which are arranged to operate as color filters to transmitted illumination. This capability can be provided with many arrangements that will become obvious to those skilled in the art. One such arrangement is provided by coating the output surface 678 of amplifier 664 with a filter coating so that transmitted illumination 668 passing through the coated output surface is filtered, but reflected illumination 678 that does not pass through the coated output surface is not filtered. Another such arrangement can be provided by placing color filters 671-673 in the path of transmitted illumination 668-670.

Filtered illumination 668-670 is controlled in intensity by amplifiers 664-666, where each amplifier is excited to pass an amount of illumination related to the desired intensity of the particular color. Amplifiers 664-666 are defined for this example to have associated filters of red, blue, and green colors respectively which are controlled by signals R, B, and G respectively. Colored illumination 668-670 may be added or mixed with well known illumination processing devices 679 such as lens arrangements.

In another example, the arrangement shown in FIG. 6D may be used for a well known traffic light; where the illumination signals 668-670 may correspond to red, orange, and green colors respectively, where these colors are in common use for traffic lights. Three independent colored lights may be provided, where each of the three illumination signals 668-670 are provided as separate signals. As an alternate, all three colors can be combined into a single light 676 for transmitting all three colors.

Traffic lights typically provide either of three colored signals. Additional capability can be provided by providing combinations of colored signals simultaneously. For example, a transition from red to green is usually made as red to orange to green. With the embodiment illustrated in FIG. 6C, combinations of colored signals can be provided such as a sequence of red to red-orange to orange to orange-green to green. This sequence of colored signals may be used to alert drivers to the portion of a change sequence in which the system is operating. Three illumination signals can provide seven different codes plus an all zero code for various control arrangements. As an alternate embodiment for a traffic control device, the control capability of amplifiers 664-666, permits color intensity to be changed gradually as an analog control; where, for example, the red signal 668 can decrease in intensity toward zero as the green signal 670 increases in intensity toward full intensity to provide a gradual change from red to green conditions.

In traffic control applications, two perpendicular traffic directions are usually controlled simultaneously with complement signals. Therefore, control of another traffic direction may be provided with reflected illumination 678 from amplifiers 664-666.

Control of Natural Illumination

In accordance with still another feature of the present invention, arrangements for control of natural illumination such as sunlight will now be described. For simplicity, control of natural illumination will be discussed for an inhabitable building and for an automobile using illumination amplifier devices such as shutters, awnings, shades, and windows. It will become obvious to those skilled in the art that the inhabitable building and automobile embodiments are exemplary of the present invention, where the present invention is useable for a wide range of systems including generalized structures such as residences, office buildings, and industrial buildings and further including generalized vehicular systems such as aircraft, trains, and seacraft.

Control of natural illumination will be discussed herein with reference to FIG. 7. For simplicity of discussion, only the structural form of the illumination amplifier is shown in FIG. 7, which is intended to represent the illumination amplifier 104 shown in FIG. 1 with the various excitation, control, feedback and other associated arrangements described herein. These illumination amplifier arrangements may be constructed with an illumination amplifier as an integral part of the structural member, where for example liquid crystal material may be enclosed between panes of glass with etched electrodes, or as independent amplifier assemblies that may be used in conjunction with separate structural devices.

Illumination control may be provided with command signals 126 from command devices 127 and feedback signals 114 from transducers 134. Command device 127 may provide manual control of illumination such as with a potentiometer or switch or may provide automatic control of illumination such as with a computer.

Various embodiments of devices for control of natural illumination will be discussed in detail in the following sections entitled Illumination control for Buildings, Illumination Control for Vehicles, Illumination Shade, and Temperature Control.

Illumination Control For Buildings

Illumination amplifier arrangements may be arranged to control external illumination such as sunlight to control the temperature or illumination or both within a building. For example, electrical control of the transmissivity of illumination amplifier window may provide precise control of illumination over a range of operating conditions such as bright, direct sunlight through hazy, indirect sunlight.

Prior art illumination control arrangements are implemented as mechanical window shades, awnings, shutters and various other forms of opaque illumination baffels. These opaque baffels may be mechanically controllable such as with manually adjustable window shades or may be fixed such as with many forms of shutters.

Buildings and structures are often constructed with large window areas for style and for visibility. Shutter arrangements are often provided to limit direct sunlight. Illumination amplifier devices in accordance with this invention may be used for such window and shutter arrangements to control transmitted illumination, thereby controlling internal light intensity or internal temperature or both. For example, electronic control of window transmissivity provides increased efficiency in illumination and temperature control of a building.

An illumination amplifier arrangement will now be described with reference to FIG. 7 for illumination control for a building. Schematic representations of windows 700 and shutters 701 are shown in FIG. 7A as implemented with illumination amplifier devices. Window panes 702 and shutters 703 may be illumination amplifiers and may be controlled either as a single amplifier or as a plurality of amplifiers. For example, each window pane 702 of window assembly 700 and each panel 703 of shutter assembly 701 may be controllable separately or in various combinations. Also, devices such as windows 700 and shutters 701 may have panels such as window 702 and shutter 703 partitioned into independently controllable areas as will be discussed with reference to window 709 with independently controllable areas 710–712 shown in FIG. 7B. Control of amplifiers 701, 702, and 710–712 may be performed independently or in various combinations and may be performed in digital (on-off) or analog (proportional) form and in open loop or closed loop form as discussed previously herein.

Control of the transmissivity of windows 702 and shutters 703 will control the input illumination 704 and 705 respectively that is permitted to be transmitted as transmitted illumination signals 706 and 707 respectively. Illumination signals that are not transmitted will be assumed to be reflected as signals 717. If transmitted illumination 706, 707 is permitted to be distributed within a building, transmitted signals 706, 707 may increase ambient illumination for lighting purposes. If transmitted illumination signals 706, 707 are permitted to be absorbed within a building such as with an absorbtion device 708, transmitted signals may increase temperature for heating purposes. Illumination absorbtion devices may take many forms such as a black curtain 708, a coating on an inner surface of a window 702, or a tank of water 730 as will be described with reference to FIG. 7D.

Visible light transducers and temperature transducers such as transducer 134 may be used to sense internal environmental conditions for control of illumination amplifiers 702 and 703 to maintain a desired temperature condition, light condition, or both.

Illumination amplifiers can be applied in several forms. In one embodiment, an illumination amplifier is constructed with a relatively thick glass substrate to be used directly as a structural panel such as a window pane. In another embodiment, illumination amplifiers may be bonded to a substrate such as a window panel to provide structural support. In still a third embodiment, illumination amplifier material such as liquid crystal material may be enclosed between glass substrates as with the plastic material within safety glass panels.

Window 709 is composed of a plurality of individually controlled amplifiers 710–712. Although a plurality of amplifiers 710–712 are shown in a horizontal rectangular arrangement, it will be obvious that other arrangements such as verticular rectangular, square, soot, and other such arrangements may be provided. Window 709 may be used as a sun visor for natural illumination, as an illumination dimmer such as for control of sunlight, and for other such purposes. Control of panels 710–712 may be provided with illumination sensing transducers 134 or with open loop commands from command device 127 or with both.

Arrangement 709 may be used as a sun visor where a top amplifier 712 may be controlled for high reflectivity, a middle amplifier 711 may be controlled for medium reflectivity, and a bottom amplifier 710 may be controlled for low reflectivity. Amplifier 711 may be partitioned to provide independent control of area 713 where localized illumination transmitted through amplifier 713 may be greater than peripheral illumination transmitted through other amplifiers 710, 712 and other parts of amplifier 711 as will be discussed hereafter for illumination control of vehicles.

Illumination Control for Vehicles

In accordance with yet another feature of this invention, illumination control for vehicles will now be discussed for an automobile with reference to FIG. 7B.

Prior art automobile arrangements have mechanical sun visors and tinted windows for reducing illumination. Visors may be manually controllable for blocking illumination. Tinted windows have fixed transmissivity characteristics and therefore have limited capability.

Illumination amplifier arrangements provide electrical control of illumination to meet a range of control requirements. Control of the transmissivity of an illumination amplifier window 709 may provide more precise control of illumination over a range of operating conditions including control of sunlight of various intensities and from various directions and also including control of oncomming headlight illumination occurring in a transient form.

Illumination amplifier arrangement 709 may be structured as a windshield or other window area of an automobile and will now be discussed as a windshield to exemplify operation. Operation of arrangement 709 is further discussed in the embodiment of a shade in the section entitled Illumination Shade.

Amplifier 709 is shown composed of individual amplifier areas 710-712, where amplifier 711 is shown to further include individual amplifier area 713. Incident illumination 714 may be reflected as reflected illumination signal 715 or transmitted as transmitted illumination signal 716 or both reflected and transmitted as signals 715 and 716 respectively. Various excitation arrangements such as digital or analog and such as open loop or closed loop have been previously discussed and are useable for this window illumination control embodiment.

All amplifier segments 710-713 of window 709 may be controlled together as a single amplifier arrangement for uniform control of input illumination 714.

If illumination 714 were incident from a higher location such as from the sun, amplifiers 710-712 could be excited for different levels of transmissivity; where amplifier 712 could be excited to be more reflective then amplifiers 710 and 711 for reducing the more direct illumination from the sun. In a digital embodiment, amplifier 712 may be excited to be reflective and amplifiers 710 and 711 may be excited to be transmissive to operate as a sun visor. In an analog embodiment, amplifiers 710-712 may be excited to have varying degrees of reflectivity.

If illumination 714 were from a concentrated source such as headlights of an oncoming vehicle or direct sunlight, reflectivity of selected segments could be controlled to reduce brightness and glare. Further control of such illumination may be provided with amplifier 713 which may be controlled to be transmissive for providing forward visibility, while other segments 710-712 may be controlled to be more reflective for reducing peripheral illumination such as from bright sunlight or from headlights.

As a safety precaution, a window area such as area 713 may be a transparent area without the capability for becoming reflective. Therefore, if an illumination amplifier control were to malfunction causing amplifiers 710-712 to become reflective and obscuring visibility, transparent area 713 would still remain transparent for driver visibility to bring the vehicle to a halt.

In another embodiment, arrangement 709 can be used as an anti-glare device such as for a rear view mirror of an automobile. Detection of bright headlights from behind may be used to selectively control reflectivity and transmissivity of segments 710-713 either manually or automatically.

In still another embodiment arrangement 709 may also be used as a sunvisor for a windshield of an automobile. Detection of glare, sun, headlights or other conditions can be used to selectively control the reflectivity and transmissivity of the segments either manually or automatically.

In yet another embodiment, window 709 may be useable for other windows of a vehicle such as a rear window or a side window. Control of transmissivity will control illumination as described above, such as for reducing illumination from headlights of a vehicle from behind or reducing sunlight.

Amplifier 713 is exemplary of the concept of area control, where one amplifier 713 or a plurality of such amplifier areas may be useable for selective control of illumination from particular directions. Control of such amplifier areas, either manually or automatically will provide improved illumination control capability.

Illumination Shade

Figure 7B:
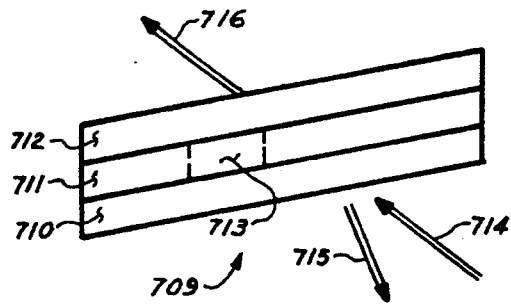
Figure 7C:
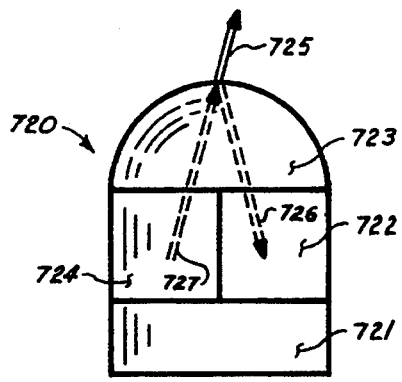
Figure 8A:
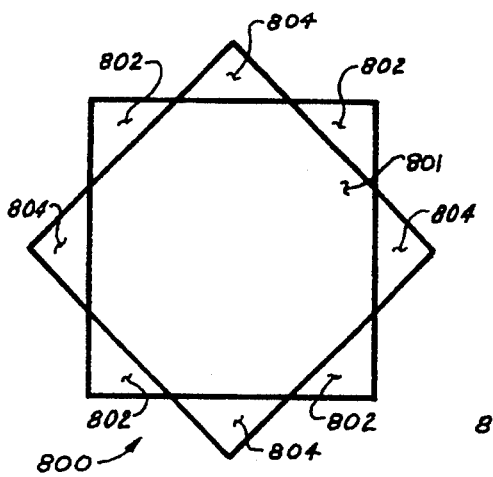
FIG. 8 is a schematic and block diagram illustrating illumination control arrangements for camera systems comprising FIG. 8A showing an image rotation arrangement, FIG. 8B showing a square aperture arrangement, FIG. 8C showing a circular aperture arrangement, and FIG. 8D showing an illumination control arrangement for a camera.

A window shade arrangement may be provided using illumination amplifiers as shown in FIG. 7B. Illumination amplifiers 710-712 may be selectively excited to control input illumination 714 for providing the desired transmitted illumination 716 and associated reflecting illumination 715.

A window shade arrangement 709 may be used for control of sunlight entering a structure such as a home or an office by selectively controlling the reflectivity and transmissivity of the segments 710-712 either manually or automatically. This window shade arrangement can be mounted in a structure such as a window, can be mounted as an awning above a window, can be mounted as louvers outside a window, or other such arrangements.

Operation of an illumination amplifier shade in accordance with this invention will now be described with reference to FIG. 7B. Window 709 is arranged with a plurality of illumination amplifiers 710-712 of control illumination, as previously described in the section entitled Illumination Control for Vehicles. Controlling a too amplifier such as amplifier 712 to be less transmissive than lower amplifiers 710, 711 will reduce illumination from higher elevations such as sunlight incident from a high angle.

Amplifiers 710-712 may be selectively excited for controlling illumination magnitude, illumination direction, or both.

For controlling illumination magnitude, amplifiers 710-712 may be controlled to transmit the desired magnitude of illumination, where amplifiers 710-712 may be all controlled either together or individually with analog or digital control and with open loop or closed loop arrangements to province the desired magnitude of illumination 716.

In one embodiment, digital control may be selectively provided for amplifiers 710-717 to select amplifiers to reflective and amplifiers to be transmissive. In order to control illumination 716 for a desired magnitude such as may be commanded with command signal 126 from command device 127, signal processor 128 may switch a fixed combination of amplifiers 710-712 to reflective states to achieve the desired illumination magnitude. As an example, an operator controlled selector switch with four positions could select four conditions such as:
 (1) All amplifiers transmissive
 (2) Amplifiers 710 and 711 transmissive and amplifier 712 reflective
 (3) Amplifier 710 transmissive and amplifiers 711 and 717 reflective
 (4) All amplifiers reflective.

Other manual and automatic control arrangements may be used to selectively switch amplifiers 710-712 in a digital manner to provide the desired illumination 716.

In another embodiment, analog control may be provided for a plurality of amplifiers 710-712 which may be excited with the same signal to control the transmissivity of those amplifiers together to provide the desired illumination 716. In this arrangement, amplifiers 710-712 may all be controlled from a single command channel 235, such as from computer 251, with a single excitation signal 536 to control the transmissivity of all amplifiers 710-712 in the same manner.

In still another embodiment, analog control can be selectively provided. For reducing illumination 716; a top amplifier 712 may be controlled to become more reflective to limit illumination until top amplifier 712 becomes fully reflective, then the next highest amplifier 711 would be controlled to become more reflective to still further limit illumination until that amplifier 711 becomes fully reflective, then the next amplifiers in sequence would be controlled accordingly. For increasing illumination 716, the amplifiers would be controlled to become less reflective in the reverse order, first the lowest amplifiers. This capability can be provided with automatic arrangements such as by switching between amplifiers 710-712 with threshold detectors, with servo feedback control, or with computer control. Threshold detectors such as comparators 234 may be biased or otherwise controlled to switch excitation to various operational amplifiers as a command signal 235 increases in magnitude. A servo loop with feedback signal 120 to summing junction 738 may also be used to control amplifiers 710-712 sequentially as will be discussed in more detail in conjunction with the aperture arrangement shown in FIGS. 8B and 8C. A computer 251 generating command signals 126 to signal processor 128 may also be used to control amplifiers 710-712 sequentially.

For controlling illumination direction, amplifiers 710-712 may be selectively excited in a preferred sequence for providing directional control. Such directional control may be to reduce direct sunlight from a high angle, where the top-most amplifiers would be preferred for becoming reflective over the lower amplifiers. Other directional control may be to reduce glare from a low angle, where the bottom-most amplifiers would be preferred for becoming reflective over the upper amplifiers.

Combined directional control and magnitude control may be provided such as with selection of a preferred sequence of amplifiers 710-712 for providing illumination magnitude control. Such an arrangement may be understood with reference to the above examples, where a preferred sequence of first top amplifier 712, next middle amplifier 711, then next bottom amplifier 710 is provided for controlling direction and magnitude.

In order to provide a simple example of illumination control, illumination amplifier devices such as amplifier 709 may be shown with large, well defined segments. Other arrangements can be provided within the scope of this invention such as an array of segments where interspersed micro-segments are selectively excited to provide a distributed condition that appears as a partially reflective condition distributed over the controlled area. Another arrangement would provide excitation to amplifiers 710-712 to provide partial reflectivity such as with the analog excitation device described herein.

Figure 8B:
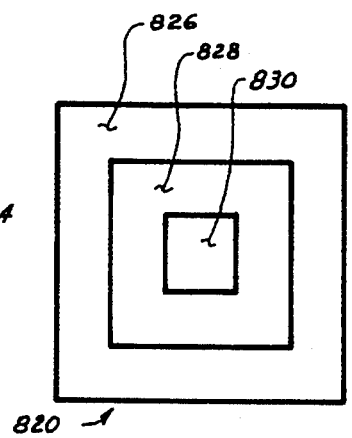
Figure 8C:
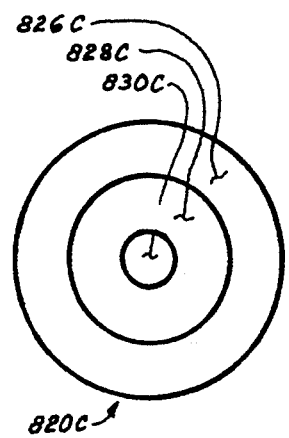

Other arrangements of selective control of amplifiers 710-712 are discussed herein, in conjunction with FIGS. 7B, 8B, and 8C.

Temperature Control

A temperature control arrangement may be provided such as for a building with illumination amplifier devices. One temperature control arrangement has been discussed in the section entitled Illumination Control for Buildings with reference to FIG. 7A. Now, another temperature control arrangement will be discussed with reference to FIG. 7D.

A tank 730 containing water 732 is exposed to sunlight 734. An illumination amplifier 740 is used to control the transmitted illumination 738 and reflected illumination 736. Transmitted illumination 738 will heat the water 732, which may be used to heat a building with well known warm water heater arrangements. Illumination amplifier 740 may be suspended above the tank 730 with supports 742 or may be mounted directly on top of tank 730. Also, other sides of tank 730 may be constructed with illumination amplifiers.

Illumination amplifier 740 may be controlled with arrangements previously discussed with reference to FIG. 1 such as with thermal signals 135 and electrical signals 133. Transducer 134 may sense illumination, temperature, humidity, or other conditions and provide feedback signals 124 to signal processor 128 for control of illumination amplifier 104 comprising amplifier 740.

Figure 7D:
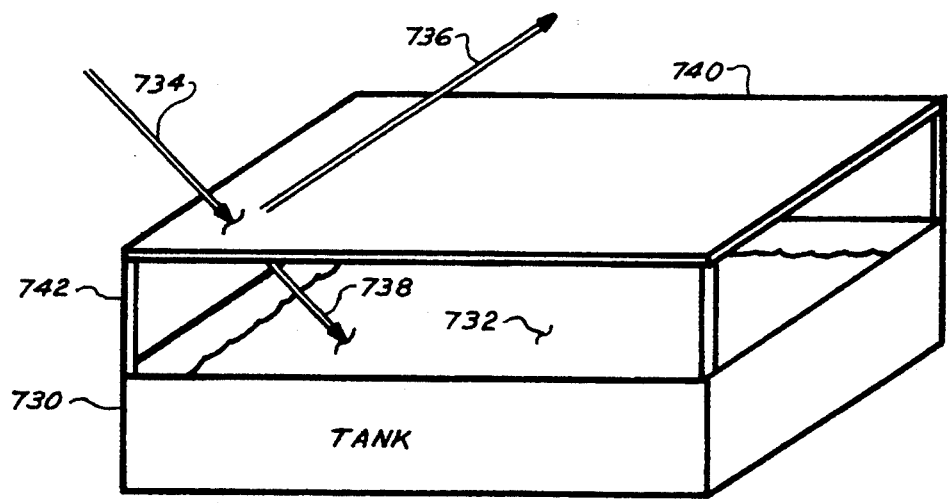

The temperature control system shown in FIG. 7D may also be used for cooling with the evaporation of water 732, for distilling of water such as salt water by collecting evaporated water with well known condensing and collecting devices, and for humidifying by evaporation of illuminated water.

Control of Artificial Illumination

In accordance with yet another feature of the present invention, arrangements for control of artificial illumination such as electric lights will now be described. For simplicity, control of artificial illumination will be discussed for an incandescent light bulb using illumination amplifier devices such as shades and light bulb enclosures. It will become obvious to those skilled in the art that the incandescent light bulb embodiment is exemplary of the present invention, but that the present invention is useable for a wide range of systems including other light sources and other illumination control systems.

Control of artificial illumination will be discussed herein with reference to FIG. 7. For simplicity of discussion, only the structural form of the illumination amplifier is shown in FIG. 7, which is intended to represent the illumination amplifier 104 shown in FIG. 1 with the various excitation, control, feedback and other associated arrangements described therewith. These illumination amplifier arrangements may be constructed with an illumination amplifier as an integral part of the illumination source as discussed with reference to FIG. 6; as an integral part of an enclosure or structural device, where for example liquid crystal material may be part of a glass bulb enclosing an incandescent filament; or as independent amplifier assemblies that may be used in conjunction with separate structural devices such as a lamp shade.

Various embodiments of devices for control of artificial illumination will be discussed in detail in the following sections entitled Lamp Control, Dimmer Control, and Flasher Control.

Lamp Control

Electric lights are in wide use in virtually every inhabitable building and vehicle. Illumination control is universally implemented with manually operated switches which control source excitation. In some applications, multiple elements in a source are switched for different illumination signal levels such as in a multiple filament bulb. Fixed lamp shades may also be used for controlling illumination direction.

An illumination amplifier arrangement for illumination control such as for electric lights will now be discussed with reference to FIGS. 1 and 7. Command device 127 generates command signals 126 as an input to signal processor 128 for control of illumination amplifiers 104. Command device 127 may be an operator control, an automatic control or other device. Illumination source 100 may be excited to provide substantially constant illumination and illumination amplifier 104 may be controlled such as with a pulse width modulator arrangement 222 previously described in reference to FIG. 2C. Illumination amplifier 104 may be configured as part of an enclosure for a source such as a glass bulb or may be a separate amplifier device set apart from source 104 between source 104 and receiver 112. One configuration of an illumination amplifier is shown in FIG. 7C shaped approximately as a light bulb for enclosing a light bulb as a source. Other configurations will become obvious to those skilled in the art from the teachings of this invention.

Illumination amplifiers 720 may be controlled by a digital (on-off) control or by an analog (proportional) control for dimming capability. Amplifier 720 may be composed of a plurality of independent amplifiers shown schematically as amplifiers 721-724 for directional control and for dimming control. Directional Control may be provided by a desired placement of individual amplifiers, where amplifier 721 may control the downward illumination direction, amplifier 722 may control horizontal illumination to the right, amplifier 724 may control horizontal illumination to the left, and amplifier may control upward illumination. Control of amplifiers 721-724 for arrangement 720 may be provided as discussed herein with reference to FIG. 7B with window 709 having amplifiers 710-713. For example, amplifiers 721-724 may be controlled in analog or digital form, in preferred sequences, and in combinations to provide either a desired illumination magnitude, or a desired illumination direction, or both a desired illumination magnitude and direction.

Illumination 727 from a source 100 located within arrangement 720 may be controlled by amplifiers 721-724 to be reflected internally as signal 726 and transmitted as signal 725. Reflection of illumination internally may provide illumination concentration capability for arrangement 720, where reflected illumination 726 may be concentrated through internal reflections and transmitted as illumination 725. Therefore, illumination may be conserved and may provide substantially constant illumination energy either in high intensity directed illumination or in lower intensity distributed illumination.

In another embodiment, arrangement 720 may be mounted in a room divider for providing illumination to either of a plurality of rooms or for providing lower level illumination to both of the rooms.

Dimmer Control

Electric lights are generally controlled in an on-off manner. In a limited number of prior art systems, intensity may also be controlled. Intensity is controlled in prior art systems by controlling a relatively large source excitation signal with potentiometer or variable inductor devices.

Prior art illumination dimmers are typified by automobile headlight dimmers which switch between multiple filaments, panel light dimmers that decrease source excitation using a potentiometer, and room light dimmers that decrease source excitation using a variable inductor. There prior art devices control source excitation and, therefore, involve control of high power levels.

An illumination amplifier arrangement in accordance with the present invention may be provided for illumination intensity control such as for electric lights and will now be discussed with reference to FIG. 1. Command device 127 generates command signals 126 as inputs to signal processor 128. Source 100 may be excited for substantially constant illumination 102 and amplifier 104 may be excited with amplifier command signal 133 to dim source illumination 102 by controlling reflected and transmitted illumination 106. This arrangement provides substantial advantages over prior art arrangements because of the low signal levels of command signals 133 required to control source illumination 102 and the control precision now possible with high speed amplifier devices 104 and precision illumination servo arrangements.

In an automobile illumination control embodiment, a dimmer control arrangement may be used to control automotive lights. Intensity of headlights, taillights and other external lights may be controlled with the above discussed arrangement. Also, internal automobile lights such as dash lights may be controlled with the above discussed arrangement. Further, the dimmer control arrangement may be used with a window and a rear view mirror for dimming external illumination sources such as sunlight or automobile headlights as previously discussed herein with reference to FIG. 7.

In a building illumination control embodiment, a dimmer control arrangement may be used to control internal lighting. Intensity of room lights may be controlled with dimmer amplifier devices arranged with light sources as previously discussed herein in the section entitled Lamp Control.

Other illumination amplifier dimmer arrangements will now become obvious to those skilled in the art from the teachings of this invention.

Flasher Control

Electric lights are generally controlled to be either in an on state or an off state. In a limited number of prior art systems, a third state may be provided. This state is a flashing state. Flashing is controlled in prior art systems by controlling a relatively large source excitation signal, typified by automobile turn signals. A mechanical switch may be sequentially opened and closed to sequentially remove and apply excitation to a lamp. Reliability of such a system is low because the thermal-shock of turning a lamp on and off causes degradation of the device. Also, relatively high power source excitation signals must be switched: thereby requiring more expensive power switches and causing greater degradation of switch contacts than required with a lower power illumination amplifier control arrangement.

An illumination amplifier arrangement will now be described for illumination flasher devices. As illustrated in FIG. 1, illumination source 100 generates source illumination 102. Source 100 may be a lamp as in an automobile turn signal application. Illumination amplifier 104 processes illumination 102 to provide controlled illumination 106. Command device 127, which may be a turn signal switch, generates command signal 126 to command signal processor 128 for generating flasher command pulses 133 to illumination amplifier 104, where processor 128 may include a well known astable multivibrator or other well known pulse generator arrangements. Command pulses 136 cause illumination amplifier 104 to become alternately transmissive and reflective for either transmitting illumination 102 or for blocking illumination 102 from being output as controlled illumination 106 incident on receiver 112. Receiver 112 may be an automobile turn signal lens, a human eye, or other such receiver. Flasher command signal 133 provides relatively low energy excitation for illumination amplifier 104, where source 100 may be maintained at substantially constant illumination during flashing coperations. Such operation reduces energy that must be switched and increases source life as previously discussed.

Although an illumination amplifier flasher has been described as a digital (on-off) device, it can be implemented to flash between illumination levels other than fully on and fully off. For example, a composite turn signal, parking light, and brake light arrangement may be provided for an automobile; where a parking light command signal may command a low illumination level, a brake light command signal may command a high illumination level, and a turn signal flasher command signal may command a sequence of illumination changes between selectable high and low illumination levels for flasher operation. These signals can be superimposed on each other for a composite signal.

Flexibility in controlling illumination 106 with amplifier 104 will permit different flasher parameters to be controlled such as for flasher rate or duty cycle control. Well known arrangements such as a variable frequency oscillator (VCO) and a reset integrator in signal processor 128 may provide controlled rate flashing as commanded by command device 127. A pulse width modulator arrangement such as previously discussed with reference to FIG. 2C may provide controlled pulse width or duty cycle flashing as commanded by command devices 127.

In one embodiment, the flasher arrangement of this invention may be used for turn signals of an automobile as discussed above.

In another embodiment, the flasher arrangement of this invention may be used for communications. A well known communications device is implemented with a mechanical shutter to flash an electric light. Still another well known communications device is provided with a mirror for reflecting sunlight toward a destination, then reflecting sunlight away from the destination with mechanical motion of a mirror. An illumination amplifier flasher arrangement in accordance with this invention provides for flashing of an illumination signal for communications purposes. Flashing may use either reflection or transmission of the illumination signal to the destination, where the illumination signal may be either sunlight, electric light, or other well know illumination signals.

In still another embodiment, the flasher arrangement of this invention may be used for illuminated displays. Well known display arrangements provide flashing capability such as for attracting an operator's attention. An illumination amplifier flasher arrangement in accordance with this invention provides for flashing illumination display signal for display purposes such as for the displays discussed in reference to FIG. 6.

In yet another embodiment, the flasher arrangement of this invention may be used for signs such as billboards, where illumination signals are flashed with illumination amplifier arrangements in accordance with this invention.

Other illumination amplifier flasher arrangements will now become obvious to those skilled in the art from the teachings of this invention.

As an alternate to a flasher, a varying control signal such as a ramp signal may be used to control an illumination signal, where a gradual change in place of a step change as with a flasher may provide advantages in many applications. A ramp signal 233 may be generated as described with reference to FIG. 2C or with well known techniques such as analog integrator arrangements.

Camera Systems

In accordance with still another feature of this invention, arrangements for camera systems will now be described. For simplicity, general camera systems will be described as photographic camera systems and photoplotter systems. It will become obvious to those skilled in the art that these camera systems are exemplary of the present invention, but that the present invention is useable for a wide range of systems for exposing an illumination sensitive medium, where the medium may be film as with a photoplotter, a phosphor screen as with a cathode ray tube (CRT) and other illumination sensitive mediums.

Figure 10:
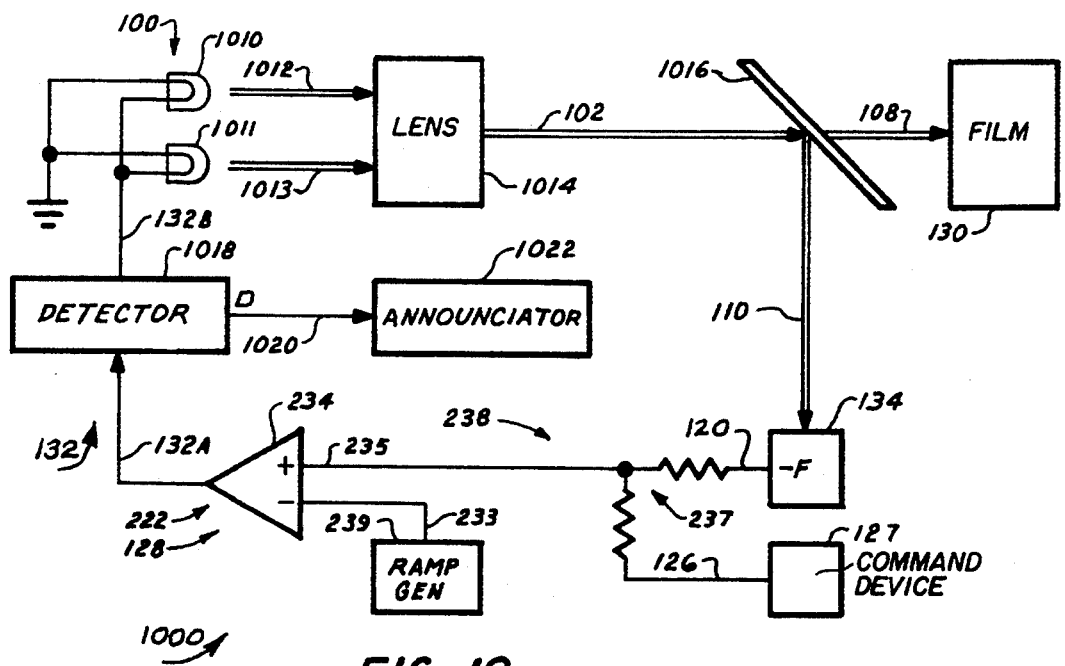
FIG. 10 is a schematic and block diagram illustrating a photoplotter system in accordance with the present invention.

Camera systems will be discussed with reference to FIGS. 1 and 8-10, where FIG. 1 shows a generalized embodiment of this invention and FIGS. 8-10 show more specific camera embodiemnts of this invention.

Various embodiments of camera control arrangements will be discussed in detail in the following sections entitled Image Rotation Control, Aperture Control, Shutter Control, Photographic Camera System, and Source Illumination Control.

Image Rotation Control

In accordance with the camera feature of this invention, an image rotation device is provided. This feature will herein be described for a photoplotter system. It will become obvious to those skilled in the art that this photoplotter system is exemplary of general features of this invention which may be applied to more general illumination control systems.

An illumination amplifier in accordance with this invention provides image rotation control with electronic devices as an alternate to the prior art electromechanical devices. A photoplotter is described in detail in the previously referenced copending patent applications Adaptive illumination Source Intensity Control Device. In particular, a prior art image rotation device is discussed at page 19 line 20 through page 21 line 6 therein.

For simplicity, the image rotation device of this invention will be described with a square image rotation device having only a few rotational positions. Additional abases and rotational positions can be provided and will become obvious from the teachings of this invention. Either of the complement arrangements (reflective or transmissive) can be provided to direct the illumination in the desired direction. Further, various digital and analog command and control arrangements, some of which have been discussed herein, may be used to control this image rotation device.

In a photoplotter system exemplary of the image rotation feature of this invention, illumination 102 from source 100 is incident on illumination amplifier 104 arranged as an image rotation device shown in FIG. 8A. Illumination 102 may be processed with various illumination processing devices such as lenses to collimate, focus, and otherwise process the illumination.

Image rotation device 800 shown in FIG. 8A is comprised of illumination amplifier areas 801-804 which are selectively excited to direct illumination of the desired configuration. Illumination 102 from an illumination source may be collimated to illuminate the image rotation device 800. When segments 801-804 are selectively excited to be reflective or transmissive, illumination 102 will be selectively transmitted and, therefore, will selectively illuminate an illumination sensitive medium 130 through illumination processing devices 801-804.

An example will now be presented to illustrate image rotational capability. For a first conditions segments 801-804 are all excited to be reflective so that the medium 130 is not illuminated. Therefore, this first all reflective condition causes the image rotation device 800 to perform as a shutter. In a second condition, segments 801 and 802 are excited to be transmissive and segments 804 are excited to be reflective so that the medium 130 is illuminated in the form of a square lined up with the axis of FIG. 8A. As a third condition, segments 801 and 804 are excited to be transmissive and segments 802 are excited to be reflective so that the medium 130 is illuminated in the form of a square lined up at forty-five degrees to the axis of FIG. 8A. Conditions two and three provide an effective image rotation for each forty-five degree increment of rotation. Other segment arrangements can be provided to generate other angular orientations.

Aperture Control

In accordance with the camera feature of this invention, an aperture control device is provided. This feature will herein be described for a photoplotter system and a photographic camera system. It will become obvious to those skilled in the art that the description is exemplary of the more general features of this invention which may be applied to more general illumination control systems.

An illumination amplifier in accordance with this invention provides aperture control for image dimensional or size variations for a photoplotter and exposure control for a camera using electronic devices as an alternate to mechanical apertures used in prior art devices. A photoplotter is described in detail in the previously referenced copending applications Adaptive Illumination Source Intensity Control Device, Adaptive Illumination Control Device, and Illumination Control System referenced above showing a mechanical shutter for selectively exposing a medium and an aperture arrangement for controlling the size of the exposure image. The aperture arrangement of this invention may provide both shutter control and aperture size control capability.

For simplicity, square and circular image dimensional control devices shown in FIGS. 8B and 8C having only a few aperture sizes will be described. Additional shapes and sizes may be provided as will become obvious from the teachings of this invention. Also, either of the complement (reflective-transmissive) arrangements may be provided as discussed previously.

Illumination from illumination source 100 may be collimated to illuminate aperture 820 provided as amplifiers 104. When areas 826-830 of aperture 820 are selectively excited to be reflective or transmissive, input illumination 102 will selectively be transmitted as illumination 106 and, therefore, will selectively illuminate the sensitive medium 130.

An example will now be discussed relative to FIG. 8B to illustrate image size capability. It will become obvious that other shaped apertures may be provided, where a circular aperture shown in FIG. 8C may be used as described for the square aperture of FIG. 8B, with elements 820C-830C corresponding to elements 820-830 respectively in the above description. For a first condition segments 826-830 are all excited to be reflective so that the medium 130 is not illuminated. Therefore, this first all reflective condition causes aperture 820 to perform as a shutter In a second condition, segment 830 is excited to be transmissive and segments 826 and 828 are excited to be reflective so that the medium 130 is illuminated with the smallest image. For a third condition, segments 828 and 830 are excited to be transmissive and segment 826 is excited to be reflective so that medium 130 is illuminated with a middle size image. For a fourth condition, segments 826, 828, and 830 are all excited to be transmissive so that medium 130 is illuminated with the largest size image. For a fifth condition, segment 826 is excited to be transmissive and segments 828 and 830 are excited to be reflective so that medium 130 is illuminated with a "hollow" or "toroidal" type image. Such a "hollow" image has been found to have particular advantages particularly when a circular or toroidal aperture 820 is used, as will be obvious to those skilled in the photoplotter art. Areas or segments can be arranged to generate apertures of other sizes and shapes and may be further arranged to combine both, the image rotation and image dimensional control capabilities discussed with reference to FIGS. 8A-8C, as will become obvious to those skilled in the art from the teachings of this invention.

The aperture arrangement of this invention has been discussed using digital control for simplicity. It will become obvious that analog control of aperture transmissivity can be provided using the teachings of this invention either in combination with a plurality of apertures 826-830 or as a single variable transmissivity aperture. A plurality of a apertures 826-830 may be preferred because of improved illumination control. In addition, masking of the outer periphery of a lens may be desireable when allowed by illumination considerations such as for reducing effects due to lens imperfections.

Shutter Control

In accordance with another feature of this invention, an illumination amplifier provides electronic shutter control as an alternate to prior art mechanical shutter devices. Mechanical shutters are in wide use in camera type equipment and comprise a spring loaded mechanical blade controlled by an operator actuated switch.

Figure 8D:
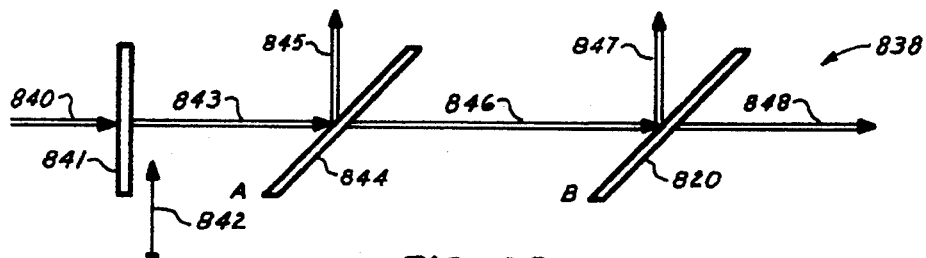

An illumination amplifier shutter arrangement 838 will now be discussed with reference to FIG. 8D. Input illumination 840 is incident on mechanical shutter 841 which is arranged to translate out of the illumination path as a mechanical motion shown with arrow 842 to permit illumination 840 to be incident on illumination amplifier 844 as input illumination signal 843. Amplifier 844 may be controlled to be reflective, causing illumination 843 to be reflected as signal 845 or amplifier 844 may be controlled to be transmissive, causing illumination 843 to be transmitted as signal 846. Transmitted signal 846 may be incident upon aperture 820 having reflected signal 847 and transmitted signal 848, where a preferred embodiment of aperture 820 has been previously discussed herein. Shutter amplifier 844 and aperture amplifier 820 may be combined as a single composite shutter-aperture arrangement as will become obvious to those skilled in the art, but has been illustrated herein for simplicity as individual shutter and aperture amplifier devices 844 and 820.

The combination of an auxiliary shutter such as a mechanical shutter 841 or other shutter device and an illumination amplifier shutter 844 have particular advantages. Mechanical shutter 841 may be difficult to control automatically but has very low levels of illumination "leakage". Amplifier shutter 844 is easy to control automatically but may have relatively high levels of illumination "leakage", as it may not be capable of providing a required low level of transmissivity. Therefore, use of a mechanical shutter 841 in combination with an illumination amplifier shutter provides convenient automatic illumination control together with low illumination leakage.

Illumination leakage through amplifier shutter 844 over long periods of time such as hours or days may improperly expose an illumination sensitive medium, but illumination leakage over seconds or fractions of seconds of time may not be significant. Therefore, precise control need not be provided with mechanical shutter 841, which may only be required to operate in reasonably short time periods such as seconds of time. In prior art systems, mechanical shutters may have to operate precisely in thousandths of a second for critical exposure timing. The mechanical shutter 841 of this invention may be a low precision, relatively slow mechanical shutter which, therefore, may be produced more economically and more reliably than prior art precision mechanical shutters.

In one embodiment, the shutter arrangement may be sequenced to first open the mechanical shutter 841, then to open the illumination amplifier shutter 844 for an exposure, then to close the illumination amplifier shutter 844 to terminate an exposure, and finally to close the mechanical shutter 841 to prevent illumination leakage. Opening and closing of the illumination amplifier shutter 844 may be precisely controlled to provide the desired exposure precision. Opening and closing of the mechanical shutter 841 may be controlled with low precision because it's primary function may be to reduce illumination leakage and not to control exposure period.

In accordance with the shutter feature of this invention, amplifier shutter 844 may provide precise control of illumination for exposure. Amplifier shutter 844 is controlled electrically to provide an exposure of a precise duration of time by being controlled electrically to be transmissive for exposure (shutter open) and reflective for non-exposure (shutter closed) conditions. Electrical control capability, particularly with low excitation requirements of some illumination amplifiers, yields advantages such as for providing an electronic control system for a camera or other exposure control systems.

Photographic Camera System

In accordance with still another feature of this invention, an electronic control system for a photographic camera is provided having illumination amplifier devices for control of photographic film exposures. It will become obvious to those skilled in the art that this photographic camera system is merely illustrative of the features of this invention which may be applied to general illumination system arrangements for illumination of an illumination medium.

Photographic cameras are in wide use, where prior art camera controls are implemented With mechanical aperture, shutter, and control arrangements.

An automatic camera control arrangement 900 will now be discussed with reference to FIG. 9.

Input illumination 901 may be incident on a partially transmissive device 940, which may be an illumination amplifier, for providing transmitted illumination 910 and reflected illumination 941. Amplifier 940 may be used to provide well known single lens reflex camera operation by directing reflected illumination 941 to a receiver 942, which may be the eye of an operator viewing an image through a viewing eye piece.

Illumination 910 may be incident on shutter-aperture arrangement 912. Arrangement 912 may include a shutter arrangement 841,844 and an aperture arrangement 820 as previously discussed in relation to FIGS. 8A-SD herein. Illumination 914 is incident on receivers 130 and 134, where receiver 130 may be an illumination sensitive medium such as photographic film and receiver 134 may be an illumination sensitive transducer such as a photocell. Illumination signal processing devices 922 such as lenses may be used to process illumination 913 to provide processed illumination 914. In a preferred embodiment, devices 922 and shutter-aperture arrangement 912 may be arranged in a batch fabricated lens, shutter, and aperture arrangement such as discussed herein. In an alternate embodiment, processing devices devices 922 may include known illumination signal processing arrangements such as lenses and filters. A partially reflective, partially transmissive illumination processing device 918 may be used to separate processed illumination 914 into an exposure signal which may be a transmitted signal 108 and a feedback signal 110. Device 918 may be an illumination amplifier, a partially silvered mirror, or other such device. Transducer 134 generates feedback signal 114 that is proportional to feedback illumination 110 and, therefore, may be proportional to illumination 914. Signal processor 128 processes feedback signal 114 for generating feedback control signal 133 and may also process various command signals 126 A which may include a film sensitivity signal 934 related to film speed such as ASA or DIN speed representations, an aperture signal 935 related to aperture opering or F stop and an exposure speed signal 936 related to an exposure period. Control signal 133 controls illumination amplifier devices 912 such as an aperture 820 and a shutter 841, 844 for providing a desired illumination signal 913 and a desired period of time for exposing the illumination sensitive medium 130.

Exposure operations may be initiated with a mechanical operation 906 such as an operator depressing a shutter switch or an automatic relay closure. Mechanical operation 906 may close a switch in device 912 for generating a start expose signal 907 to signal processor 128 and may open an auxiliary shutter such as a mechanical shutter as previously discussed with reference to FIG. 8D herein. Signal processor 128 may generate an exposure complete signal 908 for external control of exposure operations.

Figure 9A:
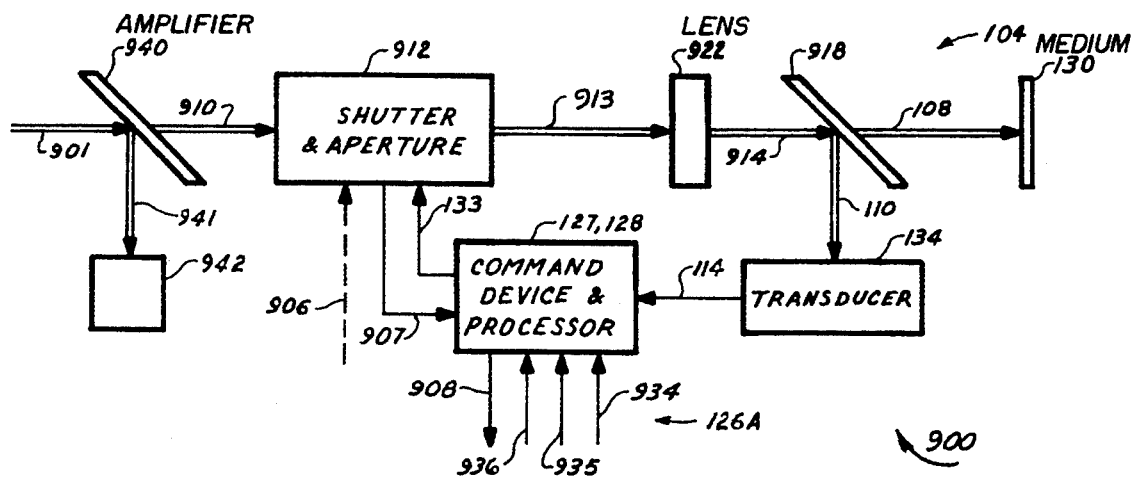
FIG. 9 is a schematic and block diagram illustrating a camera control system in accordance with the present invention comprising FIG. 9A showing a detailed camera control arrangement, FIG. 9B showing a computer control arrangement, and FIG. 9C showing a special purpose control arrangement.
Figure 9B:
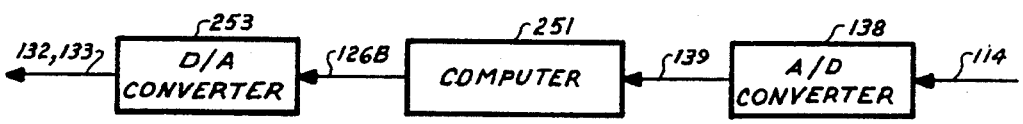

A digital embodiment of command devices 127 and command signal processor 128 will now be discussed with reference to FIG. 9B. Digital computer 251 may be used to process illumination related information for generating command signals 126B to control illumination 910. Computer 251 may be a stored program computer such as described in copending application Factored Data Processing System For Dedicated Applications referenced above or may be other types of digital computers which are well known in the art. In a preferred embodiment, computer 251 has a read only memory for storage of a program as discussed in detail in said copending patent application. A well-known analog-to-digital (A/D) converter 138 may be used to process input signals which may include feedback signals 114 for generating output digital signals 139 for use by computer 251. A preferred embodiment of to a computer control system with an A/D converter and a D/A converter is described in copending application Apparatus And Method For Providing Interactive Audio Communication referenced above and incorporated herein by reference. Computer 251 may process input signals such as in response to a stored program and generate output digital command signals 126B to D/A converter 253 to control illumination devices 912 with signals 132, 133 as described herein in relation to FIG. 2C. Computer 251 may process the input signals 139 to determine the desired exposure parameters such as time of exposure, aperture amplifiers to be excited, levels of excitation for each aperture amplifier 826-830 and other such parameters. Relationships between film speed, aperture transmissivity, and exposure period are well known in the photographic art and are programmable by computer programmers skilled in the computer art.

Figure 9C:
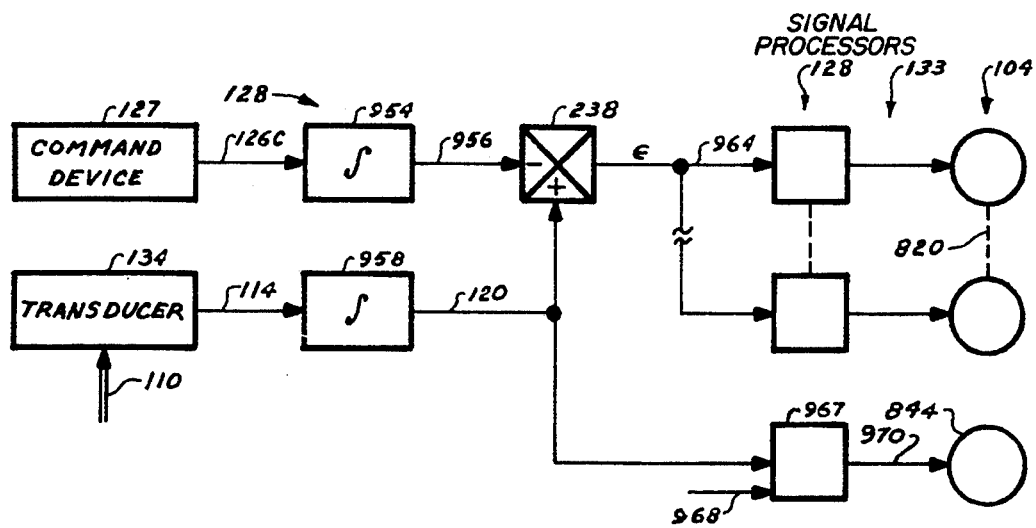

An analog embodiment of command devices 127 and command signal processors 128 will now be discussed with reference to FIG. 9C. Command signals 126A and 126C may be provided with well known cascaded potentiometer arrangements shown as command devices 127. Integrator 954 may start integrating command signals 126C at the start of an exposure to generate an ideal exposure ramp signal 956 related to the desired exposure as a function of time. Simultaneously, transducer 134 may sense illumination 110 related to the start of an exposure and generate electrical signal 114 related to illumination 110 for integration with integrator 958 to generate an actual ramp signal 120 related to the actual exposure as a function of time. Summing junction 238 may be used to compare the actual exposure ramp 120 with the desired exposure ramp 956 to generate an error signal $\epsilon$ 964 for control of illumination amplifier aperture devices such as devices 820 shown in FIG. 8B. Integrators 954 and 958 may be well known operational amplifiers such as the Fairchild integrated circuit amplifier serial no. 709 and summing junction 238 may be a well known summing resistor network and comparitor such as discussed with reference to FIG. 2C.

Aperture illumination amplifiers 820 may be controlled with amplifier signal processors 128. As previously discussed in reference to FIGS. 7B and 8B, it may be desireable to control the aperture amplifiers in a preferred sequence such as first controlling the centermost amplifier 836 until it is fully transmissive then controlling the other amplifiers in sequence as required to provide the desired levels of exposure. Signal processors 128 may be arranged with thresholds so that error signal $\epsilon$ 964 must exceed a fixed threshold before a particular amplifier 820 will be controlled to be transmissive, where each threshold may be related to the more preferred amplifiers 820 already being fully transmissive and therefore requiring additional illumination from a less preferred amplifier. Selection of aperture amplifiers 820 is made less critical with the use of a closed loop servo control arrangement discussed previously, which will significantly reduce errors introduced within the servo loop as with aperture amplifier selection errors.

Shutter amplifier 844 may be controlled with control signal 970 from signal processor 967, which may detect when the actual exposure ramp 120 reaches a desired exposure threshold, to terminate an exposure by making shutter amplifier 844 non-transmissive. The exposure threshold may be a fixed threshold or may be adjustable with input signal 968 which may be a manual potentiometer command signal. Threshold detector 967 may be any well known devices such as a Fairchild comparitor serial no. 710 with well known circuitry.

It will become obvious to those skilled in the art that arrangements such as discussed for an analog embodiment may be implemented with a digital embodiment as described previously.

The analog embodiment described above provides for a constant amount of illumination to be generated for exposing an illumination sensitive medium 130 as related to a single exposure such as with a photographic camera. It will become obvious to those skilled in the art that this arrangement is exemplary of the broad scope of illumination control features of this invention and that other arrangements may be configured from the teachings of this invention. For example, a photoplotter system may be configured by deleting integrators 954 and 958 for controlling feedback illumination 110 to be a constant value for a continuous exposure.

Color temperature relates to spectral response, where a blue tint is a high color temperature and a red tint is a low color temperature. Different films may be related to different color temperatures, where outdoor film emphasizes reds and indoor film emphasizes blues. Color temperature can be controlled with arrangement 650 (FIG. 6D) included with shutter and aperture devices 912. Control signals 133 (FIG. 9A) may correspond to signals R, B, and G (FIG. 6D); input illumination 910 (FIG. 9A) may correspond to input illumination 660 (FIG. 6D); and output illumination 913 (FIG. 9A) may correspond to output illumination 668-670 or 676 (FIG. 6D). Further, aperture 820 and shutter 844 may be included in amplifiers 664-666. Control signals R, B, and G may be used to control the poroportion of illumination 676 each filter 671-673 transmits and therefore control the color temperature of composite signal 676. One example of the use would be to increase the proportion of red illumination 668 when indoor film is being used to take outdoor pictures by increasing the transmissivity of signal R relative to signal B. Various photographic effects can be provided with this color temperature control arrangement as will become obvious to those skilled in the photographic art. Further, filter 673 may be a haze filter or other special filter for controlling other characteristics of a photograph. Control signals R, B, and G may be provided with manual control signals 126A (FIG. 9A), automatic control signals 132, 133 (FIGS. 9B and 9C) or other control signals. Further, transducer 134 (FIG. 9A) may have a spectral response matched to the spectral response of the film 130 such as with a filter to provide a feedback signal 114 related to the intensity of a particular spectral region to which the film may be sensitive.

Source Illumination Control

In accordance with yet another feature of this invention, a multiple source arrangement is provided in conjunction with an illumination servo loop to permit operation in the presence of a source malfunction. This feature will herein be described for a photoplotter system. It will become obvious to those skilled in the art that this photoplotter system is exemplary of more general features of this invention which may be applied to general illumination control systems. For example, the multiple source arrangement may exemplify an electron beam welder system with multiple electron sources. Further, two incandescent sources will be described for a photoplotter system but are intended to exemplify a plurality of source elements not limited specifically to two elements and to further exemplify a distributed or batch fabricated source arrangement where individual source elements may not be individually distinguishable. Such a multiple source arrangement may exemplify a distributed or batch fabricated source arrangement, where degradation of a distributed source such as with degradation of illumination generating capability of a localized area of a source will be compensated with a servo embodiment discussed herein for two independent incandescent sources in a photoplotter system.

In accordance with still another feature of this invention, a pulse modulated excitation arrangement is provided for proportional control of both, analog and digital source devices. In a preferred embodiment, a pulse width modulated arrangement such as discussed in conjunction with FIG. 2C will be discussed to exemplify a general pulse modulated excitation arrangement.

In accordance with yet another feature of this invention, a source burn-out detector may be provided for improved maintainability.

A photoplotter is a well known system for exposing film to controlled light. Typical photoplotter systems are described in patents to Gerber et al U.S. Pat. No. 3,330,182 issued in July 1967 and to Ritchie et al U.S. Pat. No. 3, 323,414 issued in June 1967. Prior art systems use a single lamp for generating light. When a lamp burns out, a prior art photoplotter system will not operate until the lamp is replaced. If a lamp burns out during operation, operation must be discontinued until the lamp is replaced. In prior art systems, it has not been possible to resume discontinued operation because of two primary reasons. First, lamp failure is generally accompanied with a bright flash, thereby overexposing and ruining an artwork. Second, it has been impossible to restart operations exactly at the place where operation was interrupted. Therefore, lamp failure in prior art systems may result in loss of an artwork in process. Artwork may require many hours of exposure. Therefore, lamp burn out may result in a loss of substantial exposure time and the associated expenses.

It has been found that an arrangement of a plurality of illumination sources may not alone be sufficient to permit continued operation when a source burns out because the illumination signal will change in intensity due to the burned out source. It has been found further that a closed loop illumination servo can detect a change in illumination due to a burned out source and can automatically adjust source excitation for a redundent source to maintain substantially constant illumination even through a burn out condition. Therefore, a preferred embodiment of this inventive feature comprises a combination of a plurality of source elements in combination with a closed loop illumination servo.

A closed loop illumination servo 1000 shown in FIG. 10 provides for precision control of illumination independent of whether a plurality of source elements are excited or a single source element is excited and further provides for precision control of illumination during burn out of an element to make an automatic transition from excitation of a plurality of elements to excitation of less than that plurality of elements. As a simplified example, a two element incandescent illumination source will be described. It will be obvious from the teachings of this invention that this arrangement is not limited to two elements, to incandescent sources, nor to photoplotter systems. In addition, these source elements may be in independent enclosures such as with two separate bulbs, may be in a single enclosure such as with a multi-filament bulb, or may be portions of a source such as areas on an illumination emitter that may become degraded but with other portions generating compensating illumination. Therefore, the terms related to sources such as the multiple elements or redundant elements as used herein are further intended to mean illumination capability exceeding that required to generate normal illumination when they have not been degraded in illumination generation capability, thereby permitting generation of the required illumination even after degradation has occurred.

Compensation for illumination source malfunction is provided with multiple redundancy illumination source elements which may be multiple bulbs, multiple filaments in a single bulb or other multiple redundance devices. When a degradation or a failure occurs in one source, the remaining source may provide the required illumination. Therefore, in the absence of a malfunction, each of the multiple sources are operating at partial excitation and the resultant partial illumination. As is well known in the art, partial excitation results in greatly extended lamp life.

In a preferred embodiment shown in FIG. 10, several incandescent lamp filaments are wired in parallel to be excited simultaneously. An illumination servo loop 1000 provides a source excitation level required for generating the commanded illumination levels. When a malfunction occurs in one illumination source element, the excitation level may be automatically adjusted by servo 1000 to provide the required illumination 102 with only one source element.

In reference to FIG. 1, illumination source 100 may be any type of source well known in the art. Source 100 may be an analog source including incandescent bulbs such as tungsten, quartz, iodide, and tungsten halogen; and including solid state sources such as electro-luminscent panels and light emitting diodes, or may be other analog source devices that generate illumination 102 proportional to the amplitude or duty cycle of excitation 132. Source 100 may be a digital source including has tubes such as xenon lamps, flash tubes, or other digital source devices that operate in a digital (on-off) manner. Both analog and digital sources may be excited with pulse modulated digital excitation, where such digital excitation may be considered to be a special case of analog amplitude excitation comprising two amplitude extremes, on and off, and with a duty cycle related to magnitude as previously discussed with reference to FIG. 2C.

Illumination source 100 is shown in FIG. 10 comprising source elements 1010 and 1011 excited in parallel with excitation signal 132 for generating illumination signals 1012 and 1013 respectively. Illumination signals 1012 and 1013 may be combined into a single illumination signal 102 using well known illumination processing devices 1014 such as an accumulating lens. Illumination amplifier 1016 divides illumination 102 to provide exposure illumination 108 to expose film 130 and to provide feedback illumination 110 to illuminate transducer 134. As previously discussed with reference to FIG. 2C, transducer 134 generates negated feedback signal 120 to summing junction 238 comprising summing resistors 237, Summing junction 238 sums negated feedback signal 120 from transducer 134 and command signal 126 from command devices 127 to generate a processed command signal 235 related to the difference therebetween. Processed command signal 235 is compared with ramp 233 from ramp generator 239 using comparitor 234 to generate pulse width modulated signal 132 for excitation of sources 100. Pulse width modulator 222 may be included in command signal processor 128 and has previously been discussed in detail in conjunction with FIG. 2C. When a source burns out such as source 1011 for this example, illumination 1013 will reduce toward zero. Feedback sensor 134 will sense this condition, thereby causing a reduction in feedback signal 120, thereby causing an increase in difference signal 235, thereby causing an increase in pulse width modulated signal 132 to excite source 1010, thereby increasing illumination 1012 to compensate for reducing illumination 1013 to maintain illumination 102 substantially constant, Therefore, as source illumination 102 decreases from a level commanded by command signal 126, the servo loop 1000 will adjust excitation signal 132 to maintain substantially constant illumination.

In still another embodiment, a plurality of sources 1010 and 1011 may be excited in a priority sequence, where source 1010 may initially have priority and be excited, while source 1011 may not have priority and not be excited for normal operation. If source 1010 were to burn out, excitation arrangement 222 may then excite source 1011 to provide the commanded illumination. Switch-over from one source to another source may be provided automatically by a servo loop with well known threshold arrangements such as biased diodes, where burn out of lamp 1010 will cause the servo difference signal 235 to increase in magnitude under control of the servo loop 1000 until the lower priority source 1011 is properly excited.

For simplicity, the inventive feature of source redundancy has been described for control of illumination 108 from redundant source 100 with excitation signal 132. It will become obvious to those skilled in the art from this teaching that control of illumination 108 from redundant source 100 can be controlled with amplifier 104 and excitation signal 133, Therefore, compensation for source degradation can be controlled with either source excitation signal 132 or amplifier excitation signal 133 or both. Further, redundant amplifiers may be placed in series and parallel combinations and controlled to compensate for failures to a transmissive state or reflective state respectively.

When an illumination source malfunctions, it is desireable to notify an operator of the condition for maintenance purposes. A burn out detector may be provided for automatic detection to notify an operator. Monitoring of source signals such as voltages, currents, impedances, temperatures, or spectrum provides information on source conditions.

When a source malfunctions, voltages and currents in a servo loop 1000 may change to maintain illumination 102 constant. If source 1011 were to malfunction, combined impedances of illumination sources 1010, 1011 may increase, thereby reducing current and increasing voltage of excitation signal 132. An electrical detector 1018 may be provided to detect current levels or voltage levels or both and to generate detector signal 1020 to excite an anounciator 1022 to alert an operator to a burn out condition. Announciator 1022 may be a visual announciator such as a lamp, may be an audio announciator such as a buzzer or may be other well known announciator devices.

In another detector embodiment, separate electrical detectors may be provided for each source 1010 and 1011 located in non-common excitation signal lines to identify the particular source that has malfunctioned.

In still another detector embodiment, separate illumination detectors such as photocells may be located to sense source illumination 1012 and 1013 for detecting a source malfunction.

Still a further detector embodiment would permit the operator to test the sources by exciting and monitoring each illumination source to detect a degradation condition. This test could be performed prior to operating the system to insure starting with a non-degraded source.

Audience Display System

In accordance with yet another feature of this invention, an audience display system will now be described. In a preferred embodiment, the audience display system may be a large display screen such as for a theater. It will be obvious to those skilled in the art that such a display is merely exemplary of the teachings of this invention which may be applied to other systems such as billboards and scoreboards.

In the prior art, audience display systems have been implemented with projectors such as for movie theaters or with arrays of incandescent bulbs such as for scoreboards systems. Projection systems require projection of controlled illumination, greatly limiting intensity. Bulb arrays require control of large amounts of power and have limited resolution. The illumination amplifier embodiment of this invention permits the control of high intensity illumination with low power control signals and with very good resolution.

An array of illumination amplifier devices such as illustrated in FIGS. 6 and 7 may be arranged to provide a display with the desired size and the desired resolution. For example, a scoreboard that is twelve feet high and fifty feet long having a resolution of three inches may have three inch square illumination amplifiers arranged in an array of forty-eight amplifiers high by two hundred amplifiers long. These amplifiers may be arranged similar to the discrete illumination devices described with reference to FIG. 6A or in other arrangements.

In a preferred embodiment, an audience display system may be illuminated with floodlights either from behind for a transmissive arrangement or from the front for a reflective arrangement. Floodlights provide high illumination intensity levels covering a relatively large area at low cost. Control of low power illumination amplifiers will provide control of high levels of floodlight illumination intensity with low level electrical signals.

The discrete illumination device 600 of this invention shown in FIG. 6A may be used in the audience display system. Discrete illumination amplifiers such as amplifiers 602–605 may be implemented as relatively large amplifier panels arranged in an array such as for an audience display system. For the previously discussed example, each amplifier such as amplifiers 602–605 may be three inches square and arranged in an array of 48 amplifiers high by 200 amplifiers long. The amount of illumination that may be controlled may be significant, yet only low level control signals would be required for this illumination amplifier arrangement. A prior art incandescent lamp scoreboard with a three inch resolution and a forty eight by two hundred feet size may be compared with the illumination amplifier arrangement of this invention. Assuming 100 watt incandescent lamps were used for such a prior art scoreboard, 10,000 lamps dissipating up to one megawatt would be required. Control circuitry required to switch that large amount of power would be very expensive. An illumination amplifier scoreboard arrangement would require significantly less power for control, possibly one millionth the power of the incandescent lamp arrangement. Therefore, control circuitry would be substantially reduced for the illumination amplifier arrangement.

In a preferred embodiment, a command device 127 may be used to automatically display an image, which may be a written message, a stationary picture, or a moving picture. In this embodiment, an image of a desired display may be projected on a two dimensional array of illumination sensitive transducers such as photo-SCRs 216 shown in FIG. 2A. The array of transducers may be arranged to correspond to an array of illumination amplifiers so that each transducer in the array of transducers is connected to control an illumination amplifier in a corresponding position in the array of illumination amplifiers. If a transducer 216 is illuminated with a bright illuminated portion of an image 218, a command signal 220 may be generated to cause a corresponding illumination amplifier to be excited to provide a corresponding bright illuminated point of an image for audience display. If a transducer 216 is illuminated with a dark illuminated portion of an image 218, a command signal 220 may be generated to cause a corresponding illumination amplifier to be non-excited to provide a corresponding dark illuminated point of an image for audience display. Therefore, the image projected on the transducer array will be mapped point for point on the illumination amplifier array for audience display. This arrangement will be discussed in more detail hereafter with reference to FIG. 11.

A projected image may be any image including printing, handwriting, photographs, or moving pictures. Well known still picture projectors and moving picture projectors may be used to provide the desired projected image.

A colored display may be provided for an audience display system by separating colors and by controlling a colored illumination amplifier display. In one embodiment, a colored image may be separated into images each having one of three basic colors such as well known color separators used in the graphic arts industry. Each of the three images may be projected on a transducer array to generate three signals for each point in an array of illumination amplifiers, each signal corresponding to an intensity of different color component for that display point. Each of the display points may be composed of a triad of three illumination amplifiers such as has been described with reference to FIG. 6D. Control of the triad of amplifiers 664–666 with a corresponding color signal will provide a color point on the display, either composed of a single illumination signal 676 or as a triad of different colored signals 668–670. A detailed example of the operation of such a colored display system will be described in detail hereafter.

An array of batch fabricated transducers 404 have been described with reference to FIG. 4 and may be used for the array of transducers described for the command arrangement of the audience display system. Transducers 426 of array 404 may be digital transducers such as illumination controlled rectifiers 216 or may be analog transducers such as phototransistors and photoresistors. In an analog arrangement, pulse width modulator 239 shown in FIG. 2C may be used to provide analog control for an array of illumination amplifiers in response to command signals 235 provided by analog transducers. Therefore, an audience display system may be provided with shades of grey or shades of color.

An audience display system 1100 will now be described in detail with reference to FIG. 11. For simplicity of illustration of the operation of this inventive feature, only four resolution points of a two color system will be described. This example is exemplary of more complex systems and may be expanded to cover a system with three colors or more having resolution points of a million or more. A two colored image 1100 having four resolution points 1112–1115 may have colors separated into single color images with each single color image and 1108 projected on transducer arrays 1120 and 1130 respectively with well known color separator and projector arrangements shown as separator and projector arrangement 1104. Transducer arrays 1120 and 1130 are then used to control illumination amplifier display 1140. Resolution points 1112–1115 on image 1110 correspond to illumination transducers 1122–1125 respectively on a first color transducer array 1120, to illumination transducers 1132–1135 respectively on a second color transducer array 1130, and to display amplifier pairs 1142–1145 respectively and 1152–1155 respectively on display 1140. Transducer signals 1126–1129 from transducers 1122–1125 respectively of transducer array 1120 excite amplifiers 1142–1145 respectively of amplifier array 1140. Transducer signals 1136–1139 from transducers 1132–1135 respectively of transducer array 1130 excite amplifiers 1152–1155 respectively of amplifier array 1140. Individual image points 1112–1115 will now be traced through to the final display to illustrate operation of one embodiment of this invention.

Image point 1112 is shown without cross hatch lines illustrative of a blank point. Blank Point 1112 is separated and projected onto transducers 1122 and 1132. Therefore, neither transducer 1122 and 1132 is illuminated, providing non-exciting signals on lines 1126 and 1136 resulting in neither illumination amplifier 1142 nor 1152 being excited. This excitation results in a blank display point 1142 and 1152 corresponding to a blank image point 1112.

Image point 1113 is shown with a first set of cross hatch lines illustrative of a first color point. First color point 1113 is separated and projected onto transducers 1123 and 1133. Therefore, first color transducer 1123 is illuminated providing an exciting signal on line 1127 resulting in amplifier 1143 being excited and second color transducer 1133 is non-illuminated providing a non-exciting signal on line 1137 resulting in amplifier 1153 being non-excited. This excitation results in a first color excitation for display point 1143 and 1153 corresponding to a first color image point 1113.

Image point 1114 is shown with a second set of cross hatch lines illustrative of a second color point. Second color point 1114 is separated and projected onto transducers 1124 and 1134. Therefore, second color transducer 1134 is illuminated, providing an exciting signal on line 1138 resulting in amplifier 1154 being excited and first color transducer 1124 is non-illuminated providing a non-exciting signal on line 1128 resulting in amplifier 1144 being non-excited. This excitation results in a second color excitation for display point 1144 and 1154 corresponding to a second color image point 1114.

Image point 1115 is shown with two sets of cross hatch lines illustrative of a two colored point. Two colored point 1115 is separated and projected onto transducers 1125 and 1135. Therefore, both transducers 1125 and 1135 are illuminated, providing exciting signals on lines 1129 and 1139 resulting in both illumination amplifiers 1145 and 1155 being excited. This excitation results in a two colored display point 1145 and 1155 corresponding to a two colored image point 1115.

Therefore, it can be seen that blank image point 1112 provides blank display point 1142 and 1152, first color image point 1113 provides first color display point 1143 and 1153, second color image point 1114 provides second color display point 1144 and 1154, and two color image point 1115 provides two color display point 1145 and 1155. It can be seen further that as colored illumination 1102 changes, points 1112–1115 of illumination image 1110 will be mapped onto points 1142–1145 respectively and 1152–1155 respectively of illumination display 1140 to provide a reconstructed illumination image 1140 for display.

Other command systems for incandescent bulb type audience display systems are well known in the art and may be used to control the illumination amplifier audience display system of this invention.

One feature of this invention may be described as an illumination pantograph, where a small image may be projected on a small illumination transducer array and be duplicated, point for point, on a large illumination amplifier array.

Although the display arrangement of one feature of this invention has been described for an audience display system, it will be obvious to those skilled in the art that an illumination amplifier display system may be used for smaller display arrangements such as television display systems.

Illumination Chopper, Scanner, And Modulator

The illumination amplifier feature of the present invention provides an improved means and method for chopping, scanning, and modulating illumination. Prior art devices typically involve rotating mirrors or CRT flying spot scanners, as discussed in the articles (1) Optical Scanners; Comparisons and Applications by Compton published in the February 1976 issue of Electro-Optical Systems Design and (2) Laser/Galvo Scanner Design by Tenney et al published in the October 1975 issue of Electro-Optical Systems Design magazine at pages 40–45 and herein incorporated-by-reference. The illumination amplifier feature of the present invention can provide further advantages in combination with prior art devices. For example, the reflective surfaces used in many prior art electro-mechanical scanners can be replaced by the illumination amplifier arrangement of the present invention to provide electro-optical control in place of or in addition to prior art electro-mechanical control. Still further advantages may be achieved with a fully solid-state illumination control scanner, chopper, or modulator device as discussed below with reference to FIGS. 12A–12C.

An illumination amplifier device is shown in FIG. 12A that may be used as an optical scanner, chopper, or modulator. Illumination amplifier segments 1210–1217 may be individually controlled such as to be either reflective or transmissive in response to electrical control signals, Illumination signal 102, shown incident upon scanner 1200, is transmitted by segments controlled to be transmissive such as with illumination 102 transmitted through segment 1210 to illuminate sensor 134.

Illumination 102 may be chopped by selectively controlling segments 1210–1217 to be sequentially or randomly transmissive and reflective. A sequential rotary scan will now be described for simplicity although other non-sequential scans may be provided. In the rotary scan, one and only one segment is controlled to be transmissive, wherein each of the segments is sequentially controlled to be transmissive. For example, segment 1210 may be transmissive and segments 1211–1217 may be controlled to be reflective, then segment 1211 may be controlled to be transmissive and segments 1210 and 1212–1217 may be controlled to be reflective, then segment 1212 may be controlled to be transmissive and segments 1210–1211 and 1213–1217 may be controlled to be reflective etc as shown in the table listing Sequential States. This table lists the repetitive sequence of scanner states and the transmissive and reflective segments for each state.

| | SEQUENTIAL STATES | | |
|---|---|---|---|
| SEQUENCE | CONTROL SIGNAL | TRANSMISSIVE SEGMENTS | REFLECTIVE SEGMENTS |
| 0 | B0 | 1210 | 1211–1217 |
| 1 | B1 | 1211 | 1210, 1212–1217 |
| 2 | B2 | 1212 | 1210–1211, 1213–1217 |
| 3 | B3 | 1213 | 1210–1212, 1214–1217 |
| 4 | B4 | 1214 | 1210–1213, 1215–1217 |
| 5 | B5 | 1215 | 1210–1214, 1216–1217 |
| 6 | B6 | 1216 | 1210–1215, 1217 |
| 7 | B7 | 1217 | 1210–1216 |
| 0 | B0 | 1210 | 1211–1217 |

After a complete scan with all segments, the scan may continue sequentially from segment 1217 to segment 1210 and repeat the sequence. This rotating scan concept is analogous to the well-known mechanical rotating chopper used on astrotrackers such as the Kollsman KS-50 astrotracker and other angular positioning devices.

A solid-state scanner will now be described with reference to FIG. 12B using illumination amplifier devices. In the prior art, scanner arrangements use oscillating or movable mirror arrangements such as used in the Zerox electrostatic copier machine, where a mirror is rotated or oscillated to scan a document for printing purposes. Other mechanical scanner arrangements are well known in the art. Problems exist with such prior scanners, where electro-mechanical scanners traverse a fixed scan cycle due to inertial characteristics and where the optical output may be "smeared" due to the continuous motion of the mechanical scanner. A solid-state electro-optical scanner in accordance with the present invention provides discretely selectable conditions selectable under electronic control independent of inertia and other such sequential characteristics thereby permitting random scan arrangements and virtually any scan sequence. Further, the scanner arrangement in accordance with the present invention permits discrete scan position to be selected and maintained, thereby providing a continuously changing image to the illumination destination and minimizing the blur or smearing effect of a continuous scan. The scanner of The present invention will be exemplified with a simple description to exemplify the inventive features. It is intended that this simple description be interpreted in a broad form to include more complex scanning arrangements such as having a greater number of scan positions, using devices other than the liquid crystal devices, being constructed with other techniques, providing continuous scanning in contrast to discrete scanning, and incorporating the various other teachings of this inventive feature.

For simplicity, this generalized scanner concept will be discussed for a multi-layered liquid crystal embodiment although other configurations will become obvious from the teachings thereof. A glass substrate 1222 may be composed of many layers of glass at different angles 1221 all stacked and bonded together and containing liquid crystal illumination amplifiers therebetween such as with well-known etched electrodes and liquid crystal material in each layer interface 1230–1237. Scanning is achieved by sequentially selecting different layers having different reflective angles to be reflective thereby reflecting illumination to or from different locations. For example, if device 1224 is an illumination sensor, scanner 1220 will sequentially detect illumination from illumination paths 1240–1247 as the scanning progresses along path 1223. Alternately, device 1224 may be an illumination source where an illumination signals 1240–1247 may be scanned across element 1223 for selective illumination. Illumination signals from a source 1224 may be further processed with well-known electronics. For example, illumination signals 1240–1247 may be accumulated with lens systems after illuminating scanned element 1223 for processing with illumination sensors.

In accordance with FIG. 12B, a plurality of illumination amplifier devices may be arranged having a depth dimension into the support medium such as a glass medium for liquid crystal devices wherein the illumination must traverse transmissive illumination amplifier elements until it reaches a reflective element. For example, if a first element 1230 closest to the surface is reflective, illumination will be reflected in a direction 1240 determined by this surface element, and if the first element 1230 closest to the surface is transmissive, illumination will be transmitted to a second amplifier 1231 next closest to the surface through the first transmissive element 1230. If the second element 1231 is reflective, illumination will be reflected in a direction 1241 determined by this second element 1231 which is the first reflective element, and if the second element 1231 is transmissive, illumination will be transmitted to a third amplifier 1232 next closest to the surface through the first two transmissive amplifier elements 1230 and 1231 and so forth until the illumination is incident upon a first amplifier having a reflective characteristic. This first amplifier having a reflective characteristic will determine the selected angle of the scanner. Therefore, the illumination from the source may be transmitted through a plurality of illumination amplifiers that are non-reflective until incident upon the first illumination amplifier that is reflective, thereby electro-optically selecting the particular scanner angle.

For simplicity of discussion, a sequential scanning arrangement of scanner 1220 will now be discussed. For simplicity of illustration, it shall be assumed that one and only one amplifier layer 1230–1237 of layers 1221 is controlled to be reflective and all other amplifier layers are controlled to be transmissive although other scans may be provided to make combinations of elements 1230–1237 reflective and transmissive. For a sequential scan, illumination amplifier 1230 is first controlled to be reflective thereby generating reflective illumination signal 1240, then amplifier 1230 is controlled to be transmissive and amplifier 1231 is controlled to be reflective thereby generating reflective illumination signal 1241, then amplifiers 1230 and 1231 are controlled to be transmissive and amplifier 1232 is controlled to be reflective thereby generating reflective illumination signal 1242, etc. The sequential scan may proceed as shown in the table listing Scan States. This table lists the repetitive sequence of scanner states and the transmissive and reflective elements for each state.

| | | SCAN STATES | | |
|---|---|---|---|---|
| SEQUENCE | CONTROL SIGNAL | TRANSMISSIVE SEGMENTS | REFLECTIVE SEGMENTS | ILLUMINATION SIGNAL |
| 0 | B0 | 1231–1237 | 1230 | 1240 |
| 1 | B1 | 1230, 1232–1237 | 1231 | 1241 |
| 2 | B2 | 1230–1231, 1233–1237 | 1232 | 1242 |
| 3 | B3 | 1230–1232, 1234–1237 | 1233 | 1243 |
| 4 | B4 | 1230–1233, 1235–1237 | 1234 | 1244 |
| 5 | B5 | 1230–1234, 1236–1237 | 1235 | 1245 |
| 6 | B6 | 1230–1235, 1237 | 1236 | 1246 |
| 7 | B7 | 1230–1236 | 1237 | 1247 |
| 0 | B0 | 1231–1237 | 1230 | 1240 |

When the last amplifier 1227 is controlled to be reflective to generate illumination signal 1247, then scanner 1220 may be controlled to "retrace" by making amplifier 1230 again reflective and thereby retracing from signal 1247 to signal 1240 to start a new scan along element 1223.

An alternate embodiment is illustrated with the following Alternate Scan States table.

| SEQUENCE | CONTROL SIGNAL | ALTERNATE SCAN STATES TRANSMISSIVE SEGMENTS | REFLECTIVE SEGMENTS | ILLUMINATION SIGNAL |
|---|---|---|---|---|
| 0 | B0 | NONE | 1230–1237 | 1240 |
| 1 | B1 | 1230 | 1231–1237 | 1241 |
| 2 | B2 | 1230–1231 | 1232–1237 | 1242 |
| 3 | B3 | 1230–1232 | 1233–1237 | 1243 |
| 4 | B4 | 1230–1233 | 1234–1237 | 1244 |
| 5 | B5 | 1230–1234 | 1235–1237 | 1245 |
| 6 | B6 | 1230–1235 | 1236–1237 | 1246 |
| 7 | B7 | 1230–1236 | 1237 | 1247 |
| 0 | B0 | NONE | 1230–1237 | 1240 |

Many other alternate embodiments may be provided from the teachings herein.

The scanner inventive feature described above may be characterized as selecting a sequence of elements having different reflective angles to select each of a plurality of sources of illumination (or to select each of a plurality of destinations of illumination) having different angles of incidence (or having different angles of reflection) to provide substantially a constant reflective angle (or incidence angle) to provide reflected illumination to a sensor (or from a source). Other characterizations may include a solid-state scanning device, an electro-optical device for scanning a plurality of sources of illumination to provide scan illumination to a receiver, and a plurality of illumination amplifier devices each having different angular positions for selecting different sources of illumination for reflecting selected illumination to a receiver device.

The illumination amplifier scanner of the present invention may take many forms, where one form is a plurality of individual discrete illumination amplifier elements arranged at different angles. Another form may be provided as a batch fabricated illumination amplifier as shown in FIG. 4 where a plurality of illumination amplifier surfaces such as surfaces 440 and 457 may be sequentially selected to reflect (or transmit) different source images to a common receiver element. Still another embodiment may be a planner arrangement such as illustrated in FIG. 6A, where amplifier elements 602–605 may each be provided having a different angle and where each may be selected in sequence to be reflective to reflect different images to a common destination element. Other scanner embodiments may be arranged as concentric squares and circles as illustrated in FIGS. 8B and 8C, wherein each segment may be arranged at a different angular position. Other configurations may be provided such as determined by convenient manufacturing methods to provide a plurality of illumination amplifiers having different angular positions therebetween in accordance with the teachings of the scanner feature of this invention.

A multi-dimensional scanner arrangement may be provided having a two-dimensional angular orientation between a plurality of illumination amplifier elements. In one batch fabricated arrangement, a spherical surface may be provided having facets arranged about the surface of the spherical device having different orientations in two dimensions.

One optical scanner in accordance with the present invention may be characterized as a single photosensor with a plurality of electronically controlled amplifier elements each selecting a particular source or direction for reflecting to the single photosensor. The photosensor and associated electronics may be considered as being time-shared between a plurality of source elements selectable with the illumination amplifier elements.

The scanner feature of the present invention may be usable in place of present well-known scanner arrangements including the rotating mirror associated with a Zerox copy machine, the rotating mirror and photocell arrays associated with optical character recognition systems, a Vidicon and other tube scanners associated with television cameras, flying spot scanners, and other well-known scanning devices.

Scan control may be provided with the relatively simple counter and decoder arrangement of FIG. 12C or may be provided with higher capability electronics such as a digital computer controlled scan. In order to exemplify this feature of the present invention, a simple sequential scan arrangement will be discussed with reference to FIG. 12C. Sequential scanning may be controlled with binary counter 1204 being repetitively sequenced through eight counts under control of clock signal CK. The sequential binary count from counter 1204 may be decoded with decoder 1205 to generate one of eight control signals B0–B7 in response to the three binary encoded signals B, C, and D from counter 1204. Each of the eight control lines from decoder 1205 may be used to control a different amplifier segment of scanner 1200 (FIG. 2A) and a different amplifier level of scanner 1220 (FIG. 2B). For example, decoder output signals B0–B7 may control amplifier segments 1210–1217 respectively of scanner 1200 and may control amplifiers 1230–247 respectively of scanner 1220. As counter 1204 sequences through the binary count, decoder 1205 sequences through the eight control signals B0–B7; wherein the selected control signal from decoder 1205 will cause the related segment of scanner 1200 to become transmissive (operating in the transmissive mode) and will cause the related amplifier of scanner 1220 to become reflective (operating in the reflective mode). Counter 1204 and decoder 1205 may be well-known Texas instruments S/N 7400 integrated circuit logic wherein counter 1204 may be an S/N 7491 counter and decoder 1205 may be a S/N 7445 decoder.

For simplicity of discussion, mutually exclusive control has been described where one and only one segment of scanner 1200 is controlled to be transmissive and one and only one amplifier of scanner 1220 is controlled to be reflective, but many other combinations can be provided. For example, scanning may be random in nature for adaptive scanning or may be selective in nature to select a particular segment or angle without traversing a sequential scan. Further, various combinations of segments and amplifiers may be controlled to be transmissive or reflective.

For further simplicity of discussion, the angular dimensions and resolution of amplifier segments 1210–1217 and amplifiers 1230–1237 are shown in exaggerated form. In other embodiments, the segments of scanner 1200 may have fine angular resolution such as 1024 segments being used instead of the eight segments of the present example. Further, the angles of amplifiers 1230–1237 of scanner 1220 may have greater resolution such as 1024 scanning angles in place of the eight angles of this example still further, the interchangability of the reflective and transmissive modes as discussed above permits the scanners to operate in either the reflective or transmissive mode. For example, scanner 1200 has been discussed for transmissive mode operation and scanner 1220 has been discussed for reflective mode operation, where alternately scanner 1200 may operate in the reflective mode and scanner 1220 may operate in the transmissive mode.

Still further, control may be provided in analog form wherein amplifiers 1210–1217 of scanner 1200 and amplifiers 1230–1237 of scanner 1220 may be controlled to be partially reflective and partially transmissive such as by using the pulse modulated control arrangement discussed with reference to FIG. 2.

Yet further, an analog scan may be provided by implementing continuously variable controls such as discussed in U.S. Pat. No. 3,675,988 to Sorer, which is herein incorporated-by-reference, thereby providing a continuous scan in contrast to the discretely stepped scan discussed with reference to FIGS. 12A–12C.

A closed loop adaptive scanner embodiment will now be discussed with reference to FIG. 1. Command device 127 may be an adaptive command device such as a stored program digital computer or may be other well-known adaptive command devices. Command device 127 generates command signal 126 to the command signal processor 128, as previously discussed with reference to FIG. 1. Control signals 133 to amplifier 104 may control amplifiers 1210–1217 and amplifiers 1230–1237 (FIGS. 12A and 12B), wherein these amplifier elements are included in the general amplifier block 104. Illumination transmitted or reflected to illumination detectors as shown in FIG. 12 corresponds to illumination 110 to sensor 134 (FIG. 1). Sensor signal 114 may be communicated to adaptive device 127 as signals 139 for adaptive control. Command device 127 may command scanning or monitoring with a single amplifier angle and may adaptively change the monitored angle to optimize the feedback signal 139. Adaptive control with feedback to a digital computer is discussed in application Ser. Nos. 134,958 and 135,040 for a machine control system and are equally applicable to the illumination control system of the present invention.

A specific use of the electro-optical chopper of the present invention will now be discussed in detail to exemplify the more general features of the present invention.

Mechanical chopper arrangements are well known in the prior art such as illumination choppers used for startrackers such as the Kollsman Automatic Astro Compass type KS-50-03. Such prior art devices provide a rotating mechanical shutter that permits incident light to be transmitted or blocked as a function of the angular position of the incident light and the phase of the mechanical shutter rotation.

In accordance with the teachings of the present invention, an illumination amplifier chopper may be provided using amplifiers 104 controlled by signals 133 to chop illumination 102 to generate chopped illumination 106. Amplifiers 104 may be arranged with segments having a particular orientation, discussed with the reference to FIG. 12A. Control signals 133 select the various segments in sequence, which may be a clockwise or counter-clockwise sequence as with the mechanical choppers or, in a preferred embodiment, may select the segments in a random access sequence such as may be defined under control of command devices 127 which may include a computer 251.

In a preferred mode of operation, an initial acquisition scan such as a complete clockwise scan using all segments may be performed to initially locate an image. After an image has been located, only segments closely associated with the image location may be scanned in an adaptive manner to increase the duty cycle of the chopped signal and to decrease the re-acquisition time. This adaptive capability provides significant advantages over prior art mechanical chopper arrangements, where mechanical choppers and other sequential devices do not provide selective or random access illumination chopping capabilities. The electronic control arrangement of the present invention permits external illumination to be chopped in almost any desired random order or sequence based upon optimizing the particular system considerations.

In contrast to prior art illumination chopper systems, the system of the present invention provides null seeking capability with a computer contained in command devices 127 (FIGS. 1 and 9B) for commanding the selective chopping of illumination with amplifiers 104 under control of command signals 126 to command signal processors 128 to generate control signals 133 to provide chopped illumination 106. Transducer 134 generates feedback signals 114 to signal processors 116, where computer 251 in command devices 127 is responsive to feedback signals 139 to determine the location of the illumination. Computer 251 and command devices 127 control the system to center the illumination such as by controlling a gimballed startracker to reposition the image in the telescope, as is well known in the art. Computer 251 would continually adjust such a controlled arrangement to center the illumination in response to the chopped feedback signals until incident illumination is centered, indicative of equal feedback signals when each of the illumination amplifier segments 102 were selected by computer 251.

In one embodiment of the scanning arrangement shown in FIG. 12A, digital counter 1204 included in command devices 127 generates binary output signals 1206 included in signals 126 to decoder 1205 included in command signal processor 128. Decoder 1205 decodes binary inputs signals 1206 to generate individual select output signals B0–B7 which sequentially select segments 1210–1217 or 1230–1237 to chop input illumination 102 to generate chopped output illumination 106 to illuminate transducer 134. The output of transducer 134 excites signal condition devices 116 to generate feedback signal 139 such as by loading the output of counter 1204 into the computer when the chopped signal 106 illuminates transducer 134. Therefore, the number loaded into the computer is indicative of the segment of chopper 104 upon which illumination 102 is projected, where the number loaded into the computer is indicative of the direction in which illumination 102 is off from the center 1201 of the chopper.

The number loaded into the computer may be used to identify the off-center condition of illumination 102 to process information, or to control the system, or both in response thereto using well-known prior art arrangements.

Chopper arrangement 1200 is shown in a simplified embodiment in FIG. 12A to exemplify the present invention. It will become obvious from the teachings of the present invention that more sophisticated arrangements may be configured, where the computer may directly or indirectly generate select signals B0–B7 in either a sequential form as described above or in a random access form to select particular segments in order to optimize system considerations.

Further, a computer may receive feedback signal 139 as a discrete input signal as described in the referenced copending applications to identify the segment illuminated by illumination 102. In one embodiment, computer 251 in command device 127 and command signal processor 128 may replace counter 1204 and decoder 1205 to generate select signals B0–B7 in a preferred sequence or in a random manner and may monitor output signal 139 of sensor 134 to determine the off-center direction of illumination 102. In another embodiment, the computer may select a particular segment 1210–1217, then monitor signal 139 to determine the illumination condition, then continue to interrogate the various segments 1210–1217 and, in conjunction with each interrogation, monitor signal 139 to determine the off-center direction of illumination 102. In still another embodiment shown in FIG. 9B, computer 251 may receive feedback signal 139 as a whole number digital signal from an analog-to-digital converter 138 included in feedback signal processor 116 to define the relative amplitude of illumination intensity.

In yet another feedback embodiment discussed with reference to FIG. 12C, sensor 134 (also shown in FIG. 12A) may receive chopped illumination 106 (FIG. 12A) and may generate feedback signal 114 to C-Register 1207 to load output signals 1206 from counter 1204 into C-Register 1207 in response to feedback signal 114. The contents of C-Register 1207, indicative of the angular position of incident illumination 102 (FIG. 12A) may be loaded into computer 251 for control of scanner 1200 and for control of other system operations. Loading of C-Register 1207 and communication between C-Register 1207 and computer 251 is discussed in the referenced applications, particularly in application Ser. No. 291,394.

Mechanical scanners are well known in the art and interfacing thereof may be used to interface the electro-optical scanner of the present invention.

A preferred arrangement for interfacing chopper 1200 with an electronic system such as with a computer will now be discussed with reference to FIGS. 12A and 12C. Chopping of illumination signal 102 to obtain chopped illumination signal 106 provides a phase relationship that determines the direction of offset of illumination 102 from being focused directly on the center 1201 of scanner 1200. Sensor 134 generates output pulse 114 when chopped illumination 106 illuminates sensor 134. This condition occurs when counter 1204 commands the segment that is illuminated by the off-center illumination, which is segment 1210 in the example shown in FIG. 12A, to be transmissive thereby illuminating sensor 134 with chopped illumination 106. Therefore, the state of counter 1204 when sensor 134 detects chopped illumination 106 identifies the segment transmitting the chopped illumination 106 and therefore identifies the direction of the incident illumination 102. The mechanization shown in FIG. 12C can provide feedback to an electronic system where sensor 134 generates output signal 114 when counter 1204 controls the segment having the incident illumination 102 transmitted thereon to be transmissive. Therefore, sensor signal 114 (FIG. 1) may be used to control loading of signals 1206 from counter 1204 into C-register 1207 for storing identification of the segment related to the direction of incident illumination 102. C-register 1207 may then be used as an interface register between scanner 1200 and an electronic system which may include a computer 251 (FIGS. 2C, 9B, and 12C).

The electronic system interface may be better understood relative to the disclosures in the referenced copending applications. For example, the C-register interface with a computer is discussed in detail in application Ser. No. 101,881; particularly with reference to FIG. 13 therein showing C-register 260. Further, a preferred embodiment of the C-register is discussed in application Ser. No. 291,394 particularly with reference to FIG. 7 therein. Said FIG. 7 shows C-register 460 being loaded with input signals 708 in response to load strobes $\overline{DC-7}$ and $\overline{DC-3}$ and the transfer of the loaded information from C-register 460 to A-register 706 in computer 112 as discussed therein, where strobe $\overline{DC-7}$ may be output signal 114 from sensor 134 discussed herein and in application Ser. No. 366,714. Still further, a sequence of control signals may be generated in response to an input signal with the mechanization disclosed in application Ser. No. 302,771; particularly with reference to FIG. 5 therein; wherein input signal 283 is processed with digital electronics to generate a sequence of clear signal 506 and enable signal 508 which may be used to clear and load the C-register; as discussed above for FIG. 7 of application Ser. No. 291,394; in response to the input signal 114 from sensor 134. Alternately, computer 251 may directly monitor output signal 114 of sensor 134 such as with a skip-on-discrete instruction and may directly control transmissivity and reflectivity of segments 1210–1217 such as by using the C-register discussed above as an output register.

An alternate embodiment wherein the computer is included in the feedback loop will now be discussed with reference to FIG. 12D. Computer 251 packs together a combination of one bits and zero bits in the internal A-register, wherein each packed bit corresponds to a different segment 1210–1217 of scanner 1200 and wherein a one state may define transmissivity and a zero state may control reflectivity for the corresponding segments 1210–1217. Such operations may be performed with well-known table lookup and packing operations. Computer 251 may then output the packed discrete word from the A-register to the interface C-register 1207, wherein the packed discrete conditions B0–B7 are stored in C-register 1207 to control segments 1210–1217 of scanner 1200. Computer 251 packs together and outputs a new control word B0–B7 to C-register 1207 for every scan increment such as for each desired change in transmissivity and reflectivity of one or more segments 1210–1217; which may be sequential changes implemented with well-known counting, polling, and/or indexing programming methods. Incident illumination 102 is conditionally transmitted or chopped by scanner 1200 to generate chopped illumination 106 to illuminate sensor 134. Sensor output signal 114 may be sensed directly by computer 251 such as with a skip-on-discrete instruction. Computer 251 may either sequentially scan, randomly scan, or adaptively scan illumination 102 by monitoring feedback signal 114 to identify the direction or other characteristics of incident illumination 102. Therefore, computer 251 in the scanning loop may reduce special purpose electronics and may provide flexibility and adaptive control. A preferred embodiment of such a computer is discussed in application Ser. No. 101,881; where the preferred embodiment includes a read only memory and a scratch pad memory in a micro-computer type configuration.

For simplicity of discussion, illumination signals between element 1224 and scanner 1222 are shown at different angles indicated by signal paths 1240–1247. These signals 1240–1247 inbetween scanner 1222 and generator 1224 may actually be colinear, parallel, or have other such relationships.

A scanner embodiment may be used for display purposes, wherein this scanner inventive feature will now be discussed with reference to FIG. 12B. In this embodiment, element 1223 may be a multi-character display and may be a frosted glass screen or other projection device and element 1224 may be a character generator such as a single liquid crystal character being controlled from well-known digital display electronics. Refresh electronics such as discussed in applications Ser. Nos. 101,881 and 288,247 may be used to display a sequence of characters with character generator 1224. The sequence of characters may be scanned onto element 1223 into sequential locations shown being illuminated by illumination signals 1240–1247. For example, time-shared character generator 1224 may be controlled to repetitively generate a set of eight sequential characters wherein sets of these eight characters may be continuously and repetitively refreshed or generated. As each character is sequentially generated, a related illumination amplifier 1230–1237 may be controlled to project the related character onto element 1223 in the desired position. In a preferred embodiment, each sequential character of the set generated with generator 1224 corresponds to a different scanner element 1230–1237 and therefore a different projection location identified with illumination signals 1240–1247; wherein character generator 1224 and scanner segments 1230–1237 may be correspondingly controlled in the sequential character generation and scanning process. For example, a first character of the set may be generated in combination with the first scanned segment 1230 being selected to project the first character in the set onto the location of project screen 1223 defined by illumination signal 1240. Correspondingly, as each of the set of eight characters is sequentially generated with generator 1224, one of the scanner segments 1230–1237 is selected for the corresponding character. This can be seen with reference to the scan table discussed above, wherein each sequential scan signal B0–B7 may select a different control signal or character to be projected along the appropriate illumination signal path of signal paths 1240–1247 respectively. During the repetitive scan cycle, the B0 control signal or character will always be projected with illumination signal 1240 as controlled with the scan mechanization discussed above relative to FIGS. 12C and 12D. Therefore, scanner 1220 of the present invention may be used to time share a single-character display to provide a multiple-character display; thereby providing a low-cost and efficient multiple-character display.

Display generator 1224 may be a very small display generator such as a miniature liquid crystal display character and operator display 1223 may be a large display such as an audience display. Proper introduction of well-known optics such as magnifying lenses inbetween display generator 1224 and scanner 1222 or inbetween scanner 1222 and screen 1223 may permit use of a small character generator 1224 and a large screen 1223.

Another feature of the present invention illuminates generator 1224 with a high intensity floodlight 1225, where this floodlight is shown illuminating generator 1224 in a transmissive mode but similarly may be used in a reflective mood. High intensity illumination of a small generator 1224 may be used in combination with magnification optics such as magnifying lenses placed inbetween generator 1224 and projection screen 1223 to provide high intensity large screen displays with a miniature character generator 1224 using low power electrical control signals to control or modulate high intensity illumination from floodlight 1225 in an illumination amplifier configuration. Further, generator 1224 may generate other symbols than characters such as a spot of light, a schematic symbol, or other such symbols. In such an embodiment, system 1220 may be used as a photo-plotter or display, wherein element 1223 may be an illumination sensitive medium such as film for permanent recordings, may be a frosted glass screen or a frosted coating for temporary displays, or may be other types of illumination sensitive or projection devices.

Scanners 1200 and 1220 are discussed above as single-dimension scanners for simplicity of illustration. It is herein intended that the teachings discussed with reference to FIG. 12 be interpreted as exemplifying multi-dimensional scanning capability. For example, the angular representations of elements 1230–1237 shown in a single-dimensional configuration may be similarly shown in a multi-dimensional configuration for scanning illumination signals in a plurality of dimensions. For example, linear screen 1223 may be replaced with a two-dimensional screen such as used in a television receiver and the signals may be scanned in various well-known patterns such as a raster scan used in a conventional TV receiver. Alternately, other well-known scans may be used such as radar related scans identified as Palmer scans, A-scans, and B-scans.

Other applications and other embodiments of illumination chopper arrangements will now become obvious to those skilled in the art from the teachings of this invention and from prior art control arrangements used in conjunction with mechanical chopper arrangements.

Illumination Modulators

The various arrangements described in application Ser. No. 366,714 for controlling illumination permits modulation of illumination for communication of information. The illumination amplifier arrangement shown in FIG. 1 may be used to modulate illumination signals for communication of information. Prior art systems modulate illumination by controlling the source such as with optical couplers using electrical signals for controlling a Light Emitting Diode (LED) source and such as with mechanical modulators used in Navy communication devices to flash digital signals between ships. The illumination amplifier arrangement of the present invention permits modulation of illumination signals for communication of information such as modulating source illumination 102 with amplifier 104 to provide modulated illumination 106; where receiver 112 may include a photocell in an optical coupler arrangement or other receiver or the receiver may be an operator visually monitoring modulated optical signals.

Digital modulation of illumination can be provided with logic arrangements as illustrated in FIG. 2A with gates 210 and flip-flops 200 and 213. In addition, well-known digital arrangements may be used to generate pulse code modulation, pulse width modulation, and other digital modulation arrangements. Signals 214 may be used to control illumination amplifiers to digitally modulate illumination signals. Further, a pulse width modulation arrangement is discussed with reference to FIGS. 2B-2D in application Ser. No. 366,714 to provide pulse width control for illumination amplifier devices. Further, as discussed in application Ser. No. 366,714; an analog amplitude control can be provided for illumination amplifiers that are responsive to analog amplitude signals for controlling illumination in response thereto.

Well-known optical coupler arrangements use a LED source and a photocell sensor to provide electrical isolation. In an improved arrangement, illumination amplifier 104 inbetween source 100 and photosensor 134 controls illumination 102 to be modulated under control of signal 133 to transmit illumination 106 conveying the desired information to photosensor 134.

Because of the solid-state characteristics of many source devices such as LEDs and the batch fabricated solid-state characteristics of illumination amplifier 104 and photosensor 134, a batch fabricated coupling arrangement can be provided. As an example, a monolithic array of source elements 100 may be provided using well-known integrated circuit technology and may be provided in combination with illumination amplifier devices in a batch fabricated configuration to control source illumination 102 with amplifier 104. The monolithic structure associated with solid-state source elements such as LEDs is typically a semiconductor wafer and may be passivated with well-known techniques such as silicon dioxide. Illumination amplifiers may be constructed using glass substrates such as glass substrates for liquid crystal devices, where the silicon dioxide passivation provides an illumination amplifier substrate for combining source 100 and amplifier 104 structures in monolithic form. Further, well-known monolithic processes for producing photosensors 134 are also compatible with illumination amplifier technology. Therefore, illumination amplifier 104 may be configured in a batch fabricated monolithic form in conjunction with source 100, or photosensor 134, or both source 100 and photosensor 134.

As a further example, LEDs are packaged as individual components with a batch fabricated lens as part of the incapsulation package. Incorporation of illumination amplifiers as part of the lens structure or as part of the monolithic structure associated with source 100 provides a batch fabricated illumination element that is controllable with the very low levels of electric power.

Camera System Improvements

The camera system of the present invention is discussed in detail in application Ser. No. 366,714; particularly with reference to FIGS. 8-10 therein. Additional improvements are discussed hereinafter.

The camera system of the present invention provides a solid-state arrangement for controlling illumination. This is contrasted to prior art arrangements such as the well-known polaroid cameras which use electromechanical arrangements such as motors, mechanical shutters, and mechanical apertures for controlling illumination. The solid-state illumination control arrangements of the present invention provide advantages such as low cost, high reliability, low power, extensive flexibility, and others, and further permits batch fabrication.

One embodiment of an aperture arrangement will now be discussed with reference to FIG. 8C. Aperture 820C includes concentric segments 826C, 828C, and 830C. Only three segments will be illustrated for simplicity to exemplify the present invention. In a first embodiment; aperture segments 826C, 828C, and 830C may be controlled to be either transmissive or reflective for three aperture conditions; where segment 830C is controlled to be transmissive and segments 828C and 826C are controlled to be reflective for a first condition, segments 830C and 828C are controlled to be transmissive and segment 826C is controlled to be reflective for a second condition, and all segments 830C, 828C, and 826C are controlled to be transmissive for a third condition. In a second embodiment; aperture segments 830C, 828C, and 826C may all be controlled to be reflective or may all be controlled to be transmissive in various combinations such as segments 826C, 828C, and 830C may have one and only one segment transmissive, may have any pair of segments transmissive, or may have all segments transmissive for seven aperture states. In a third embodiment; segments 826C, 828C, and 830C may be controlled in analog fashion to be partially or totally reflective and/or transmissive to provide a virtually unlimited combination of aperture conditions.

In many applications, it may be preferred to concentrate illumination transmission (or reflection) in a particular portion of the illumination amplifier. For example, a lens introduces greater errors such as distortion at the outer periphery, wherein it is desired to concentrate illumination transmission near the center of the lens. Therefore, in a preferred embodiment of a shutter control in accordance with the present invention, it may be desirable to control shutter 820C to minimize transmissivity of the outer segments. For example, segment 830C may be controlled to become transmissive in analog fashion until it is completely transmissive before the next segment 828C is controlled to be even partially transmissive. When segment 830C becomes fully transmissive, segment 828C will then be controlled to become transmissive, and similarly when segment 828C becomes fully transmissive, segment 826C will then be controlled to become transmissive; thereby maximizing the reflectivity of the outermost segments and relying on control with the innermost segments until they become "saturated" or otherwise limiting.

In one control embodiment, an illumination servo arrangement as described in application Ser. No. 366,714 may be used to control aperture 820C to generate an illumination control signal related to a difference between the desired and the actual illumination transmitted through aperture 820C. A threshold detector would be used to control each of segments 828C and 826C; wherein an error signal below a first threshold would control only segment 830C, an error signal greater than the first threshold but less than a second threshold would be used to control segment 828C with segment 830C being fully transmissive due to the large error signal and an error signal greater than the second threshold would be used to control segment 826C with segments 828C and 830C being fully transmissive due to the large error signal. Such multi-segment control is similar to the use of multi-speed resolver control used in servo systems. In such systems, the one-out-of-three resolvers for control is selected based upon the error signal magnitude and threshold considerations. This well-known multi-speed resolver control concept can be used to provide the multi-segment control for the electro-optical resolver as discussed above.

A method for implementing electro-optical shutter and aperture arrangements will now be discussed for a lens and a liquid crystal device. Aperture and shutter arrangement 820C may be composed of liquid crystal material contained between lens elements having electrodes corresponding to segments 826C, 828C, and 830C provided thereon. Common prior art lens arrangements have combinations of concave and convex surfaces and provide precise mating therebetween. The inter-lens gap or space between lens elements may be filled with liquid crystal material therein and electrodes may be plated on the lens surfaces to provide batch fabricated lens, aperture, and shutter arrangements. One batch fabricated embodiment is illustrated in FIG. 4 of application Ser. No. 366,714 in a preferred embodiment, inter-element gap 436 may have curved surfaces and devices 434, 402, 403, and 435 may be shaped in the form of concave lenses, convex lenses, or various combinations of concave and convex lenses to provide mating therebetween and to provide inter-lens gaps such as gap 436. Gap 436 may be filled with liquid crystal material which may have electrodes thereon to control the transmissivity and reflectivity of the lenses for shutter control, aperture control, filter control, and combinations thereof. The shaping of elements such as elements 434, 402, 403, and 435 into lenses is well known in the optical art such as with lens grinding methods.

Batch fabricated devices 434 and 402 may be lens devices with mating surfaces being concave and convex respectively and having gap 436 filled with liquid crystal material and having electrodes formed on such lens surfaces. In one embodiment, the concave and convex lens may be constructed so that they do not match perfectly but provide a void at interface 436 when placed in contact therebetween. Therefore, gap 436 containing liquid crystal material may be formed as a natural gap by the mating of devices 434 and 402.

Movie Camera System

In accordance with still another feature of the present invention, an electronic control system is provided for a movie camera embodiment of the photographic camera system described herein and described in application Ser. No. 366,714 having illumination amplifier devices for control of movie film exposure. This movie camera system is illustrative of the more general features of the present invention which may be applied to other illumination system arrangements for exposure of an illumination sensitive medium with dynamic exposure operations such as multiple exposures synchronized with film motion as in a movie camera system.

Movie cameras are in wide use, where prior art movie camera controls are implemented with mechanical aperture, shutter, and control arrangements. Mechanical devices provide for film motion and for control of a shutter using sprocket drives and mechanical devices to provide synchronization therebetween. An improved arrangement will be discussed for controlling illumination of the film and providing synchronization between the film and the shutter with electronic devices.

A movie camera control arrangement will now be described with reference to FIG. 1. An illumination sensitive medium 130 such as movie film may be exposed with illumination 108 controlled by illumination amplifier 104. Amplifier 104 controls illumination in response to control signals 133. Input illumination may be natural illumination or may be artificial illumination, where artificial illumination may be generated with source 100 which may be excited with signal 132 or may be excited with raw excitation. Command device 127 and command signal processor 128 may be arrangements discussed in application Ser. No. 366,714 and, in a preferred embodiment, may be stored program digital computer 251 which may have integrated circuit memory arrangements as further discussed in application Ser. No. 101,881. Film 130 may be transported past illumination 108 such as with well-known sprocket drives or other known drive arrangements. Input illumination may be controlled by amplifier 104 to expose film 130 when amplifier 104 is transmissive and not to expose film 130 when amplifier 104 is reflective as described in application Ser. No. 366,714 for an illumination amplifier shutter. Control of amplifier 104 to be sequentially transmissive and reflective has been described in application Ser. No. 366,714 under Flasher Control which may be used to flash illumination 104 to expose film 130 by controlling amplifier 104 with signals 133.

Synchronization of exposures and film motion may be provided with prior art mechanical or electrical arrangements. In one embodiment, synchronization may be provided electronically, where electronic signals 133 are used to control illumination amplifiers 104 in synchronizm with motion of film 130. Transducers for generating electrical signals in response to mechanical motion are well known in the art. In one embodiment, a switch arrangement may be controlled with a cam for opening and closing a switch in response to the rotation of a film sprocket wheel, where the switch may provide feedback signals to command devices 127 or command signal processor 128 to synchronize control of amplifiers 104 for generating flashing illumination 106 with signals 133. In another embodiment, a feedback signal may be used to control the command device 127 or signal processor 128; which may include computer 251, flip-flops 200 or 213, or other command devices For example the above-mentioned sprocket synchronized switch may generate a pulse at the start of exposure and a pulse at the completion of exposure for clocking flip-flop 213 to provide shutter signal 214A to control amplifier 104 to be sequentially reflective and transmissive. Switch signal processing circuits such as for switch debounce are well known in the art. In still another embodiment, photocell 134 may sense illumination being chopped by mechanical motion of the film drive arrangement to generate output signals 114 and feedback signals 120, 124, and 139 to synchronize flasher operation. Further, synchronization of print hammer actuation with position of a rotating print drum is similar to synchronization of electro-optical shutter operations with a rotating film sprocket drive; wherein such print devices are well known and are exemplified by the line printer products of Data Products Corporation of Woodland Hills, Calif.; and wherein the implementation thereof may be used for the exposure control of the present invention. Other control arrangements will now become obvious to those skilled in the art.

A detailed description of a photographic camera is presented in application Ser. No. 366,714 with reference to FIGS. 9A–9C, where the arrangements provided therein for the generalized photographic camera may also be used for a movie camera embodiment.

Computer Control Arrangement

A preferred illumination control embodiment uses computer 251 (FIGS. 2C and 9B) for generating command signals 126 to control source 100 with signal 132 generating controlled illumination 102 or to control amplifier 104 with signal 133 generating controlled illumination 106 or combinations thereof. Particular advantages are achieved by controlling amplifier 104 directly from computer 251 when computer 251 is a monolithic data processor as described in detail in the referenced copending applications, particularly in application Ser. No. 101,881. Such a monolithic data processor is low in cost and small in size, but provides output signals that can be used to directly excite illumination amplifiers of large size and having complex arrays of segments; where output signals from such a monolithic data processor implemented with processes such as MOS-FET integrated circuits have sufficient voltage and power levels to directly excite illumination amplifiers. In one embodiment, flip-flops 200 and 213 (FIG. 2A) may be controlled by generating clocks 208 and 215 respectively with discrete output instructions from computer 251 such as described in detail in the referenced applications. As further described in the referenced applications, toggling of flip-flops such as flip-flops 200 and 213 may be performed with a duty cycle related to a desired illumination parameter, thereby providing pulse width modulated signals on lines 204 and 212A to control illumination amplifiers in an analog fashion with signals 214 and 220, as described in application Ser. No. 366,714. In an alternate arrangement, pulse width modulated signals and phase related signals may be provided directly from a stored program digital computer such as computer 251 as described in application Ser. No. 366,714 under Analog Excitation and in the other referenced applications.

Traffic Light Control

As discussed in application Ser. No. 366,714; illumination amplifiers may be used to provide an improved traffic light system. Illumination amplifier 104 may be used to control illumination 102 from source 100 to provide output illumination 106, which may be colored illumination 668–670 or 676 as described for color illumination control illumination 650. Traffic light command and control signals 126,132 and 133 may be provided with command device 127 and command signal processor 128 respectively. In a preferred embodiment, devices 127 and 128 include a stored program digital computer of the general purpose variety such as computer 251 (FIGS. 2C and 9B), where a preferred embodiment of computer 251 is described herein under Computer Control Arrangement.

In a preferred embodiment, computer 251 may be a monolithic computer and may include an integrated circuit memory such as an integrated circuit read only memory for program storage or an integrated circuit alterable memory for intermediate parameter storage or both a read only memory and an alterable memory. The combination of such an integrated circuit or monolithic computer and illumination amplifier devices are further described in application Ser. No. 366,714. In an alternate embodiment, devices 127 and 128 may include special purpose arrangements.

Control of traffic lights can be provided using various illumination amplifier arrangements described herein and in application Ser. No. 366,714. As an example, amplifiers 104 may be controlled with signals 133 for flashing as described in application Ser. No. 366,714; where a flashing arrangement provides for attracting the attention of motorists associated with a change in traffic light color, a traffic warning, or other such purpose. As another example, traffic lights may be controlled in intensity as discussed in application Ser. No. 366,714 for the Dimmer Control; where a dimmer control may have a photocell transducer for sensing external illumination 140 such as sunlight or headlights or for sensing source illumination 106 to maintain constant illumination or, in a servo arrangement, for sensing controlled illumination 106. As yet another example, a combination of colors may be provided as discussed in application Ser. No. 366,714 to provide various shades and intensities of color for greater flexibility in traffic control.

Operator Panel

The teachings of the present invention may be exemplified with an operator panel to provide interaction between an operator and a system. A preferred embodiment of an operator panel is described in detail in application Ser. No. 101,881 and in continuations-in-part derived therefrom. Illumination amplifier devices described herein may be used in the operator panel of that application, where features such as the flat plane configuration, discrete illumination device, light pen arrangement, illuminated switch, color control, lamp control, dimmer control and flasher control described in application Ser. No. 366,714 may be used in the operator panel of application Ser. No. 101,881.

In another embodiment, the teachings of this invention may be applied to the dashboard of a vehicle such as an automobile; where an automobile dashboard will be described herein to exemplify the operator panel features of the present invention. Further, the teachings of the present invention are equally applicable to other panels for operator interaction as exemplified by the dashboard of the following description.

Operator panels in the prior art may have illumination intensity controls such as a panel light dimmer control in prior art automobiles. Such an arrangement embodies a potentiometer for reducing excitation to the illumination source such as dashboard bulbs for source illumination control. Use of illumination amplifier display elements in accordance with the present invention permits intensity to be controlled electronically using an illumination amplifier such as with excitation signal 133 to amplifier 104, using only low power and providing other advantages over source illumination control as discussed in application Ser. No. 366,714.

Flashing display elements consistent with the flasher control feature of the present invention (discussed in application Ser. No. 366,714) improves operator interaction by rapidly drawing attention to the flashing indicator.

Colored displays provide improved human-factor considerations that are well known in the art. The color control features of the present invention can be implemented as colored display elements to enhance operator interaction. Further, a colored display that provides a color that changes in intensity, hue, or other characteristic as a function of a controlling parameter will enhance operator interaction. For example, a display of engine temperature or oil pressure that varies from green through red as a function of the temperature parameter or pressure parameter respectively will provide an analog indication of the controlling parameter, where the colored display enhances human-factor considerations. Further, a velocity display may be provided that changes color with the vehicle velocity. Such colored displays may change color either continuously or as a function of transition through a threshold condition and may also provide a flashing display which may be a flashing colored display when a particular condition such as a warning condition of high temperature, low pressure, or high speed is encountered.

A display of a plurality of characters such as numeric characters or alpha-numeric characters as discussed in application Ser. No. 101,881 may be provided in the dashboard of the present invention. Such character displays may be the segment displays of application Ser. No. 101,881 and may be refreshable displays controlled in the manner described in that application. Such character displays may provide a digital readout of operating conditions such as a digital display of velocity in place of or in addition to the conventional analog speedometer display and may further be a switchable display such as described in application Ser. No. 101,881, where a plurality of operating parameters may be displayed such as selected by the operator with a selector switch.

In a preferred embodiment, a computer such as described in application Ser. No. 101,881 controls the vehicle and the dashboard in the same manner described for the numerical control system of application Ser. No. 101,881 for controlling a machine. As discussed in application Ser. No. 101,881 for manual data input in the keyboard mode, the vehicle dashboard of the present invention permits an operator to provide various input controls such as velocity, acceleration and deceleration ramps, vehicle path of travel, and control of various vehicle operations such as described in application Ser. No. 291,394.

The audionic clock of application Ser. No. 325,933 may be provided with the system of the present application for display of time information with the above-disclosed character display to provide time information. Such a clock embodiment may be inherent in the system of this invention, where the computer has inherent capability to provide time information and the display for such time information may already be available on the operator panel with the character display.

It will become obvious from the teachings herein that the computer system arrangement described in the co-pending patent applications is equally applicable to the control of an automobile as it is to control of machine tools described therein. The control of direction, velocity, machine operations, and interaction with an operator described for a machine control system is directly applicable to the control of a vehicle such as an automobile and machine control arrangements described therein are intended to be applied to an automobile herein.

The Discrete Illumination Device described in application Ser. No. 366,714 may be used for displaying the vehicular conditions associated with the automobile dashboard of the present invention.

The audionic system of application Ser. No. 325,933 provides a preferred embodiment of operator interaction for control of a vehicle such as an automobile and in a preferred embodiment is used in conbination with the control and display arrangement for the automobile dashboard.

Improved Slide Projector

Another feature of the present invention provides an arrangement to blank out the objectionable illumination pulse introduced when changing slides in a slide projector. Prior art slide projectors such as the Kodak Carousel 35 mm slide projector have illumination masks for static slide projection so that only illumination transmitted through the slide is projected on the screen, thereby eliminating other light paths which could project distracting high intensity illumination. Unfortunately, during slide change operations, high intensity projection illumination is permitted to leak into the projection optics and is projected on the screen. This high intensity leakage illumination is distracting and disturbing to an audience during slide change operations.

In accordance with the instant inventive feature, slide projector illumination may be blanked-out during slide change operations to prevent projection of high intensity illumination during slide changing. Illumination blanking may be achieved by turning off the lamp, by introducing a mechanical shutter, or by introducing an electro-optical shutter.

In a preferred embodiment, the electro-optical shutter of the present invention may be used to blank slide changing leakage illumination. Well-known slide projectors receive a slide change signal such as from a remote slide change switch closure. This slide change signal can also be used to turn off the lamp or activate the shutter. In one embodiment, the slide change switch may be a well-known multiple-pole switch wherein the extra switch pole may be used to perform the blanking function such as with lamp turn-off or with shutter activation. Alternately, the slide change mechanism internal to the slide projector may include a switch to control the blanking operation during the slide change operation of the mechanism. Many other blanking control arrangements will become obvious from the teachings herein.

In an alternate embodiment, a mechanical shutter arrangement may be constructed as part of the slide change mechanism wherein the slide change mechanism may include opaque shutter portions that minimize illumination leakage into the projection optics.

It has been found that the above-discussed slide change illumination pulse is disturbing to an audience because of the high intensity compared with normal slide viewing and that a lower intensity slide change pulse would reduce such disturbance. Therefore, the slide change blanking operation need not provide total illumination blanking but may provide merely reduction in illumination intensity such as with a partially transmissive shutter or a partially de-energized lamp.

Segment Arrays.

Illumination control has been described herein relative to illumination amplifier areas having desired shapes. In one embodiment of illumination control devices in accordance with the present invention, illumination amplifier devices are arranged having an array of miniature segments 1300 (FIG. 13) which will herein be described as micro-segments over an area, where illumination control characteristics of that area may be defined as a sum or an integral of the effects of a multitude of micro-segments controlled individually or as groups of micro-segments. In one embodiment, the micro-segments may be similar to the dot patterns associated with the printing art and known as screened or half-tone arrays of dots. It is well known to those skilled in the printing art that an array of dots in a screened configuration provides an image having the combined effect of a plurality of the dots in a particular area to provide shades of grey or shades of color for the printing process. In a manner analogous to the use of screened printing concepts, an array of micro-segments can be controlled to transmit and reflect illumination; wherein the characteristics of the controlled illumination 108 is related to the combined effects of multitudes of micro-segments in a particular area 1300.

In one embodiment, control of illumination intensity or color or both may be provided with a plurality of sets of micro-segments wherein the illumination amplifier device contains micro-segments from each set interspersed together. For simplicity of discussion, two sets of interspersed micro-segments will be considered. It may further be assumed that a first set of micro-segments 1310 shown shaded covers one-third of the illumination amplifier area 1300 and a second set of micro-segments 1312 shown non-shaded covers the other two-thirds of the illumination amplifier area. When both sets 1310 and 1312 are controlled to be transmissive, all of illumination 102 will be transmitted as illumination 108 and no illumination will be reflected as illumination 110o Similarly, when the first set is excited to be transmissive and the second set is excited to be reflective, one-third of illumination 102 will be transmitted as illumination 108 and two-thirds of illumination 102 will be reflected as illumination 110. When both sets are excited to be reflective, substantially all illumination 102 will be reflected as illumination 110. Therefore, two sets of interspersed micro-segments may be used to provide four states of illumination from full transmissivity to full reflectivity. Further, a larger number of sets of micro-segments can be provided to control the transmitted and reflected illumination, where digital control of sets of micro-segments can provide variations in transmitted and reflected illumination intensity. Therefore, a form of analog control of illumination intensity can be provided by digital control of a plurality of sets of micro-segments. Still further, the micro-segments may have different shapes and different dimensions and sets of micro-segments may be related to different densities such as with different size micro-segments and different quantities of micro-segments, where the embodiment described above can be implemented having the second set of micro-segments providing twice the density either with twice as many of the same size micro-segments or with the same quantities of micro-segments being twice as large as those of the first set or other combinations of size and quantity. Further, micro-segment size and quantity may be determined and may be intermixed in combinations and arrangements to meet the special requirements of the particular application.

From the above discussion, it can be seen that the net effect of an illumination amplifier arrangement may be controlled to provide variations in intensity, in color, or in other characteristics using only digital control of micro-segments. Further, micro-segments can also be controlled with analog excitation to provide additional flexibility for illumination control. Still further, micro-segments can be provided having different color characteristics such as described for color control in application Ser. No. 366,714 to provide color patterns such as is well known in the printing field with color screened type printing techniques.

Yet further, arrays of micro-segments or individual micro-segments can be selected with coincident select excitation to provide the desired illumination control. Such an arrangement may be used for a display such as discussed herein and in application Ser. No. 366,714 for the Operator Panel and the Audience Display System or may be used for arrangements such as for a television receiver. Color television receivers are well known in the art having dot patterns of colored phosphor arranged on a screen and selected with an electron beam scanning the phosphor pattern. A solid state television display may be provided with micro-segments of illumination amplifier devices either individually selectable with a linear select arrangement or, for greater economy, selectable with a multiple-dimensional select arrangement such as a two dimensional or coincidence selection arrangement. In such a television display system, arrays of micro-segments may comprise a set of three micro-segments each having a different color such as with phosphorous segments on a color television tube and using the color control concepts described in application Ser. No. 366,714 under Color Control and applied to the micro-segment configuration. Therefore, individual control of each of three colored micro-segments associated with each set of micro-segments may provide the intensity of the three primary colors, thereby yielding the equivalent of a spot having a color related to the combination of the intensities of the three colors of that set of micro-segments as described in application Ser. No. 366,714 under Audience Display System. Still further, sequential selection of each set of three micro-segments will provide the equivalent of the roster scan associated with well-known color television sets.

The above-mentioned display system having sets of micro-segments may be used for black and white television sets, color television sets, and general display systems such as described in application Ser. No. 366,714 under Audience Display System.

Multiple Electrode Logic

The present invention has been described for simplicity using a pair of electrodes providing an electric field therebetween. One feature of this invention provides a plurality of electrodes which may be a quantity greater than two electrodes each having a different control signal for excitation for providing greater control flexibility. For simplicity, this arrangement having a plurality of control signals will be described as summation of electrostatic fields such as with a liquid crystal device. It is herein intended that such an arrangement exemplify more generalized inventive features wherein a plurality of electrodes each have a different control signal and that at least one return electrode be provided as may be required for control of the illumination amplifier from said plurality of electrical control signals.

One embodiment of the multiple control feature of the present invention will be described with respect to FIG. 8B, where a plurality of electrodes 826, 827, and 830 are provided on one side of the electro-optical material in conjunction with a common electrode on the opposite side of the illumination amplifier material, wherein the electrostatic field between control electrodes 826,828, and 830 and the common electrode may be defined with well-known electrostatic theory such as described in the textbook Electromagnetic Fields and Waves by Ramo and Whinnery. Any number of control electrodes may be provided wherein the combination of excitation fields, the magnitudes of excitation fields, and other such characteristics define the total excitation field for controlling the illumination amplifier material such as the liquid crystal material. The net effect of a plurality of signals and fields is related to the summation of the excitation signals, the geometry of the electrodes, the geometry of the illumination amplifier structure, and other such considerations that can be analyzed and designed with such well-known electrical field theory.

Figure 11:
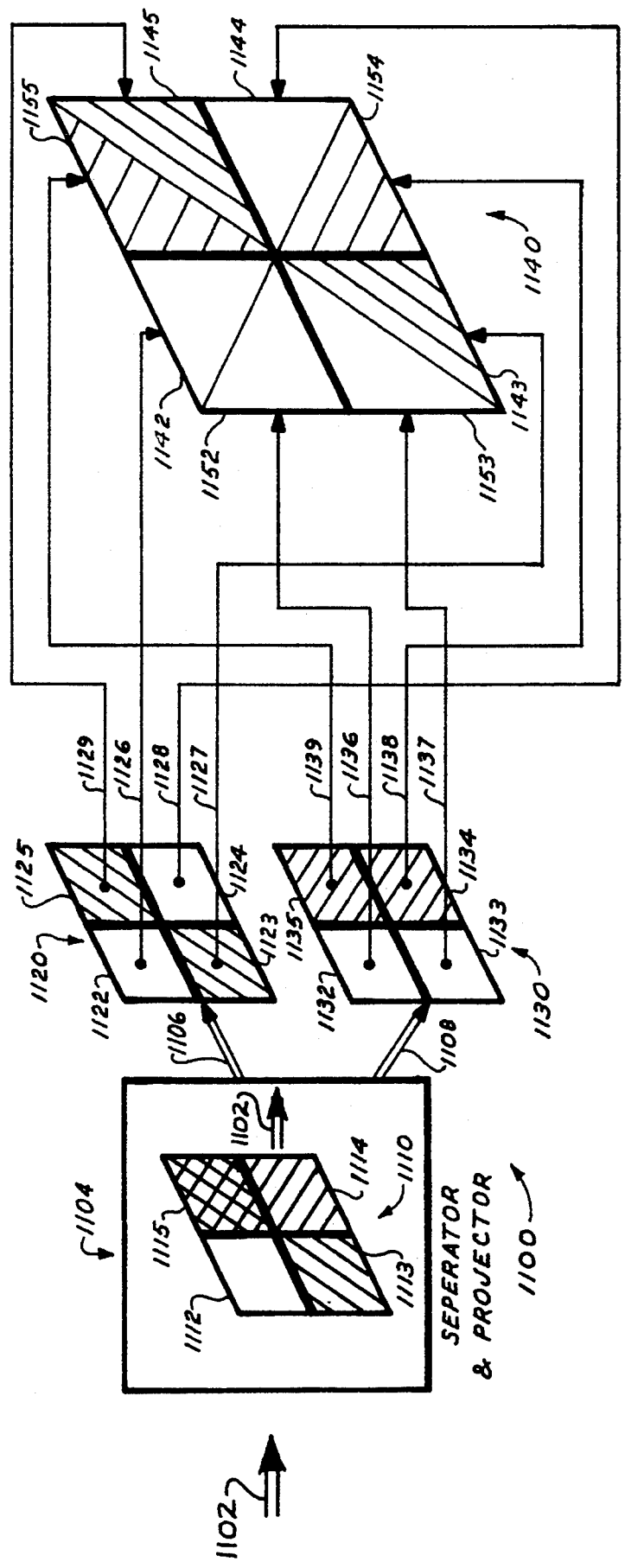
FIG. 11 is a schematic and block diagram illustrating a display system in accordance with the present invention.

The plurality of electrodes illustrated in FIG. 8B is merely exemplary of the general features of the present invention, where the electrodes may be shaped, positioned, and oriented therebetween to provide the desired field pattern and where said plurality of electrodes may be square electrodes within square electrodes as illustrated in FIG. 8B, concentric circular electrodes as illustrated in FIG. 8C, geometric patterns of electrodes as illustrated in FIG. 8A, electrode patterns as illustrated in FIG. 11, micro-segment electrodes interspersed therebetween as described with reference to FIG. 13 and other patterns of electrodes to provide the desired fields for excitation.

In one embodiment, a pair of electrodes may be interspersed so that the field pattern of either electrode can excite the liquid crystal material to be reflective and the absence of excitation from both electrodes will render the liquid crystal material to be transmissive. This arrangement is equivalent to a logical OR gate, where excitation by either one or by both electrodes will control the amplifier to be reflective and where excitation on neither electrode will control the amplifier to be transmissive. In a complement form, a logical AND gate may be provided with complement-excitation (non-excitation) on both electrodes to provide transmissivity, but the absence of complement-excitation (non-excitation) on either electrode will provide reflectivity.

In yet another embodiment, the two control electrodes may have inverse excitation such as positive and negative DC fields or in-phase and out-of-phase AC excitation; where excitation on a first control electrode may provide reflectivity, excitation on neither electrode may provide transmissivity, and excitation on both electrodes may provide a cancellation effect equivalent to the non-excitation state thereby providing transmissivity; thereby providing an A·B̄ logical operation.

The above-described arrangement may use analog excitation. In one such embodiment, excitation from a plurality of electrodes may be summed either in combinations of inverted and non-inverted forms to provide addition and subtraction with addition and subtraction of fields respectively based upon the related excitation magnitudes. Various types of analog excitations such as analog amplitude excitation, pulse modulated excitation, combinations of analog amplitude and pulse modulated excitation, and other such forms of excitation may be provided for the plurality of control electrodes feature of the present invention.

Control, arithmetic, logical, and other operations may be provided such as with the geometry of the electrodes, the inter-relation of the electrodes, and other such design parameters. For example, a first electrode may be provided for primary excitation and a second electrode may be provided having a geometric relationship with said first electrode to provide fringe fields that are a function of the geometry of the electrode relationships, wherein the effect of the second electrode may provide a non-linear control, mathematical, or digital relationship. Such non-linear relationships may be logarithmic, exponential, geometric, and other desired functions of excitation.

A still further feature of the present invention may provide a greater number of electrodes such as 3 electrodes, 4 electrodes, or 5 electrodes to provide combinations of the operations described above. In one example, digital excitation for a first electrode may provide an enable and disable control operation, bias excitation for a second electrode may provide bias control related to a predetermined level, a third electrode may be excited with a mathematical control function, a fourth electrode may be excited with a non-linear function, and additional electrodes may be used to perform other such functions.

Fringe Control

The electric fields and waves art such as described in the textbook Electromagnetic Fields and Waves by Ramo and Whinnery show that the fields outside of the electrode area may provide a fringe field affect. Particular advantage may be achieved with fringe fields when used with liquid crystal devices, exemplary of a general inventive feature having electrodes offset therebetween to provide fringe fields therebetween for excitation of liquid crystal material to exemplify this inventive feature.

A simplified description of the fringe control inventive feature will now be provided with reference to FIG. 11. For simplicity of discussion, it will be assumed that each segment 1142–1145 and 1152–1155 has a corresponding electrode thereunder; colocated, similarly shaped and designated with an A symbol. For example, segment 1144 is assumed to be located directly above and on the other side of the controlled liquid crystal material of a corresponding similarly shaped electrode 1144A. Excitation of electrode 1144 and return electrode 1144A directly thereunder provides a controllable segment shaped as segment 1144. Excitation of segment 1145 and return segment 1145A directly thereunder provides a controllable segment shaped as segment 1145 and further provides a fringe pattern being most intense at the transition between segments 1144 and 1145 and may vary in intensity such as from the center of arrangement 1140 outward to the right therefrom. Similarly, intensity may decrease in relation to the distance from the intersection of segments 1144 and 1145 and may vary as a function of the distance from the center of arrangement 1140. One analysis of the intensity may be made from well-known field theory, where the intensity of the field may control intensity of the reflectivity or transmissivity of the illumination amplifier device.

From the above description, it can be seen that complex patterns of intensities can be provided by excitation and return electrode shapes and positions therebetween. Further excitation of a plurality of electrodes such as electrodes 1142–1145 and 1152–1155 and having corresponding return electrodes 1142A–1145A and 1152A–1155A thereunder can selectively provide complex field arrangements therebetween for providing different geometric patterns End intensities of illumination amplifier action.

The term fringe arrangement is herein intended to mean control of illumination amplifier devices having offset, or non-orthognal, or skewed, or other such relationships and in particular offset electrodes for providing non-perpendicular electrostatic fields therebetween for controlling illumination amplifier devices.

Still further, such offset arrangements may be partially offset, where segments 1144A and 1145A together may define a return electrode and segments 1144 and 1145 together may define an excitation electrode; where segment 1144 thereby defines the common area or superimposed area of return electrode 1144A and 1145A and excitation electrodes 1144 and 1145 and segments 1145 and 1154 thereby define offset portions of the electrodes such as for fringe effects. In one embodiment, common segment 1144 may be larger than segments 1145 and 1154 and therefore segment 1144 may provide the primary illumination control with fringe segments 1145 and 1154 providing only secondary illumination control such as edge or fringe effects, possibly for a soft glow area around the edge of display segments. In still other embodiments, fringe segments 1145 and 1154 may be larger than segment 1144 and therefore segments 1145 and 1154 may provide the primary illumination control.

Integrated Electro-Optic Devices

Many features of the present invention are directed to batch-fabricated or integrated illumination processing devices. For example, a batch fabricated (or integrated) illumination processor is discussed in application Ser. No. 366,714 with reference to FIG. 4. Because illumination amplifier technology such as using liquid crystal material is associated with an illumination transmission medium such as glass, a high degree of integration can be achieved. For example, the inter-lens interface between a plurality of lens elements in a compound lens device is an ideal environment for introducing a liquid crystal aperture, shutter, modulator, and/or other liquid crystal illumination processing devices. Such integrated or batch fabricated implementation is particularly meaningful in the presence of the general industrial belief that such integration is ultimately possible but is not presently practical, This is demonstrated in the article Integrated Electronics: 1973-1975 by Cunningham in the June 1975 issue of Electro-Optical Systems Design. For example, fiber optic transmission mediums provide excellent structure for liquid crystal devices as discussed herein. As discussed herein for glass-type transmission medium, many optical processing devices similar to glass can provide ideal structure for liquid crystal devices. For example, many optical processing devices are made of semiconductor material such as germanium and silicon. These materials are very similar to glass and therefore can provide an excellent structure for liquid crystal devices similar to the well-known use of glass. For example, liquid crystal material can be provided inbetween silicon wafers or silicon dice and liquid crystal electrodes can be provided on the silicon surfaces with well-known photo-chemical techniques as used in the manufacture of integrated circuits. Therefore, important advantages can be achieved by using electro-optical materials in combination with semiconductor materials.

In one embodiment, liquid crystal material may be used in conjunction with a silicon die for selectively illuminating silicon areas such as for photo-diode and photo-transistor control. The photo-diodes and photo-transistors can be readily implemented on the silicon die with well-known photo-lithographic integrated circuit techniques and the metalized electrodes can be implemented with well-known deposition and etching techniques to provide a batch fabricated or integrated electro-optical device and sensor device. This example can be better understood with reference to FIG. 4, where element 435 may be a transmission or processing medium such as glass, element 404 may be a photo-detector array such as having silicon photo-transistors 426, and liquid crystal material may be provided in the inter-device gap 422 with well-known techniques as if devices 435 and 404 were conventional glass substrates for liquid crystal displays. Illumination sensed by photo-detectors 426 may be controlled with the illumination amplifiers in gap 422 or with the other batch fabricated illumination amplifiers described with reference to FIG. 4 such as amplifier 476. Illumination may be controlled with illumination amplifiers using the digital and analog processing techniques discussed with reference to FIG. 3. Further, the second substrate 435 may be other than a mere illumination transmission substrate but may be a batch fabricated illumination source such as having a plurality of light emitting diodes (LEDs). This would provide a batch fabricated system having illumination sources, controls, and detectors; wherein substrate 435 may provide illumination sources such as LEDs, gap 422 may provide illumination amplifier control such as with liquid crystal material, and substrate 404 may provide illumination sensors 426 all in a batch fabricated or integrated form.

Particular advantage can be achieved by using illumination amplifier devices such as liquid crystals in conjunction with semiconductor or monolithic source devices and sensor devices and particularly in a batch fabricated arrangement. For example, many source devices such as light-emitting diodes and electro-luminescent devices and many sensors such as photo-transistors, photoresistors, and photocells are constructed with monolithic processes and may be protected with passivation techniques sometimes known as glassivation, as discussed in the textbook Integrated Circuits by Warner and Fordemwalt. Passivation consists of a substrate coating placed over the monolithic components for protection and may be usable as a substrate for an illumination amplifier device. The passivation coating may be processed such as with grinding, depositing, etching, etc to form liquid crystal substrates and may have another substrate placed in conjunction therewith with liquid crystal material placed therebetween.

Batch fabricated components may consist of illumination source 100 or illumination receiver 112 or both source 100 and receiver 112 constructed in conjunction with amplifier 104; where the source may generate transmitted illumination 102 being incident upon amplifier 104 on the same substrate or illumination 102 may be incident from external sources onto amplifier 104 for control of illumination 106 being incident upon receiver 112 in the monolithic structure. Still further, source 100 and receiver 112 may both be constructed on the monolithic device in conjunction with amplifier 104 where source illumination 102 may be incident upon amplifier 104 on the surface and reflected to receiver 112 on the same substrate as reflected illumination 106.

The batch fabricated nature of the combined structure such as a semiconductor and liquid crystal device will now be described with reference to FIG. 4. Sensor 404 may have one or more elements 426 and may have a passivation coating on surface at gap 422 for protection. Another substrate 425 may be placed in conjunction with sensors 404 and the space therebetween 422 may be constructed with metalized electrodes and filled with illumination amplifier material. The surfaces of devices 435 and 404 may be processed with deposition and etching methods to selectively form conductors. In another configuration, device 434 may be a source device such as having light-emitting diodes constructed therein and having surface mated with substrate 402 which may be a passivated surface and providing interface 436 which may be constructed with electrodes and being filled with illumination amplifier material such as liquid crystal material. Although surfaces at interfaces 436 and 422 may be shown in irregular form, grinding and other such processes may be used to provide the desired interface surface geometry such as with lens curvatures. In one embodiment, source and transducer elements may be constructed on the same substrate and having an illumination amplifier constructed on the surface thereof.

Further, particular advantages can be obtained by using an illumination amplifier in conjunction with a light-emitting diode (LED) or with a phototransistor or other such semiconductor source and sensor devices. Still further advantage can be obtained by providing this combination as a batch fabricated combination.

Further, many other devices permit illumination amplifier and optical device integration. For example, various types of modulators such as crystal modulators are used in conjunction with shutters, apertures, and mirrors for controlling and modulating illumination. The use of electro-optical illumination amplifier devices such as liquid crystal devices in conjunction with such crystal modulators such as a Pockel cell permit the combined functions of high frequency modulation and low frequency shutter and aperture control to be achieved. The implementation of the liquid crystal material in combination with the modulator device is similar to that discussed herein for integration of liquid crystal material with lenses, illumination sources, detectors, and processors such as with reference to FIG. 4.

Still further, the illumination amplifier may be integrated with other optical devices such as prisms, ceramic substrates, etc as discussed for integration with lenses and other such devices in application Ser. No. 366,714.

Particular advantages may be achieved by using batch fabricated photo sensor arrays such as array 404 with elements 426 shown in FIG. 4. One such array is manufactured by RCA for use in vidicon camera tubes, which arrays and camera tubes are applicable as discussed in application Ser. No. 366,714 for photo sensors such as with reference to array 404 of FIG. 4. Such devices are provided by the RCA Corporation, Camera Tube Division, Lancaster, Pa. such as vidicon tube model nos. 4532, 4804, and 4833.

Another embodiment of the illumination amplifier feature of the present invention utilizes an illumination amplifier for photocell control in a batch fabricated configuration. Photocells have wide applicability for direct conversion of solar energy into electrical energy. Illumination control in conjunction with photocells such as for controlling natural illumination such as sunlight illuminating a photocell can be performed with illumination amplifier techniques such as with liquid crystal devices. The batch fabricated embodiments discussed with reference to FIG. 4 provide a preferred embodiment thereof. Further, the control of sunlight incident on water discussed with reference to FIG. 7D is also applicable to the control of illumination incident on photocells. In the photocell embodiment, the compatibility between the photocell array and the liquid crystal substrate permit a batch fabricated liquid crystal and photocell configuration to be implemented, thereby providing further advantages.

Improved Fiber Optic Arrangement

The use of illumination amplifier inventive features in combination with fiber optic devices provides further advantages. Fiber optic devices may be implemented for example as strands of glass for transmitting illumination. The placement of illumination amplifier material in inter-strand gaps or other locations with well-known methods permits electronic control of transmitted illumination. In one embodiment discussed with reference to FIG. 4, element 434 may be a first fiber optic strand portion and element 402 may be a second fiber optic strand portion which may be connected with an inter-strand gap 436 wherein illumination may be transmitted through strand 434, through gap 436, and then through strand 402. Placement of an illumination amplifier in inter-strand gap 436 permits electronic control of transmitted illumination. Although FIG. 4 has previously been used to exemplify a batch-fabricated illumination processor, the inter-medium gap technique is equally applicable to fiber optic devices and other devices. For example, FIG. 4 shows angular surfaces such as surface 432 for reflection of controlled illumination, but the inter-medium gap 436 may be implemented with square surfaces, curved surfaces, or other surfaces to facilitate the desired effect. For example, in the fiber optic control arrangement discussed below, gap 436 may be flat and may be square with the axes of the fiber optic strand or alternately gap 436 may be curved with concentric-type matching curves on mating elements 434 and 402.

Fiber optics may be considered to be illumination conductors analageous to electronic conductors. The illumination computer elements described with reference to FIGS. 3 and 4 implement illumination circuits analageous to electronic circuits. Similarly, fiber optic conductors may provide illumination signals, analageous to electrical wires performing as electrical conductors. Further, illumination amplifier digital and analog computational elements discussed with reference to FIGS. 3 and 4 provide computational functions analageous to electronic integrated circuits and other electronic circuit elements. For example, the illumination signals shown in FIG. 3 may be conducted with fiber optic illumination conductors for more precise control of illumination signal routing.

Additional Considerations

The arrangements and methods described herein and in application Ser. No. 366,714 are useful individually and in combinations and further may be used in many new and unique applications either individually or in combinations to provide improvements in prior art equipment and methods. Some of these new and unique applications are described hereinafter exemplary of the broad range of applicability of the features of the present invention. It is intended that these specific applications discussed hereinafter be exemplary of the very broad applicability of the features of the present invention.

The system of this invention is discussed relative to photo-electric devices such as the well-known liquid crystal devices. Many of the applications described herein may be described in terms of the "illumination amplifier" concept and embodiment. It is herein intended that the scope of this invention be broadly interpreyed and be applicable to a wide range of electro-optical, electro-chemical, and other such devices for controlling illumination that may be used to provide the capabilities described herein which are exemplified with liquid crystal devices.

Further advantages may be achieved by using the features of the instant illumination amplifier invention in combination with a coherent illumination source such as a laser. The combination of a plurality of illumination signals such as a plurality of coherent signals may also be combined with non-coherent signals and may be processed with the illumination amplifier inventive features. For example, the multiple illumination signals shown in FIG. 5 may be combinations of coherent and non-coherent signals. In various embodiments signals 510, 520, and 522 may all be coherent laser-type signals, may all be non-coherent signals, or may be combinations of coherent and non-coherent signals such as signals 510 and 520 being coherent and signal 522 being non-coherent or conversely signals 510 and 520 being non-coherent and signal 522 being coherent.

The use of illumination amplifiers in combination with lasers provides important advantages, wherein laser systems often utilize beam splitters, mirrors, and transmitters. The electronically controllable reflectivity, transmissivity, absorbtivity, and other characteristics of illumination amplifiers permits convenient electronic control of laser illumination. Control of the reflectivity and transmissivity of an illumination amplifier is discussed with reference to FIG. 3 where for example amplifier 340 may be an electronically controllable beam splitter which is controlled with electronic signal D providing transmitted signal 342 and reflected signal 343 from incident signal 341.

Another feature of the present invention is the use of illumination amplifiers in combination with surface acoustic wave (SAW) devices. SAW devices are well known in the art and are exemplified with a piezo-electric crystal that generates and propogates acoustic surface waves in response to electrical excitation. A combined acoustical and optical arrangement provides particular advantages. For example, the integration of an SAW device and an electro-optical device such as a liquid crystal device can be used to provide combinations of capabilities. This can be exemplified by placement of a liquid crystal device on the surface of an SAW device such as with well-known electrode deposition on an SAW device which is then covered with a glass substrate and filling with liquid crystal material to provide an integrated LCD and SAW. This may be seen with reference to FIG. 4 where element 434 may be the SAW device, gap 436 may be filled with liquid crystal material, and substrate 402 may be a glass substrate or may be a portion of the batch fabricated illumination computer discussed with reference to FIG. 4 in application Ser. No. 366,714. Surface acoustic waves propagating over the surface of SAW device 434 can modulate the illumination reflected therefrom such as illumination 460 and 466 to provide reflected illumination modulated with the acoustic wave information. Many other embodiments and uses will now become obvious from the teachings herein.

Time sharing of excitation devices is enhanced by providing memory elements with illumination amplifier devices, where memory elements such as flip-flops and capacitors can be provided to store excitation signals for illumination amplifiers. Memory elements may be refreshed or updated with excitation electronics 127 and 128 using refresh methods provided in application Ser. No. 288,247. The excitation electronics need not continuously excite illumination amplifier devices 104 having memory devices contained therewith. Time shared excitation devices may be defined as devices that excite an illumination amplifier for a limited period of time, then terminate the excitation of that particular illumination amplifier element to provide excitation for another illumination amplifier element. Capacitor devices may be provided as batch fabricated devices, where illumination amplifier substrates may provide capacitive effects that may be sufficient for exciting the illumination amplifier devices. In another embodiment, capacitors may be formed with thin and thick film techniques and constructed as part of the illumination amplifier structure or may be constructed as separate components mounted on the illumination amplifier structure to provide the batch fabricated arrangements.

An illuminated switch arrangement will be described hereinafter using a capacitor memory to store a switch display condition. Such a memory arrangement is exemplary of the broad teachings of the present invention, where the capacitor memory arrangement may be used in conjunction with illumination amplifier devices in other applications. In general, time sharing of command devices and command signal processors 127 and 128 between a plurality of illumination amplifier devices is enhanced with memory devices such as a capacitor for signal storage. Other memory devices such as flip-flops may also be used in conjunction with illumination amplifier devices. In a preferred embodiment, a batch fabricated illumination amplifier and memory arrangement provides further advantages such as low cost, small size, and greater performance.

Modern integrated circuit technology is based upon monolithic elements of low power capabilities communicating in the monolithic domain with other low power devices. Typically, external components require complex interface drivers to amplify low power levels of the monolithic devices to drive interface lines and to control higher powered external devices which may be discrete elements such as light emitting diodes, display tubes, and other such components. The availability of a low power illumination control device such as the illumination amplifier arrangement described herein provides direct drive capability from the low power monolithic elements to low power illumination amplifier elements which can operate directly from monolithic circuit output signal levels.

One application of the low power capability of illumination amplifier devices is an automobile which may use monolithic digital devices such as the monolithic computer described in application Ser. No. 101,881 which may be implemented with well-known CMOS integrated circuit techniques for low power consumption and controlling many illumination signals within a vehicle. Such a monolithic computer can be used to control brake lights, flashing turn signals, dash lights, head lights, and other illumination devices in the vehicle using illumination amplifiers directly operable from the output signals of the monolithic computer. In such an application the monolithic computer may receive a plurality of input signals and control the illumination amplifiers in response thereto. A turn signal control such as a switch may be interrogated by such a computer, where the computer may generate command signals to a turn signal related illumination amplifier to control flashing thereof. Alternately, a brake control such as a switch may also be interrogated by such a monolithic computer, where the computer may generate command signals to a brake light related illumination amplifier in response to the brake command signal. Further, headlight control may be implemented with low level command signals from a monolithic computer controlling headlight illumination amplifier devices.

Still further, electronically controllable illumination amplifiers may be used in combination with various coatings such as dielectric coatings, ceramic coatings, and other coatings to provide further advantages in the combination thereof which advantages are well known in the art. Although certain types of illumination may tend to degrade optical coatings and illumination amplifiers. This degradation can be minimized using well-known chemical methods or by using low energy illumination. Although degradation is a consideration, degradation need not be a major limitation as indicated by material degradation in important technologies such as cathode degradation in the vacuum tube technology. Therefore, degradation characteristics are herein noted merely for completeness. Optical coatings and characteristics are discussed in the article Dielectric Cavity Laser YAG Efficiency by Hahn and Hahn in Electro-Optical Systems Design magazine dated February 1975 herein incorporated-by-reference.

In another embodiment, an illumination dimmer may be implemented as a pair of sunglasses constructed with illumination amplifier eye-pieces. The low power requirements of many types of illumination amplifiers will permit a small battery and excitation device to be provided in a portable configuration which may include an operator control such as a potentiometer for operator adjustment to provide the desired dimming characteristics. The illumination dimmer embodiment is discussed in application Ser. No. 366,714.

Color control arrangements are discussed in application Ser. No. 366,714. Still another arrangement may be implemented by using illumination amplifier material such as liquid crystal material having a particular spectral characteristic such as by adding color elements to liquid crystal material or providing a liquid crystal material having a self-contained or inherent color characteristic. Yet another arrangement provides a substrate with a particular spectral response such as a colored glass substrate used in combination with a liquid crystal device.

Photographic arrangements are discussed in application Ser. No. 366,714. In one embodiment, control of exposure in response to artificial illumination such as for flash photography may be provided in an adaptive manner with the photographic camera system of this invention. As shown in FIG. 1, illumination 102 from source 100 is controlled by signal 132; where source 100 may be a well-known photographic flash device. Illumination receiver 134, which may be a photocell responsive to illumination from source 100, generates feedback signals 114 provided as feedback signals 120,124, or 139 which may be used to control source 100 with signals 132 and to control amplifier 104 with signals 133 to provide desired source illumination 102 and exposure illumination 106. These feedback control signals may be used to minimize required source energy such as from a battery by de-energizing source 100 when sufficient illumination has been provided as detected with transducer 134. Further, control of amplifier 104 may be used to control the precise amount of illumination that is exposing film 130 as discussed in detail in application Ser. No. 366,714.

Pertinence Of Material Incorporated-By-Reference

The instant application (as with the parent application Ser. No. 366,714) incorporates-by-reference copending applications and patents that contribute to the disclosure of the present invention. The pertinence thereof will now be discussed.

The pertinence of copending application Ser. No. 101,881 will now be discussed.

FIG. 1 of application Ser. No. 101,881 sets forth a data processor 12 for controlling machine 24 with servos 20–22 and discrete control signals 26 and with operator panels 14 and 18. Control of machine 24 with servos and discrete controls is similar to control of the illumination amplifiers of the present invention with servos and discrete control devices. For example, the machine control servos are disclosed using pulse-modulated methods similar to the methods discussed in the instant application. Further, discrete signals can also be used for controlling illumination amplifiers and for providing computer feedback from illumination amplifiers. Still further, the discrete and alpha-numeric displays of display panel 18 can use the illumination amplifier arrangements of the instant application and control panel 14 can use the illuminated switches of the present invention, thereby further describing the usage environment of the illumination amplifier displays.

FIG. 2 of application Ser. No. 101,881 sets forth the detailed operator control and display panel environment for usage and operation of the illumination amplifier devices of the present application. In particular, FIGS. 2C and 2D provide the interface between a monolithic computer and an operator panel which can incorporate the illumination amplifier features of the present invention. Further, this computer interface is exemplary of more general uses discussed in the instant application for control of illumination amplifiers with a digital computer.

FIGS. 3 and 16–19 of application Ser. No. 101,881 exemplifies a servo control with a computer interface, wherein the computer-commanded servo control is usable with the illumination amplifier devices of the present invention in substitution for machine tool 24 of the embodiment discussed in application Ser. No. 101,881.

FIGS. 5–12 of application Ser. No. 101,881 sets forth architecture of one embodiment of a monolithic computer exemplary of the more generalized computer usable with the illumination amplifier features of the instant invention.

FIG. 13 of application Ser. No. 101,881 exemplifies input and output control between a computer and external devices which may be the illumination amplifier devices of the present invention. For example, discrete inputs $\overline{DI\text{-}0}$ to $\overline{DI\text{-}11}$ may be used to monitor discrete states such as sensor signals that monitor controlled illumination. Discrete outputs DO-1 to DO-11 may be used to control illumination amplifier devices such as by exciting the illumination amplifier either with a static DC output level set into a flip-flop such as by toggling flip-flops I1 to I4 with discrete outputs $\overline{DO\text{-}8}$, $\overline{DO\text{-}4}$, $\overline{DO\text{-}5}$, and $\overline{DO\text{-}6}$ respectively; or by directly pulsing the illumination amplifier device such as with a pulse rate modulated signal; or otherwise controlling illumination amplifiers through well-known interface electronics under discrete output control. Whole word outputs OW-0 to OW-11 may be used to generate whole number commands such as with packed discretes to the lamps discussed with reference to OW-11 outputs, or to numeric displays discussed with reference to OW-9 outputs, or with analog magnitude information to a digital-to-analog converter which is exemplified with the disclosure set forth in copending application Ser. No. 325,933 discussed hereinafter. Latched discretes and control signals are shown generated with the OW-8 signal loading C-register 260 and generating the C6Q to C15Q signals. Input word signals IW-0 to IW-7 are shown loading feedback information into the computer such as packed discretes from sensors; whole number digital signals from an analog-to-digital converter such as disclosed in application Ser. No. 325,933 discussed hereinafter; or other computer input signals.

Figure 14A:
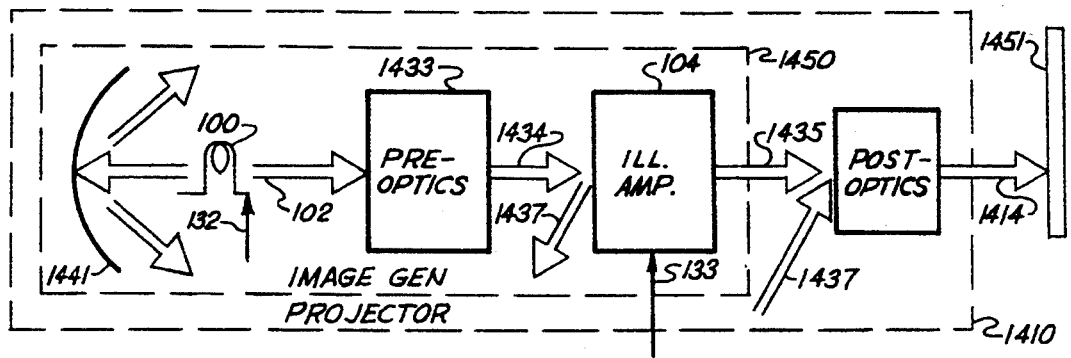
FIG. 14 is a schematic and block diagram illustrating a projection display arrangement comprising FIG. 14A showing a single projector arrangement, FIGS. 14B through 14E showing multiple image projection arrangements, and FIG. 14F showing a TV projection embodiment.
Figure 14B:
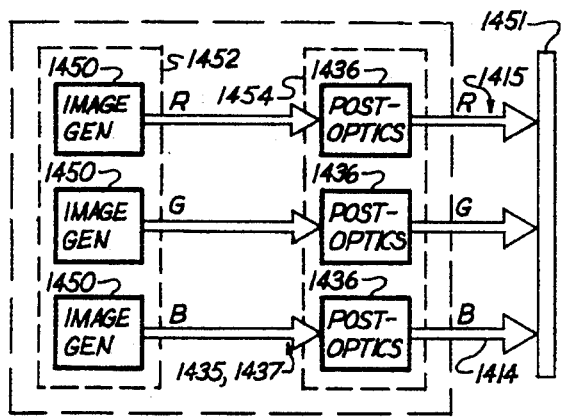

FIGS. 14A and 14B of application Ser. No. 101,881 further exemplify computer inputs such as loading packed signals T0-T8, P0-P3, M0-M2, J0-J2, and S0-S11 into the computer and also exemplify the output of packed control signals from Z-register 268 with storage flip-flops Z0-Z11.

FIG. 15 of application Ser. No. 101,881 discloses packed output control signals TS-0 to TS-7 and encoded input signals S0-S3 and others.

FIGS. 16-19 of application Ser. No. 101,881 disclose a servo arrangement that is exemplary of servos that may be used for illumination control in place of the machine control.

The pertinence of applications Ser. Nos. 134,958 and 135,040 will now be discussed. These applications are directed to servo control of a machine with a computer, wherein the machine servo control is also exemplary of an illumination amplifier servo control. This control is disclosed using hardwired servo loops commanded by a computer in an open-loop fashion and also in an alternate embodiment with the computer being in the servo loop. Further, pulse modulated control under computer program control is disclosed wherein the computer may be in the servo loop directly exciting the control device which may be an illumination amplifier and by directly monitoring the feedback device which may be an illumination sensor.

The pertinence of copending application Ser. No. 288,247 will now be discussed. In particular, application Ser. No. 288,247 is directed to interaction between the operator panel and the computer of the above-discussed application Ser. No. 101,881; wherein the computer flow diagrams of FIGS. 3 and 5-7 of application Ser. No. 288,247 disclose the processing and communication implemented with the hardware diagrams of FIGS. 1, 2, 8, and 9 corresponding to related figures of application Ser. No. 101,881 as discussed above.

The pertinence of copending application Ser. No. 291,394 will now be discussed. This application is directed to control of a machine by a computer using discrete signals which is exemplary of control of the illumination amplifier arrangements of the present invention with a computer using discrete signals. FIGS. 1, 2, and 4-6 of application Ser. No. 291,394 are similar to related figures of application Ser. No. 101,881 but application Ser. No. 291,394 provides more detailed disclosure relative to discrete control. In application Ser. No. 291,394; FIG. 7 provides a more detailed disclosure of a discrete input and output interface for the computer and FIG. 8 provides program control disclosures relative to controlling of external devices; exemplary of control of illumination amplifier devices with discrete signals.

The pertinence of application Ser. No. 302,771 will now be discussed. This application is also directed to control of a machine with various control methods including servos and adaptive control; exemplary of control of illumination devices in accordance with the present invention. FIGS. 1, 2, and 4A of application Ser. No. 302,771 are similar to related figures in application Ser. No. 101,881 as discussed above. FIGS. 3 and 4B of application Ser. No. 302,771 are exemplary of control arrangements applicable to the illumination control devices of the instant application. FIGS. 6 and 8 of application Ser. No. 302,771 are exemplary of signal processing for control of devices and are directly usable with illumination devices. FIGS. 7 and 10 of application Ser. No. 302,771 are exemplary of computer operations for control of devices such as the illumination devices of the present invention.

The pertinence of copending application Ser. No. 325,933 will now be discussed. Although this application is directed to audio response, many of the audio control functions are exemplary of illumination control functions. FIGS. 1 and 2 of application Ser. No. 325,933 are similar to related figs of copending application Ser. No. 101,881 discussed above and are discussed in greater detail in application Ser. No. 325,933. FIG. 3 of application Ser. No. 325,933 sets forth a detailed analog-to-digital converter, digital-to-analog converter, and computer input/output structure usable in combination with the computer operations of FIG. 6 and are exemplary of generalized converter input/output operations usable with the illumination devices of the present invention. FIG. 5 of application Ser. No. 325,933 is exemplary of generalized computer operations of controlling external devices which may be the illumination devices of the present invention.

The pertinence of copending application Ser. No. 550,231 will now be discussed. This application is directed to filtering, signal processing, communications, and memory systems which may be implemented with illumination devices disclosed in the instant application. For example, analog and digital illumination computing devices disclosed with reference to FIG. 3 of the instant application may be used to implement the devices of application Ser. No. 550,231 such as disclosed in FIGS. 4, 6, and 7 therein. Further, the illumination devices of the instant application may be usable in combination with or in replacement of the CCD devices of application Ser. No. 550,231 as set forth in FIG. 9 therein.

In view of the above, the disclosures of the referenced copending applications herein incorporated-by-reference exemplify arrangements and methods that are usable with the illumination devices of the present invention and are intended to be usable in combination therewith. For example, the servo control arrangements disclosed in said copending applications are intended to be used in replacement for the servo control arrangements disclosed in the instant application and are in general intended to be usable in combination with the illumination control devices of the instant application. Further, the computer control and interaction disclosed in said copending applications is intended to be usable in combination with the illumination control devices of the present invention where for example the computer 251 disclosed in FIGS. 2 and 9 of the instant application is intended to be supplemented with the computer disclosure of said copending applications.

Projection Display Arrangement

An illumination amplifier projection display arrangement in accordance with the present invention has been described in U.S. Pat. No. 3,986,020 and in copending application Ser. No. 727,330 wherein the following discussion will more specifically describe preferred embodiments thereof.

Conventional display arrangements typically require an image generator to generate the illumination as a source, wherein the illumination generated by the image generator such as a conventional television (TV) receiver therefore has relatively low intensity. It is well known that projection and magnification of an image reduces intensity of the image. Therefore, it was not practical to project prior art images generated with such image generators. In accordance with the present invention, an image generator is provided that is an illumination amplifier which controls externally generated illumination such as through reflectivity and transmissivity characteristics of the illumination amplifier. Therefore, intensity of the image is a function of intensity of the incident illumination controlled with the illumination amplifier image generator, where very high image intensities may be provided by illuminating the amplifier image generator with high intensity illumination. In accordance with the illumination amplifier feature of the present invention, an image generator may be used in a magnifying projection display system providing high intensity magnified projection displays by illuminating an amplifier image generator with high intensity illumination.

The projection display feature of the present invention will now be discussed in the embodiment of a projection audience display system and particularly in the embodiment of a large screen television display. This preferred embodiment is intended to exemplify but not to limit the general features of the projection display system of the present invention.

A basis for the inventive features discussed hereinafter are set forth in U.S. Pat. No. 3,986,022; other related applications discussed therein; and copending application Ser. No. 727,330. For example, the general features of excitation; batch fabrication; closed loop control; computer control; camera systems; choppers, scanners, and modulators; traffic light controls; and other such implementations discussed in said related patents and applications are directly applicable to the projection display system and are intended to be used in combinations therewith. For example, said U.S. Pat. No. 3,986,022 and application Ser. No. 727,330 discloses a large screen audience display system at pages 104–109, a television display at page 109 lines 28–32, a CRT embodiment at page 84 lines 8–11, a camera embodiment at pages 84–96, color control at pages 61–63 and pages 106–109, multiple source control at pages 99–103, high intensity projection at page 104 lines 28–35, closed loop control at pages 46–49, storage of displayed signals such as with a capacitor at pages 58–60, and batch fabricated arrangements such as at pages 41–45.

Further, copending application Ser. No. 727,330 includes the above disclosures in addition to the disclosures of television embodiments and scanning embodiments at page 128 lines 21–35, projection of magnified high intensity images at page 128 lines 1–12, a slide projector embodiment at pages 146 and 147, fiber optic embodiments at pages 163 and 164, batch fabricated arrangements at page 159 line 30–page 160 line 16 and computer control at pages 139 and 172–177 therein.

It is herein intended that the above-listed disclosures from all copending applications and the other disclosures from said copending applications be considered as usable with the projection display system and are intended for use in combinations therewith, wherein the use of these disclosed implementations and methods may be applied to the projection display system of the present invention in a manner that will become obvious to those skilled in the art from the teachings herein. For example, the projection display system may be batch fabricated, may use fiber optics, may be projected such as with slides or movies, may be projected with high intensity and magnification characteristics, may utilize computerized closed loop control, may use a light pen, may use circuitry discussed for illuminated switch signal storage, may use color control, may be used to expose an illumination sensitive medium, may use multiple sources and multiple colors, and may be used in conjunction with other teachings provided in the instant application and in the referenced copending applications.

A preferred embodiment of the projector arrangement will now be discussed with reference to FIG. 14. Projector 1410 including illumination amplifier 104 generates projected illumination 1414 to a projection screen 1451. Projector 1410 includes image generator 1450 and post-optics 1436. Image generator 1450 generates controlled illumination 1435 and 1437 to post-optics 1436 for post-processing of illumination to generate projection illumination 1414. Post-optics 1436 may be composed of conventional optics arrangements and may include magnifying optics such as provided in conventional projectors including slide projectors and movie projectors. Image generator 1450 may include illumination source 100 which may be any of many well-known sources including light bulbs such as projector bulbs and may be other types of illumination sources such as flame sources used on the well-known search-lights. Source 100 may be controlled with control signal 132 generated with control electronics 127, 128 as discussed in U.S. Pat. No. 3,986,022 with reference to FIG. 1 therein. Illumination from source 100 may be high intensity illumination for projection display and may be concentrated with reflector 1441 which may be a well-known reflector arrangement such as used on flashlights, slide projectors, or searchlights. Source illumination 102 may include direct illumination from source 100 and reflected illumination from reflector 1441. Source illumination 102 may be pre-processed with pre-optics 1433 which may include well-known optical devices such as accumulating and focusing lenses. Pre-processed illumination 1434 from pre-optics 1433 may be controlled with illumination amplifier 104 for generating illumination images. Illumination amplifier 104 may operate in a transmissive mode generating transmissive image 1435 or may operate in a reflective mode generating reflective illumination 1437. Illumination amplifier 104 may operate in response to control signals 133 from control devices 127,128 as discussed in U.S. Pat. No. 3,986,022 with reference to FIG. 1 therein.

Illumination images 1435 and 1437 may be processed with post-optics 1436 for focusing, magnification, and other well-known optical functions. In a simplified embodiment, projector 1410 may be a well-known slide projector having an illumination source 100, reflector 1441, pre-optics 1433, and post-optics 1436; wherein illumination amplifier 104 may be substituted for the well-known slides in the slide projector.

Illumination amplifier 104 may be a monochromatic arrangement for generating a single-color image 1435 and 1437 or may be a multi-colored arrangement for generating colored images 1435 and 1437; where color arrangements are discussed with reference to FIGS. 6D and 11 of U.S. Pat. No. 3,986,022. In one embodiment, color may be introduced using a colored source 100, colored filters in pre-optics 1433, colored filters in post-optics 1436, or colored segments of illumination amplifier 104. Other methods of introducing color will now become obvious from the teachings herein.

Projection screen 1451 may be any well-known screen. For example, conventional movie and slide projector screens may be used for screen 1451. Alternately, screen 1451 may be a wall of a building which may have a desired coating such as a light colored paint, beaded material, or other such coatings. Alternately, screen 1451 may be a frosted glass screen or other screen material which might be illuminated from one side and viewed from the other side. Screen 1451 may be part of projector 1410 such as with the self-contained screens in TV sets or may be a remote screen such as a slide projection or movie projection screen located remotely from projector 1410. Further, screen 1451 may be a scoreboard, billboard, or other large-scale outdoor-type screen. Yet further, screen 1451 may comprise a plurality of different screens and post-optics 1436 may include prism or beam splitter type optics to project each of a plurality of identical images 1414 on different ones of a plurality of screens 1451 for viewing from different locations such as different sides of a scoreboard.

An alternate embodiment for a color projector will now be discussed with reference to FIG. 14B. Multiple-color projector 1411 comprises three channels of projectors similar to projector 1410 discussed with reference to FIG. 14A. Each of the three image generators 1450 may generate either transmitted or reflected illumination images to post-optics 1436 to generate projected image 1414. Each channel, comprising image generator 1450 and post-optics 1436, may represent a different color such as red, green, and blue colors indicated by the R, G, and B symbols associated with the three related channels of illumination. Triple image generators 1452 may generate transmitted illumination 1435, reflected illumination 1437, or combinations thereof. Triple post-optics 1454 may project the three colored illumination beams to screen 1451 so that all three colored beams 1415 are superimposed and have registration therebetween to provide a focused image on screen 1451 that represents the combination of all three colored images 1415.

Figure 14D:
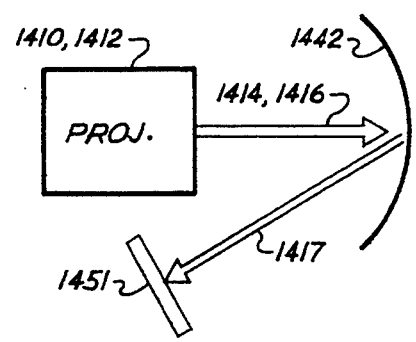
Figure 14C:
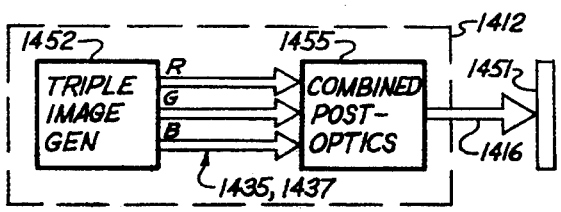

Another alternate embodiment will now be discussed with reference to FIG. 14C. Triple-image generator 1452 may generate three illumination images which may be transmitted illumination 1435 or reflected illumination 1437 or combinations thereof for processing with combined post-optics 1455. Combined post-optics may combine the three illumination beams such as with accumulating and focusing lenses to generate a single combined colored image beam 1416 for projection onto screen 1451.

Figure 14E:
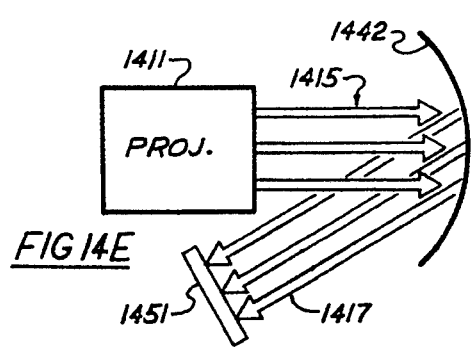

Still other alternative embodiments will now be discussed with reference to FIGS. 14D and 14E which represent reflection projection arrangements in contrast to the transmission projection arrangements discussed with reference to FIGS. 14A–14C. In these embodiments, projectors 1410–1412 generate projection illumination 1414–1416 which is reflected from image reflector 1442 to focus on screen 1451. Reflector 1442 may be a magnifying reflector for accumulating, magnifying, focusing, and projecting the image onto screen 1451 as reflected image 1417. A single beam projector 1410 and 1412 (FIG. 14D) generates projected images 1414 and 1416 respectively as discussed with reference to FIGS. 14A and 14C. A triple beam projector 1411 (FIG. 14E) generates triple image beams 1415 in a reflection embodiment as discussed with reference to FIG. 14D above using reflector 1432 to reflect images 1417 to screen 1451.

Projector 1410 may include a zoom capability. The zoom capability which may be implemented electronically or optically. For the electronic implementation, command arrangement 127 and 128 generating control signals 133 may computationally enlarge the image by controlling amplifier 104 to generate a larger optical image under electronic control. Alternately, post-optics 1436 may include a zoom lens capability such as used on slide and movie projectors and other well-known systems to enlarge or reduce image 1414 projected on screen 1451. Zoom capability may be either manual or automatic as implemented in well-known projection systems.

A large-screen-projection television embodiment will now be discussed with reference to FIG. 14. Advances in prior art TV systems and known projection TV systems are discussed in the article New Season's Color TV Sets Slate Major Role For Large-Scale Integration by Gerald M. Walker in the Sep. 30, 1976 issue of Electronics magazine which is incorporated-by-reference herein. This article points out the importance of projection TV systems and the configuration of prior art systems. Such prior art systems use projection tubes, projection lanterns, CRTs, and a trinitron tube; where a major limitation of these prior art arrangements is the low intensity levels available with these projectors. The illumination amplifier feature of the present invention solves the intensity problem and permits a fully solid-state arrangement using low voltage electronics which eliminates vacuum tubes and expensive high-voltage electronics.

In prior art systems, the image generator such as the cathode ray tube (CRT) must generate the image having the desired intensity. The intensity available with CRTs and other such devices is very low and not practically suitable for projection particularly for projection of large images with significant magnification. The image generator of the present invention does not generate its own illumination but controls externally generated raw illumination as an illumination amplifier. For example, illumination amplifier 104 is not a source of illumination but merely modulates or amplifies illumination from source 100, wherein low level electrical signals 133 may be used to control high intensity images 1435 for projection with post-optics 1436. It is estimated that intensity of image 1435 using illumination amplifier 104 may be hundreds or thousands of times more intense than the intensity of images generated with conventional techniques such as CRTs. For example, conventional televisions using CRTs are marginally acceptable, where the CRT is adequate for a darkened room and a non-projection system. If a 24-inch CRT TV picture were projected to a four-by-six-foot large screen, the intensity of the projected image would be approximately one-sixth of the intensity from the CRT in a non-projection configuration. Obviously, this one-sixth of normal TV intensity would be inadequate. Therefore, exotic techniques, higher voltage circuitry, and other expensive methods are used to increase image intensity using conventional techniques.

In the system of the present invention, a small illumination amplifier device 104 may be used in conjunction with a high intensity source 100 to generate high intensity large-screen projection images 1414. Present photolithographic integrated circuit techniques make it relatively simple to provide small 0.001-inch elements on a substrate. Therefore, the 512-by-512-point resolution of a TV CRT may be implemented on an illumination amplifier device such as a liquid crystal device of approximately one inch square. Illumination of a small image such as a one-inch-square image formed on illumination amplifier 104 using high intensity raw illumination 1234 will permit projection and magnification of the small image to large dimensions with post-optics 1436 for projection onto screen 1451.

In a TV embodiment, conventional TV signals may be received and processed with conventional TV electronics. Video signals may be electronically scanned across illumination amplifier 104 with well-known electronic scanning methods such as the TV raster scan. Each amplifier element may have a memory element related thereto such as a flip-flop or capacitor as discussed with reference to FIG. 6C in U.S. Pat. No. 3,986,022. Accessing of an array of elements such as liquid crystal elements is well known in the art such as two-dimensional coincident excitation arrangements used with core memory systems.

Figure 14F:
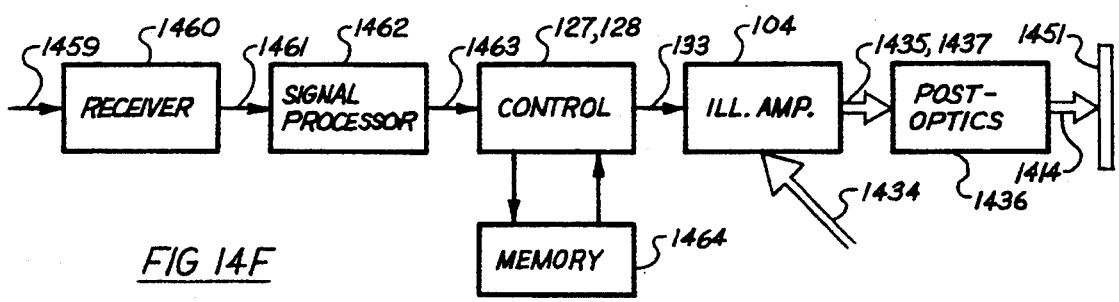

The projector arrangement discussed above will now be discussed with reference to FIG. 14F to illustrate use in a complete TV receiver system. TV signal 1459 may be received with TV receiver 1460 comprising well-known antennas and tuner, RF, video, IF, and audio circuitry to generate video signals 1461 to TV signal processor 1462. Signal processor 1462 may include well-known TV signal processing circuitry such as used with well-known solid-state image generators. Control 127 and 128 generates control signal 133 in response to processed signal 1463; wherein signal 133 may include scan control and intensity control signals and may further include pulse width modulated or other signal characteristics such as discussed in said U.S. Pat. No. 3,986,022. Control signal 133 controls illumination amplifier 104 to control illumination 1234 to generate controlled illumination 1435, 1437 which is projected with post-optics 1436 as projected signal 1414 to illuminate screen 1451; as discussed with reference to FIG. 14 herein.

In view of the above, it can be seen that the arrangement disclosed in FIGS. 14A–14E can be implemented in combination with well-known TV front-end circuitry to provide an implementation of a complete TV receiver.

The arrangement discussed with reference to FIG. 14 may be implemented in the form of a conventional projector arrangement such as a TV receiver or in the form of a holographic projector. In the conventional projector arrangement, source 100 may be a non-coherent illumination source such as a zenon lamp, mercury vapor lamp, incandescent lamp, or other well-known lamps which may be of a high intensity variety and illumination amplifier 104 may provide conventional images such as viewed on a conventional TV display. Alternately, this projection system may be implemented with a coherent illumination source 100 such as a laser or other coherent source and illumination amplifier 104 may display holographic patterns such as interference patterns for generating and projecting holographic images as images 1435, 1437, and 1414. In a conventional projection arrangement, a projected illumination image may be projected upon a screen to provide a two-dimensional image. In the holographic embodiment, illumination images 1435, 1437, and 1414 may be holographic images and may be projected on a screen such as screen 1451 or may be projected without a screen for providing three-dimensional holographic images.

In accordance with the holographic projector arrangement discussed above, a holographic TV camera can be provided, wherein holographic images may be provided with the appropriate optics such as lenses and a conventional television camera may be used to take moving video pictures of the holographic interference patterns for transmission to the receiver, discussed with reference to FIG. 14F, to provide a three-dimensional holographic TV system.

Because of the integrating effect of the human eye, photographic film, etc. and because each illumination image portion is independently formed in a non-coherent system, a scanned image such as with the raster scan in a conventional TV system is acceptable. In a holographic system, dependence is placed on interference between phases of different image portions. Therefore, it may be desirable to provide projection of a complete holographic image rather than projection of a scanned image.

In one embodiment, a holographic image may be scanned onto illumination amplifier 104 with control signal 133; may be temporarily stored on amplifier 104 such as with capacitors; and coherent source 100 may be de-energized during scanning. After the holographic image has been fully stored on amplifier 104, source 100 may be energized to project stored image 1435, 1437 as illumination 1414. In a multiple-channel system such as discussed with reference to FIG. 14B, the multiple channels may be scanned in an interleaved manner and may be sequentially projected. For example, while a red image is being scanned in the red channel R and therefore non-projecting, the green channel G and blue channel B may be projecting green G and blue B images 1415. Such interleaved operation may be implemented in the form of a well-known refresh arrangement and image information to be scanned may be stored in memory 1464 performing a buffer or refresh function.

Because of said integration effect, the pulsed operation of the holographic system is analogous to the scanned operation of a conventional TV system. Pulsing of lasers and control thereof is well known in the art.

The projection feature of the present invention may be used in a recording embodiment, where screen 1451 may be an illumination sensitive medium 130 such as films light sensitive paper, a phosphor surface, or other well-known illumination sensitive mediums, where exposure of medium 130 is discussed in U.S. Pat. No. 3,986,022. Projection of an image onto medium 130 used in place of screen 1451 can provide a permanent record of information displayed with amplifier 104. In this recorder embodiment, amplifier 104 may be a physically small element such as one-square-inch television image or may be a physically large element such as a ten-square-inch arrangement for greater resolution. Post-optics 1436 may magnify or reduce image 1435, 1437. Magnification of a small image may be provided for using a smaller, lower resolution amplifier 104 in conjunction with a recorded image to be used by an operator such as on an 8½-by-11-inch page. Alternately, the system may be used for microfilm reproduction wherein a high resolution image 1414 is required and wherein image 1414 is very small for printing on microfilm. For this embodiment, illumination amplifier 104 may be large for providing greater image resolution and post-optics 1436 may provide illumination image reduction capability to print or record a high resolution miniature image 1414 on microfilm.

In another embodiment, post-optics 1436 may include a scanner for scanning image 1435 onto screen or medium 1451. The scanner may be a well-known prior art electro-mechanical scanner such as used in Xerox copiers and OCR systems or may be the electro-optical scanner discussed in application Ser. No. 727,330 with reference to FIG. 12 therein and as further discussed herein. In this embodiment, the scanner may scan an image such as a rectangular image across screen or medium 1451 as discussed for the photoplotter with reference to FIGS. 8 and 10 in U.S. Pat. No. 3,986,022. Alternately, image 1435, 1437 from amplifier 104 may be continuously changing as it is scanned across screen 1451 or medium 130. For example, control signal 133 may control a sequence of alpha-numeric characters which are scanned across a screen or medium 1451 for displaying or recording alpha-numeric information, wherein each scanned position may correspond to a different character commanded by signal 133, as discussed with reference to FIG. 12B of application Ser. No. 727,330.

The TV system of the present invention includes many additional advantages implicit in the small size, simplicity, and projection aspects. For example, this TV set may be used in a manner similar to common slide projectors and movie projectors wherein post-optics 1436 may include zoom capability, screen 1451 may be a portable screen or a wall and projector 1410–1412 may be a portable TV projector for projecting colored TV pictures on various types of screens and walls. Post-optics 1436 may also include well-known focusing optics as is common in slide projectors for focusing image 1414 on screen 1451 to provide projection from different distances and positions.

A high-intensity low-power portable embodiment of the TV system of the present invention may be provided, wherein source 100 constitutes the high-power dissipation element of the system and may be implemented as a flame-type lamp and wherein power-consuming electronics in projector 1410 may be powered with batteries. Lamp 100 may be a gas lamp or other lamp such as used on searchlights, lanterns, and in lighthouses to provide high-intensity illumination without electrical power consumption. Integrated circuit electronics may be used to drive illumination amplifier 104, where typical illumination amplifiers such as liquid crystals have bery low power dissipation and wherein integrated circuit electronics do not need high voltage and high powered drives usually required for conventional television sets and therefore may be provided in a low-power battery-operated portable configuration.

Flexibility of the instant projection TV arrangement permits operation with many different screens including a self-contained screen for close viewing and a remote projection screen for audience-type viewing. Illumination intensity may be controlled such as a function of the viewing screen using pulse or amplitude modulation as signal 132 to source 100 or signal 133 to illumination amplifier 104. Portable screens may be used such as a removable self-contained screen for self-contained viewing and a remote screen such as a folding slide projector screen for audience viewing. Use of both, a removable self-contained screen and a portable remote screen, in conjunction with zoom and focusing capability in post-optics 1436 permits adaptation to many different viewing situations.

In another embodiment, illumination amplifier 104 may be coupled to provide illumination to an illumination sensitive medium such as photographic film or a phosphorus screen using fiber optic techniques such as used on the Honeywell VISICORDER. Use of an illumination diffuser as a projection screen at the remote end of a fiber optic bundle permits high intensity illumination from a small image to enter the source end of a fiber optic bundle, where divergence of the fiber optic strands permits a larger image to be projected or conducted from the destination end of the fiber optic strands to a larger screen (or alternately a smaller screen) for display purposes.

One traffic control system has been described in U.S. Pat. No. 3,986,022; wherein an alternate embodiment or additional features for the said previously disclosed embodiment are discussed below. The illumination amplifier projection arrangement discussed above may also be used for traffic control as a traffic light by projecting colored signals, alpha-numeric characters, symbols, and other information on traffic control panels and display screens. This embodiment may use the ambient illumination feedback, color control, projection control, and other features of the present invention as applied to traffic control systems.

The pictorial image feature of the present invention exemplified with a TV projection system may also be used for hardcopy recording of pictorial information. For example, use of an illumination sensitive medium 130 included in screen 1451 permits recording of pictorial information such as in a facsimile machine, a pictorial copier, or other such systems.

In the multi-beam embodiment, one beam may be used for operator viewing of a projected image and another beam may be used for recording of that image. For example, in a TV system used for projection viewing, it may be desired to record an image. Therefore, an illumination amplifier shutter may be used to expose an illumination sensitive medium with an alternate beam or with a redirected primary beam such as discussed for the single-lens reflex camera with reference to FIG. 9 of U.S. Pat. No. 3,986,022. Said reflex camera provides viewing to set up the picture and recording to expose the illumination sensitive medium using a single directionally controlled image beam. Alternately, a plurality of beams may be provided for simultaneous viewing and recording. Therefore, in accordance with this feature of the present invention, a system is provided for viewing an image and for recording an image using illumination amplifier devices such as a liquid crystal arrangement.

A plurality of controllable segments have been described relative to photoplotter and camera-type systems with reference to FIGS. 8A–8C and for a character display system such as with reference to FIG. 6 of U.S. Pat. No. 3,986,022 and further with reference to FIG. 12B of copending application Ser. No. 727,330. In an alternate embodiment, these segment illumination control arrangements may be implemented with the image control arrangement discussed for the image projection system such as for TV receivers. For example, the resolution of the TV image control system provides rectangular images at a very large number of angles relative to the 45-degree angular increments discussed with reference to FIG. 8A of U.S. Pat. No. 3,986,022 and may provide a very large number of different types of characters for a character generator in addition to a common set of alpha-numeric characters. Further, aperture control such as discussed with reference to FIGS. 8B and 8C of U.S. Pat. No. 3,986,022 may be provided with significantly greater resolution by using a large number of illumination amplifier segments compared to the three segments shown in said FIGS. 8B and 8C.

Alternate Scanner Embodiment

An alternate scanner embodiment will now be discussed with reference to FIG. 12E. Illumination control device 1279 includes a plurality of controlled surfaces 1270–1276 for controlling illumination signals 1250–1256 respectively as controlled reflected signals 1260–1266 respectively. Controlling of elements 1270–1276 to be selectively reflective causes illumination from source 110 to be selectively scanned with signals 1260–1266 such as onto screen 1223. For example, generator 1224 may generate illumination characters in response to illumination 102 from source 100, 1225 which may be selectively reflected from surfaces 1260–1266 to scan the illumination characters onto screen 1223, as discussed with reference to FIG. 12E in copending application Ser. No. 727,330. For example, characters generated with generator 1224 along incident beam 1250 may be reflected as signal 1260 if element 1270 is reflective and may not be reflected as signal 1260 if element 1270 is not reflective. Similarly, incident illumination signals 1251–1256 may be reflected or nonreflected from elements 1271–1276 respectively as signals 1261–1266 respectively depending upon whether elements 1271–1276 are controlled to be reflective or nonreflective. Signals B0–B6 may be used to control elements 1270–1276 similar to the arrangement discussed with reference to FIGS. 12A–12D in application Ser. No. 727,330 and other approaches may be used to control devices 1270–1276 similar to that discussed for the other scanner embodiments.

Figure 12E:
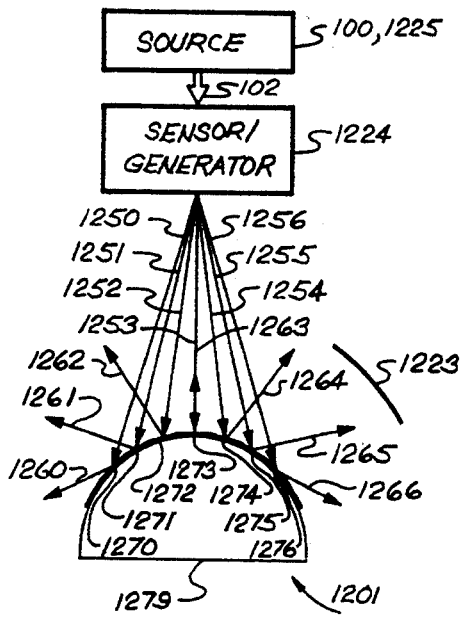
FIG. 12 is a schematic and block diagram illustrating an illumination scanner, chopper, and modulator system in accordance with the present invention comprising FIG. 12A showing a first electro-optical embodiment, FIG. 12B showing a second electro-optical embodiment, FIG. 12C showing a first control embodiment, FIG. 12D showing a second control embodiment, and FIG. 12E showing a third electro-optical embodiment.

The arrangement discussed with reference to FIG. 12E is shown in simplified form for ease of description. Elements 1270–1276 may be a batch fabricated device such as discussed with reference to FIG. 4 in U.S. Pat. No. 3,986,022 and may be formed as facets 1270–1276 or flat areas on spherical substrate 1279 which may be a trans-glass substrate. Alternately, continuous control may be provided over the surface of a single continuous circular or spherical surface providing different reflecting angles using analog spacial methods of moving a reflecting area over substrate 1279 similar to well-known prior art analog spacial arrangements. Alternately, elements 1270–1276 may be individual elements that are not batch fabricated which may be implemented with well-known methods such as liquid crystal methods wherein each device 1270–1276 may have an innermost electrode closest to the center of hemisphere 1279 being reflective and being covered with liquid crystal material and may have an outermost transparent electrode for containing the liquid crystal material between the inner reflective electrode and substrate and the outer transmissive electrode and cover as is well known in the reflective liquid crystal art for providing reflective mode operation. When the liquid crystal material is controlled to be opaque or scattering, illumination 1250–1256 may not be able to penetrate the reflecting electrodes and therefore may not be reflected but may be scattered. When the liquid crystal material of a device 1270–1276 is controlled to be transmissive, incident illumination 1250–1256 respectively will be transmitted by the outermost transparent electrode, transmitted by the transparent liquid crystal material, and reflected by the reflective innermost electrode back through the transparent liquid crystal material and through the transparent outermost electrode as reflected signals 1260–1266 respectively. Therefore, the arrangement discussed with reference to FIG. 12E can be controlled to provide all of the capabilities discussed with reference to FIGS. 12A and 12B in said copending application Ser. No. 727,330.

Further, substrate 1279 may be spherical in shape with reflective facets like the well-known devices used for a reflective effect such as in ballrooms, but with the difference that the faceted mirrors have controllable reflectivity such as for controlled scanners, choppers, and other illumination control arrangements.

The arrangement shown in FIG. 12E is intended to be indicative of a solid-state version of a scanning mirror such as provided in Xerox machines and other scanning devices. In such devices, as the scanning mirror is rotated from an angle shown with element 1270 to an angle shown by element 1276 through angles shown by elements 1271–1275; illumination is reflected through the angles shown by illumination beams 1260–1266 respectively. Therefore, the arrangement shown in FIG. 12E provides a solid-state electro-optical device for replacing prior art opto-mechanical scanning arrangements.

A scanner embodiment is described in referenced application Ser. No. 727,330 with reference to FIG. 12B and FIG. 12C therein and with reference to FIG. 12E herein; wherein source 1225 illuminates generator 1224 to provide an image to be scanned onto a screen with scanner segments 1230–1237 or 1260–1266 respectively. In an improved embodiment, segments 1230–1237 or 1260–1266 may be formed having alpha-numeric or other characters wherein the characters may be generated at surfaces 1230–1237 or 1260–1266 rather than with a separate generator 1224. If each of surfaces 1230–1237 or 1260–1266 contained image generation capability such as controllable segments for alpha-numeric characters as is well known in the art, then control of the appropriate surface to have selected segments reflective and for all other surfaces to be transmissive would project the appropriate segments and therefore the desired characters onto screen 1223. In this embodiment, the corresponding segment on each of surfaces 1230–1237 or 1260–1266 may be connected together in parallel for selecting that corresponding segment on all surfaces. Selection of the particular surface would be provided by selecting the appropriate one of eight return electrode signals B0–B7 (FIG. 12C) so that only the selected surface would have the segments reflective for display of the controlled character on screen 1223.

This arrangement is analogous to well-known display refresh electronics, where a particular character out of a plurality of characters is selected with individual character select signals and where all of the corresponding segments of the plurality of characters are connected in parallel to a particular segment control signal. Therefore, coincidence of a character select signal and the segment select signals define which segments of which character are to be displayed. Such an arrangement is discussed in detail in copending application Ser. No. 101,881 relative to FIG. 2D and in copending application Ser. No. 288,247 relative to FIG. 4 therein showing character select control signals and segment select controls from select drivers and from segment drivers respectively for a segment display tube wherein said FIG. 2D and FIG. 4 and the related discussion are herein incorporated-by-reference. A similar selection embodiment using liquid crystal type characters on angular surfaces shown in said FIG. 2B and FIG. 12E can be used to implement the scanning of multiple characters onto a refreshable screen 1223.

In another embodiment, generator 1224 may be constructed as an integral part of scanner 1222; such as with another layer above surface 1230 (FIG. 12C) wherein the projection image may be formed with integral generator 1224 and may be reflected to the correct position on screen 1223 having a batch fabricated self-contained character generator and scanner arrangement.

In accordance with the projection display arrangement of the present invention, display arrangements 1220 and 1201 may be miniature displays and screen 1223 may be a large screen, wherein post-optics 1436 (FIG. 14) may be used to project and focus scanned images 1240-1247 or 1260-1266 along screen 1223 (FIG. 12B and FIG. 12E) and onto screen 1451 (FIG. 14A).

A further important feature of the scanner and projector arrangements of the present invention includes the ability to scan high intensity illumination that is magnified to large dimensions such as with pre-optics 1433 or post-optics 1436 (FIG. 14A). For example, pre-optics 1433 (FIG. 14A) may be inserted between source-generator 1224 and electro-optical device 1222 and 1279 for focusing projected characters formed with generator 1225 onto small controllable reflectors 1230-1237 and 1270-1276 respectively for selectively scanning or controlling projection of illumination from source 1225 and generator 1224. Focusing of illumination onto devices 1230-1237 and 1270-1276 forms a very small beam of illumination focused on devices 1230-1237 and 1270-1276 and reflected from devices 1230-1237 and 1270-1276 to project large magnified images on a screen with a very small focused beam using very small-sized reflecting devices.

Spacial Control of Illumination

Spacial control of illumination is well known in the art using resistive electrodes for providing potential gradients. Another feature of the present invention provides such spacial control of illumination using thickness of electro-optical material. For simplicity, this arrangement will be discussed for liquid crystal material with reference to FIG. 15A and FIG. 15B.

Figure 15A:
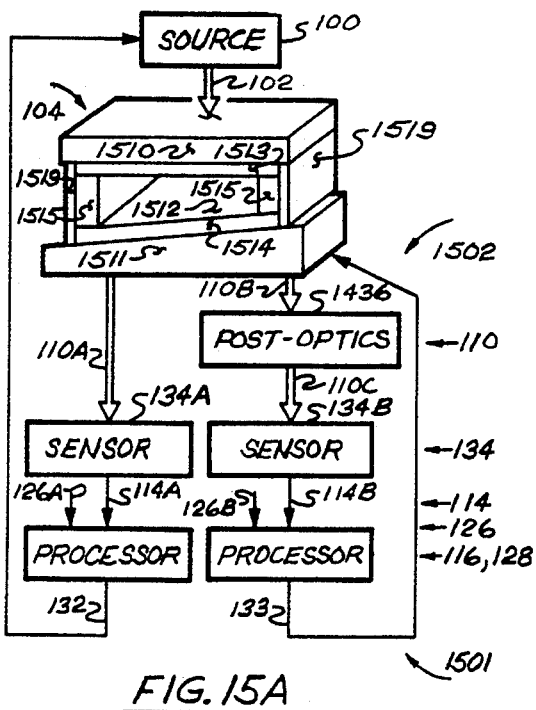
FIG. 15 is a schematic and block diagram illustrating spacial control comprising FIG. 15A showing a rectangular symetry arrangement, FIG. 15B showing a circular symetry arrangement, FIG. 15C showing a watch embodiment, and FIG. 15D showing a camera control embodiment.

Liquid crystal material 1512 may be sandwiched between a pair of glass substrates 1510 and 1511 having electrodes 1513 and 1514 respectively deposited or otherwise placed thereon. A retainer 1515 for liquid crystal material 1512 may be constructed with teflon and a sealer 1519 may be constructed with epoxy. The arrangement shown in FIG. 15A represents a cross section, wherein retainer 1515 and seal 1519 encapsulate liquid crystal material 1512 in the vertical plane and substrates 1510 and 1511 encapsulate liquid crystal material 1512 in the vertical plane and substrates 1510 and 1511 encapsulate liquid crystal material 1512 in the horizontal plane. In FIG. 15A, liquid crystal material 1512 is shown deeper at the left-hand side and shallower at the right-hand side and is shown in FIG. 15B deeper in the center and shallower at the outer periphery implemented by properly dimensioned retainer 1515 and seal 1519 and may be further implemented with substrates 1510 and 1511 ground at sloping angles down to the left as shown in FIG. 15A and down toward the outer periphery as shown in FIG. 15B. Excitation of liquid crystal material 1512 with the proper constant voltage across electrodes 1513 and 1514 will cause the liquid crystal material at the shallower right-hand portion of FIG. 15A and at the shallower outer periphery of FIG. 15B to become opaque and will preserve the transmissive nature of the liquid crystal material 1512 at the deeper left-hand side of FIG. 15A and deeper central portion of FIG. 15B. As the electrical field between electrodes 1513 and 1514 is increased the liquid crystal opaque region interface at the shallower right-hand portion shown in FIG. 15A will move towards the left and the liquid crystal opaque region interface at the shallower outer periphery shown in FIG. 15B will move towards the center thereby encompassing a greater area. Conversely as the electric field is decreased the liquid crystal opaque region interface at the shallower right-hand portion shown in FIG. 15A will move towards the right and the liquid crystal opaque region interface at the shallower outer periphery shown in FIG. 15B will move towards the outer periphery thereby encompassing a lesser area. This variable depth method may be used in combination with the well-known prior art method using resistive electrodes to obtain an additional degree of freedom of control.

Spacial control is well known in the prior art such as controlling the relative transmissive and opaque areas of the liquid crystal device. These arrangements are inaccurate because of the difficulty in controlling liquid crystal device thresholds, excitation voltages, and other characteristics. A feedback arrangement will now be discussed to provide precise spacial control such as to control the relative areas that are opaque and transmissive of a liquid crystal device. Use of the closed loop feedback method of the present invention significantly enhances precision of spacial control, as will now be discussed with reference to FIGS. 1 and 15A. The electro-optical arrangement shown in FIG. 15A may be illumination amplifier 104 shown in FIG. 1. Illumination 102 from source 100 may illuminate amplifier 104 controlled with signal 133 to generate controlled illumination 108 and 110. Feedback sensor 134 generates feedback signal 114 in response to illumination 110, wherein signal 114 is processed with signal processor 116 and command device 127 and signal processor 128 for control of amplifier 104. Control may be analog control or digital control and may be pulse modulated control or other forms of control discussed in U.S. Pat. No. 3,986,022 wherein digital excitation is discussed with reference to FIG. 2A, pulse modulated excitation is discussed with reference to FIGS. 2B-2D and other forms of excitation are discussed elsewhere therein.

One embodiment of a feedback arrangement will now be discussed with reference to FIG. 15A as a multiple-loop spacial feedback control arrangement, where this arrangement may also be used with other embodiments such as discussed in U.S. Pat. No. 3,986,022 and application Ser. No. 727,330 and elsewhere herein.

Source 100 illuminates amplifier 104 with source illumination 102 to generate controlled illumination 110 comprising signals 110A, 110B, and 110C. Illumination 110 exposes sensors 134 comprising AGC control sensor 134A and spacial control sensor 134B to generate feedback signals 114 comprising AGC feedback signal 114A and spacial control feedback signal 114B to be compared with command signals 126 comprising a scale factor or AGC command signal 126A and a spacial command signal 126B to feedback signal processors 116, 128 to generate control signal 132 and illumination amplifier control signal 133. This arrangement is exemplary of a multiple-feedback arrangement such as for AGC and spacial control and is also exemplary of other multiple feedback arrangements usable with other embodiments discussed herein; in U.S. Pat. No. 3,986,022; and in copending application Ser. No. 727,330. Source 100 may generate illumination 102 in response to feedback signal 114 where source control is exemplary of automatic gain control and wherein other arrangements may be used such as control of an electro-optical device 104 to control source illumination. Illumination 102 is controlled by illumination amplifier 104 such as having liquid crystal material 1512 in a spacial control. The transmissive region of the spacially controlled material is shown in the right-hand portion of FIG. 15A wherein the thicker the liquid crystal material the more likely it is to be transmissive and wherein the thickest spacial region is the last region to become opaque, as discussed above. Therefore, sensor 134A providing a form of automatic gain control (AGC) may be placed in a region that is the least likely region to become non-transmissive or alternately may be placed to directly sense source illumination 102 for AGC. AGC illumination 110A may be sensed with sensor 134A to generate feedback signal 114A which may be compared with command signal 126A using processor 116,128 to generate control signal 132 to control source 100.

Similarly, spacial illumination control may be provided with feedback arrangement 1502 where source illumination 102 as controlled by illumination amplifier 104 may be received as controlled illumination 110B, processed with post-optics 1436 to generate post-processed illumination 110C for illuminating sensor 134B. Sensor signal 114B may be processed with processor 116, 128 to generate illumination amplifier control signal 133 for controlling illumination amplifier 104. Post-optics 1436 may include an accumulating lens for accumulating a portion of or all of the illumination from illumination amplifier 104 to provide spacial control of amplifier 104.

Processor 116, 128 may compare feedback signal 114B with command signal 126B to generate a difference signal 133 to provide spacial control to make a particular area proportional to command signal 126B opaque or transmissive. For example, if command signal 126B is at one-quarter of the peak amplitude; processor 116, 128 may generate command signal 133 to servo the amplifier 104 to make three-quarters of the area opaque and one-quarter of the area transmissive to generate feedback signal 114B being one-quarter amplitude. When command signal 126B and feedback signal 114B are each related to one-quarter illumination amplifier magnitude, the difference signal 133 will maintain illumination amplifier 104 having that particular excitation level and that spacial illumination control level. Therefore, the amplitude on command signal 126B defines the relative areas of amplifier 104 that are opaque and transmissive.

Spacial control used to form lines, circles, segments, and other constant area devices are well known in the art by providing positive and negative excitation to resistive electrodes wherein the transition through zero voltage gradient provides the desired line or other shaped element. Biasing of the constant gradient is used to control the position of the transmissive element. The prior art does not control dimensions nor characteristics of the transmissive or opaque element except as fixed in the design of the device. An arrangement will now be discussed, to control the characteristics of the element in addition to the prior art methods of providing spacial control.

Biasing of the constant slope gradient is used in the prior art to provide spacial control. In accordance with the present feature of the present invention, the slope of the gradient may be controlled to control the spacial distance covered by the line or other element, to control the sharpness and other characteristics of the edges, and to provide other such capabilities. Such gradient slope control may be provided with an illumination feedback loop in the form discussed with reference to FIG. 15A herein. For example, control of an element such as a line or circular arc may be provided with feedback loop comprising post-optics 1436 to accumulate the illumination as illumination signal 1110C, sensor 134B for generating feedback signal 114B proportional to illumination signal 110C, processor 116, 128 for processing feedback signal 114B and for comparing feedback signal 114B with command signal 126B to generate illumination amplifier control signal 133 to control illumination amplifier 104. Command signal 126B may define the amount of illumination to be transmitted by amplifier 104 and may be used to change the gradient of the electrode voltage on amplifier 104 such as by increasing the positive excitation and decreasing the negative excitation such as with push-pull or inverter amplifier techniques. This gradient slope control may change the shape of the transmissive element and the edgequity or sharpness of the edges.

Further, a plurality of feedback loops may be provided such as for shape control of the illumination element, spacial position control of the illumination element, and control of other such characteristics. Further, the system may operate in a reflective mode wherein the more remote electrode 1514 may be reflective for reflecting illumination 102 in contrast to the transmission of illumination 102 shown in FIG. 15A and wherein sensors 134 may sense reflected illumination.

Figure 15C:
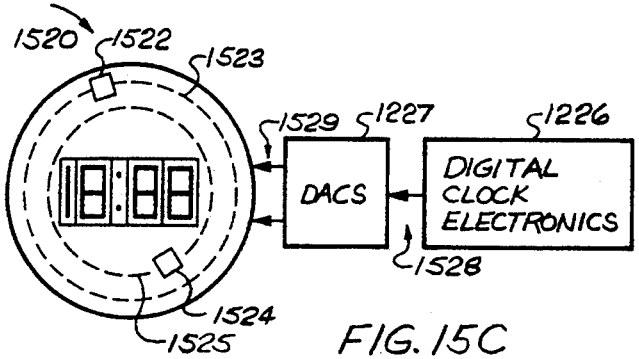
Figure 15B:
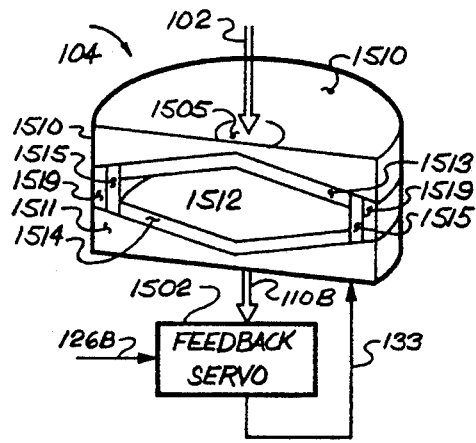

One embodiment of the spacial control feature of the present invention is a spacial controlled clock such as a watch 1520 (FIG. 15C). Liquid crystal watches are well known in the art such as providing digital displays 1521. The liquid crystal watch of the present invention uses area control to provide analog rotational motion similar to mechanical watches with second, minute, and hour hands. Because the angular position of a display element may be controlled with spacial control gradient methods, these elements may be used to provide pointers on a watch. For example, controlled illumination area 1522 may represent an hour pointer which may traverse the periphery of watch 1520 once every 12 hours and illumination pointer 1524 may be a minute pointer and may traverse the periphery of watch 1520 once every hour and further other pointers may provide second information and date information accordingly. The position of these pointers 1522 and 1524 may be controlled with digital electronics used to generate digital displays 1521 which are well known in the art. These digital electronics may excite digital-to-analog converters 1227 to control the gradient by exciting resistive electrodes to control the position of pointer elements 1522 and 1524. The analog spacial control pointers of watch 1520 may be used in conjunction with digital display 1521 or in replacement thereof.

An alternate embodiment is shown in FIG. 15B where a circular symmetry spacial control arrangement is provided. Illumination amplifier 104 is shown in section circular symetry form having feedback servo 1502 generating feedback control signal 133 in response to controlled illumination 110B similar to that discussed with reference to FIG. 15A. Feedback servo 1502 may have post-optics 1436 for generating a post-processed illumination signal 110C to illuminate sensor 134B for generating feedback signal 114B to be compared with command signal 126B. Processor 116, 128 may compare feedback signal 114B with command signal 126B to generate feedback control signal 133 to control illumination amplifier 104. Illumination amplifier 104 may comprise glass substrates 1510 and 1511, electrodes 1513 and 1514 on substrates 1510 and 1511 respectively, spacer and support 1515, sealer 1519, and liquid crystal material 1512.

Substrates 1510 and 1511 may be formed to provide thicker liquid crystal material at the center and shallower liquid crystal material at the outer periphery as shown in FIG. 15B. Therefore, excitation 133 controls the liquid crystal material at the outer periphery to become opaque before the center liquid crystal material becomes opaque. As excitation is applied and increased in magnitude, liquid crystal material at the outer periphery near spacer 1515 becomes opaque but the liquid crystal material towards the center remains transparent. As the excitation is increased, the outer periphery of opaque material increases in area radially inward towards the center until a level of excitation is reached sufficient to make the deeper liquid crystal material at the center opaque. Therefore, the arrangement shown in FIG. 15C may be used to electronically control the radius of the central transparent area 1505.

Alternately, substrates 1510 and 1511 and spacer 1515 may be formed to provide thicker liquid crystal material at the outer periphery and shallower liquid crystal material at the center to provide a transparent circle at the outer periphery that increases in radius away from the center as excitation is increased, providing the complement of operation of the arrangement shown in FIG. 143. Further, the arrangement shown in FIG. 153 may use the high resistance electrode arrangement or other techniques to provide electric field gradients to generate a transparent (or opaque) spot 1505 and to control the radius of spot 1505 for illumination control.

The arrangement discussed with reference to FIG. 153 may be used as a camera shutter and aperture such as discussed with reference to FIGS. 8-10 in U.S. Pat. No. 3,986,022 and copending application Ser. No. 727,330. A command signal 1263 may be input to feedback servo 1502 (FIG. 153) to generate control signal 133.

If command signal 1263 is a large command signal, servo 1502 generates a large excitation signal 133 which causes the complete area of liquid crystal material 1512 to become opaque and spot 1505 to reduce to zero radius of transparent material; thereby blocking all of illumination 102 and implementing a shutter. This shutter may be used in conjunction with mechanical shutters and other photographic camera devices as discussed with reference to FIGS. 8-10 of U.S. Pat. No. 3,986,022. Changing of control signal 1263 to a command magnitude less than the threshold magnitude for the thicker center liquid crystal material causes transparent spot 1505 to form having a radius that is a function of the magnitude of command signal 126B.

Control of transparent spot 1505 is similar to control of an aperture such as a prior art mechanical aperture for controlling the amount of illumination transmitted. Therefore, a camera using the arrangement shown in FIG. 15B controls exposure of an illumination sensitive medium 130 by initially maintaining shutter aperture arrangement 104 opaque with a high magnitude command signal 126B and then generating said lower magnitude threshold signal 126B in response to an exposure command signal to provide a transparent spot 1505 having a desired radius that is a function of an aperture or illumination magnitude camera setting. After a particular exposure time, signal 126B is returned to the high magnitude value to again control illumination amplifier 104 to be fully opaque to terminate the exposure. The shutter magnitude may be a characteristic of the camera system such as a fixed high magnitude level and the exposure magnitude may be settable such as with a well-known potentiometer setting to control the aperture to define the threshold magnitude of signal 126B to control the radius of transparent spot 1505 with feedback signal 133 for the duration of the exposure. Well-known prior art timing arrangements may provide timing for the exposure in response to an exposure command from an operator, switching to the lower magnitude exposure signal in response to the exposure command and then switching command signal 126B back to the higher magnitude shutter signal after the time delay for exposure has expired.

The arrangement discussed with reference to FIG. 15B may operate as a conventional aperture in an open loop command arrangement or may operate as an adaptive aperture for the closed loop control arrangement shown in FIG. 15B. For example, generation of control signal 133 in response to command signal 126B causes a controlled diameter of transparent spot 1505. Use of feedback servo 1502 operating in response to illumination 110B causes the diameter of transparent spot 1505 to be controlled to a magnitude that is a function of the command signal 126B and the magnitude of incident illumination 102. Therefore, the greater the command signal 126B the larger will be the diameter of transparent spot 1505 and the greater the magnitude of incident illumination 102 the smaller will be the diameter of transparent spot 1505 implicit in the operation of servo 1502.

Figure 15D:
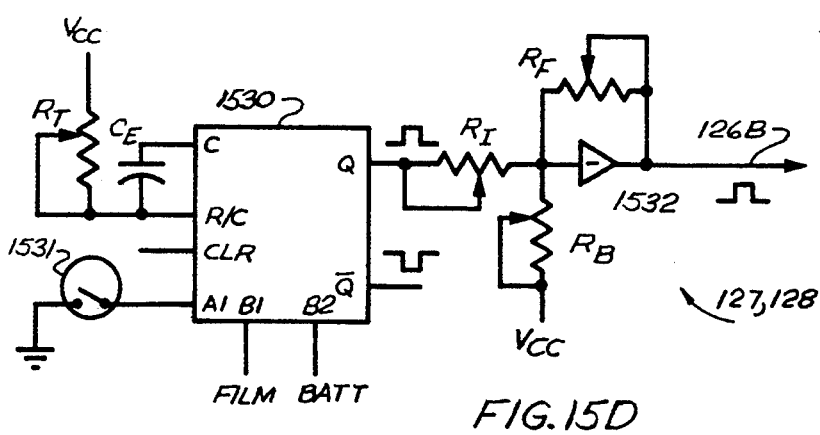

A camera control system will now be discussed with reference to FIG. 15D. For simplicity of illustration, a Texas Instruments 74122 time delay multivibrator and a Fairchild 709 operational amplifier will be used to exemplify this invention, although many other control arrangements may be provided. Multivibrator 1530 generates output pulses Q and $\overline{Q}$ in response to closure of switch 1531 to excite input A1, where switch 1531 initiates an exposure. The width of output pulse Q is determined by the values of capacitor CE and resistor RT to multivibrator terminals C and R/C. Resistor RT may be a variable resistor for controlling time duration of output pulse Q, where resistor RT controls exposure time. The exposure may be interlocked with many different signals using inputs B1 and B2 and using other signals ANDed or ORed together using well-known logical techniques. For example, a switch may be closed by the film being wound after an exposure and this switch closure may enable the next exposure through input B1 and a battery having sufficient charge for the exposure such as to drive a flashbulb or for operation of the camera electronics may interlock the exposure with a signal input to terminal B2. Many other interlocks may be provided hereto. Exposure control pulse Q may be processed with conventional electronics such as with operational amplifier 1532 exemplified by the Fairchild 709 or 741 amplifiers. The amplitude of output pulse 126B may be controlled with variable input resistor RI and a variable feedback resistor RF to establish gain of amplifier 1532 and therefore to establish amplitude of output pulse 126B. Further, variable resistor RB may bias output pulse 126B to a desired level. The input signals to amplifier 1532 may be connected to the negative input terminal as shown in FIG. 15D or conversely may be connected to a positive input terminal using well-known differential amplifier techniques.

Control potentiometers RI, RF and RB may control the aperture function; where the amplitude and bias of signal 126B to feedback servo 1502 may control excitation signal 133 and therefore control the radius of transparent area 1505 (FIG. 15C). For example, the bias signal controlled with resistor RB may define the steady state excitation magnitude of signal 126B which may be adjusted to cause transparent area 1505 to have zero radius or to cause illumination amplifier 104 to be fully opaque to provide the shutter function in the absence of a pulse Q from multivibrator 1530. Control potentiameters RI and RF may be used to control amplitude of control pulse 126B, wherein the amplitude of pulse 126B controls the radius of transparent area 1505 and therefore controls the function of an aperture control illumination amplifier 104 for a camera system. It should be recognized that there may be interaction between the bias controls and amplitude controls relative to aperture size. Therefore, control RB may be a factor setting, control RI may be a factory setting, and control RF may be an operator-determined aperture control setting.

Multivibrator 1530 may be relatively insensitive to false triggering such as jitter or bounce of switch 1531 and the output of multivibrator 1530 may be independent of further transitions of the inputs once fired and may be a function only of timing components CE and RT, where well-known circuits for switch debounce may not be necessary.

The S/N 74122 multivibrator may be adjusted from a 40-nanosecond to a 28-second exposure time and may be further extended in exposure time by proper selection of components CE and RT. It may be desirable to limit the exposure time delay to a minimum of one millisecond rather than the 40-nanosecond time, which can be provided with fixed series and parallel resistors connected between terminals C and R/C and connected with components CE and RT in well-known parallel and serial combinations. The output pulse may be terminated such as with feedback signals 132 and 133 or other signals such as integration signals 956 and 120 as discussed with reference to FIG. 9C in U.S. Pat. No. 3,986,022; where a threshold comparitor circuit such as the Fairchild 710 may detect a desired threshold amplitude and generate a clear signal. Alternately, the S/N 74122 multivibrator has a retriggerable capability wherein well-known circuits may be provided for re-triggering multi-vibrator 1530 to generate longer output pulses Q and $\overline{Q}$. Such multivibrators are discussed in the TTL Data Book For Design Engineers by Texas Instruments Inc, copyright 1973; particularly at pages 82 and 134–140 therein and herein incorporated-by-reference.

Audience Display System, Additional Features

An audience display system has been described in U.S. Pat. No. 3,986,022 wherein improvements thereto are presented hereinafter.

An audience display system implemented in a transmissive mode such as being back-lighted with floodlights is enhanced if the floodlight illumination is evenly dispersed over the display area. Therefore, another inventive feature is related to including a device for evenly dispersing illumination over an audience display arrangement in particular and over an electro-optical device in general. Practical systems provide relatively even distribution, but it should be recognized that perfection in uniformity of distribution may not be practically achievable. Therefore, it is herein intended that terms relating to uniform distribution mean good distribution of illumination. In one embodiment, use of floodlight type devices or other wide beam device provides good distribution of illumination. In a further improved embodiment, an illumination distribution device may be placed inbetween the illumination source and the electro-optical device such as a screen for illumination distribution that may be composed of frosted glass, lucite, or other illumination conducting and distributing devices.

Various features of the present invention may be used in an environment that has changing ambient light conditions such as for an outdoor display that may operate in an outdoor environment having daytime and night-time conditions and further having varying sunlight conditions in the daytime. As discussed in U.S. Pat. No. 3,986,022; an electro-optical device may operate with ambient illumination (not artificial illumination) when ambient illumination such as sunlight is sufficiently intense. When ambient illumination is not sufficiently intense, the electro-optical device may operate in conjunction with artificial illumination such as with floodlights. An electronic control may control artificial illumination as a function of natural illumination. For example, in the simplest implementation a manual switch may be provided to turn-on the artificial illumination when the natural illumination is not sufficiently intense. Alternately, an automatic system may be implemented such as with a photosensor detecting ambient illumination and controlling the intensity of artificial illumination. This embodiment may be better understood with reference to FIG. 1 as discussed below.

Photosensor 134 may sense ambient illumination and generate feedback signals 114, 120, 124, and 139 with feedback signal processors 116 as feedback to command device 127 and signal processor 128 for controlling intensity of source 100, which may be a floodlight, as a function of ambient illumination. Similarly, amplifier 104 may be controlled as a function of ambient illumination with signal 133. Alternately, feedback transducer 134 may sense transmitted and/or reflected illumination 110 from amplifier 104 for controlling illumination amplifier 104 to maintain a desired intensity of signal 110 comprising either natural illumination, source illumination, or a combination of natural and source illumination.

In a further improvement, an audience display system may include a plurality of illumination sensors including an ambient illumination sensor and a controlled illumination sensor. The ambient illumination sensor may sense ambient illumination 110 to control source 100 with feedback signals 120 and 124 to processor 128 to generate source control signal 132. The control illumination sensor may sense controlled illumination 110 to control amplifier 104 with feedback signals 120 and 124 to processor 128 to generate amplifier control signal 133.

In the above-described control arrangements, command elements 127 and 128 may include a stored program digital computer, as discussed in the referenced copending patent applications, wherein this computer may include a program to optimize intensity as a function of ambient illumination by controlling source 100 and illumination amplifier 104 to provide the desired optical effect. In this embodiment, computer 251 would receive feedback signals from sensor 134 comprising an ambient illumination sensor and a controlled illumination sensor for generating control signals 132 and 133 in response to an interrelationship between ambient and controlled illumination intensity.

Ambient illumination is herein intended to mean external illumination in the environment of the controlled device, background illumination, and generally external illumination that is not controllable in response to the illumination feedback signal and which may be controlled with the illumination amplifier arrangement of the present invention.

The audience display features of the present invention have been discussed with reference to a preferred embodiment using an electro-optical arrangement but the improvements are also applicable to other embodiments. For example, the improvements of feedback control, ambient illumination control, intensity control using pulsed width modulation, colored displays, and other inventive features may be used in conjunction with incandescent bulb displays and other displays, wherein it is intended that the features of the instant invention not be limited to an electro-optical embodiment.

Further Considerations

The system of the present invention is directed to illumination control in a general and a broad conceptual form. For simplicity of discussion, illumination control devices have been characterized as illumination amplifiers, liquid crystal devices, electro-chemical devices, electro-optical devices, and many other well-known devices have been referred to in general form. These generally referred to well-known devices include electrochromic devices, electrophoretic devices, PLZT devices, and other devices for illumination control.

Control of transmissivity and reflectivity is discussed and claimed in the system of the present invention for devices such as liquid crystal devices, where the device may be either transparent or opaque but may not provide true reflectivity. As is well known in the art, the transmissivity characteristic provides for control of transmission of illumination by controlling the device to be transmissive or opaque. When operating in the reflective mode, a reflector may be provided to reflect illumination back through transmissive segments such as a reflective rear electrode for reflecting illumination transmitted through the transmissive liquid crystal material. Therefore, although reflectivity may be discussed in the context of reflective liquid crystals, etc, it is intended that the common reflective mode terminology pertaining to providing a reflector for reflective mode operation imply an auxiliary reflector if the illumination control device itself does not provide such reflective characteristics. Certainly, if the controllable material such as liquid crystal material provides directly controllable reflectivity, there may be no need for auxiliary reflecting structures.

It is herein recognized that extremely high intensity illumination may affect certain electro-optical and electro-chemical devices in a chemical or thermal manner that may be considered undesirable. For most intensities and for most materials, this may not be a problem. For very high intensities and for certain materials, the affect of energy levels adversely affecting the electro-optical devices must be considered and this consideration is herein recognized.

It is herein intended that the various inventive features set forth herein be usable in well-known illumination processing devices. For example, various inventive features including apertures, shutters, choppers, scanners, feedback control, etc. may be usable with well-known telescopes, microscopes, binoculars, and periscopes, and other illumination processing devices.

Electro-Optical Thermal Design

In accordance with another feature of the present invention, an arrangement is provided for removal of thermal energy from an illumination amplifier device, which may constitute removal of relatively large quantities of thermal energy. For example, projection arrangements illuminated with high intensity illumination may cause an illumination amplifier to absorb illumination energy to the degree where thermal considerations become important, wherein heat transfer methods disclosed herein and/or well known in the art may be used.

An illumination amplifier may be illuminated with high intensity illumination and may exhibit a thermal temperature rise in response to absorbed illumination energy. Some heat transfer may be provided through passive mechanisms inherent in substantially any implementation such as through radiation and through convection, but these inherent passive cooling mechanisms may not be sufficient. Therefore, supplementary cooling methods may be required. Many supplementary cooling methods are disclosed herein and/or are well known in the art. For example, forced air convection can be used such as with a fan blowing air over the surface of the illumination amplifier. Also, a heat exchanger can be used either independently or in combination with other methods such as in conjunction with forced air cooling and/or in conjunction with fluid cooling. Forced air cooling can be provided with a well-known blower. Fluid cooling can be provided by circulating cooling fluid through a heat exchanger. Commercially available cooling elements can be used such as commercially available fans; heat exchangers; fluid cooling arrangements such as chilled water, nitrogen, freon, air, or other cooling fluids or gases; and other cooling arrangements. Also, a radiation median such as a cool radiation receiver can be provided for radiant cooling of the illumination amplifier. Many other methods will become obvious from the teachings herein.

Thermal design is well known in the art and may be applied to the arrangement of the present invention from the teachings herein. This is exemplified with the articles by McNeal and Gordon and by Leonard and Axelband referenced herein and with multitudes of textbooks, articles, and other publications in the public domain.

Controls for heat transfer devices are well known in the art and may include electronic, mechanical, and/or other control devices. For example, mechanical controls are well known for automobile cooling systems and for household refrigerators, electro-mechanical controls are well known for air conditioners and for household heating systems, electronic controls are well known for ovens, and many different types of controls are well known for many applications. In view of the above, well-known thermal controls may be used with the embodiments set forth herein and therefore may not be further discussed herein for a particular embodiment; but are intended to be implicit herein as will become obvious from the teachings herein.

Prior art systems using illumination amplifier devices are not concerned with heat generated by the illumination amplifier device (IAD) because of the low illumination power levels used in prior art systems. For example, prior art liquid crystal devices (LCDs) are inherently low power devices and therefore with prior art systems there has been no concern for heating due to electrical excitation. Further, prior art LCDs operate in relatively low illumination environments such as in sunlight or with low intensity illumination sources for nighttime viewing such as provided with well-known LCD watch displays. Therefore, the prior art is not concerned with thermal effects of the incident illumination or of the electrical excitation.

LCDs are affected by ambient temperatures, wherein the response is slowed at low temperatures and the display is degraded at high temperatures. Ambient temperature operation is considered by the prior art to be a requirement, wherein thermal considerations are limited to merely placing a constraint on the operating environment. For example, LCDs are specified for operating in a limited ambient temperature environment such as from 0° C. to 70° C. The prior art does not in any way provide arrangements for cooling LCDs or other IADs because the prior art does not use LCDs in arrangements that might provide significant heating effects or in arrangements that operate at environmental temperatures outside of the specified LCD operating regions.

In accordance with the instant feature of the present invention, a thermal control arrangement is provided to permit IADs to tolerate high energy illumination and/or excitation and/or to operate in ambient temperature enrivonments outside of the specified operating region for IADs. The need for such thermal control arrangements has not been acknowledged by the prior art because the prior art is unaware of uses that could exceed the thermal specifications of the IAD and/or extend the use of IADs beyond the specified operating region. For example, in accordance with the projection display arrange-merit of the present invention, an IAD can be illuminated with high intensity illumination for projection of high intensity large screen displays. High intensity illumination causes heating of the IAD and therefore could require thermal design considerations. Because the prior art does not consider such projection display arrangements, the prior art has not been concerned with high intensity illumination nor any need to cool an IAD exposed to high intensity illumination.

For simplicity of discussion, the thermal design feature of the present invention will be discussed for a liquid crystal device (LCD). It is herein intended that any reference to an LCD be interpreted as a reference to a generalized illumination amplifier device.

In a preferred embodiment, a projection IAD is provided, operating in a reflective mode, having heat transfer devices as discussed hereinafter, and being illuminated by high intensity illumination. The prior art does not consider heat transfer devices, nor projection arrangements for IADs and certainly not in combination with reflective mode operation.

Although the preferred embodiment of a heat transfer device is related to cooling of an IAD, it will become obvious from the teachings herein that a heating arrangement for heating an IAD can be implemented therefrom. Therefore, it is herein intended that any reference to heat transfer, cooling, etc be interpreted as a reference to a generalized heat transfer arrangement for cooling, heating, etc.

Further, heat transfer means and methods are discussed herein for different preferred embodiments, wherein it is herein intended that any heat transfer arrangement discussed herein may be used in combination with any other heat transfer arrangement and with any IAD arrangement.

Yet further, heat transfer advantages are discussed herein for IAD, LCD, and filter arrangements; wherein it is herein intended that this reflective mode heat transfer arrangement be applicable to illumination devices in general including lens, filters, etc as exemplified by IAD, LCD, and filter arrangements herein.

Heat transfer can be provided in the form of radiant, convective, and/or conductive heat transfer and can be enhanced with devices that improve radiation, convection, and conduction.

An IAD can be operated in a transmissive mode or in a reflective mode, wherein heat transfer arrangements for a transmissive mode IAD has more constraints than for a reflective mode IAD. For a transmissive mode IAD, both sides of the IAD are unobstructed to permit transmission of the illumination from one side to the other side. For a reflective mode IAD, illumination is reflected from the same side that is illuminated with the incident illumination. Therefore, the back side or rear side (opposite from the illuminated side) of a reflective mode IAD is available for heat transfer devices. This provides a significant advantage over transmissive mode arrangements because heating affects due to high intensity illumination are concentrated on the illuminated portions of the IAD, wherein heat transfer from the back side of the IAD is therefore significantly more efficient.

For a transmissive mode IAD, both the front and the back of the IAD must be relatively transparent to illumination, thereby minimizing the location of thermal devices. For a reflective mode IAD, the back of the IAD does not have to be transparent and therefore can provide convenient mounting for heat transfer devices. Mounting of heat transfer devices on the back of a reflective mode IAD brings the heat transfer device into very close proximity with the illuminated front face of the IAD. Because the front face of the IAD typically exhibits the worst case heating condition, such a reflective mode rear cooled IAD permits a more efficient thermal design. Therefore, in a preferred embodiment, a reflective mode IAD is provided having a heat transfer arrangement mounted on the rear or back side of the IAD to enhance heat transfer.

Experience indicates that providing heat transfer from the back side of a reflective mode IAD is about ten times better than providing heat transfer from the edges or outside periphery of an IAD, wherein such an order of magnitude improvement is very significant.

Natural radiation, convection, and conduction provide some cooling for IADs, but such heat transfer may not be adequate for many uses. For example, substantially any device transfers radiant energy to or from the external environment and provides some heat transfer due to free air convection and due to conduction through a mounting structure or other contact structure. Such heat transfer may be significantly enhanced with the proper heat transfer devices.

One method of heat transfer is to provide forced conduction cooling such as by blowing air at the IAD for cooling. This arrangement has advantages, wherein cooling air is transparent to illumination and therefore can be directed at the front face of the IAD or at hot spots on the IAD for optimum cooling. Further, forced air cooling is inexpensive and effective for many applications. Disadvantages include the primary disadvantage that it may be undesirable to provide a fan or other such device in many types of systems such as small portable systems characterized by a calculator or an electronic toy. Further, a blower consumes a relatively large amount of electrical energy compared to the excitation energy for an IAD, thereby degrading battery life for portable battery operated systems. Yet further, blowers have disadvantages such as requiring dust filters, ducting, etc. In view of the above, a blower heat transfer device is acceptable for many IAD applications, but a conductive heat transfer device provides important advantages for other IAD applications.

Although an IAD is herein intended to be generally interpreted in a broad context, an illumination amplifier may be exemplified with an LCD in a preferred embodiment to provide a simple illustration of the features of the present invention. Various arrangements of the heat transfer arrangement for illumination amplifiers will now be discussed in the embodiment of an LCD arrangement with reference to FIG. 16, which is herein intended to be exemplary of the broad scope of illumination amplifier arrangements.

Various embodiments of cooling arrangements are shown in FIGS. 16A–16D. These arrangements show LCD 1610 being illuminated by incident illumination 1611 which is transmitted as transmitted illumination 1612 and/or reflected as reflected illumination 1613. LCD 1610 may be heated such as by absorbing incident illumination 1611, by heat dissipation due to electrical excitation, by ambient conditions, etc. Inherent cooling is provided by radiation 1615 such as to the external environment, convection 1616 such as to the air, and/or conduction 1617 such as to a mounting structure.

Forced air cooling can be provided with blower 1618 generating forced air 1619 to cool LCD 1610. Blower 1618 can be any well-known blower including fans, etc and can include devices such as plenums, tubing, etc to facilitate cooling.

Conductive cooling can be provided as shown in FIGS. 16B–16D. Conductive devices 1621 and 1622 (FIG. 16B) and/or device 1623 (FIG. 16C) and/or device 1624 (FIG. 16D) can be placed in contact with LCD 1610 having edge 1620, illustrated to provide an isometric perspective. Conductive devices 1621–1624 can be placed in contact with LCD 1610 in a manner that provides good thermal contact such as by providing flat contact surfaces, thermal conducting adhesives, thermal conducting contact materials, thin contact materials and/or various well-known thermal contacting methods and devices. Conducting devices can be provided around the periphery of LCD 1610 such as "picture-frame" type devices 1621 and 1622 (FIG. 16B) and/or edge type devices 1623 (FIG. 16C). Such picture-frame and edge devices permit transmission of illumination 1611 through a portion of the center of LCD 1610 to provide transmitted illumination 1612. Such devices can be mounted near the edge of LCD 1610 for minimum obstruction of incident illumination 1611, such as shown with conducting devices 1622 (FIG. 16B) and 1623 (FIG. 16C) or alternately such conducting devices can be mounted on the side of LCD 1610 opposite the side receiving incident illumination 1611 such as illustrated with conducting device 1621 (FIG. 16B).

The arrangements shown in FIG. 16A–16C can be used with transmissive or reflective mode LCDs, wherein the back side of LCD 1610 (the side opposite the side illuminated with incident illumination 1611) is not obscured with heat transfer devices thereby permitting transmissive mode operation.

In accordance with a preferred embodiment of the present invention, a reflective mode IAD is provided having improved heat transfer capability, as will be discussed with reference to FIG. 16D. LCD 1610 can operate in a reflective mode having controlled reflection of incident illumination 1611 as reflected illumination 1613. Because of the reflective mode of operation, transmission of incident illumination 1611 through LCD 1610 and through the back side of LCD 1610 is not required. Therefore, the back side of LCD 1610 is available for heat transfer devices. Because the thickness of edge 1620 of LCD 1610 is small relative to the dimensions of the planer faces, heat transfer to the back side is significantly more efficient than heat transfer to the edges. This can be seen in FIGS. 16B and 16C, where illumination incident upon the center of LCD 1610 is conducted by LCD 1610 to the outer edges to be conducted away with conduction devices 1621–1623. Conversely, with the arrangement shown in FIG. 16D, heat need only be conducted through the relatively thin LCD 1610 to the back side to be conducted away with conduction device 1624. For prior art LCDs, the thickness may only be ten percent or may be only one percent of the face dimensions, thereby providing possibly a factor of 10 to 100 times improvement in heat transfer capability from the back side. Therefore, for many applications where heat transfer efficiency is important such as for high intensity illumination for projection displays or where simple conduction without forced air or exotic cooling methods is important such as for handheld calculators and electronic games, the arrangement shown in FIG. 6D represents a preferred embodiment having significant advantages over other arrangements.

Conduction devices 1621–1624 can be simple thermal conduction devices such as metal devices or can be heat sinks, fluid cooling devices, thermoelectric coolers, or other known cooling arrangements. Heat sinks such as finned heat sinks are manufactured by many companies such as the Vemaline Division of Astby and Barton Co. of Warwick R.I. and Wakefield Engineering Inc. of Wakefield Mass. Thermoelectric coolers such as Pettier coolers are manufactured by many companies such as Melcore of Trenton N.J. (FRIGICHIP and FRIGI-TOTE) and Frigidheat (Model 45M-10X). Several conduction devices will now be discussed, which are exemplary of the more general conduction arrangements of the present invention.

Conduction devices 1621–1624 can be heat conductive mounting structures that conduct heat away from LCD 1610. Such devices can be heat sinks that absorb heat energy or that conduct heat energy away from LCD 1610 for better heat transfer. In one embodiment, heat conductive devices are connected to the case or other structure of a display arrangement for heat transfer from the case to the air through free air convection. In another embodiment, conduction devices are known heat sinks such as having fins and other structures for efficient heat transfer to the air through convection. In another embodiment, a blower is used to improve heat transfer from the heat conduction device to the air. In yet another embodiment, cooling fluid is circulated through the heat conductive device to conduct heat away from LCD 1610. For example, forced air 1619 from blower 1618 (FIG. 16A) can be blown into or through heat conductive devices 1621-1624 as illustrated with arrow 1625. Alternately, arrow 1625 can exemplify cooling fluid such as freon. Further, heat conductive devices 1621-1624 can have fins or other arrangements for efficient heat transfer.

Several heat transfer arrangements are shown in FIG. 16E that can be used for heat transfer devices 1621-1624 (FIGS. 16B-16D). Heat transfer devices 1621-1624 can be heat sinks having fins 1626 for heat conduction, heat sinking, heat transfer to the air, etc. Heat transfer can be enhanced with blower 1618 generating forced air 1619. Heat transfer can be enhanced with cooling fluid flow such as with cooling tube 1628 having coolant 1627 entering and coolant 1629 exiting such as with well-known coolant devices. One well-known cooling fluid device is an automobile radiator. Another well-known cooling fluid device is a common household refrigerator or air conditioner having cold freon or other coolant circulated through cooling coils. Cooling coils 1628 can be used in combination with heat sink 1626 to further improve cooling such as with an automobile radiator, a refrigerator, and an air conditioner.

Cooling can be provided with thermoelectric coolers, where elements 1621-1624 can be thermoelectric coolers mounted or bonded directly to LCD 1610. Alternately, a thermoelectric cooler can be used for cooling heat sink material which conducts heat from LCD 1610 to the thermoelectric cooler, shown with heat sinks 1621-1624. Other cooling arrangements that can be used include dewars, conventional refrigerators, Peltier coolers, and other known cooling devices.

In an alternate embodiment, electro-optic material in IAD 1610 can be circulated through a coolant device such as a refrigerator, heat exchanger, etc for cooling. In this embodiment, IAD 1610 contains electro-optical material that flows under control of a pump, convection forces, or other mechanisms; wherein the fluid can flow out of IAD 1610 to be cooled and can flow back into IAD 1610 when cooled for control of illumination 1611.

A preferred embodiment 1600 of an integral batch-fabricated display arrangement of the present invention is shown in FIG. 16F. Arrangement 1600 provides a batch-fabricated configuration having integral and/or implicit structural and cooling capability in a simple, effective, and inexpensive arrangement.

In FIG. 16F, incident illumination 1611 is generated with source 1634. Source 1634 can include devices that are well known in the art such as bulbs, reflectors, lenses, etc as with prior art slide projector and movie projector arrangements and as discussed with reference to FIG. 14. Source illumination 1611A is processed with heat filter 1636 for enhancing the visibility-to-heat ratio (VHR) of illumination 1611. Filter 1636 may be a well-known heat filter such as for filtering out infrared energy. Filter 1636 can be mounted on structure 1637 for conducting absorbed heat energy from filter 1636 to case 1632. Filtered illumination 1611B is incident upon IAD 1610, generating reflected illumination 1613. IAD 1610 can be operated in a reflective mode, generating reflected illumination 1613. IAD 1610 can be attached to case 1632 such as with bonding material 1630 which can be a good heat conductive material. Various attachment methods are discussed herein and/or are well known in the art.

LCD 1610 can be bonded to heat sink 1632 with a thin thermally conductive bonding material 1630, where heat sink 1632 can be a part of the enclosure of an illumination display device. Case 1632 can provide a heat sink for conducting heat energy from illumination amplifier 1610; for dispersing heat energy throughout the case; and for radiant, convective, and conductive cooling to the outside environment, as illustrated with arrows 1615-1617. Further, fins or other heat sinking 1633 and heat transfer devices can be provided on case 1632 to enhance heat transfer. This can be considered to be a batch-fabricated case, mounting structure, and heat transfer media to facilitate protection, mounting, and cooling respectively of illumination amplifier 1610.

Reflected controlled illumination 1613A can be processed with projection optics 1638 to generate projection illumination 1613B for projection onto screen 1635 as discussed with reference to FIG. 14 herein. Projection optics can include lenses, prisms, and other arrangements and can have focusing, zooming, and other capabilities well known in the projection optics art; as further discussed with reference to FIG. 14 herein. Case 1632 can provide beat sink capability such as for dissipating heat through radiation 1615, convection 1616, and conduction 1617. Finned heat sink 1633 can be used to enhance heat transfer such as with convection heat transfer 1616.

The projection IAD arrangement shown in FIG. 16F can be used in multitudes of different types of systems. In one embodiment, system 1600 can be used as a toy or a game for providing a large screen display. In another embodiment, system 1600 can be used as an advertising display such as an illuminated display in a store. In yet another embodiment, system 1600 can be used as a large screen information display such as to replace well-known clock displays, temperature displays, propogating information displays, scoreboard displays, billboard displays, etc. In yet another embodiment, system 1600 can be used as a portable television display or other pictorial display such as discussed with reference to FIG. 14 herein. In yet still another embodiment, system 1600 can be used as a light organ display such as for projecting o colored illumination in response to audio signals. In yet still another embodiment, system 1600 can be used as a display for interactive operator communication with a computer. And in another embodiment, system 1600 can be used as an equipment display such as in numerical control systems; machine systems; vehicular systems including sea, ground, air and space vehicles; and many other equipment systems.

System 1600 is shown implemented with a passive cooling arrangement (FIG. 16F) that does not dissipate electrical energy for cooling such as with conductive and free air convective cooling. This arrangement is particularly advantageous, wherein a low power arrangement can be provided because of the low power requirements of IAD 1610, and the low power (or no power) cooling requirements.

Further, the arrangement shown in FIG. 16F can be a miniature arrangement, wherein screen 1635 can be an external screen such as a well-known detached movie projector screen, a wall, etc and therefore arrangement 1600 excluding screen 1635 can be implemented in miniature form. In order to preserve the miniature form and low power characteristics, it is desirable to minimize active (power dissipating) heat transfer devices such as fans, refrigeration, thermoelectric coolers, etc. In an alternate embodiment not having constraints such as power, size, etc; system 1600 can be implemented with active cooling arrangements such as forced air cooling, fluid cooling, thermoelectric cooling, etc to enhance thermal considerations. Although cooling simplicity is important for many applications, other applications may require high intensity and/or large size projected images; wherein high intensity and large size require high intensity illumination from source 1634. In such applications, exotic cooling techniques may be permissable in order to achieve the high intensity and/or large size projected image on screen 1635. Such exotic techniques may include circulating the electro-optical filler material 1659 (FIG. 16G) for coolant with an external refrigeration coolant device, implementing the IAD substrates to include coolant coils contained therein, implementing the internal IAD space to include coolant coils circulated therein, implementing the IAD with a heat pipe, etc.

Heat pipe technology may be used for IAD heat transfer. Such a heat pipe is characterized by the RCA Corp heat pipe product discussed in the Oct. 27, 1977 issue of Electronics Magazine at page 50 therein.

A heat shield or filter can be used to further reduce heating effects. Illumination in the higher frequency or blue and violet spectral region is more effective for displays and reduces heating compared with illumination in the red and orange spectral region, wherein this red and orange spectral region is only moderately effective for displays and produces more pronounced heating effects. Therefore, in embodiments where heating effects are important, higher frequency visible illumination such as in the blue and violet regions having a higher visibility-to-heat ratio (VHR) is more desirable than lower frequency visible illumination such as in the red and orange regions having a lower VHR. A method for spectral selection can be implemented in various ways such as by selecting illumination sources that generate illumination towards the higher VHR spectral region; using filters that remove illumination having a lower VHR such as heat filters, infrared filters, and red filters; and other methods and arrangements for reducing portions of the spectrum having a lower VHR and enhancing spectral regions having a greater VHR.

In one such embodiment, source 1634 includes a source for generating illumination having a higher VHR such as a mercury vapor lamp, a fluorescent lamp, a xenon lamp, etc as preferred to lower VHR lamps such as incandescent lamps; although such lower VHR lamps are not precluded in alternate embodiments.

In another such embodiment, heat filter 1636 removes lower VHR spectral energy from input illumination 1611A and transmits more of the higher VHR spectral energy as filtered illumination 1611B. Heat filter 1636 can be used and can be any known filter such as an infrared filter for reducing infrared energy which has a low VHR. Filter 1636 can remove a higher percentage of red and orange spectral energy having a relatively low VHR and can pass a higher percentage of blue spectral energy as signal 1611B having a higher VHR. Heat filter 1636 can absorb large amounts of illumination energy from input illumination signal 1611A for conversion to heat energy, wherein filter 1636 can be mounted on a heat sink 1637 to conduct heat energy to case 1632 or can dissipate heat energy in other forms such as with radiant, convective, and conductive cooling as discussed with reference to FIGS. 16A–16E herein.

Alternately, heat filter 1636 can be operated in a reflective mode rather than a transmissive mode, wherein filter 1636 can transmit and/or absorb lower VHR illumination and can reflect higher VHR illumination such as by transmitting and/or absorbing infrared and red spectral region illumination and by reflecting blue and violet spectral region illumination. In this embodiment, the heat transfer advantages associated with reflective mode LCD 1610 also pertain to a reflective mode filter. Further, transmitted filter illumination can be transmitted to a heat absorbing medium or can be transmitted to the external environment to reduce heating effects. Alternately, filter 1636 can transmit higher VHR illumination to LCD 1610 and can reflect lower VHR illumination to a heat absorbing medium or to the external environment.

In a preferred embodiment, heat transfer arrangements are discussed with reference to IAD 1610. Other devices such as source optics 1634, filter 1636, projection optics 1638, etc may experience heating effects and may require cooling, wherein the cooling arrangements discussed for LCD 1610 are equally applicable to the other elements in the system and wherein these cooling arrangements may be used in any combination with the elements shown in FIG. 16F. For example, source optics 1634 may be cooled with forced air 1619 from blower 1618 (FIGS. 16A and 16E), filter 1636 may be cooled conductively with conductive mounting 1637 (FIG. 16F), illumination amplifier 1610 may be cooled with heat sink 1633 (FIG. 16F), projection optics 1638 may be cooled with a freon refrigerator, and screen 1635 may not be cooled explicitly but may be cooled implicitly with free air convective cooling; or alternately, many other combinations and permutations of heat transfer arrangements may be provided.

In a preferred embodiment of a bonded IAD arrangement, the bonding material is a good heat conductor and is relatively thin to optimize heat transfer. In prior art arrangements, the mounting device is relatively thick and does not provide good heat transfer. For example, prior art systems use non-conductive epoxy in a relatively thick form. Also, prior art systems such as LCD electronic watches use a pressure contact called a "zebra strip" for contacting the electrode points with electrically conductives bumps, but providing poor thermal conductivity due to the limited contact area, poor thermal conductivity, etc and being relatively thick. Therefore, it is apparent that the prior art is unconcerned with heat transfer considerations.

Although the arrangement shown in FIG. 16 has been discussed in the embodiment of an arrangement for cooling an IAD, these arrangements can also be used for heating an IAD such as for operation at low temperatures. For example, heat conducting devices 1621–1624 can alternately be heating devices for conducting heat to IAD 1610. Further, fluid flow 1625 (FIGS. 16B–16D) and fluid conductor 1628 (FIG. 16E) can be used for heating IAD 1610. Alternately, electrodes such as for exciting liquid crystal material can be resistive electrodes which may be transparent or non-transparent for heating liquid crystal material for operation at low temperature conditions. Heating arrangements as described herein may be thermostatically controlled such as with electronic controls to heat liquid crystal material to maintain a temperature above the low temperature operating threshold.

Thermal considerations can be further enhanced by proper construction of an IAD element, wherein a preferred embodiment thereof will now be discussed with reference to FIG. 16G. The arrangement shown in FIG. 16G is discussed in greater detail herein under the title LARGE PANEL CONSTRUCTION. Illumination 1611 is shown incident on IAD 1641 operating in a reflective mode. Reflected illumination 1613 is generated under control of IAD 641 such as by having a reflective surface at the lower surface 1655 or at the outer surface 1645. Base 1655 provides for mounting, cooling, and/or providing a reflective surface.

Heat transfer can be improved by having heat conducting materials such as upper substrate 1644, lower substrate 1645, and filler material 1659. Upper substrate 1644 and lower substrate 1645 can be constructed of heat conductive material such as glass, plastic, and other materials that are fabricated in a form to provide good heat conduction. Such substrate materials are transparent materials in a preferred embodiment, but may be other than transparent materials. For example, operating in a reflective mode, electro-optical device 1641 can have a reflective coating on the inside of substrate 1645 such as at inside surface 1653, wherein transparency of lower substrate 1645 may not be an important consideration. Therefore, bottom substrate 1645 can be a non-transparent heat conductive substrate such as a metal substrate or other substrate having good heat transfer characteristics.

Further, IAD 1641 can have a plurality of heat transfer devices such as discussed with reference to FIGS. 16A-16E, used in combination with the preferred embodiment of a reflective mode IAD having a good heat transfer backing 1655. For example, IAD 1641 can have a picture frame type heat transfer structure on top electrode 1644 such as structure 1622 (FIG. 16B), can have fluid flow cooling such as illustrated with arrow 1625 (FIGS. 16A-16D) and with arrows 1627 and 1629 (FIG. 16E), etc in combination with heat filter 1636 and heat conductive mounting of IAD 1610 (FIG. 16F) and other arrangements described herein in various combinations. Further, IAD 1641 can have a heat conductive filler material 1659 to enhance heat transfer such as using a filler material that has an inherently good heat conductive characteristic and/or by including material in filler 1659 to enhance the heat conductivity characteristic.

Yet further, filler material 1659 can be circulated either internal to IAD 1641 or external to IAD 1641. Internal circulation can be provided with an internally mounted agitator, pump element, etc; by including magnetic particles with the filler material and inducing a magnetic field to cause fluid flow; by implementing fluid flow caused by differences in temperature such as used in self-cooling oil-filled electrical transformers; and other methods that will now become obvious from the teachings herein. External heat transfer can be provided in combination with the above methods and arrangements or independent thereof. Pipe 1656A can introduce cooled fluids 1627 into IAD 1641 and pipe 1656B can extract heated fluids 1629 from IAD 1641. An external pump, convective cooler, or other arrangement can be used to induce fluid flow 1627 and 1629 for cooling. The pipe comprising input segment 1656A and output segment 1656B can be routed to a heat exchanger such as a heat sink 1633 (FIG. 16E) for heat transfer to the air, or to a coolant heat exchanger, or to other heat transfer devices.

The structure of substrates 1644 and 1645 (FIG. 16G) can be constructed in a manner that improves heat transfer. For example, top substrate 1644 can be a thin substrate having a thin dimension 1657 to minimize illumination absorbtion and to minimize related heating effects. Bottom substrate 1645 can be thicker than top substrate 1644 because bottom substrate 1645 is closer to heat sink 1655 and therefore provides better heat transfer. Further, inner surface 1653 of bottom substrate 1645 can have a reflective coating, thereby significantly reducing illumination transmission through bottom substrate 1645 and the related heating effects.

Where illumination absorbtion of filler material 1659 is an important consideration, it may be desirable to maximize heat transfer between filler material 1659 and heat sink 1655. Therefore, lower substrate 1645 may be thinner than upper substrate 1644 to enhance heat transfer from filler material 1659 to heat sink 1655. In yet another embodiment, upper substrate 1644 may have a thickness equal to or substantially the same thickness as lower substrate 1645 such as to combine the advantages of a thinner upper substrate 1644 and a thinner lower substrate 1645. Therefore, heat transfer can be enhanced having a thinner lower substrate 1645, or a thinner upper substrate 644, or equally thin substrates 1645 and 1644. Thinness is herein intended to mean the dimension transmitting illumination and/or the substrate dimension shown as cross-hatched upper dimension 1657 and lower dimension 1658.

Further cooling advantages can be achieved with evaporation, wherein evaporative cooling is highly efficient. For example, fluid can be controlled to flow over or be sprayed over heat sink 1633 in a manner that causes evaporation such as is well known in the art for evaporative cooling. Similarly, fluid can be caused to flow over or be sprayed over the surface of LCD 1610 to cool the surface having incident illumination 1611, such as top surface 1644 of illumination amplifier 1641 (FIG. 16G). In one embodiment, a fine mist can be sprayed over top surface 1644, wherein the fineness and amounts of the spray may be such that illumination degradation is minimal and cooling such as through evaporation and mist effects is enhanced.

Still further, a plurality of liquid crystal elements 1610 can be sequentially rotated into position such as on a rotating disk or cylinder so that each element is illuminated in sequence to provide the desired projected image. The percentage of the energy absorbed by each element is related to the number of elements and therefore the heating of any element can be significantly reduced. Such an arrangement is exemplified with a moving picture projector, where a plurality of frames of the film are rotated into the illumination beam. As the IAD is rotated out of the illumination beam, it can be cooled such as with the various methods discussed above. Therefore, when the IAD is rotated back into the illumination beam, it has been sufficiently cooled to reduce thermal degradation effects. More latitude is permitted in cooling of IADs that are not in the illumination beam because there is reduced concern for degradation of the projected image until the IAD is rotated back into the illumination beam. For example, IADs rotated out of the illumination beam can be sprayed with a mist for cooling, passed through a wiper assembly to remove unevaporated mist, and then rotated back into the illumination beam. Similarly, IADs rotated out of the illumination beam can be rotated through a water bath or other coolant, passed through a drying assembly, and then rotated back into the illumination beam.

Cooling is particularly enhanced with high velocity flow, with evaporation, and by covering a large area. For example, forced air 1619 from blower 1618 and fluid 1627 and 1629 flowing in pipe 1628 (FIG. 16E) may have high velocity Flow and may cool a large area. Heat sink 1633 may cover a larger area than illumination amplifier 1610 for more efficient heat transfer to the air 1616 (FIG. 16F) and air 1616 (FIG. 16F) may be high velocity air 1619 generated with a high velocity blower such as blower 1618 (FIGS. 16A and 16E).

Still further cooling advantages can be achieved with fluid circulation. For example, prior art arrangements have been configured for recirculating the illumination control fluid to reduce or avoid agglomeration of the particles (U.S. Pat. No. 3,788,729) but not to provide cooling. In such prior art arrangements, heat is applied to the fluid to provide convective flow, thereby specifically precluding the objective of the present invention for providing cooling. Nevertheless, such prior art arrangements may be used for cooling in accordance with the arrangement of the present invention such as by convective flow, pumped flow, etc and having external heat transfer means to remove heat from the circulating fluid.

Yet further, closed system heat exchangers are well known and can be used with the system of the present invention. Such devices are exemplified by an automotive transmission fluid cooling system having a heat transfer arrangement in conjunction with a radiator. Transmission fluid is circulated through a closed cooling system to prevent contamination and to provide cooling of the transmission fluid. The transmission fluid is circulated through a heat exchanger such as heat exchanger 1633 (FIG. 16E) and is cooled by convective air flow from the radiator and by forced air flow generated with the automobile fan such as illustrated with blower 1618. In some applications, transmission fluid can be circulated through the cooling water in the automotive radiator, wherein the integrity of the transmission fluid cooling system is preserved by conducting the transmission fluid through a sealed pipe such as pipe 1628 (FIG. 16E).

Yet further, an illumination amplifier substrate can provide cooling such as with deposited metalic thermal conductors either using the conventional metallic deposited electrodes or using supplementary thermal conductors deposited or otherwise formed on substrates of amplifier 1641. Similarly, other cooling methods may be provided as an integral part of IAD 1641 such as coolant tubes 1628 formed in the substrate 1643 of amplifier 1641 for circulating cooling fluid to remove heat.

It is herein intended that the heat transfer considerations described for the preferred embodiment of a projection LCD arrangement also be usable with the other embodiments disclosed herein. For example, an IAD window may be subjected to heat and cold environmental conditions, wherein the heat transfer embodiments disclosed herein may be used for heating a cold IAD window and/or cooling a hot IAD window.

Although high intensity and large size terminology pertaining to displays are relative terms, they are self-explanatory and do characterize the projection IAD arrangement of the present invention.

Although terminology such as high intensity illumination is not quantitative, it is illustrative in accordance with the improvement of the present invention. For example, prior art liquid crystal displays use ambient light such as room lighting in a home, which is considered to be low intensity illumination. Further, prior art liquid crystal watches use a very small light bulb for nighttime viewing, which is also considered to be low intensity illumination. Yet further, prior art liquid crystal displays use sunlight but are viewed in indirect rather than direct sunlight, which is considered to be low intensity (and natural) illumination. Use of a high intensity source (not natural illumination) in combination with a projection display arrangement characterized one feature of the present invention.

In alternate embodiments, a high intensity IAD display may be characterized as a display that is illuminated with illumination from a source that is greater than ambient illumination; or an IAD display that is illuminated with illumination from a source that is greater than sunlight illumination; or an IAD display that is illuminated to provide greater than ambient display illumination; or an IAD display that is illuminated with illumination from a source that is at least a one-watt source, or is at least a four-watt source, or is at least a ten-watt source, or is at least a 100-watt source. Further, high intensity may be characterized as source illumination intensity that is greater than needed for direct viewing, wherein source illumination intensity needed for viewing a magnified projected image is greater than needed for direct viewing of an TAD because of the intensity reduction caused by projection and magnification.

In alternate embodiments, size-related projection terminology may be characterized with the table entitled SIZE RELATED ALTERNATE EMBODIMENTS; where the first column identifies an IAD dimension, the second column identifies a projected display dimension which may correspond to the related IAD dimension in the first column, and the third column identifies the projection magnification related to such correspondence. In order to broaden the example, the IAD dimensions in said first column are defined as "less than" dimensions, while the projected dimensions and projection magnification in said second and third columns are defined as "greater than" dimensions.

| TABLE OF SIZE-RELATED ALTERNATE EMBODIMENTS | | |
|---|---|---|
| IAD DIMENSION (less than) | PROJECTED DIMENSION (greater than) | PROJECTION MAGNIFICATION (greater than) |
| <0.01 | >0.01 | >1 |
| <0.1 | >0.1 | >1 |
| <0.5 | >0.5 | >1 |
| <1.0 | >1.0 | >1 |
| <5.0 | >5.0 | >1 |
| <10.0 | >10.0 | >1 |
| <0.01 | >0.1 | >10 |
| <0.1 | >1.0 | >10 |
| <1.0 | >10.0 | >10 |
| <10.0 | >100.0 | >10 |
| <0.01 | >1.0 | >100 |
| <0.1 | >10.0 | >100 |
| <1.0 | >100 | >100 |
| <10.0 | >1,000 | >100 |
| <0.01 | >10.0 | >1,000 |
| <0.1 | >100 | >1,000 |
| <1.0 | >1,000 | >1,000 |
| <10.0 | >10,000 | >1,000 |
| <0.01 | >100 | >10,000 |
| <0.1 | >1,000 | >10,000 |
| <1.0 | >10,000 | >10,000 |

TABLE OF
SIZE-RELATED ALTERNATE EMBODIMENTS

| IAD DIMENSION (less than) | PROJECTED DIMENSION (greater than) | PROJECTION MAGNIFICATION (greater than) |
|---|---|---|
| <10.0 | >100,000 | >10,000 |

Large Panel Construction

Large panels of electro-optical devices may be required such as for windows and large displays. For example, large panels can be implemented with liquid crystal material sandwiched inbetween glass substrates having deposited electrodes on the inner surfaces. Liquid crystal support is usually provided by contacts between the two glass substrates at the outer edges or periphery of a panel. For small panels, this edge support has been adequate. For large panels such as in accordance with the window and display embodiments of the present invention and for multitudes of other embodiments, it may be desirable to provide supports within the panel interior between the outer edges. Therefore, in accordance with another feature of the present invention, a panel arrangement is provided for construction of large panels such as with internal support elements.

The broad teachings of the present invention for constructing large photo-optical panels can be accomplished with many arrangements, some of which are discussed above. The teachings herein are very broad and are not limited to merely internal support structures, but include any generalized arrangement for implementing large panels.

A large panel element will now be discussed with reference to FIG. 16G in the embodiment of a large LCD panel. Panel 1641 is shown in simplified form for purposes of illustration of the improvements provided herein, wherein construction of small panels is well known in the art and provides a basis for this discussion on large panels. For example, substrate materials 1643 are shown in rectangular form having a cross-hatched section taken in the plane of the figure and having exaggerated spacing between the substrate for purposes of illustration. Panel 1641 can be implemented with electro-optical materials such as liquid crystal material filling space between sandwiched substrates 1643 which may be glass, plastic, or other substrates. Substrates 1643 comprise upper substrate 1644 and lower substrate 1645 bonded together at edge 1646. In the usual prior art configuration, substrates 1644 and 1645 are connected at the outer edges such as with support 1647 at the left side and support 1648 at the right side. Electrodes are provided such as on the inner surface 1652 of top substrate 1644 and the inner surface 1653 of bottom substrate 1645.

In accordance with one feature of the present invention, internal supports 1649-1651 are provided for supporting substrates 1644 and 1645 inbetween edge supports 1647 and 1648. Supports 1649 and 1650 are shown at the sectioned plane of the figure and support 1651 is shown set back from the plane of the figure. Supports 1649-1651 are shown in simplified form for convenience of illustration, wherein supports 1649-1651 may be small dimension or point supports such as support 1649, long ridge-type or barrier-type supports such as supports 1650 and 1651, or other types of supports for supporting substrates 1644 and 1645 inbetween outer edge peripheral supports 1647 and 1648.

Supports or spacers can be constructed as part of substrates 1644 and 1645 or can be attached to substrates 1644 and 1645 such as with bonding methods. For example, integral construction of supports as part of the substrates can be provided by well-known moulding, etching, grinding, milling, etc of substrates 1644 and 1645 to provide internal or intermediate supports or spacers 1649-1651. Alternately, substrates 1644 and 1645 can be constructed without internal supports, wherein internal supports can be attached during the bonding together of substrates 1644 and 1645. Alternately, supports such as supports 1649-1651 can be an inserted structure rather than a bonded structure. For example, such supports may be a thin honeycomb structure inserted between substrates 1644 and 1645 and either maintained in place by close proximity of the substrates or glued or otherwise bonded to the substrates to provide support and maintain separation between the substrates. Such a support structure is similar to the honeycomb structure for supporting and separating sheets or aircraft and missile surface "skin"; as is well known in the airframe structural art. Internal supports 1649-1651 can be a self-supporting internal structure such as a honeycomb or other structure inserted between substrates 1644 and 1645 and either bonded or not bonded thereto for providing the desired support. Many other techniques will now become obvious to those skilled in the art from the teachings herein.

For a honeycomb-type structure or other such internal supporting structure, the supports may be a barrier to the free flow of electro-optical material. This can be either desirable or undesirable, depending on the implementation. Where undesirable and where free flow of material is desired, ports or holes can be provided such as hole 1660 to permit flow of the material through supporting structure 1650.

Still further, many other techniques for providing support and maintaining separation for substrates 1644 and 1645 and many other arrangements for implementing large photo-optical panels will now become obvious to those skilled in the art from the teachings herein.

The embodiment shown in FIG. 16 clearly finds antecedent basis in U.S. Pat. No. 3,986,022; wherein projection optics are disclosed therein, reflective mode illumination amplifier operation is disclosed therein, and a large screen audience display is disclosed therein and wherein the combination of these disclosures is disclosed explicitly therein and/or is implicit therein based upon the statements of intention of combinations of separate disclosures such as at column 56 lines 14–25 therein. For example, antecedent basis for the projection disclosure is discussed in the next section herein.

Antecedent Basis For Projection Disclosure

The projection illumination amplifier disclosure of the present invention finds extensive antecedent basis in parent application Ser. No. 366,714 now U.S. Pat. No. 3,986,022. This antecedent basis will now be discussed to illustrate the relationship between the disclosure of the instant application and the disclosure of said parent application.

In said parent application, illumination amplifiers have been discussed for applications wherein projection is implicit therein. For example, use of an illumination amplifier in the disclosed camera system and photoplotter system establishes the projection nature of the illumination amplifier arrangement. Further, use of an illumination amplifier in combination with lenses further establishes the projection nature of the illumination amplifier arrangement. A detailed discussion of specific disclosures in said parent application providing antecedent basis with references To U.S. Pat. No. 3,986,022 is provided below.

Control of projected illumination with an illumination amplifier finds antecedent basis in U.S. Pat. No. 3,986,022; particularly with reference to the photographic camera embodiments therein and implicit in the arrangements having lens arrangements therein. Camera systems are illustrated in FIGS. 8-10 therein and various lens arrangements are illustrated in FIGS. 6D 9A 9C and 10 therein. Further, camera systems are discussed at column 41 line 46 to column 48 line 37 therein and lens arrangements are discussed at column 13 lines 33-49, column 31 lines 1-7 and lines 31-33, column 42 lines 35-39, column 45 line 61 to column 46 line 6, column 57 lines 19-37, and elsewhere therein.

The projection arrangement of the present invention is further shown in the discussions of FIGS. 8A-8C at column 42 line 1 to column 45 line 29 therein; wherein shutter and aperture arrangements and rotation arrangements 800,820, and 820C (FIGS. 8A, 8B, and 8C respectively) are disclosed in the preferred embodiment of a photoplotter system such as the photoplotter system referenced and incorporated by reference from U.S. Pat. No. 3,738,242 (U.S. Pat. No. 3,986,022 at column 1 lines 14-18 and lines 40-44; column 42 at lines 15-19; column 43 at lines 16-25 and elsewhere therein). Said U.S. Pat. No. 3,738,242 sets forth a projection-type illumination control system having illumination source 48; projection objects 68, 70, and 71; shutter 69; aperture 73; and rotation device 10. Substitution of the illumination amplifier aperture, shutter, and rotation devices of the present invention (as discussed relative to FIGS. 8A-8C in said U.S. Pat. No. 3,986,022) provides for illumination amplifier control and in particular liquid crystal control of projection illumination with the rotation control, aperture, and/or shutter of said U.S. Pat. No. 3,986,022. Further, terminology of transmitted illumination in said U.S. Pat. No. 3,986,022 such as at column 31 lines 41-43, column 46 lines 2-6, and elsewhere therein corresponds to the term projected illumination of the instant application.

Further, the use of coherent illumination such as from a laser source is disclosed in U.S. Pat. No. 3,986,022 at column 57 lines 4-9 for the various embodiments set forth therein and therefore can be used in various combination with the projection arrangement, as discussed herein.

Further, an audience display system is disclosed in U.S. Pat. No. 3,986,022 at FIG. 11 and at column 52 line 1 to column 55 line 27 therein, wherein it was stated therein as being intended that the various features in the disclosure that are set forth individually be combinable in various combinations such as at column 56 lines 14-47, column 57 lines 19-31, and elsewhere therein.

The projection feature of the photo-optical arrangement of said U.S. Pat. No. 3,738,242 is clearly established at column 1 lines 48-52 therein which states " . . . an optical arrangement required to project the image of the aperture onto the film . . . " [emphasis added]; clearly combining the aperture therein in a projection arrangement and wherein said aperture in the preferred embodiment of U.S. Pat. No. 3,986,022 is an illumination amplifier aperture in accordance with the projection illumination amplifier arrangement of the present invention.

In view of the above, the projection illumination amplifier arrangement and the laser coherent light source features of the present invention find ample antecedent basis in U.S. Pat. No. 3,986,022.

Pulse Modulated Control

Pulse modulated control can be implemented with the system of the present invention for various uses exemplified by machine control and illumination control; as discussed in the referenced patent applications, as is well known in the art, and as further discussed herein. Although pulse modulation may herein be exemplified with pulsed-width-modulation, it is herein intended that pulse-width-modulation be exemplary of other types of pulse modulation such as pulse-rate-modulation, pulse-code-modulation, and other types of pulse modulation.

A pulse modulation arrangement for use with a sound system such as a high fidelity and/or stereo type sound system will now be discussed with reference to FIG. 1A of U.S. Pat. No. 4,016,540. Data processor 112 can generate control signals such as whole number and discrete control signals 123 and 126 to interface electronics such as elements 120-122 and to device 124 which can be a pulse-width-modulated sound system. For example, machine 124 can be a sound transducer such as a speaker and electronic devices 120-122 can be pulse-width-modulated amplifiers and controls used in place of the pulse-width-modulated servos which are discussed in the referenced patent applications. Alternately, pulse modulated digital signals can be generated with data processor 112 such as with a discrete output signal which can be signal 101 to interface device 100. In an embodiment where signal 101 is a pulse modulated signal, element 102 can be a power amplifier to generate pulse modulated signal 103 as a power signal to drive transducer 104 to generate sound signal 105. Use of a data processor to generate a pulse modulated output signal such as with a discrete signal is discussed in referenced application Ser. No. 134,958 at page 22 line 2 to page 23 line 15 and elsewhere in the referenced patent applications. The above-described arrangement can be used for a sound response system such as discussed with reference to interface 100 (FIG. 1A) which may be used for a toy, a game, or multitudes of other uses some of which are discussed in referenced U.S. Pat. No. 4,016,540. Further uses of this pulse modulation arrangement will now become obvious from the teachings herein.

Pulse-width-modulation has been discussed in detail in the referenced patent applications for a machine control embodiment and for an illumination control embodiment, wherein these disclosures have been incorporated herein by reference. For example, a pulse-width-modulated arrangement has been disclosed in referenced application Ser. No. 101,881 particularly with reference to FIGS. 1 and 16-19 therein; at page 33 lines 13-27, page 85 lines 23-25, page 86 lines 7-24, and page 88 lines 11-15; and elsewhere therein. Further, a pulse-width-modulation arrangement has been disclosed in referenced application Ser. No. 134,958 particularly at page 3 lines 21-28, page 6 lines 14-24, and page 22 line 2 to page 23 line 15, and elsewhere therein. Yet further, a pulse-width-modulated arrangement has been disclosed in referenced application Ser. No. 135,040 particularly at page 10 lines 10-15, page 18 lines 16-26, page 22 lines 1-28, page 24 lines 14-28, page 26 lines 10-16, page 31 line 4 to page 32 line 5, and elsewhere therein. Still further, a pulse-width-modulation arrangement has been disclosed in referenced application Ser. No. 246,867 particularly in FIGS. 4A and 4B; at page 24 lines 27–33 and page 27 line 1 to page 34 line 30; and elsewhere therein. Yet further, a pulse-width-modulated arrangement has been disclosed in referenced application Ser. No. 302,771 particularly with reference to FIGS. 5, 6, and 8; at page 21 line 30 to page 22 line 2 and page 57 line 1 to page 67 line 24; and elsewhere therein. Still further, a pulse-width-modulated arrangement has been disclosed in referenced applications Ser. Nos. 366,714; 727,330; and 730,756 particularly with reference to FIGS. 2 and 6E and at page 16 lines 10–19, page 17 line 1 to page 21 line 15, page 46 lines 18–30, and page 48 lines 12–34; and elsewhere therein and further with reference to applications Ser. Nos. 727,330 and 730,756 particularly at page 172 lines 9–25 and elsewhere therein.

As an alternate embodiment to the D/A converter of the interface device, a pulse modulated or other duty cycle modulated arrangement can be used. Such a duty cycle arrangement provides particular advantages, where a duty cycle device may be a digital device which may be more compatible with the digital electronics of the digital audionic system than would be a hybrid D/A converter arrangement. Various pulse modulated devices such as pulse-width-modulated devices are set forth in the copending applications in the chain of related applications which are incorporated by reference such as for the pulse-width-modulated servo drives of referenced applications Ser. Nos. 101,881; 134,958; 135,040; 339,817 now U.S. Pat. No. 4,034,276; and Ser. No. 339,688 and for illumination control in referenced applications Ser. Nos. 366,714 now U.S. Pat. No. 3,986,022; Ser. Nos. 727,330; and 730,756 set forth a pulse-width-modulated arrangement in FIGS. 2B, 2C, and 2D therein. Further, various pulse-width-modulated drives are commercially available and may be used with the system of the present invention for output transducer drivers in place of the D/A converter arrangement discussed herein.

In one embodiment such as discussed herein with reference to FIG. 17, a pulse-width-modulated signal may be generated with a counter such as by loading the output digital number into o the counter and permitting the counter to count-down to zero. When the counter counts-down to zero, detection of the counter zero condition or the counter overflow condition can be used to reset a flip-flop. The flip-flop can be set at the start of the new cycle. Therefore, the output of the flip-flop set at the beginning of a cycle and reset after a controlled period of time provides a pulse-width-modulated output signal to drive an output transducer. Alternately, the pulse-width-modulated signal can be generated under program control of the computer, where the computer can set the flip-flop at the beginning of a cycle and can provide a program time delay for resetting the flip-flop thereby performing the same function as the counter described above; such as discussed in greater detail in the related applications referenced herein.

Further, the pulse modulated servo arrangement of the referenced patent applications set forth interface register and counter arrangements for interfacing a computer to a servo. These arrangements are exemplary of interfacing a computer to a sound generation arrangement wherein servo electronics 120–122 of the referenced patent applications is exemplary of sound interface electronics and wherein machine 124 of the referenced patent applications is exemplary of a sound transducer such as a speaker.

The audionic system of U.S. Pat. No. 4,016,540 has been discussed in a preferred embodiment using a digital-to-analog converter 102 to interface between data processor 112 and transducer 104 (FIG. 1A). Alternately, other arrangements can be used including analog, hybrid, and digital arrangements as disclosed in U.S. Pat. No. 4,016,540 particularly at column 7 lines 15–24 and also at column 5 line 67 to column 6 line 19 and elsewhere therein. An analog embodiment is exemplified by the direct outputting of analog signals stored in an analog ROM or other analog memory as discussed in referenced application Ser. No. 812,285 such as at page 41 line 16 to page 42 line 7 and elsewhere therein. A hybrid (analog and digital) embodiment is characterized by the digital-to-analog converter arrangement discussed in U.S. Pat. No. 4,016,540 with reference to FIG. 3. A digital embodiment can be implemented as the pulse modulated embodiment discussed herein such as with reference to FIGS. 9A and 9B. Further, a digital embodiment is illustrated in the referenced applications such as applications Ser. Nos. 101,881; 134,958; 135,040; 302,771; etc such as for controlling analog servos with pulse-width-modulated signals as discussed elsewhere herein wherein digital commands are loaded into counters and registers for controlling pulse-width-modulated servos. Many other embodiments will now become obvious to those skilled in the art from the teachings herein.

Time-Domain Pulse Modulation

A time-domain pulse modulator will now be discussed for a preferred embodiment using the monolithic computer of the system of the present invention for generating a pulse-width-modulated signal under program control. Other pulse modulation arrangements will now become obvious from the teachings herein such as using program controlled arrangements as described herein and as described in related application Ser. No. 134,958 at page 22 line 2 to page 23 line 15; or using hardwired arrangements as disclosed in the related patent applications referenced herein; or using other computers, programs, and/or arrangements as will now become obvious from the teachings herein.

A program controlled pulse-width-modulation arrangement will now be discussed with reference to FIGS. 17A and 17B. An interface arrangement 971 consistent with the data processor of referenced application Ser. No. 101,881 is illustrated in FIG. 9A. A flow diagram 976 for generating a pulse-width-modulated signal with arrangement 971 (FIG. 17A) is illustrated in FIG. 17B. Arrangement 971 constitutes set-reset flip-flop 972 which is set by discrete output signal DO-8, reset by discrete output signal DO-9, and used to control device 974 with output signal 975 from flip-flop 972. Device 974 can be an audio speaker, a servo, or other device controlled with a pulse modulated signal. Amplifier 973 can be used to amplify output signal 975 to drive output device 974. Feedback signal DI-8 provides feedback on the state of flip-flop 972 to the data processor. The data processor generates signal DO-8 to set flip-flop 972 and generates signal DO-9 to reset flip-flop 972 under program control using discrete output instructions. A time delay between generating the DO-8 signal and the DO-9 signal controls the time period that output signal 975 is in the high state or the duty cycle of output signal 975. Therefore, the duty cycle of output signal 975 can be directly controlled by the data processor under program control. One form of program control which is exemplary of a wide range of methods is discussed herein with reference to FIG. 17B.

Flow diagram 976 (FIG. 17B) illustrates one method for generating pulse-width-modulated signal 975 under program control. The computer enters subroutine 976 through operation 977 and exits subroutine 976 through operation 983 with well-known subroutine operations. For example, ENTER operation 977 can include a calling sequence such as saving the return address to the main program or to the executive program and EXIT operation 983 can include fetching the stored return address and transferring back to the main program location defined with the return address, as is well known in the computer programming art.

After entering subroutine 976 through operation 977, the program initializes the subroutine such as by loading parameters or constants into various registers and memory locations. For example, a time delay word that defines the width of the pulse-width-modulated signal is defined as the $N_o$ parameter which is loaded into the N scratchpad register; wherein this scratchpad register designation is provided for convenience and may be assigned to any scratchpad register or other storage in the computer. The time delay number $N_o$ can be provided as a stored constant, or generated under program control, or generated by various known methods to determine the time delay between discrete output signals which determines the width of output pulse 975 and therefore the information content of the pulse-width-modulated signal.

The program generates the DO-8 signal with a discrete output instruction to set flip-flop 972 with operation 979 and then executes a time delay iterative routine using decrement operation 980 and test operation 981 to control the width of pulse-width-modulated output signal 975. The N-parameter is successively decremented in operation 980 to provide a time delay and tested with operation 981 to detect when the time delay has expired. Operations 980 and 981 can be implemented with a decrement and transfer on non-negative instruction, where the N-parameter in the N-register is decremented and the program operation transferred until the N-parameter is decremented to a negative number. The conditional transfer on the N-parameter being non-negative is shown by the looping back from the test operation 981 to the decrement operation 980 along the positive path. When the N-parameter has been decremented to a negative number, the conditional transfer is disabled and the program operations continue in sequence to operations 982 and 983.

Operation 982 discontinues the pulse-width-modulated output signal 975 by generating the DO-9 signal with a discrete output instruction to flip-flop 972. Program operation then continues to exit operation 983 to exit the subroutine.

Optical Effects

Various optical effects can be provided for electronic devices such as for electronic toys and games. In a preferred embodiment, these optical effects can be provided with liquid crystal optical devices under control of a microcomputer such as disclosed in the referenced patent applications; wherein this preferred embodiment is intended to exemplify generalized optical effects that can be controlled with any computer or circuit arrangement. Alternately, non-microcomputer related control arrangements can be implemented in accordance with the teachings of the present invention using optical devices in general and control circuits in general that are exemplified by the microcomputer controlled liquid crystal arrangement of this preferred embodiment.

Optical effects will now be exemplified with a liquid crystal eyelid embodiment for a toy doll with reference to FIG. 17C. Illustration 984 shows liquid crystal eyelids 986 controlling illumination 987 to illuminate eye patterns 988. Illustration 984A shows liquid crystal eyelids 986A being controlled to be transmissive for viewing eye patterns 988 indicative of open eyes and illustration 984B shows liquid crystal eyelids 986B controlled to be non-transparent for obscuring eye patterns 988 indicative of closed eyes. Eye patterns 988 may be any known eye pattern arrangement such as painted or otherwise colored eyes such as conventionally used in dolls. Liquid crystal elements 986 can be implemented with liquid crystal techniques discussed in U.S. Pat. No. 3,986,022 and copending applications Ser. Nos. 727,330 and 730,756. The two liquid crystal eyelids 986 can be controlled together to be transparent and non-transparent to provide an awake effect and a sleeping effect respectively. Further, the two liquid crystal eyelids 986 can be controlled separately such as for controlling one of the two eyelids to be transparent while the other eyelid is controlled to be opaque and then transparent for a winking effect. Further, eyelids 986 can be controlled in various ways such as multiple sequential on and off transparent and non-transparent control operations to provide a fluttering eye effect. Yet further, eyelids 986 can be implemented in segments such as to provide half-closed eyelid effects. Many other effects will now become obvious from the teachings herein.

Control arrangements are discussed in detail in said patent and in said two copending applications such as pulse modulated control, digital control, and analog control. Further, in a preferred embodiment, the microcomputer of the present invention can be used to control devices 986 such as discussed in said patent and two copending applications such as for a camera control embodiment and a pulse modulation control embodiment discussed therein.

A simplified control arrangement 985 (FIG. 17D) will now be provided to exemplify operation of the liquid crystal doll eye embodiment. Liquid crystal eyes 986 can include a first eye element 986C and a second eye element 986D being excited with excitation signal EXCIT under control of switches 989 and 990. Switch 989 provides dual eyelid control and switch 990 provides single eyelid control. Dual eyelid control switch 989 may be a well-known double-pole double-through (DPDT) type switch where both contacts operate together to control both LCD elements together for both eyelids to be opened or closed together. Switch 989 may be implemented as a gravity switch. The gravity switch will open when the doll is upright to provide an open eyelid condition 984A and will close when the doll is reclining to provide a closed eyelid condition 984B. Such gravity switches are well known in the art such as mercury switches and such as safety switches exemplified with the switch in Sears Kenmore portable heater Model No 771-72230. Single eyelid control switch 990 may be a well-known single-pole double-through (SPDT) switch with a center off position for selecting either element 986C to be non-transmissive when in the up position, or to select element 986D to be non-transmissive when in the down position, or to select both elements 986C and 986D to be transmissive when in the center-off position. Corresponding terminals of switches 989 and 990 are connected together for control of elements 986C and 986D in accordance with the dual eye control and single eye control arrangements discussed above.

Further, liquid crystal devices 986 can be implemented as eyeglasses (either for a doll or for a human) which may be controlled to be transmissive for conventional eyeglasses and opaque or semi-opaque for sunglasses.

Still further, eyelids 986 and eye patterns 988 can be combined into a single element being a liquid crystal element having concentric controllable sub-elements. Control of an inner concentric element to be continuously non-transmissive, control of the middle concentric element to be partially transmissive, and control of the outer concentric element to be transparent provides the effect of an open eye and control of all elements to be fully non-transmissive provides the effect of a closed eye. Such a concentric circle control arrangement is discussed in the embodiment of a shutter and aperture for a camera in U.S. Pat. No. 3,986,022 and in copending applications Ser. Nos. 727,330 and 730,756 with reference to FIG. 8 therein.

Optical effects for toys and games will now be exemplified with a three-dimensional illumination control arrangement 991 (FIG. 17E). For simplicity of discussion, this embodiment will be discussed in the arrangement of the transparent person toy. Such a toy has been implemented in the prior art using transparent plastic elements mounted within each other and formed to appear as internal parts therebetween such as for internal organs presented in a transparent doll type figure. In this arrangement, element 994 is shown internal to element 993 which is shown internal to element 992. Each element 992-994 includes liquid crystal illumination control elements which are controlled to be transmissive or non-transmissive. Switch 995 applies excitation signal EXCIT to either outer element 992 to make outer element 992 non-transmissive, to middle element 993 to make middle element 993 non-transmissive, and/or to neither element 992 nor 993 to permit viewing of inner element 994 through transparent elements 992 and 993. Therefore, liquid crystal arrangements can be provided internal to other liquid crystal arrangements for selective viewing of internal elements as a function of excitation of the more outer elements.

The projection display arrangement of copending application Ser. No. 730,756 may be used to provide large screen display capability for enhanced effectiveness in combination with a small low-cost illumination amplifier device. This game embodiment exemplifies the general concept of projection displays for enhanced utility and economy. A game projection display arrangement will now be discussed with reference to FIG. 14A of application Ser. No. 730,756. An electronic game can be implemented having an illumination amplifier display such as a chess game, a "battleship" game, or other games. The illumination amplifier display can be implemented as illumination amplifier 104 in image generator 1450 as part of projector 1410 for projection of the display as illumination 1414 on screen 1451.

Other uses of displays for toys will now become obvious from the teachings herein. For example, projection LCD displays (or non-projection LCD displays) can be used for board games such as bingo, battleship, monopoly, tic-tac-toe, dungeons and dragons, etc.

Further, improved electronic toy and game arrangements are discussed in referenced applications Ser. Nos. 849,733 and 849,812 at pages 102-105 therein which is herein incorporated by reference.

Light Organ

The arrangements described herein may be used for an illumination amplifier light organ. Light bulb light organs are well known in the art such as used in conjunction with sound systems such as stereo hi-fi systems. In a preferred embodiment, the illumination amplifier light organ can use the projection IAD, color IAD, spacial control arrangement, and other features disclosed herein in combination therewith.

In a preferred embodiment, the light organ is configured as a colored projection LCD arrangement implemented as part of a sound system, wherein the projected pattern is projected on a wall, and/or ceiling, and/or screen, and/or other structures.

The light organ of the present invention can be controlled by audio signals as is well known for prior art light organs. Alternately, the light organ of the present invention can be controlled independent of a sound system, independent of sound, etc. Independent control can be provided from a recording medium such as from signals superimposed on an audio recording such as signature signals that are separable from the audio recording, or from signals recorded on a separate track as with well-known multiple-track recording devices characterized by cassette recorders, eight-track tape recorders, etc. In such an independent embodiment, a light display can be provided that is synchronized with but independent of a sound presentation.

Further Spacial Control Features

The spacial control arrangement discussed with reference to FIG. 15 can be used in many other embodiments and applications, some of which will now be described below. Spacial control can be implemented with resistive electrodes, variable thickness electro-optical material, etc; wherein the resistive electrode arrangement will be discussed for simplicity as exemplary of the other methods.

A two degree of freedom arrangement can be provided with resistive electrodes on both sides of the electro-optical material such as by deposition on each substrate, as is well known in the art for conductive electrodes. A voltage gradient across a pair of electrodes can be used to provide a transparent window or a non-transparent window that can be controlled in its position by adjusting the voltages on the two resistive electrodes. Such an arrangement may be utilized as a scanner by scanning a transparent window or, in an alternate embodiment, by scanning an opaque window. The dimensions of the window can be controlled with the magnitudes of the voltages and the position of the window can be controlled with the relationships between the voltages applied to the two electrodes.

In one embodiment, the resistive electrodes provide a constant resistivity for a constant resistive gradient. In an alternate embodiment, the resistive electrodes provide a variable resistivity for a variable resistive gradient. In yet another embodiment, the resistive electrodes interconnect conductive electrode segments; wherein the conductive electrode segments are controlled by the excitation of the conductive and resistive electrode combination; and wherein particular electrode shapes can be provided such as with the conductive electrode segments instead of merely a progressive bar graph or other such simple effect. In this embodiment, the resistive electrode portions may be very narrow and the conductive electrode portions may be relatively wide, where the display can be dominated by the conductive electrode portions. Therefore, the resistive electrode portions can provide the excitation-sensitive control of the conductive electrode portions, wherein the conductive electrode portions can dominate the display over the resistive electrode portions or to the virtual exclusion of the resistive electrode portions.

For example, when the excitation voltage occurs at the threshold of a conductive portion, the excitation voltage would cause the conductive region after the resistive region to "pop" into the display or to move more rapidly into the display, wherein a linear increase in voltage would cause a non-linear increase in illumination or display. For example, a thin resistive electrode between display elements could cause a thin minimal illumination effect until a conductive display position is reached; where the display element associated with the conductive region would "pop" into visual appearance as the voltage threshold is reached.

Therefore, use of a non-linear resistive gradient and/or conductive regions and/or a linear resistive gradient can provide useful optical effects.

If the above resistive and conductive electrode arrangement is used in combination with the dual-resistive electrode embodiment for scanning an optical window, a particular one of a plurality of conductive electrode portions may be selected as a function of the excitation voltage In this embodiment voltage-scanned elements can be selected as contrasted to the conventional approach of logically selecting elements; thereby reducing the number of electrodes, the electronic circuit complexity, etc and providing an analog scanning, selection, etc capability.

The controllable or scanned window discussed above can be utilized for a reading machine, wherein a student is taught reading by controlling visual access to printed material. For example, a page of printed material is provided under an IAD. Control of size and position of a transparent window can be controlled to provide visibility of a word, a portion of a word, or a plurality of words by controlling the relative excitations on two resistive electrodes. The window size can be controlled as a function of the amount of written material to be displayed and the position of the window can be controlled as a function of the portion of the written material to be displayed. The window can be dynamically positioned over the written material, moving from display portion to display portion under control of an electronic control device to teach a student to read by visually following the window. Voltages can be controlled with a digital control device such as the computer disclosed herein generating digital words to a pair of A/D converters for dynamically controlling the transparent window; wherein such A/D converter control is discussed with reference to FIG. 9B.

For the resistive electrode embodiment, capability can be provided with non-transparent or with transparent resistive electrodes. In a non-transparent resistive electrode embodiment, the IAD is used in a reflective mode; wherein the non-transparent resistive electrode is provided as the electrode associated with the reflective side of the IAD and wherein a transparent electrode such as a transparent conductive electrode is associated with the transmissive side of the IAD.

SCOPE AND DEFINITIONS

The invention disclosed herein is presented in preferred embodiments of illumination control arrangements to exemplify the inventive features, but the scope of this invention is much broader than illustrated with these preferred embodiments. Therefore, the scope is intended to be broadly interpreted to cover the general fields of illumination control. Various publications may be used for providing background for this invention and for illustrating the prior art. The various subject areas and associated references for each subject area are listed below.

(1) Integrated circuit technology is described in the book *Integrated Circuits* by Raymond M. Warner, Jr. and James N. Fordemwalt (Editors) for McGraw-Hill Book Company (1965).

(2) Digital computer technology is described in the books
   (a) *Digital Computer Design* by Edward L. Braun for Academic Press (1963) and
   (b) *Digital Computer Design Fundamentals* by Yaohan Chu for McGraw Hill (1962).

(3) Digital computer programming is described in the books
   (a) *Programming: An Introduction to Computer Languages and Techniques* by Ward Douglas Maurer for Holden Day Inc. (1968),
   (b) *Programming for Digital Computers* by Joachim Jeenel for McGraw Hill (1959), and
   (c) *Elements of Computer Programming* by Swallow and Price for Holt, Rinehart, and Winston (1965).

(4) Analog computer technology is described in the book *Methods for Solving Engineering Problems Using Analog Computers* by Leon Levine for McGraw Hill (1964).

(5) Servo technology is described in the book *Automatic Control Systems* by Benjamin C. Kuo for Prentice-Hall (1962).

(6) Illumination technology is described in the books
   (a) *Optics, A Course For Engineers and Scientists* by Charles Williams and Orville Becklund for John Wiley and Sons Inc,
   (b) *Optical Data Processing* by Arnold Roy Shulman For John Wiley and Sons Inc, and
   (c) *Optics* by Bruno Rossi for Addison-Wesley (1957).

(7) Integrated circuits are described in the book *The TTL Data Book For Design Engineers* from Texas Instruments Incorporated.

(8) Thermal design is described in the articles
   (a) *What's New in Cool(ing)?* by W. S. Hudspeth in the May 1977 issue of Electro-Optical Systems Design magazine at pages 32–37,
   (b) *A New Approach to High-Power Microstrip Attenuators* by Jerry McNeal and Larry Gordon in the October 1977 issue of Electronic Packaging and Production magazine at pages 109 and 110, and
   (c) *Cold-Plate Thermal Design, Analysis and Sizing* by Ira Leonard and Steven Axelband in the October 1977 issue of Electronic Packaging and Production magazine at pages 101–107.

Various elements of the present invention have been described herein separately for simplicity. In a preferred embodiment, various elements of the present invention may be used in combination to provide the combined advantages of the individual elements. These combinations will become obvious to those skilled in the art from the teachings of this invention. As an example the combination of the aperture size device 820 (FIG. 8B), aperture rotational device 800 (FIG. 8A), and shutter device 838 (FIG. 8D) can be provided by combinations of the patterns described for each independent arrangement.

Illumination processing arrangements may be shown to illustrate individual features and may not repeat description of other arrangements that are described herein or that will become obvious to those skilled in the art from the teachings of this invention. For example; aperture, shutter, and control arrangements are individually discussed in detail herein but may not be repeated for each specific description. It is intended that such aperture, shutter, and control arrangements be useable with other arrangements described herein such as the illumination computer. In general, it is intended that all individual features of this invention be useable in combination with all other individual features of this invention.

Inventive features that may be used in combination include open loop or closed loop excitation, digital or analog excitation, aperture and shutter devices, and other such features. Further, such combinations may not be individually distinguishable where, for example, the aperture and shutter devices may be integrated together by making all aperture segments 826-830 (FIG. 8B) reflective to provide shutter capability.

For the various embodiments discussed herein, the illumination amplifier may be an integral part of an illumination source such as a glass enclosure of a bulb, an intermediate device placed inbetween a source and a receiver, or other such arrangement.

Illumination is herein intended to be interpreted in broad form and is intended to mean generalized illumination including light, both visible and non-visible, electron beams, generalized electromagnetic radiation including microwaves, and other forms of illumination. Illumination is intended to further include natural light from the sun, generated light such as from a light bulb, coherent light such as from a laser, and non-visible light such as infra-red and ultra-violet illumination. Illumination may herein be referred to as illumination signals and illumination beams to describe directed illumination. Illumination may have a broad spectrum or a narrow spectrum. Well known illumination processing devices such as filters may be used to selectively provide illumination of a desired spectral characteristic. The term illumination as used herein may mean a particular characteristic of an illumination signal such as intensity, intensity of a particular spectral region, or other illumination characteristic.

An illumination source is herein intended to be interpreted in broad form and may include a single source or a plurality of sources, a light bulb source for visible light, a laser or maser source for coherent illumination, the sun as a source of natural sunlight, and other sources of illumination.

A preferred embodiment of an illumination amplifier is discussed herein as a variable transmissivity or reflectivity device such as the well known liquid crystal devices. Terms used herein such as illumination control device or illumination amplifier are intended to include such a variable transmissivity or reflectivity device, but is also intended to include other illumination control devices such as variable absorption and variable filtering devices.

Illumination processing devices are well known to those skilled in the art. Different types of illumination may require different types of processing devices. For example lenses, prisms, mirrors, filters, shutters, and apertures may be used for visible illumination; magnetic and electric fields may be used for electron beams; and other well known devices may be used for other types of illumination. These illumination processing devices perform functions such as collimating, focusing, blocking, shaping, and filtering illumination. Because these illumination processing devices and their use are well known, such devices may not be described herein unless necessary to further illustrate operation.

Illumination may be imaged, collimated, focused or otherwise processed with illumination processing devices. An image may be used to illuminate or to expose an illumination sensitive medium such as film for recording the image such as by exposing or otherwise affecting the medium.

An illumination amplifier such as a liquid crystal device that converts between reflective and transmissive characteristics can be provided in complement illumination arrangements. Complement illumination arrangements will be illustrated with reference to FIG. 3A, where source illumination is directed to illumination amplifier 300 which may be a liquid crystal amplifier. The transmissive characteristic of amplifier 300 permits transmitted illumination 302 to be transmitted through amplifier 300 to illumination receiver 303. The reflective characteristic of amplifier 300 permits reflected illumination 304 to be reflected from amplifier 300 to illumination receiver 305. Assuming conservation of illumination and constant input illumination 301, as the reflectivity of 300 is increased, the transmissivity is decreased, and conversely. Therefore as transmitted illumination 302 is increased, reflected illumination is decreased, and conversely. A complement arrangement can be illustrated with a simple example, where it is desired to first fully illuminate, then to remove illumination from an illumination receiver. For this example, the receiver can be arranged as receiver 303, where amplifier 300 can be made transmissive for illuminating receiver 303 and then be made reflective for removing illumination from receiver 303. In a complement arrangement, the receiver can be arranged as receiver 305, where amplifier 300 can be made reflective for illuminating receiver 305 and then can be made transmissive for removing illumination from receiver 305. Because of the complementing characteristics of reflective-transmissive illumination amplifier devices, it will now become obvious that either of the complement arrangements may be used for implementing an illumination amplifier arrangement. For simplicity, only one of the complement forms is usually described herein. It is herein intended that either of the complement illumination amplifier forms be useable with an embodiment, even though an embodiment may only be described relative to one of such complement forms.

The features of the present invention have been described for the preferred embodiment of an IAD, but these features may be applied to other illumination systems. For example, the pulse modulation arrangement can be applied to light emitting diode (LED) displays and to plasma displays to provide shades of intensity as discussed herein for the IAD embodiment. Further, the flat-plane IAD embodiment disclosed herein such as with reference to FIG. 6 can be used in conjunction with LED and plasma display devices.

Many features of the present invention are related to the machine control parent applications referenced herein. For example, a camera may be considered to be a machine and a photoplotter clearly bridges the technologies between a conventional photographic camera and a machine. Control of illumination and control of a machine, particularly with the microcomputer of the present invention and with other control arrangements are disclosed in detail in the chain of copending applications. Therefore, control of illumination and control of machines finds extensive basis in the instant application and in the chain of copending applications.

From the above description it will be apparent that there is thus provided a device of the character described possessing the particular features of advantage before enumerated as desirable, but which obviously is susceptible to modification in it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is the following:

1. A liquid crystal illumination control system comprising:
   an illumination source generating source illumination;
   an electrical controller generating electrical control signals;
   a liquid crystal illumination controller coupled to the illumination source and to the electrical controller and generating reflected illumination in response to the source illumination and in response to the electrical control signals, wherein the source illumination generates heat in the liquid crystal illumination controller, and wherein the liquid crystal illumination controller includes a deposited heat conductive electrode conducting heat generated by the source illumination; and
   a heat transfer device coupled to the liquid crystal illumination controller and removing heat conducted by the heat conductive electrode.

2. A liquid crystal illumination control system comprising:
   a multicolored illumination source generating multicolored source illumination;
   an electrical controller generating electrical control signals;
   a liquid crystal illumination controller coupled to the multicolored illumination source and to the electrical controller and generating multicolored reflected illumination in response to the multicolored source illumination and in response to the electrical control signals, wherein the source illumination generates heat in the liquid crystal illumination controller, and wherein the liquid crystal illumination controller includes a deposited heat conductive electrode conducting heat generated by the source illumination; and
   a heat transfer device coupled to the liquid crystal illumination controller and removing heat conducted by the heat conductive electrode.

3. A liquid crystal illumination control system comprising:
   an illumination source generating source illumination;
   an electrical controller generating electrical control signals;
   a liquid crystal illumination controller coupled to the illumination source and to the electrical controller and controlling the source illumination in response to the electrical control signals, wherein the source illumination generates heat in the liquid crystal illumination controller, and wherein the liquid crystal illumination controller includes a heat conductive substrate conducting heat generated by the source illumination; and
   a cooling device coupled to the liquid crystal illumination controller and removing heat conducted by the heat conductive substrate.

4. A liquid crystal illumination control system comprising:
   an illumination source generating source illumination;
   an electrical controller generating electrical control signals;
   a liquid crystal illumination controller coupled to the illumination source and to the electrical controller and controlling the source illumination in response to the electrical control signals, wherein the source illumination generates heat in the liquid crystal illumination controller, and wherein the liquid crystal illumination controller includes a heat conductive substrate conducting heat generated by the source illumination; and
   a heat conduction device arranged around an outer edge of the liquid crystal illumination controller, coupled to the liquid crystal illumination controller and conductively removing heat conducted by the heat conductive substrate at an outer edge of the liquid crystal illumination controller.

5. The system as set forth in claim 3 above, wherein the cooling device includes a thermoelectric device coupled to the liquid crystal illumination controller and removing heat conducted by the heat conductive substrate.

6. A liquid crystal illumination control system comprising:
   an illumination source generating source illumination;
   an electrical controller generating electrical control signals;
   a liquid crystal illumination controller coupled to the illumination source and to the electrical controller and generating controlled illumination in response to the source illumination and in response to the electrical control signals, wherein the source illumination generates heat in the liquid crystal illumination controller, and wherein the liquid crystal illumination controller includes a transparent heat conductive substrate conducting heat generated by the source illumination; and
   a cooling device coupled to the liquid crystal illumination controller and removing the heat conducted by the heat conductive substrate.

7. A liquid crystal illumination control system comprising:
   an illumination source generating source illumination;
   an electrical controller generating electrical control signals;
   a liquid crystal illumination controller coupled to the illumination source and to the electrical controller and generating controlled illumination by controlling the source illumination in response to the electrical control signals, wherein the liquid crystal illumination controller is heated by the source illumination, and wherein the liquid crystal illumination controller includes a transparent heat conductive electrode conducting heat from the liquid crystal illumination controller; and a cooling device coupled to the liquid crystal illumination controller and removing heat conducted by the transparent heat conductive electrode.

8. A liquid crystal illumination control system comprising:

an illumination source generating source illumination;

an electrical controller generating electrical control signals;

a liquid crystal illumination controller coupled to the illumination source and to the electrical controller and generating controlled illumination in response to the source illumination and in response to the electrical control signals, wherein the liquid crystal illumination controller is heated by the source illumination, and wherein the liquid crystal illumination controller includes a heat conductive substrate conducting heat from the liquid crystal illumination controller;

a cooling device coupled to the liquid crystal illumination controller and removing heat conducted by the heat conductive substrate;

a projector coupled to the liquid crystal illumination controller and projecting the controlled illumination generated by the liquid crystal illumination controller; and a screen coupled to the projector and generating a display image in response to the controlled illumination projected by the projector.

9. A liquid crystal illumination control system comprising:

an illumination source generating source illumination;

an electrical controller generating electrical control signals;

a liquid crystal illumination controller coupled to the illumination source and to the electrical controller and generating controlled colored illumination in response to the source illumination and in response to the electrical control signals, wherein the source illumination causes heating of the liquid crystal illumination controller, and wherein the liquid crystal illumination controller includes a heat conductive electrode conductively cooling the liquid crystal illumination controller; and a heat transfer device coupled to the liquid crystal illumination controller and removing heat conducted by the heat conductive electrode.

10. A liquid crystal illumination control system comprising:

an illumination source generating source illumination;

an electrical controller generating electrical control signals;

a liquid crystal device coupled to the illumination source and to the electrical controller and generating controlled illumination in response to the source illumination and in response to the electrical control signals, and wherein the liquid crystal device is heated by the source illumination; and a thermoelectric cooling device coupled to the liquid crystal device and cooling the liquid crystal device.

11. A liquid crystal illumination control system comprising:

an illumination source generating source illumination;

an electrical controller generating electrical control signals;

a liquid crystal device having a transparent heat conductive electrode, coupled to the illumination source and to the electrical controller, and controlling the source illumination to generate controlled illumination by exciting the transparent heat conductive electrode with the electrical control signals, wherein the source illumination generates heat in the liquid crystal device, and wherein the transparent heat conductive electrode is arranged to conduct heat generated by the source illumination; and a cooling device coupled to the liquid crystal device and removing heat conducted by the transparent heat conductive electrode.

12. A liquid crystal illumination control system comprising:

an illumination source generating source illumination;

an electrical controller generating electrical control signals;

a liquid crystal device having a heat conductive substrate, coupled to the illumination source and to the electrical controller, and generating controlled illumination in response to the source illumination and in response to the electrical control signals, wherein the source illumination generates heat in the liquid crystal device, and wherein the heat conductive substrate is arranged to conduct the heat to a cooling device; and a cooling device coupled to the liquid crystal device and removing heat conducted by the heat conductive substrate.

13. A liquid crystal illumination control system comprising:

an illumination source generating source illumination;

an electrical controller generating electrical control signals;

a reflective liquid crystal illumination controller coupled to the illumination source and to the electrical controller and generating reflected illumination in response to the source illumination and in response to the electrical control signals, wherein the source illumination generates heat in the reflective liquid crystal illumination controller; and a metallic thermal conductor deposited on the reflective liquid crystal illumination controller and removing heat generated in the reflective liquid crystal illumination controller by the source illumination.

14. A liquid crystal illumination control system comprising:

an illumination source generating source illumination;

an electrical controller generating electrical control signals;

a reflective liquid crystal illumination controller coupled to the illumination source and to the electrical controller and controlling reflection of the source illumination to generate reflected illumination in response to the electrical control signals, wherein the source illumination generates heat in the reflective liquid crystal illumination controller; and a metallic electrode deposited on the reflective liquid crystal illumination controller and removing heat generated in the reflective liquid crystal illumination controller by the source illumination.

15. A liquid crystal illumination control system comprising:

an illumination source generating source illumination;

an electrical controller generating electrical control signals;

a reflective liquid crystal illumination controller coupled to the illumination source and to the electrical controller and generating reflected illumination in response to the source illumination and in response to the electrical control signals, wherein the source illumination generates heat in the reflective liquid crystal illumination controller; and a heat conduction device arranged around the outer edge of the reflective liquid crystal illumination controller and conductively removing heat generated in the reflective liquid crystal illumination controller by the source illumination.

16. A liquid crystal illumination control system comprising:

an illumination source generating source illumination;

an electrical controller generating electrical control signals;

a reflective liquid crystal illumination controller coupled to the illumination source and to the electrical controller and generating reflected illumination in response to the source illumination and in response to the electrical control signals, wherein the source illumination generates heat in the reflective liquid crystal illumination controller; and a thermoelectric cooling device coupled to the reflective liquid crystal illumination controller and removing heat generated in the reflective liquid crystal illumination controller by the source illumination.

17. A liquid crystal illumination control system comprising:

an illumination source generating source illumination;

an electrical controller generating electrical control signals;

a reflective liquid crystal illumination controller coupled to the illumination source and to the electrical controller and generating reflected illumination in response to the source illumination and in response to the electrical control signals, wherein the source illumination generates heat in the reflective liquid crystal illumination controller; and a heat sink coupled to the reflective liquid crystal illumination controller and removing heat generated in the reflective liquid crystal illumination controller by the source illumination.

18. A liquid crystal illumination control system comprising:

an illumination source generating source illumination;

an electrical controller generating electrical control signals;

a reflective liquid crystal illumination controller coupled to the illumination source and to the electrical controller and generating reflected illumination in response to the source illumination and in response to the electrical control signals generated by the electrical controller, wherein the source illumination generates heat in the reflective liquid crystal illumination controller; and a heat conductive substrate implemented on the reflective liquid crystal illumination controller and removing heat generated in the reflective liquid crystal illumination controller by the source illumination.

19. A liquid crystal illumination control system comprising:

an illumination source generating source illumination;

an electrical controller generating electrical control signals;

a reflective liquid crystal illumination controller coupled to the illumination source and to the electrical controller and generating reflected illumination in response to the source illumination and in response to the electrical control signals, wherein the source illumination generates heat in the reflective liquid crystal illumination controller; and a heat conductive glass substrate implemented on the reflective liquid crystal illumination controller and removing heat generated in the reflective liquid crystal illumination controller by the source illumination.

20. A liquid crystal illumination control system comprising:

an illumination source generating source illumination;

an electrical signal controller generating electrical control signals;

a first liquid crystal illumination controller coupled to the illumination source and to the electrical signal controller and generating first controlled illumination having a first color in response to the source illumination and in response to the electrical control signals;

a second liquid crystal illumination controller coupled to the illumination source and to the electrical signal controller and generating second controlled illumination having a second color that is different from the first color in response to the source illumination and in response to the electrical control signals;

a screen coupled to the first liquid crystal illumination controller and to the second liquid crystal illumination controller and generating a colored display image in response to the first controlled illumination and the second controlled illumination;

a first metallic thermal conductor deposited on the first liquid crystal illumination controller and removing heat from the first liquid crystal illumination controller; and a second metallic thermal conductor deposited on the second liquid crystal illumination controller and removing heat from the second liquid crystal illumination controller.

21. A liquid crystal illumination control system comprising:

an illumination source generating source illumination;

an electrical signal controller generating electrical control signals;

a first liquid crystal illumination controller coupled to the illumination source and to the electrical signal controller and generating first controlled illumination having a first color in response to the source illumination and in response to the electrical control signals;

a second liquid crystal illumination controller coupled to the illumination source and to the electrical signal controller and generating second controlled illumination having a second color that is different from the first color in response to the source illumination and in response to the electrical control signals;

a screen coupled to the first liquid crystal illumination controller and to the second liquid crystal illumination controller and generating a colored display image in response to the first controlled illumination and in response to the second controlled illumination;

a first metallic electrode deposited on the first liquid crystal illumination controller and removing heat from the first liquid crystal illumination controller; and a second metallic electrode deposited on the second liquid crystal illumination controller and removing heat from the second liquid crystal illumination controller.

22. A liquid crystal illumination control system comprising:

an illumination source generating source illumination;

an electrical signal controller generating electrical control signals;

a first liquid crystal illumination controller coupled to the illumination source and to the electrical signal controller and generating first controlled illumination having a first color in response to the source illumination and in response to the electrical control signals;

a second liquid crystal illumination controller coupled to the illumination source and to the electrical signal controller and generating second controlled illumination having a second color that is different from the first color in response to the source illumination and in response to the electrical control signals;

a screen coupled to the first liquid crystal illumination controller and to the second liquid crystal illumination controller and generating a colored display image in response to the first controlled illumination and the second controlled illumination;

a first heat conduction device arranged around the outer edge of the first liquid crystal illumination controller and conductively removing heat from the outer edge of the first liquid crystal illumination controller; and a second heat conduction device arranged around the outer edge of the second liquid crystal illumination controller and conductively removing heat from the outer edge of the second liquid crystal illumination controller.

23. A liquid crystal illumination control system comprising:

an illumination source generating source illumination;

an electrical signal controller generating electrical control signals;

a first liquid crystal illumination controller coupled to the illumination source and to the electrical signal controller and generating first controlled illumination having a first color in response to the source illumination and in response to the electrical control signals;

a second liquid crystal illumination controller coupled to the illumination source and to the electrical signal controller and generating second controlled illumination having a second color that is different from the first color in response to the source illumination and in response to the electrical control signals;

a display screen coupled to the first liquid crystal illumination controller and to the second liquid crystal illumination controller and generating a colored display image in response to the first controlled illumination and in response to the second controlled illumination; and a thermoelectric device coupled to remove heat from the first liquid crystal illumination controller and from the second liquid crystal illumination controller.

24. A liquid crystal illumination control system comprising:

an illumination source generating source illumination;

an electrical signal controller generating electrical control signals;

a first liquid crystal illumination controller coupled to the illumination source and to the electrical signal controller and generating first controlled illumination having a first color by controlling the source illumination in response to the electrical control signals;

a second liquid crystal illumination controller coupled to the illumination source and to the electrical signal controller and generating second controlled illumination having a second color that is different from the first color by controlling the source illumination in response to the electrical control signals;

a display screen coupled to the first liquid crystal illumination controller and to the second liquid crystal illumination controller and generating a colored display image in response to the first controlled illumination and the second controlled illumination;

a heat sink deposited on the first liquid crystal illumination controller and removing heat from the first liquid crystal illumination controller; and a heat sink deposited on the second liquid crystal illumination controller and removing heat from the second liquid crystal illumination controller.

25. A liquid crystal illumination control system comprising:

an illumination source generating source illumination;

an electrical signal controller generating electrical control signals;

a first liquid crystal illumination controller coupled to the illumination source and to the electrical signal controller and generating first controlled illumination having a first color by controlling the source illumination in response to the electrical control signals;

a second liquid crystal illumination controller coupled to the illumination source and to the electrical signal controller and generating second controlled illumination having a second color that is different from the first color by controlling the source illumination in response to the electrical control signals;

a display screen coupled to the first liquid crystal illumination controller and to the second liquid crystal illumination controller and generating a colored display image in response to the first controlled illumination and in response to the second controlled illumination;

a first heat conductive substrate implemented on the first liquid crystal illumination controller and removing heat therefrom; and a second heat conductive substrate implemented on the second liquid crystal illumination controller and removing heat therefrom.

26. A liquid crystal illumination control system comprising:

an illumination source generating source illumination;

an electrical signal controller generating electrical control signals;

a first liquid crystal illumination controller coupled to the illumination source and to the electrical signal controller and generating first controlled illumination having a first color by controlling the source illumination in response to the electrical control signals;

a second liquid crystal illumination controller coupled to the illumination source and to the electrical signal controller and generating second controlled illumination having a second color that is different from the first color by controlling the source illumination in response to the electrical control signals;

a display screen coupled to the first liquid crystal illumination controller and to the second liquid crystal illumination controller and generating a colored display image in response to the first controlled illumination and the second controlled illumination;

a first heat conductive glass substrate implemented on the first liquid crystal illumination controller and removing heat from the first liquid crystal illumination controller; and a second heat conductive glass substrate implemented on the second liquid crystal illumination controller and removing heat from the second liquid crystal illumination controller.

27. A liquid crystal illumination control system comprising:

an illumination source generating source illumination;

an electrical controller generating electrical control signals;

a liquid crystal illumination controller coupled to the illumination source and to the electrical controller and controlling the source illumination in response to the electrical control signals, wherein the source illumination generates heat in the liquid crystal illumination controller, and wherein the liquid crystal illumination controller includes a substrate having a metallic heat conductor deposited thereon conducting heat generated by the source illumination from the liquid crystal illumination controller; and a cooling device coupled to the metallic heat conductor and removing heat conducted by the metallic heat conductor deposited on the substrate of the liquid crystal illumination controller.

28. A liquid crystal illumination control system comprising:

an illumination source generating source illumination;

an electrical controller generating electrical control signals;

a liquid crystal illumination controller coupled to the illumination source and to the electrical controller and generating controlled illumination in response to the source illumination and in response to the electrical control signals, wherein the source illumination generates heat in the liquid crystal illumination controller, and wherein the liquid crystal illumination controller includes a substrate having a metallic electrode deposited thereon and conducting heat generated by the source illumination from the liquid crystal illumination controller; and a cooling device coupled to the metallic electrode and removing heat conducted thereby.

29. A liquid crystal illumination control system comprising:

an illumination source generating source illumination;

an electrical controller generating electrical control signals;

a liquid crystal illumination controller coupled to the illumination source and to the electrical controller and generating controlled illumination in response to the source illumination and in response to the electrical control signals, wherein the source illumination generates heat in the liquid crystal illumination controller, and wherein the liquid crystal illumination controller includes a heat conductive substrate conducting heat generated by the source illumination; and a forced air cooling device coupled to the heat conductive substrate and removing heat conducted thereby.

30. A liquid crystal illumination control system comprising:

an illumination source generating source illumination;

an electrical controller generating electrical control signals;

a liquid crystal illumination controller coupled to the illumination source and to the electrical controller and controlling the source illumination in response to the electrical control signals, wherein the source illumination generates heat in the liquid crystal illumination controller, and wherein the liquid crystal illumination controller includes a heat conductive substrate conducting heat generated by the source illumination; and a fluid cooling device coupled to the heat conductive substrate and removing heat conducted by the heat conductive substrate from the liquid crystal illumination controller with cooling fluid.

31. A liquid crystal illumination control system comprising:

an illumination source generating source illumination;

an electrical controller generating electrical control signals;

a liquid crystal illumination controller coupled to the illumination source and to the electrical controller and controlling the source illumination in response to the electrical control signals, wherein the source illumination generates heat in the liquid crystal illumination controller, and wherein the liquid crystal illumination controller includes a transparent heat conductive substrate conducting heat generated by the source illumination from the liquid crystal illumination controller; and a cooling device coupled to the transparent heat conductive substrate and removing heat conducted by the transparent heat conductive substrate deposited on the heat conductive substrate of the liquid crystal illumination controller.

32. A liquid crystal illumination control system comprising:

an illumination source generating source illumination;

an electrical controller generating electrical control signals;

a reflective liquid crystal illumination controller having a front face and a back face, coupled to the illumination source and to the electrical controller, and generating reflected illumination through the front face of the reflective liquid crystal illumination controller in response to the source illumination and in response to the electrical control signals, wherein the source illumination generates heat in the reflective liquid crystal illumination controller; and a metallic thermal conductor deposited on the back face of the reflective liquid crystal illumination controller and conductively cooling the back face of the reflective liquid crystal illumination controller to remove heat generated by the source illumination.

33. A liquid crystal illumination control system comprising:

an illumination source generating source illumination;

an electrical controller generating electrical control signals;

a reflective liquid crystal illumination controller having a front face and a back face, coupled to the illumination source and to the electrical controller, and generating reflected illumination through the front face of the reflective liquid crystal illumination controller in response to the source illumination and in response to the electrical control signals, wherein the source illumination generates heat in the reflective liquid crystal illumination controller; and a metallic electrode deposited on the back face of the reflective liquid crystal illumination controller and conductively cooling the back face of the reflective liquid crystal illumination controller to remove heat generated by the source illumination.

34. A liquid crystal illumination control system comprising:

an illumination source generating source illumination;

an electrical controller generating electrical control signals;

a reflective liquid crystal illumination controller having a front face and a back face, coupled to the illumination source and to the electrical controller, and generating reflected illumination by controlling reflection of the source illumination through the front face of the reflective liquid crystal illumination controller in response to the electrical control signals, wherein the source illumination generates heat in the reflective liquid crystal illumination controller; and a thermoelectric cooling device coupled to the reflective liquid crystal illumination controller and cooling the back face of the reflective liquid crystal illumination controller to remove heat generated by the source illumination.

35. A liquid crystal illumination control system comprising:

an illumination source generating source illumination;

an electrical controller generating electrical control signals;

a reflective liquid crystal illumination controller having a front face and a back face, coupled to the illumination source and to the electrical controller, and generating reflected illumination through the front face of the reflective liquid crystal illumination controller in response to the source illumination and in response to the electrical control signals, wherein the source illumination generates heat in the reflective liquid crystal illumination controller; and a heat sink deposited on the back face of the reflective liquid crystal illumination controller and removing the heat generated by the source illumination.

36. A liquid crystal illumination control system comprising:

an illumination source generating source illumination;

an electrical controller generating electrical control signals;

a reflective liquid crystal illumination controller having a front face and a back face, coupled to the illumination source and to the electrical controller, and generating reflected illumination through the front face of the reflective liquid crystal illumination controller in response to the source illumination and in response to the electrical control signals, wherein the source illumination generates heat in the reflective liquid crystal illumination controller; and a heat conductive substrate implemented on the back face of the reflective liquid crystal illumination controller and removing heat generated by the source illumination.

37. A liquid crystal illumination control system comprising:

an illumination source generating source illumination;

an electrical controller generating electrical control signals;

a reflective liquid crystal illumination controller having a front face and a back face, coupled to the illumination source and to the electrical controller, and generating reflected illumination through the front face of the reflective liquid crystal illumination controller in response to the source illumination and in response to the electrical control signals, wherein the source illumination generates heat in the reflective liquid crystal illumination controller; and a heat conductive glass substrate implemented on the back face of the reflective liquid crystal illumination controller and removing the heat generated by the source illumination.

38. A liquid crystal illumination control system comprising:

an illumination source generating source illumination;

an electrical controller generating electrical control signals;

a liquid crystal illumination controller coupled to receive the source illumination from the illumination source and to receive the electrical control signals from the electrical controller and generating reflected illumination in response to the received source illumination and in response to the received electrical control signals, wherein the source illumination heats the liquid crystal illumination controller; and a fluid heat transfer device having good thermal coupling to the liquid crystal illumination controller and removing heat therefrom.

39. A liquid crystal illumination control system comprising:

an illumination source generating source illumination;

an electrical controller generating electrical control signals;

a liquid crystal illumination controller coupled to receive the source illumination from the illumination source and to receive the electrical control signals from the electrical controller and generating reflected illumination in response to the received source illumination and in response to the received electrical control signals, wherein the source illumination heats the liquid crystal illumination controller; and a forced air heat transfer device having good thermal coupling to the liquid crystal illumination controller and removing heat therefrom.

40. A liquid crystal illumination control system comprising:

an illumination source generating source illumination;

an electrical controller generating electrical control signals;

a liquid crystal illumination controller coupled to receive the source illumination from the illumination source and to receive the electrical control signals from the electrical controller and generating reflected illumination in response to the received source illumination and in response to the received electrical control signals, wherein the source illumination heats the liquid crystal illumination controller; and a thermoelectric heat transfer device having good thermal coupling to the liquid crystal illumination controller and removing heat therefrom.

41. A liquid crystal illumination control system comprising:

an illumination source generating source illumination;

an electrical controller generating electrical control signals;

a liquid crystal illumination controller coupled to receive the source illumination from the illumination source and to receive the electrical control signals from the electrical controller and generating reflected illumination in response to the received source illumination and in response to the received electrical control signals, wherein the source illumination heats the liquid crystal illumination controller; and a heat sink heat transfer device having good thermal coupling to the liquid crystal illumination controller and removing heat therefrom.

42. A liquid crystal illumination control system comprising:

an illumination source generating source illumination;

an electrical controller generating electrical control signals;

a liquid crystal illumination controller coupled to receive the source illumination from the illumination source and to receive the electrical control signals from the electrical controller and generating reflected illumination in response to the received source illumination and in response to the received electrical control signals, wherein the source illumination heats the liquid crystal illumination controller; and a finned heat transfer device having good thermal coupling to the liquid crystal illumination controller and removing heat therefrom.

43. A liquid crystal illumination control system comprising:

an illumination source generating source illumination;

an electrical controller generating electrical control signals;

a liquid crystal illumination controller coupled to the illumination source and to the electrical controller and generating reflected illumination in response to the source illumination and in response to the electrical control signals, wherein the source illumination generates heat in the liquid crystal illumination controller, and wherein the liquid crystal illumination controller includes a transparent deposited heat conductive metallic layer conducting heat generated by the source illumination; and a heat transfer device coupled to the liquid crystal illumination controller and removing heat conducted by the heat conductive electrode.

44. A liquid crystal illumination control system comprising:

an illumination source generating source illuminations;

an electrical controller generating electrical control signals;

a liquid crystal illumination controller coupled to the illumination source and to the electrical controller and generating reflected illumination in response to the source illumination and in response to the electrical control signals, wherein the source illumination generates heat in the liquid crystal illumination controller, and wherein the liquid crystal illumination controller includes a transparent deposited heat conductive electrode conducting heat generated by the source illumination; and a heat transfer device coupled to the liquid crystal illumination controller and removing heat conducted by the heat conductive electrode.

45. A liquid crystal illumination control system as set forth in claim 3, wherein the cooling device is a fluid cooling device removing heat conducted by the heat conductive substrate.

46. A liquid crystal illumination control system as set forth in claim 3, wherein the cooling device is a forced air cooling device removing heat conducted by the heat conductive substrate.

47. A liquid crystal illumination control system as set forth in claim 3, wherein the cooling device is a thermoelectric cooling device removing heat conducted by the heat conductive substrate.

48. A liquid crystal illumination control system as set forth in claim 3, wherein the cooling device is a heat sink cooling device removing heat conducted by the heat conductive substrate.

49. A liquid crystal illumination control system as set forth in claim 3, wherein the cooling device is a finned cooling device removing heat conducted by the heat conductive substrate.

50. A liquid crystal illumination control system as set forth in claim 6, wherein the cooling device is a fluid cooling device removing heat conducted by the heat conductive substrate.

51. A liquid crystal illumination control system as set forth in claim 6, wherein the cooling device is a forced air cooling device removing heat conducted by the heat conductive substrate.

52. A liquid crystal illumination control system as set forth in claim 6, wherein the cooling device is a thermoelectric cooling device removing heat conducted by the heat conductive substrate.

53. A liquid crystal illumination control system as set forth in claim 6, wherein the cooling device is a heat sink cooling device removing heat conducted by the heat conductive substrate.

54. A liquid crystal illumination control system as set forth in claim 6, wherein the cooling device is a finned cooling device removing heat conducted by the heat conductive substrate.

55. A liquid crystal illumination control system as set forth in claim 7, wherein the cooling device is a fluid cooling device removing heat conducted by the transparent heat conductive electrode.

56. A liquid crystal illumination control system as set forth in claim 7, wherein the cooling device is a forced air cooling device removing heat conducted by the transparent heat conductive electrode.

57. A liquid crystal illumination control system as set forth in claim 7, wherein the cooling device is a thermoelectric cooling device removing heat conducted by the transparent heat conductive electrode.

58. A liquid crystal illumination control system as set forth in claim 7, wherein the cooling device is a heat sink cooling device removing heat conducted by the transparent heat conductive electrode.

59. A liquid crystal illumination control system as set forth in claim 7, wherein the cooling device is a finned cooling device removing heat conducted by the transparent heat conductive electrode.

60. A liquid crystal illumination control system comprising:

an illumination source generating source illumination;
an electrical controller generating electrical control signals;
a liquid crystal illumination controller coupled to the illumination source and to the electrical controller and generating controlled illumination in response to the source illumination and in response to the electrical control signals, wherein the liquid crystal illumination controller is heated by the source illumination, and wherein the liquid crystal illumination controller includes a heat conductive substrate conducting heat from the liquid crystal illumination controller;
a fluid cooling device coupled to the liquid crystal illumination controller and removing heat conducted by the heat conductive substrate;
a projector coupled to the liquid crystal illumination controller and projecting the controlled illumination generated by the liquid crystal illumination controller; and
a screen coupled to the projector and generating a display image in response to the controlled illumination projected by the projector.

61. A liquid crystal illumination control system comprising:

an illumination source generating source illumination;
an electrical controller generating electrical control signals;
a liquid crystal illumination controller coupled to the illumination source and to the electrical controller and generating controlled illumination in response to the source. illumination and in response to the electrical control signals, wherein the liquid crystal illumination controller is heated by the source illumination, and wherein the liquid crystal illumination controller includes a heat conductive substrate conducting heat from the liquid crystal illumination controller;
a forced air cooling device having good thermal coupling to the liquid crystal illumination controller and removing heat conducted by the heat conductive substrate;
a projector coupled to the liquid crystal illumination controller and projecting the controlled illumination generated by the liquid crystal illumination controller; and
a screen coupled to the projector and generating a display image in response to the controlled illumination projected by the projector.

62. A liquid crystal illumination control system comprising:

an illumination source generating source illumination;
an electrical controller generating electrical control signals;
a liquid crystal illumination controller coupled to the illumination source and to the electrical controller and generating controlled illumination in response to the source illumination and in response to the electrical control signals, wherein the liquid crystal illumination controller is heated by the source illumination; and wherein the liquid crystal illumination controller includes a heat conductive substrate conducting heat from the liquid crystal illumination controller;
a thermoelectric cooling device coupled to the liquid crystal illumination controller and removing heat conducted by the heat conductive substrate;
a projector coupled to the liquid crystal illumination controller and projecting the controlled illumination generated by the liquid crystal illumination controller; and
a screen coupled to the projector and generating a display image in response to the controlled illumination projected by the projector.

63. A liquid crystal illumination control system comprising:

an illumination source generating source illumination;
an electrical controller generating electrical control signals;
a liquid crystal illumination controller coupled to the illumination source and to the electrical controller and generating controlled illumination in response to the source illumination and in response to the electrical control signals, wherein the liquid crystal illumination controller is heated by the source illumination, and wherein the liquid crystal illumination controller includes a heat conductive substrate conducting heat from the liquid crystal illumination controller;
a heat sink cooling device coupled to the liquid crystal illumination controller and removing heat conducted by the heat conductive substrate;
a projector coupled to the liquid crystal illumination controller and projecting the controlled illumination generated by the liquid crystal illumination controller; and
a screen coupled to the projector and generating a display image in response to the controlled illumination projected by the projector.

64. A liquid crystal illumination control system comprising:

an illumination source generating source illumination;
an electrical controller generating electrical control signals;
a liquid crystal illumination controller coupled to the illumination source and to the electrical controller and generating controlled illumination in response to the source illumination and in response so the electrical control signals, wherein the liquid crystal illumination controller is heated by the source illumination and wherein the liquid crystal illumination controller includes a heat conductive substrate conducting heat from the liquid crystal illumination controller;
a finned cooling device coupled to the liquid crystal illumination controller and removing heat conducted by the heat conductive substrate;

a projector coupled to the liquid crystal illumination controller and projecting the controlled illumination generated by the liquid crystal illumination controller; and a screen coupled to the projector and generating a display image in response to the controlled illumination projected by the projector.

65. A liquid crystal illumination control system comprising:

an illumination source generating source illumination;

an electrical controller generating electrical control signals;

a plurality of capacitors coupled to the electrical controller and storing the electrical control signals;

a liquid crystal illumination controller having a plurality of liquid crystal segments, coupled to the illumination source and to the plurality of capacitors, and generating reflected illumination in response to the source illumination and in response to the electrical control signals stored by the plurality of capacitors, wherein the source illumination generates heat in the liquid crystal illumination controller, and wherein the liquid crystal illumination controller includes a deposited heat conductive electrode conducting heat generated by the source illumination; and a heat transfer device coupled to the liquid crystal illumination controller and removing heat conducted by the heat conductive electrode.

66. A liquid crystal illumination control system as set forth in claim 65, wherein the heat transfer device is a fluid heat transfer device removing heat conducted by the heat conductive electrode.

67. A liquid crystal illumination control system comprising:

an illumination source generating source illumination;

an electrical controller generating electrical control signals;

a plurality of capacitors coupled to the electrical controller and storing the electrical control signals;

a liquid crystal illumination controller having a plurality of liquid crystal segments, coupled to the illumination source and to the plurality of capacitors, and generating reflected illumination in response to the source illumination and in response to the electrical control signals stored by the plurality of capacitors, wherein the source illumination generates heat in the liquid crystal illumination controller, and wherein the liquid crystal illumination controller includes a deposited heat conductive electrode conducting heat generated by the source illumination; and a forced air heat transfer device coupled to the liquid crystal illumination controller and removing heat conducted by the heat conductive electrode.

68. A liquid crystal illumination control system as set forth in claim 65, wherein the heat transfer device is a thermoelectric heat transfer device removing heat conducted by the heat conductive electrode.

69. A liquid crystal illumination control system as set forth in claim 65, wherein the heat transfer device is a heat sink heat transfer device removing heat conducted by the heat conductive electrode.

70. A liquid crystal illumination control system as set forth in claim 65, wherein the heat transfer device is a finned heat transfer device removing heat conducted by the heat conductive electrode.

71. A liquid crystal illumination control system comprising:

an illumination source generating source illumination;

an electrical controller generating electrical control signals;

a plurality of capacitors coupled to the electrical controller and storing the electrical control signals;

a liquid crystal illumination controller having a plurality of liquid crystal segments, coupled to the illumination source and to the plurality of capacitors, and generating reflected illumination in response to the source illumination and in response to the electrical control signals stored by the plurality of capacitors, wherein the source illumination generates heat in the liquid crystal illumination controller, and wherein the liquid crystal illumination controller includes a transparent deposited heat conductive metallic layer conducting heat generated by the source illumination; and a heat transfer device coupled to the liquid crystal illumination controller and removing heat conducted by the transparent deposited heat conductive layer.

72. A liquid crystal illumination control system comprising:

an illumination source generating source illumination;

an electrical controller generating electrical control signals;

a plurality of capacitors coupled to the electrical controller and storing the electrical control signals;

a liquid crystal illumination controller having a plurality of liquid crystal segments, coupled to the illumination source and to the plurality of capacitors, and generating reflected illumination in response to the source illumination and in response to the electrical control signals stored by the plurality of capacitors, wherein the source illumination generates heat in the liquid crystal illumination controller; and wherein the liquid crystal illumination controller includes a transparent deposited heat conductive electrode conducting heat generated by the source illumination; and a heat transfer device coupled to the liquid crystal illumination controller and removing heat conducted by the transparent deposited heat conductive electrode.

* * * * *